US012433149B2

(12) United States Patent
Wang et al.

(10) Patent No.: US 12,433,149 B2
(45) Date of Patent: Sep. 30, 2025

(54) PHOSPHORESCENT ORGANOMETALLIC COMPLEX AND DEVICE THEREOF

(71) Applicant: BEIJING SUMMER SPROUT TECHNOLOGY CO., LTD., Beijing (CN)

(72) Inventors: Zhen Wang, Beijing (CN); Wei Cai, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 897 days.

(21) Appl. No.: 17/546,790

(22) Filed: Dec. 9, 2021

(65) Prior Publication Data

US 2022/0181560 A1 Jun. 9, 2022

(30) Foreign Application Priority Data

Dec. 9, 2020 (CN) ......................... 202011421043.9

(51) Int. Cl.
*H01L 51/50* (2006.01)
*H10K 85/30* (2023.01)
(Continued)

(52) U.S. Cl.
CPC ........... *H10K 85/342* (2023.02); *H10K 50/11* (2023.02); *H10K 2101/10* (2023.02); *H10K 2101/30* (2023.02); *H10K 2101/40* (2023.02)

(58) Field of Classification Search
None
See application file for complete search history.

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 109467575 A 3/2019
CN 111333611 A 6/2020
(Continued)

OTHER PUBLICATIONS

First Office Action in Chinese Application No. 202011421043.9 dated Jul. 15, 2023 (with English translation), 8 pages.
(Continued)

*Primary Examiner* — Gregory D Clark
(74) *Attorney, Agent, or Firm* — ArentFox Schiff LLP; Joseph M. Maraia; Marlo Schepper Grolnic

(57) ABSTRACT

Provided are a phosphorescent organometallic complex and a device thereof. The organometallic complex contains a ligand $L_a$ having a structure of Formula 1 and a ligand $L_b$ having a structure of Formula 2. Such metal complexes can be used as light-emitting materials in electroluminescent devices. These novel compounds in organic electroluminescent devices can effectively improve efficiency, reduce device voltage, and provide better device performance. Further provided are an organic electroluminescent device containing the metal complex and a compound composition containing the metal complex.

27 Claims, 2 Drawing Sheets

(51) Int. Cl.

| | |
|---|---|
| *H10K 50/11* | (2023.01) |
| *H10K 101/10* | (2023.01) |
| *H10K 101/30* | (2023.01) |
| *H10K 101/40* | (2023.01) |

(56) References Cited

U.S. PATENT DOCUMENTS

| | | | | |
|---|---|---|---|---|
| 5,844,363 | A | 12/1998 | Gu et al. | |
| 6,097,147 | A | 8/2000 | Baldo et al. | |
| 6,303,238 | B1 | 10/2001 | Thompson et al. | |
| 7,279,704 | B2 | 10/2007 | Walters et al. | |
| 7,968,146 | B2 | 6/2011 | Wagner et al. | |
| 2003/0230980 | A1 | 12/2003 | Forrest et al. | |
| 2004/0174116 | A1 | 9/2004 | Lu et al. | |
| 2015/0137096 | A1* | 5/2015 | Xia | C07F 15/0033 546/4 |
| 2015/0349273 | A1 | 12/2015 | Hung et al. | |
| 2016/0359122 | A1 | 12/2016 | Boudreault et al. | |
| 2018/0006247 | A1 | 1/2018 | Zeng et al. | |
| 2020/0062778 | A1 | 2/2020 | Cui et al. | |
| 2020/0087311 | A1 | 3/2020 | Cui et al. | |
| 2020/0091442 | A1 | 3/2020 | Cai et al. | |
| 2020/0131204 | A1 | 4/2020 | Chen et al. | |
| 2020/0231602 | A1 | 7/2020 | Wang et al. | |
| 2020/0251666 | A1 | 8/2020 | Cai et al. | |
| 2021/0280802 | A1 | 9/2021 | Wang et al. | |
| 2021/0403496 | A1 | 12/2021 | Cai et al. | |
| 2022/0002329 | A1 | 1/2022 | Cai et al. | |

FOREIGN PATENT DOCUMENTS

| | | | |
|---|---|---|---|
| CN | 111440216 | A | 7/2020 |
| CN | 111518139 | A | 8/2020 |
| CN | 111635436 | A | 9/2020 |
| CN | 111675707 | A | 9/2020 |
| CN | 113087745 | A | 7/2021 |
| CN | 113683643 | A | 11/2021 |
| CN | 114057797 | A | 2/2022 |
| KR | 20180003461 | A | 1/2018 |
| KR | 20200032646 | A | 3/2020 |
| KR | 20210036829 | A | 4/2021 |
| KR | 20220043755 | A | 4/2022 |

OTHER PUBLICATIONS

Search Report in Chinese Application No. 202011421043.9 dated Jul. 11, 2023 (with English translation), 4 pages.

Tang et al., “Organic electroluminescent diodes,” Appl. Phys. Lett. 51(12), pp. 913-915, DOI:10.1063/1.98799 (1987), 4 pages.

Uoyama et al., “Highly efficient organic light-emitting diodes from delayed fluorescence,” Nature 492, pp. 234-240, DOI:10.1038/nature11687 (Dec. 2012), 7 pages.

Request for the Submission of an Opinion received in Korean Application No. 10-2021-0174970 on Jan. 19, 2024 and its English translation, 26 pages.

* cited by examiner

PHOSPHORESCENT ORGANOMETALLIC COMPLEX AND DEVICE THEREOF

CROSS-REFERENCE TO RELATED APPLICATION(S)

This application claims priority to Chinese Patent Application No. CN 202011421043.9 filed on Dec. 9, 2020, the disclosure of which is incorporated herein by reference in its entirety.

TECHNICAL FIELD

The present disclosure relates to compounds for organic electronic devices such as organic light-emitting devices. In particular, the present disclosure relates to an organometallic complex containing a ligand $L_a$ having a structure of Formula 1 and a ligand $L_b$ having a structure of Formula 2 and an organic electroluminescent device and compound composition containing the metal complex.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modem organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

US20200251666A1 has disclosed a ligand structure

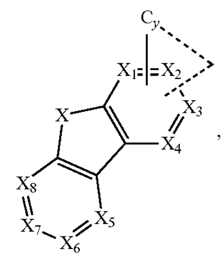

, wherein at least one of $X_1$ to $X_8$ is selected from C—CN and has further disclosed an iridium complex with the following structure

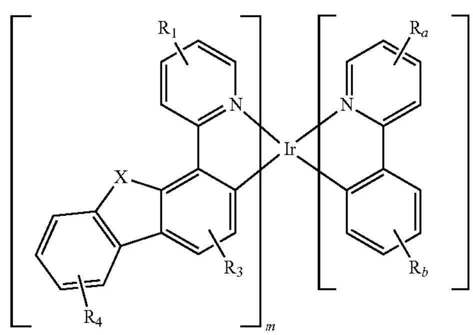

,

The iridium complex applied to an organic electroluminescent device can improve device performance and color saturation, which are still to be improved though they have reached a relatively high level in the industry. Meanwhile, this application has neither disclosed nor taught an effect of a phenylpyridine ligand having a structure of Formula 2 of the present application.

US20200091442A1 has disclosed the following ligand structure

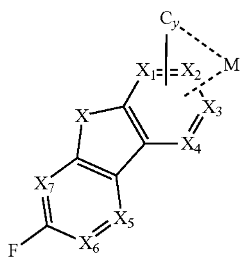

and further disclosed an iridium complex with the following structure

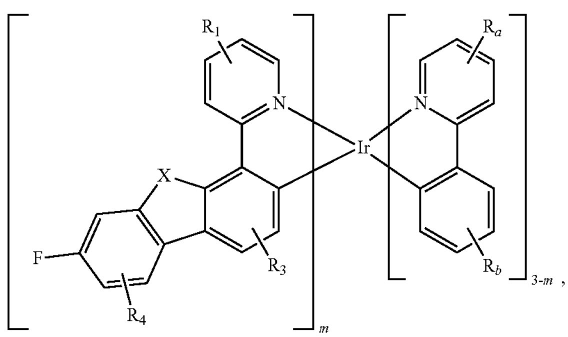

In this application, fluorine at a particular position of the ligand can improve device performance including a device lifetime and thermal stability. However, this application has neither disclosed nor taught an effect of a phenylpyridine ligand having a structure of Formula 2 of the present application.

US20180006247A1 has disclosed an iridium complex having a structure of

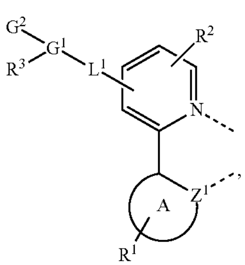

wherein $G^1$ is a condensed aromatic structure containing at least four carbon atoms and two aromatic rings. This application has neither disclosed nor taught an effect of a metal complex containing $L_b$ with cyano and fluorine.

SUMMARY

The present disclosure aims to provide a series of metal complexes each containing ligands with structures of Formula 1 and Formula 2 to solve at least part of the preceding problems. These metal complexes may be used as light-emitting materials in electroluminescent devices. These novel compounds in organic electroluminescent devices can effectively improve efficiency, reduce device voltage, and provide better device performance.

An embodiment of the present disclosure provides a metal complex having a general formula of $M(L_a)_m(L_b)_n(L_c)_q$;

wherein m is 1 or 2, n is 1 or 2, and q is 0 or 1; when m is 2, two $L_a$ are identical or different; when n is 2, two $L_b$ are identical or different; and $L_a$, $L_b$ and $L_e$ can be optionally joined to form a multidentate ligand;

$L_a$ has a structure represented by Formula 1 and $L_b$ has a structure represented by Formula 2:

Formula 1

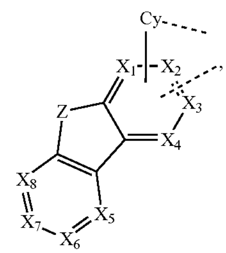

Formula 2

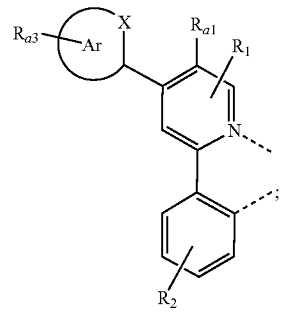

wherein the metal M is selected from a metal with a relative atomic mass greater than 40;

Cy is, at each occurrence identically or differently, selected from substituted or unsubstituted aryl having 5 to 24 ring atoms or substituted or unsubstituted heteroaryl having 5 to 24 ring atoms; and the Cy is joined to the metal M by a metal-carbon bond or a metal-nitrogen bond;

Z is, at each occurrence identically or differently, selected from the group consisting of O, S, Se, $NR_z$, $CR_zR_z$ and $SiR_zR_z$; when two $R_z$ are present at the same time, the two $R_z$ are identical or different;

$X_1$ to $X_8$ are, at each occurrence identically or differently, selected from C, $CR_x$ or N, and at least one of $X_1$ to $X_4$ is C and joined to Cy;

at least one of $X_1$ to $X_8$ is $CR_x$, and the $R_x$ is cyano or fluorine;

$X_1$, $X_2$, $X_3$ or $X_4$ is joined to the metal M by a metal-carbon bond or a metal-nitrogen bond;

X is, at each occurrence identically or differently, selected from the group consisting of $CR_{a2}$, $NR_{a2}$, N, O and S;

the ring Ar is, at each occurrence identically or differently, selected from the group consisting of: substituted or unsubstituted aryl having 6 to 30 carbon atoms, substituted or unsubstituted heteroaryl having 3 to 30 carbon atoms and combinations thereof;

$R_{a3}$, $R_1$ and $R_2$ represent, at each occurrence identically or differently, mono-substitution, multiple substitutions or non-substitution;

$R_{a1}$, $R_{a2}$, $R_{a3}$, $R_1$, $R_2$, $R_z$ and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $R_{a1}$ and $R_{a2}$ is selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_x$, $R_z$ can be optionally joined to form a ring;

adjacent substituents $R_1$, $R_{a1}$, $R_{a2}$, $R_{a3}$ can be optionally joined to form a ring;

$L_c$ is, at each occurrence identically or differently, selected from a structure represented by any one of the group consisting of the following:

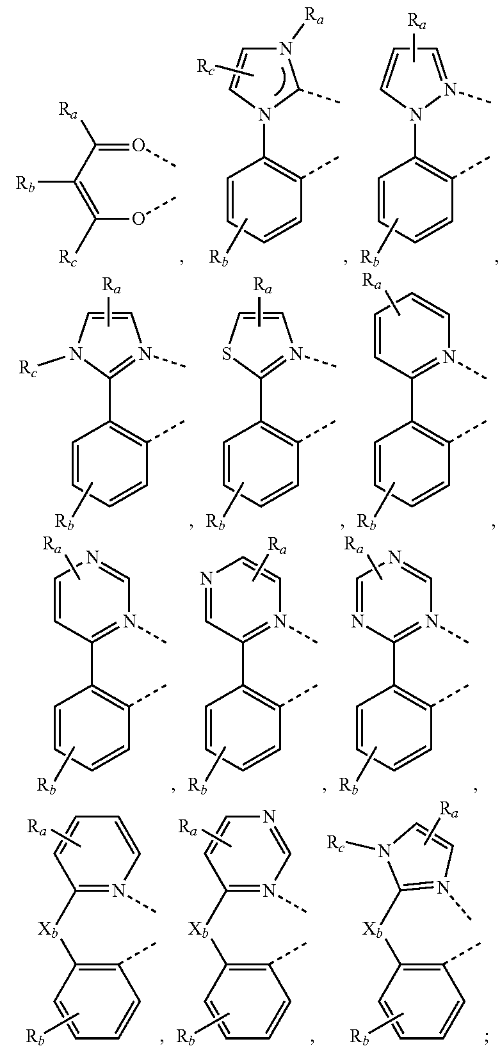

wherein $R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{C1}R_{C2}$;

$R_a$, $R_b$, $R_c$, $R_{N1}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_a$, $R_b$, $R_c$, $R_{N1}$, $R_{C1}$ and $R_{C2}$ can be optionally joined to form a ring.

Another embodiment of the present disclosure further provides an organic electroluminescent device. The organic electroluminescent device includes an anode, a cathode and an organic layer disposed between the anode and the cathode, wherein at least one layer of the organic layer contains the metal complex in the preceding embodiment.

Another embodiment of the present disclosure further provides a compound composition. The compound composition contains the metal complex in the preceding embodiment.

The series of metal complexes each containing a ligand $L_a$ having a structure of Formula 1 and a ligand $L_b$ having a structure of Formula 2, which are provided in the present disclosure, may be used as light-emitting materials in electroluminescent devices. These novel compounds can be used in organic electroluminescent devices and can effectively improve efficiency, reduce device voltage, and provide better device performance.

DETAILED DESCRIPTION

Figure 1:
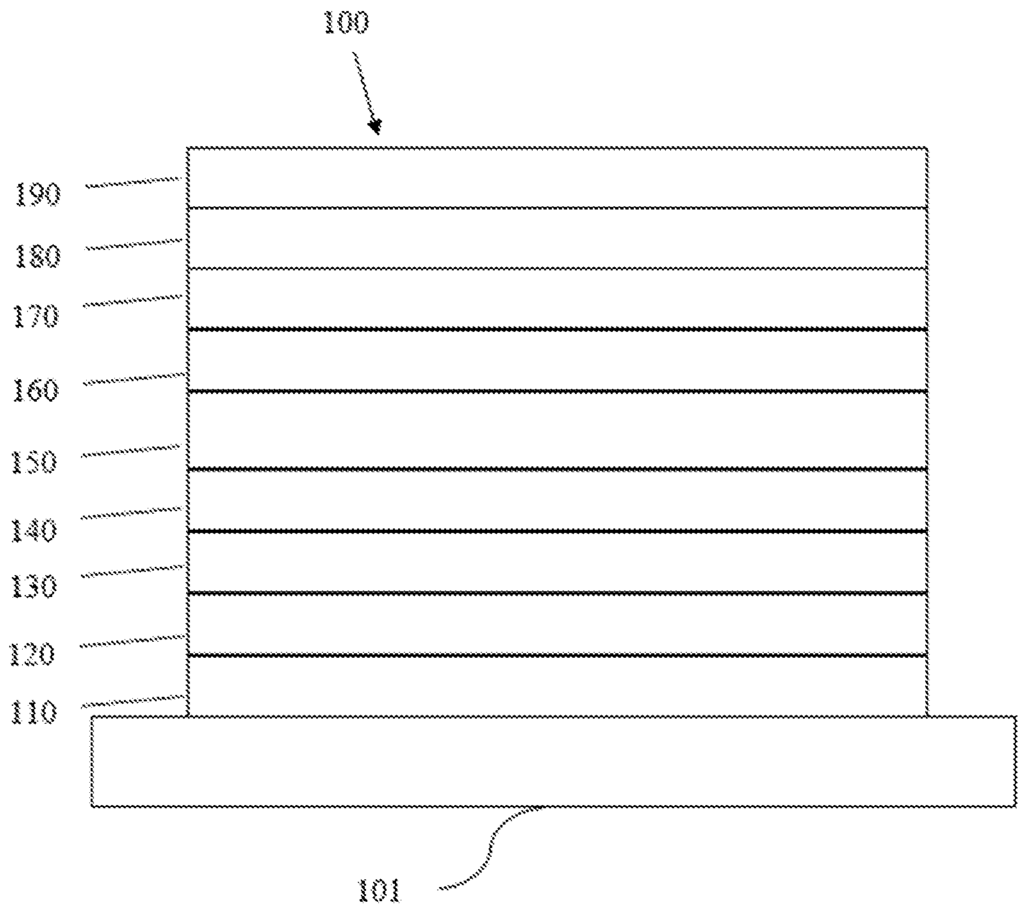
FIG. 1 is a schematic diagram of an organic light-emitting device that may contain a metal complex and a compound composition disclosed herein.

OLEDs can be fabricated on various types of substrates such as glass, plastic, and metal foil. FIG. 1 schematically shows an organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
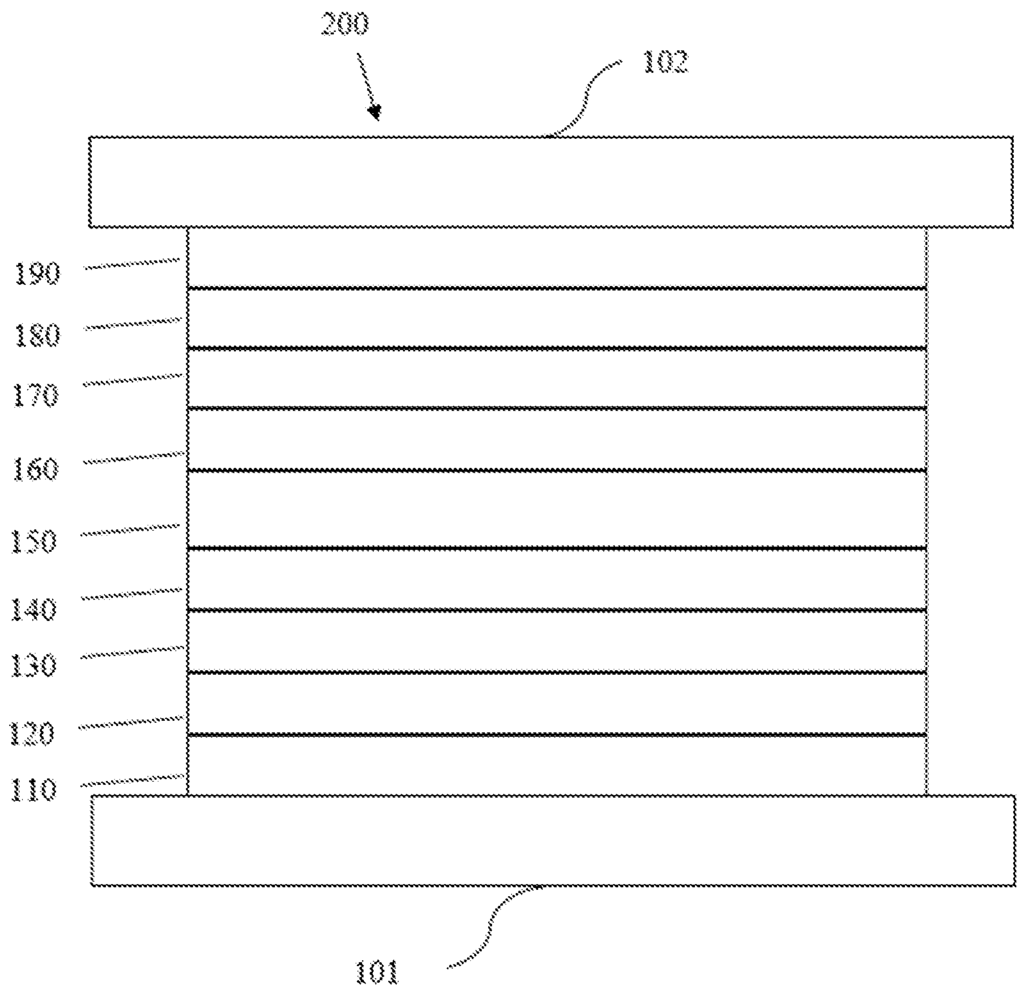
FIG. 2 is a schematic diagram of another organic light-emitting device that may contain a metal complex and a compound composition disclosed herein.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small AES-T. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylsilyl, dimethylethylsilyl, dimethylisopropylsilyl, t-butyldimethylsilyl, triethylsilyl, triisopropylsilyl, trimethylsilylmethyl, trimethylsilylethyl, and trimethylsilylisopropyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4''-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups includes saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, where at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, amino, acyl, carbonyl, a carboxylic acid group, an ester group, sulfinyl, sulfonyl, and phosphino may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitution refers to a range that includes a di-substitution, up to the maximum available substitution. When substitution in the compounds mentioned in the present disclosure represents multiple substitution (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic, as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

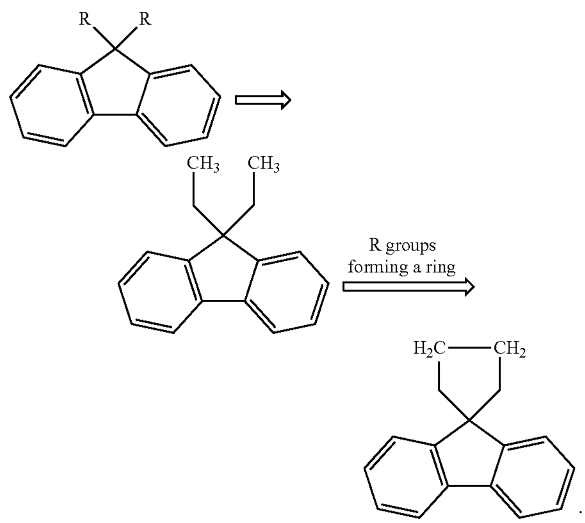

The expression that adjacent substituents can be optionally joined to form a ring is also intended to mean that two substituents bonded to carbon atoms which are directly bonded to each other are joined to each other via a chemical bond to form a ring, which can be exemplified by the following formula:

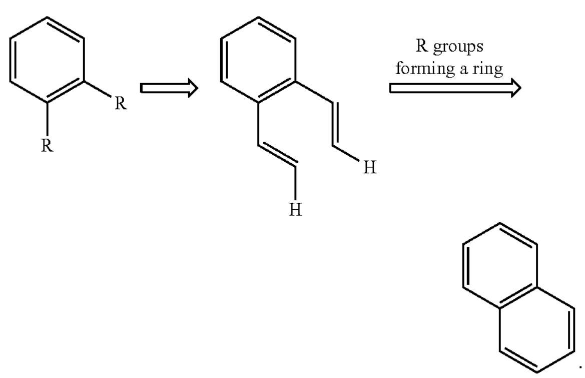

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

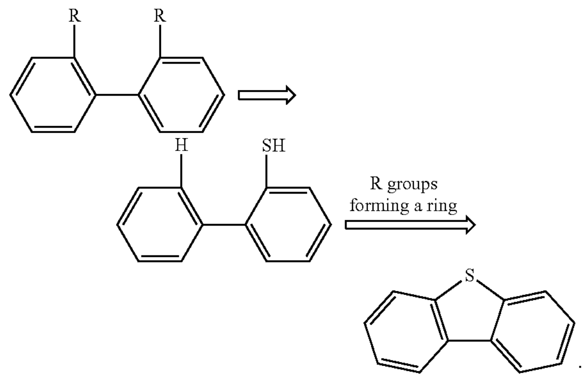

An embodiment of the present disclosure provides a metal complex having a general formula of $M(L_a)_m(L_b)_n(L_c)_q$; wherein m is 1 or 2, n is 1 or 2, and q is 0 or 1; when m is 2, two $L_a$ are identical or different; when n is 2, two $L_b$ are identical or different; and $L_a$, $L_b$ and $L_c$ can be optionally joined to form a multidentate ligand; for example, any two of $L_a$, $L_b$ and $L_e$ may be joined to form a tetradentate ligand; in another example, $L_a$, $L_b$ and $L_c$ may be joined to each other to form a hexadentate ligand; in another example, none of $L_a$, $L_b$ and $L_c$ are joined so that the multidentate ligand is not formed;

$L_a$ has a structure represented by Formula 1 and $L_b$ has a structure represented by Formula 2:

Formula 1

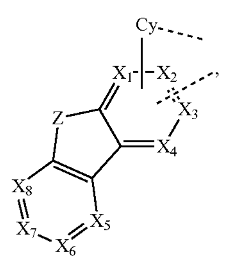

Formula 2

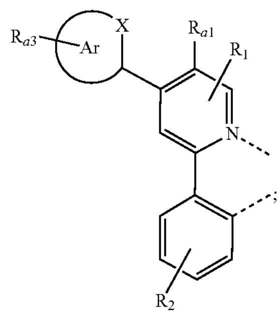

wherein the metal M is selected from a metal with a relative atomic mass greater than 40;

Cy is, at each occurrence identically or differently, selected from substituted or unsubstituted aryl having 5 to 24 ring atoms or substituted or unsubstituted heteroaryl having 5 to 24 ring atoms; and the Cy is joined to the metal M by a metal-carbon bond or a metal-nitrogen bond;

Z is, at each occurrence identically or differently, selected from the group consisting of O, S, Se, $NR_z$, $CR_zR_z$ and $SiR_zR_z$; when two $R_z$ are present at the same time, the two $R_z$ are identical or different;

$X_1$ to $X_8$ are, at each occurrence identically or differently, selected from C, $CR_x$ or N, and at least one of $X_1$ to $X_4$ is C and joined to Cy;

at least one of $X_1$ to $X_8$ is $CR_x$, and the $R_x$ is cyano or fluorine;

$X_1$, $X_2$, $X_3$ or $X_4$ is joined to the metal M by a metal-carbon bond or a metal-nitrogen bond;

X is, at each occurrence identically or differently, selected from the group consisting of $CR_{a2}$, $NR_{a2}$, N, O and S;

the ring Ar is, at each occurrence identically or differently, selected from the group consisting of: substituted or unsubstituted aryl having 6 to 30 carbon atoms, substituted or unsubstituted heteroaryl having 3 to 30 carbon atoms and combinations thereof;

$R_{a3}$, $R_1$ and $R_2$ represent, at each occurrence identically or differently, mono-substitution, multiple substitutions or non-substitution;

$R_{a1}$, $R_{a2}$, $R_{a3}$, $R_1$, $R_2$, $R_z$ and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $R_{a1}$ and $R_{a2}$ is selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; when X is selected from N, O or S, $R_{a2}$ is absent and $R_{a1}$ is selected from this group of substituents;

adjacent substituents $R_x$, $R_z$ can be optionally joined to form a ring;

adjacent substituents $R_1$, $R_{a1}$, $R_{a2}$, $R_{a3}$ can be optionally joined to form a ring;

$L_c$ is, at each occurrence identically or differently, selected from a structure represented by any one of the group consisting of the following:

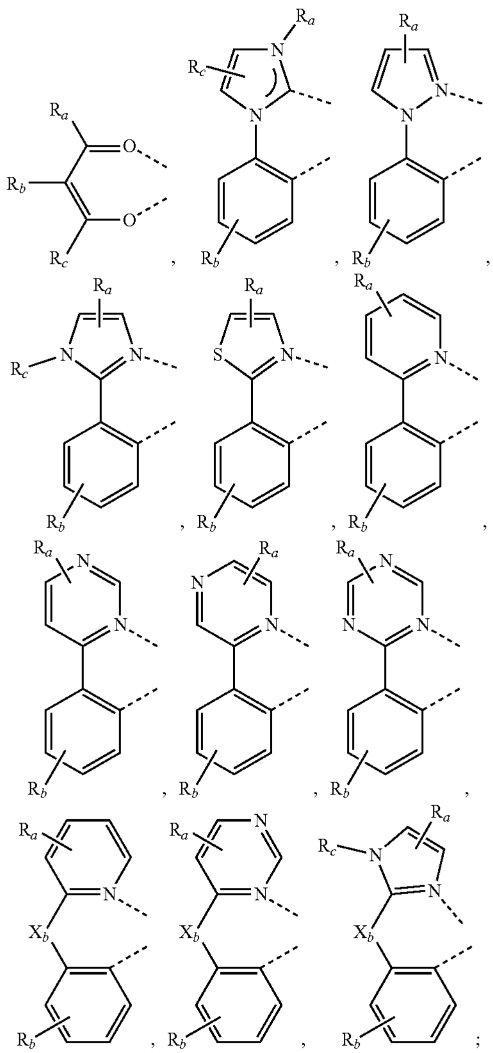

wherein $R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{C1}R_{C2}$;

$R_a$, $R_b$, $R_c$, $R_{N1}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_a$, $R_b$, $R_c$, $R_{N1}$, $R_{C1}$ and $R_{C2}$ can be optionally joined to form a ring.

In this embodiment, the expression that "adjacent substituents $R_x$, $R_z$ can be optionally joined to form a ring" is intended to mean that any one or more of groups of adjacent substituents, such as two substituents $R_x$, two substituents $R_z$, and substituents $R_x$ and $R_z$, can be joined to form a ring. Obviously, it is possible that none of these substituents are joined to form a ring.

In this embodiment, the expression that "adjacent substituents $R_1$, $R_{a1}$, $R_{a2}$, $R_{a3}$ can be optionally joined to form a ring" is intended to mean that any one or more of groups of adjacent substituents, such as two substituents $R_1$, two substituents $R_{a3}$, substituents $R_{a1}$ and $R_{a2}$, and substituents $R_{a2}$ and $R_{a3}$, can be joined to form a ring. Obviously, it is possible that none of these substituents are joined to form a ring.

In this embodiment, the expression that "adjacent substituents $R_a$, $R_b$, $R_c$, $R_{N1}$, $R_{C1}$ and $R_{C2}$ can be optionally joined to form a ring" is intended to mean that any one or more of groups of adjacent substituents, such as two substituents $R_a$, two substituents $R_b$, two substituents $R_c$, substituents $R_a$ and $R_b$, substituents $R_a$ and $R_c$, substituents Re and $R_c$, substituents $R_a$ and $R_{N1}$, substituents Re and $R_{N1}$, substituents $R_a$ and $R_{C1}$, substituents $R_a$ and $R_{C2}$, substituents Re and $R_{C1}$, substituents Re and $R_{C2}$, and substituents $R_{C1}$ and $R_{C2}$, can be joined to form a ring. Obviously, it is possible that none of these substituents are joined to form a ring.

According to an embodiment of the present disclosure, wherein, the metal M is, at each occurrence identically or differently, selected from the group consisting of Cu, Ag, Au, Ru, Rh, Pd, Os, Ir and Pt.

According to an embodiment of the present disclosure, wherein, the metal M is, at each occurrence identically or differently, selected from Pt or Ir.

According to an embodiment of the present disclosure, wherein, the metal M is Ir.

According to an embodiment of the present disclosure, wherein, X is, at each occurrence identically or differently, selected from $CR_{a2}$.

According to an embodiment of the present disclosure, wherein, m is 1 and n is 2; or n is 1 and m is 2.

According to an embodiment of the present disclosure, wherein, m is 1 and n is 2.

According to an embodiment of the present disclosure, wherein, Z is, at each occurrence identically or differently, selected from O or S.

According to an embodiment of the present disclosure, wherein, Z is O.

According to an embodiment of the present disclosure, wherein, Cy is selected from any one of the group consisting of the following structures:

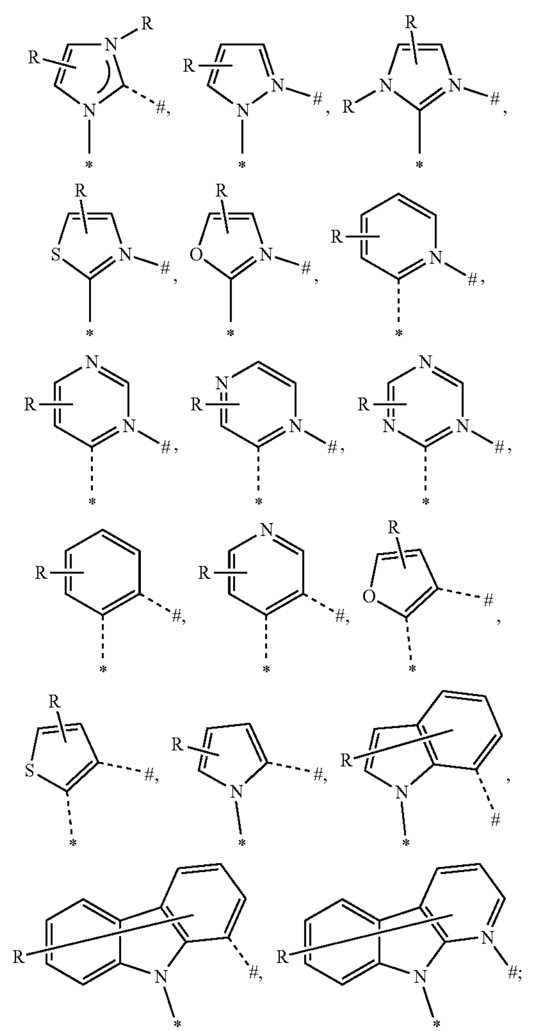

wherein

R represents, at each occurrence identically or differently, mono-substitution, multiple substitutions or non-substitution;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a hydroxyl group, a sulfinyl group, a sulfonyl group, a phosphino group and combinations thereof; and adjacent substituents R can be optionally joined to form a ring;

wherein '#' represents a position where Cy is joined to the metal M, and '*' represents a position where Cy is joined to $X_1$, $X_2$, $X_3$ or $X_4$ in Formula 1.

Herein, the expression that "adjacent substituents R can be optionally joined to form a ring" is intended to mean that any one or more of groups of adjacent substituents R can be joined to form a ring. Obviously, it is possible that none of these substituents are joined to form a ring.

According to an embodiment of the present disclosure, wherein, Cy is

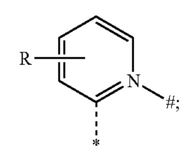

wherein

R represents, at each occurrence identically or differently, mono-substitution, multiple substitutions or non-substitution;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a hydroxyl group, a sulfinyl group, a sulfonyl group, a phosphino group and combinations thereof; and adjacent substituents R can be optionally joined to form a ring;

wherein # represents a position where Cy is joined to the metal M, and '*' represents a position where Cy is joined to $X_1$, $X_2$, $X_3$ or $X_4$ in Formula 1.

According to an embodiment of the present disclosure, wherein, at least one of $X_1$ to $X_8$ is selected from N.

According to an embodiment of the present disclosure, wherein, $X_8$ is N.

According to an embodiment of the present disclosure, wherein, $X_1$ to $X_8$ are, at each occurrence identically or differently, selected from C or $CR_x$.

According to an embodiment of the present disclosure, wherein, at least one of $X_1$ to $X_8$ is $CR_x$, and the $R_x$ is cyano or fluorine; and other $R_x$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, cyano and combinations thereof.

According to an embodiment of the present disclosure, wherein, the ligand $L_a$ is, at each occurrence identically or differently, selected from any one of the following structures:

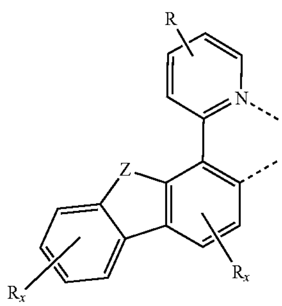

and

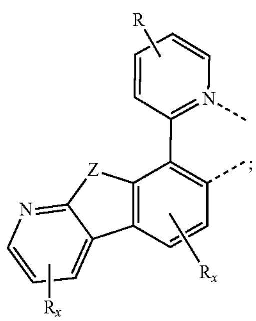

wherein

Z is, at each occurrence identically or differently, selected from O, S or Se;

R represents, at each occurrence identically or differently, mono-substitution, multiple substitutions or non-substitution;

$R_x$ represents, at each occurrence identically or differently, mono-substitution or multiple substitutions;

R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $R_x$ is cyano or fluorine; and adjacent substituents R, $R_x$ can be optionally joined to form a ring.

Herein, the expression that "adjacent substituents R, $R_x$ can be optionally joined to form a ring" is intended to mean that any one or more of groups of adjacent substituents, such as two substituents R and two substituents $R_x$, can be joined to form a ring. Obviously, it is possible that none of these substituents are joined to form a ring.

According to an embodiment of the present disclosure, wherein, the ligand $L_a$ is, at each occurrence identically or differently, selected from any one of the following structures:

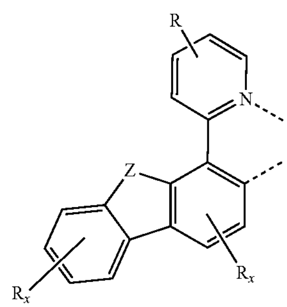

and

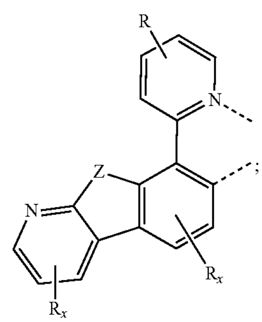

wherein

Z is, at each occurrence identically or differently, selected from O, S or Se;

R represents, at each occurrence identically or differently, mono-substitution, multiple substitutions or non-substitution;

$R_x$ represents, at each occurrence identically or differently, mono-substitution or multiple substitutions;

R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $R_x$ is cyano or fluorine; and there is at least another one $R_x$, and the $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, cyano and combinations thereof.

Adjacent substituents R, $R_x$ can be optionally joined to form a ring.

According to an embodiment of the present disclosure, wherein, the ligand $L_a$ is selected from the following structure:

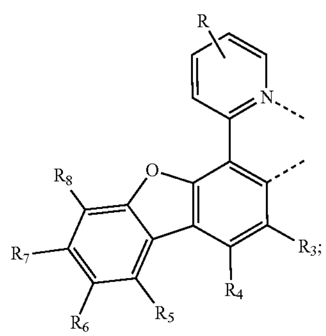

wherein

R represents, at each occurrence identically or differently, mono-substitution, multiple substitutions or non-substitution;

$R_3$ to $R_8$ and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a hydroxyl group, a sulfinyl group, a sulfonyl group, a phosphino group and combinations thereof;

adjacent substituents $R_3$ to $R_8$ and R can be optionally joined to form a ring; and at least one of $R_3$ to $R_8$ is cyano or fluorine.

In this embodiment, the expression that "adjacent substituents $R_3$ to $R_8$ and R can be optionally joined to form a ring" is intended to mean that any one or more of groups of adjacent substituents, such as any two substituents of $R_3$ to $R_8$ and two substituents R, can be joined to form a ring. Obviously, it is possible that none of these substituents are joined to form a ring.

According to an embodiment of the present disclosure, wherein, at least one of $R_5$ to $R_8$ is cyano.

According to an embodiment of the present disclosure, wherein, at least one of $R_5$ to $R_8$ is fluorine.

According to an embodiment of the present disclosure, wherein, $R_7$ or $R_8$ is cyano.

According to an embodiment of the present disclosure, wherein, $R_7$ is fluorine.

According to an embodiment of the present disclosure, wherein, R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof.

According to an embodiment of the present disclosure, wherein, $L_a$ is, at each occurrence identically or differently, selected from the group consisting of $L_{a1}$ to $L_{a326}$, wherein the specific structures of $L_{a1}$ to $L_{a326}$ are referred to claim 13.

According to an embodiment of the present disclosure, wherein, $R_{a1}$ is, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein, $R_{a1}$ is, at each occurrence identically or differently, selected from halogen, substituted or unsubstituted alkyl having 1 to 20 carbon atoms, substituted or unsubstituted cycloalkyl having 3 to 20 ring carbon atoms or a combination thereof; optionally, hydrogen in the above groups can be partially or fully deuterated.

According to an embodiment of the present disclosure, wherein, $R_{a1}$ is, at each occurrence identically or differently, selected from fluorine, methyl, ethyl, propyl, isopropyl, butyl, isobutyl, t-butyl, pentyl, neopentyl, cyclopentyl, cyclohexyl or a combination thereof; optionally, hydrogen in the above groups can be partially or fully deuterated.

According to an embodiment of the present disclosure, wherein, $R_{a1}$ is selected from methyl or deuterated methyl.

According to an embodiment of the present disclosure, wherein, $R_{a2}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms and combinations thereof.

According to an embodiment of the present disclosure, wherein, $R_{a2}$ is, at each occurrence identically or differently, selected from hydrogen, deuterium, fluorine, methyl, ethyl, propyl, isopropyl, butyl, isobutyl, t-butyl, pentyl, neopentyl, cyclopentyl, cyclohexyl, phenyl or a combination thereof; optionally, hydrogen in the above groups can be partially or fully deuterated.

According to an embodiment of the present disclosure, wherein, $R_{a2}$ is selected from hydrogen, deuterium, methyl or deuterated methyl.

According to an embodiment of the present disclosure, wherein, $R_{a1}$ and $R_{a2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms and combinations thereof; and at least one of $R_{a1}$ and $R_{a2}$ is selected from the group consisting of: halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms and combinations thereof.

According to an embodiment of the present disclosure, wherein, $R_{a1}$ is selected from substituted or unsubstituted alkyl having 1 to 10 carbon atoms, and $R_{a2}$ is hydrogen or deuterium.

According to an embodiment of the present disclosure, wherein, $R_{a2}$ is selected from substituted or unsubstituted alkyl having 1 to 10 carbon atoms or substituted or unsubstituted aryl having 6 to 12 carbon atoms, and $R_{a1}$ is hydrogen or deuterium.

According to an embodiment of the present disclosure, wherein, $R_{a3}$ is, at each occurrence identically or differently, selected from the group consisting of: hydrogen, deuterium, halogen, cyano, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms and combinations thereof.

According to an embodiment of the present disclosure, wherein, $R_{a3}$ is, at each occurrence identically or differently, selected from the group consisting of: hydrogen, deuterium, fluorine, cyano, substituted or unsubstituted alkyl having 1 to 6 carbon atoms, substituted or unsubstituted cycloalkyl having 3 to 6 ring carbon atoms, substituted or unsubstituted aryl having 6 to 18 carbon atoms, substituted or unsubstituted heteroaryl having 3 to 18 carbon atoms, substituted or unsubstituted alkylsilyl having 3 to 10 carbon atoms and combinations thereof.

According to an embodiment of the present disclosure, wherein, $R_{a3}$ is, at each occurrence identically or differently, selected from hydrogen, deuterium, fluorine, cyano, methyl, deuterated methyl, isopropyl, deuterated isopropyl, t-butyl, deuterated t-butyl, cyclopentyl, deuterated cyclopentyl, cyclohexyl, deuterated cyclohexyl, trimethylsilyl, phenyl or a combination thereof.

According to an embodiment of the present disclosure, wherein, the ring Ar is selected from substituted or unsubstituted aryl having 6 to 12 carbon atoms, substituted or unsubstituted heteroaryl having 3 to 12 carbon atoms or a combination thereof.

According to an embodiment of the present disclosure, wherein, the ring Ar is substituted or unsubstituted phenyl.

According to an embodiment of the present disclosure, wherein, the ring Ar is unsubstituted phenyl.

Herein, when the ring Ar is selected from unsubstituted aryl or heteroaryl, it means that substituents $R_{a2}$ and $R_{a3}$ on the ring Ar are both hydrogen. For example, when Ar is selected from unsubstituted phenyl, it means that the substituents $R_{a2}$ and $R_{a3}$ on the ring Ar are both hydrogen, that is, Formula 2 has the following structure:

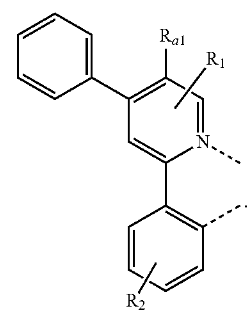

According to an embodiment of the present disclosure, wherein, $R_1$ and $R_2$ are, at each occurrence identically or differently, selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms or a combination thereof.

According to an embodiment of the present disclosure, wherein, $L_b$ is, at each occurrence identically or differently, selected from the group consisting of $L_{b1}$ to $L_{b545}$, wherein the specific structures of $L_{b1}$ to $L_{b545}$ are referred to claim 21.

According to an embodiment of the present disclosure, wherein, the metal complex has a structure of $lr(L_a)_2(L_b)$, wherein $L_a$ is, at each occurrence identically or differently, selected from any one or two of the group consisting of $L_{a1}$ to $L_{a326}$ and $L_b$ is selected from any one of the group consisting of $L_{b1}$ to $L_{b545}$, wherein the specific structures of $L_{a1}$ to $L_{a326}$ are referred to claim 13 and the specific structures of $L_{b1}$ to $L_{b545}$ are referred to claim 21.

According to an embodiment of the present disclosure, wherein, the metal complex has a structure of $lr(L_a)(L_b)_2$, wherein $L_a$ is selected from any one of the group consisting of $L_{a1}$ to $L_{a326}$ and $L_b$ is, at each occurrence identically or differently, selected from any one or two of the group consisting of $L_{b1}$ to $L_{b545}$, wherein the specific structures of $L_{a1}$ to $L_{a326}$ are referred to claim 13 and the specific structures of $L_{b1}$ to $L_{b545}$ are referred to claim 21.

According to an embodiment of the present disclosure, wherein, the metal complex is selected from the group consisting of Metal Complex 1 to Metal Complex 3348, wherein the specific structures of Metal Complex 1 to Metal Complex 3348 are referred to claim 22.

An embodiment of the present disclosure further provides an organic electroluminescent device. The electroluminescent device includes an anode, a cathode and an organic layer disposed between the anode and the cathode, wherein at least one layer of the organic layer contains the metal complex in any one of the preceding embodiments.

According to an embodiment of the present disclosure, in the organic electroluminescent device, the organic layer is a light-emitting layer.

According to an embodiment of the present disclosure, in the electroluminescent device, the organic layer is a light-emitting layer and the metal complex is a light-emitting material.

According to an embodiment of the present disclosure, the organic electroluminescent device emits green light.

According to an embodiment of the present disclosure, the organic electroluminescent device emits yellow light.

According to an embodiment of the present disclosure, in the organic electroluminescent device, the light-emitting layer further contains at least one first host compound.

According to an embodiment of the present disclosure, in the organic electroluminescent device, the light-emitting layer further contains a second host compounds.

According to an embodiment of the present disclosure, in the organic electroluminescent device, at least one of the host compounds comprises at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

According to an embodiment of the present disclosure, in the device, at least one first host compound and at least one second host compound independently contain at least one chemical group selected from the group consisting of: benzene, carbazole, indolocarbazole, fluorene, silafluorene and combinations thereof.

According to an embodiment of the present disclosure, in the organic electroluminescent device, the first host compound has a structure represented by Formula 3:

Formula 3

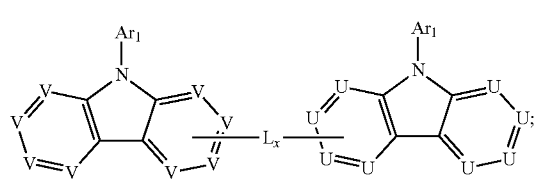

wherein $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

V is, at each occurrence identically or differently, selected from C, $CR_v$ or N, and one V is C and joined to $L_x$;

U is, at each occurrence identically or differently, selected from C, $CR_u$ or N, and one U is C and joined to $L_x$;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_1$ is, at each occurrence identically or differently, selected from substituted or unsubstituted aryl having 6 to 30 carbon atoms, substituted or unsubstituted heteroaryl having 3 to 30 carbon atoms or a combination thereof; and adjacent substituents $R_v$ and $R_u$ can be optionally joined to form a ring.

Herein, the expression that "adjacent substituents $R_v$ and $R_u$ can be optionally joined to form a ring" is intended to mean that any one or more of groups of adjacent substituents, such as two substituents $R_v$, two substituents $R_u$, and substituents $R_v$ and $R_u$, can be joined to form a ring. Obviously, it is possible that none of these substituents are joined to form a ring.

According to an embodiment of the present disclosure, in the organic electroluminescent device, the first host compound has a structure represented by one of Formulas 3-a to 3-j:

3-a

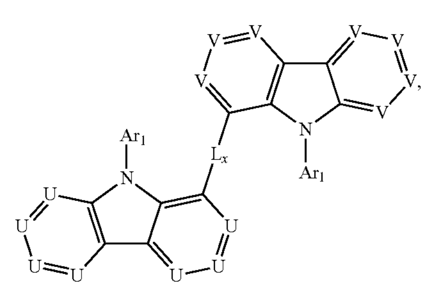

-continued
3-b
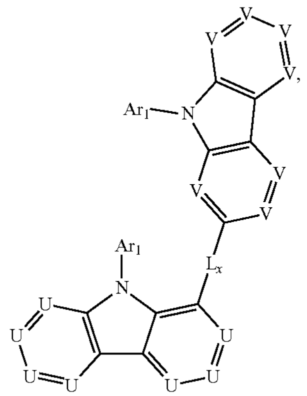
3-c
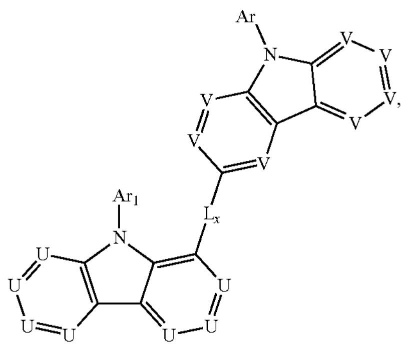
3-d
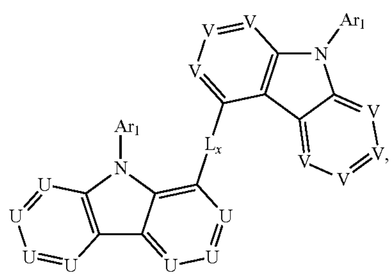
3-e
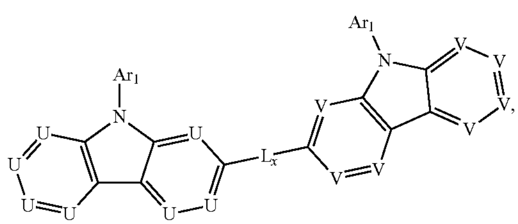
3-f
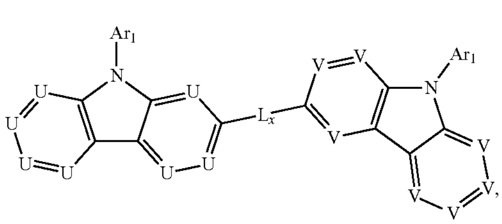
-continued
3-g
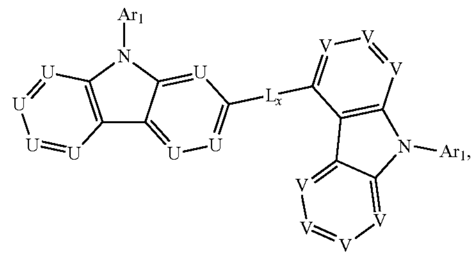
3-h
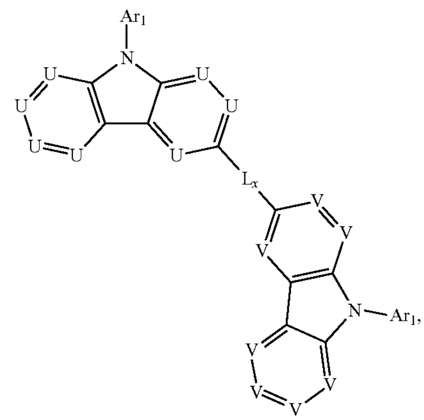
3-i
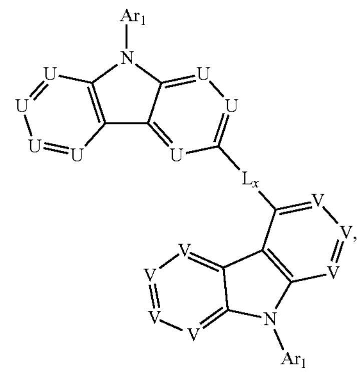
3-j
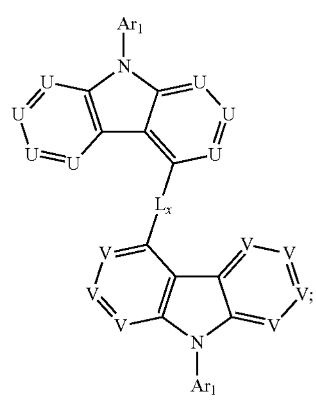
wherein
$L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

V is, at each occurrence identically or differently, selected from C, $CR_v$ or N;

U is, at each occurrence identically or differently, selected from C, $CR_u$ or N;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_1$ is, at each occurrence identically or differently, selected from substituted or unsubstituted aryl having 6 to 30 carbon atoms, substituted or unsubstituted heteroaryl having 3 to 30 carbon atoms or a combination thereof; and adjacent substituents $R_v$ and $R_u$ can be optionally joined to form a ring.

According to an embodiment of the present disclosure, wherein, at least one of all V is N, for example, one or two of V are N.

According to an embodiment of the present disclosure, wherein, at least one of all U is N, for example, one or two of U are N.

According to an embodiment of the present disclosure, in the organic electroluminescent device, the metal complex is doped in the first host compound and the second host compound, and the weight of the metal complex accounts for 1% to 30% of the total weight of the light-emitting layer.

According to an embodiment of the present disclosure, in the organic electroluminescent device, the metal complex is doped in the first host compound and the second host compound, and the weight of the metal complex accounts for 3% to 13% of the total weight of the light-emitting layer.

Another embodiment of the present disclosure further provides a compound composition. The compound composition includes the metal complex in any one of the preceding embodiments.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Material Synthesis Example

The method for preparing a compound in the present disclosure is not limited herein. Typically, the following compounds are used as examples without limitations, and synthesis routes and preparation methods thereof are described below.

Synthesis Example 1: Synthesis of Metal Complex 2010

Step 1:

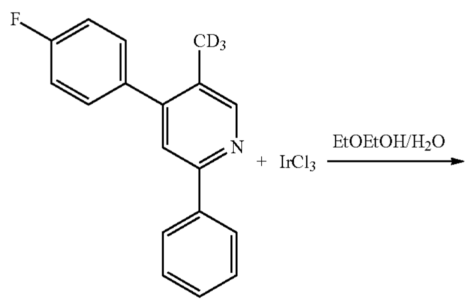

Intermediate 1

-continued

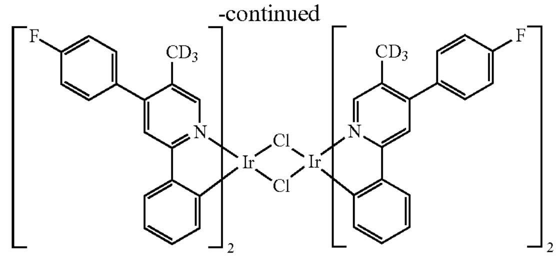

Intermediate 2

Intermediate 1 (3.0 g, 11.3 mmol), iridium trichloride (1.0 g, 2.8 mmol), 60 mL of ethoxyethanol and 20 mL of water were added in sequence to a dry 250 mL round-bottom flask, purged with $N_2$ three times, and heated and stirred overnight at 130° C. under $N_2$ protection. After the reaction ended, the reaction was cooled to room temperature and filtered under reduced pressure. The upper solid was dried to obtain Intermediate 2 (2.1 g, 99%).

Step 2:

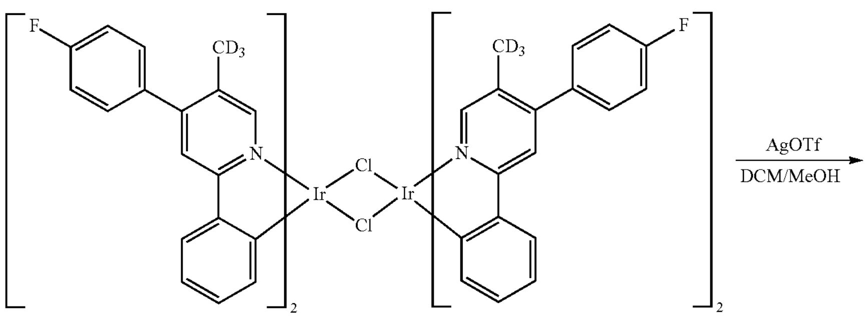

Intermediate 2

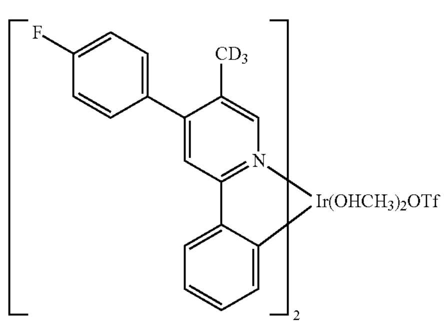

Intermediate 3

Intermediate 2 (2.1 g, 1.4 mmol), silver trifluoromethanesulfonate (0.8 g, 3.1 mmol), 120 mL of dichloromethane and 5 mL of methanol were added in sequence to a dry 250 mL round-bottom flask, purged with $N_2$ three times, and stirred overnight at room temperature under $N_2$ protection. After the reaction ended, the mixture was filtered through Celite and washed with dichloromethane. The filtrate was concentrated to obtain Intermediate 3 (2.5 g, 95%).

Step 3:

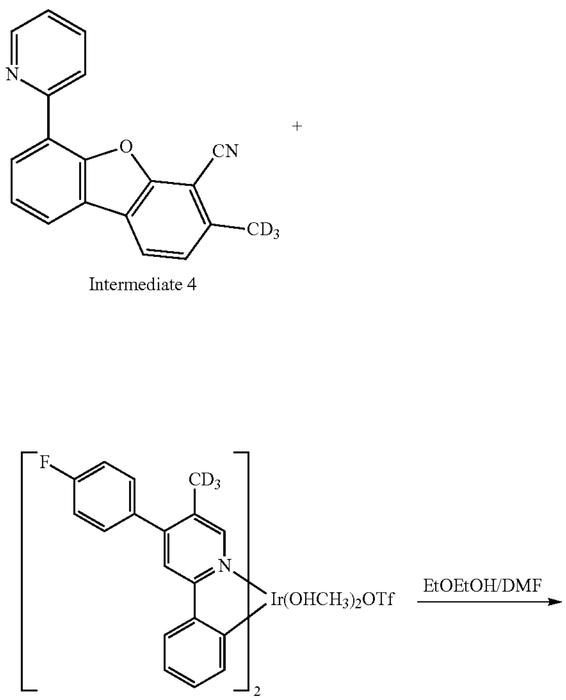

Intermediate 4

Intermediate 3

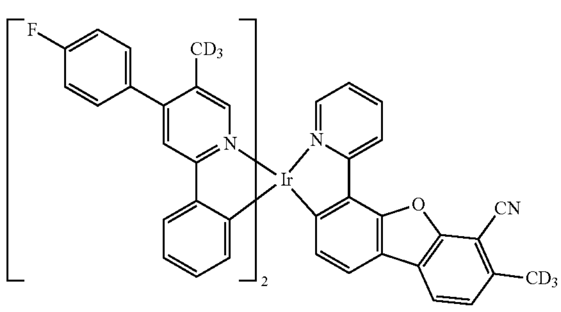

Metal Complex 2010

Intermediate 4 (1.8 g, 6.3 mmol), Intermediate 3 (4.5 g, 4.8 mmol), 50 mL of ethoxyethanol and 50 mL of N',N-dimethylformamide were added in sequence to a dry 250 mL round-bottom flask, purged with $N_2$ three times, and heated at 100° C. for 72 h under $N_2$ protection. After the reaction was cooled, the solvent was removed through rotary evaporation, methanol was added to the system, and the system was filtered through Celite. The system was washed twice with methanol and n-hexane, separately. A yellow solid on the Celite was dissolved in dichloromethane. The filtrate was collected, concentrated under reduced pressure, and separated and purified through column chromatography to obtain Metal Complex 2010 (2.2 g, 45%). The product was confirmed as the target product with a molecular weight of 1009.3.

Synthesis Example 2: Synthesis of Metal Complex 150

Step 1:

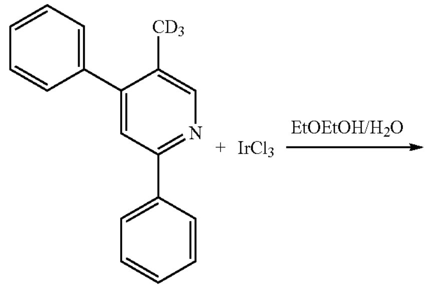

Intermediate 5

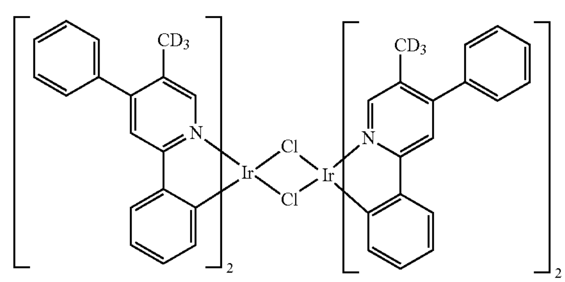

Intermediate 6

Intermediate 5 (3.0 g, 12.1 mmol), iridium trichloride (1.1 g, 3.0 mmol), 60 mL of ethoxyethanol and 20 mL of water were added in sequence to a dry 250 mL round-bottom flask, purged with $N_2$ three times, and heated and stirred overnight at 130° C. under $N_2$ protection. After the reaction ended, the reaction was cooled to room temperature and filtered under reduced pressure. The upper solid was dried to obtain Intermediate 6 (2.1 g, 97%).

Step 2:

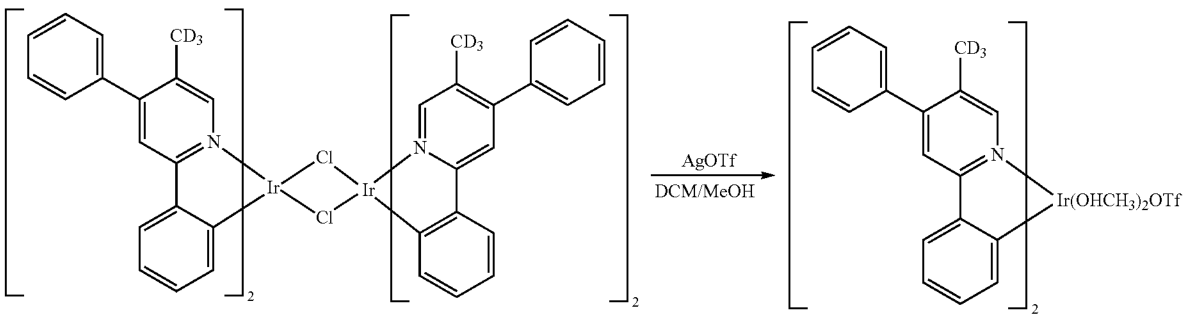

Intermediate 6 Intermediate 7

Intermediate 6 (2.1 g, 1.4 mmol), silver trifluoromethanesulfonate (0.8 g, 3.2 mmol), 120 mL of dichloromethane and 5 mL of methanol were added in sequence to a dry 250 mL round-bottom flask, purged with $N_2$ three times, and stirred overnight at room temperature under $N_2$ protection. After the reaction ended, the mixture was filtered through Celite and washed with dichloromethane. The filtrate was concentrated to obtain Intermediate 7 (2.4 g, 97%).

Step 3:

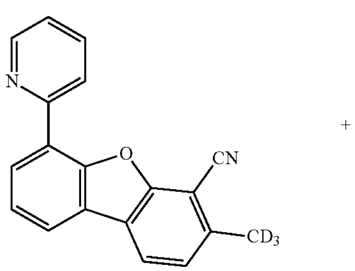

Intermediate 4

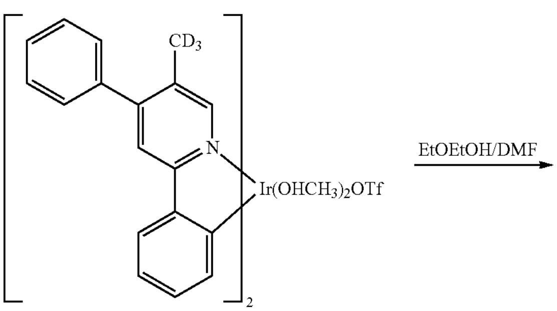

Intermediate 7

-continued

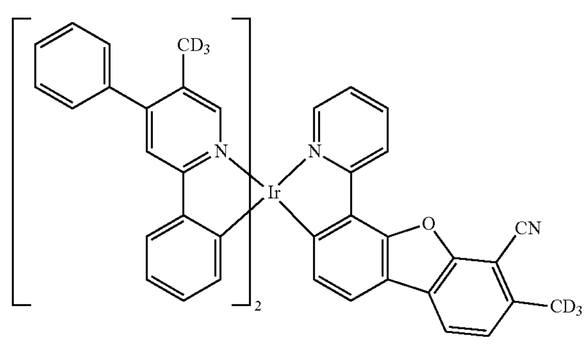

Metal Complex 150

Intermediate 4 (1.8 g, 6.3 mmol), Intermediate 7 (4.3 g, 4.8 mmol), 50 mL of ethoxyethanol and 50 mL of N',N-dimethylformamide were added in sequence to a dry 250 mL round-bottom flask, purged with $N_2$ three times, and heated at 100° C. for 72 h under $N_2$ protection. After the reaction was cooled, the solvent was removed through rotary evaporation, methanol was added to the system, and the system was filtered through Celite. The system was washed twice with methanol and n-hexane, separately. A yellow solid on the Celite was dissolved in dichloromethane. The filtrate was collected, concentrated under reduced pressure, and separated and purified through column chromatography to obtain Metal Complex 150 (2.0 g, 43%). The product was confirmed as the target product with a molecular weight of 973.3.

Synthesis Example 3: Synthesis of Metal Complex 2382

Step 1:

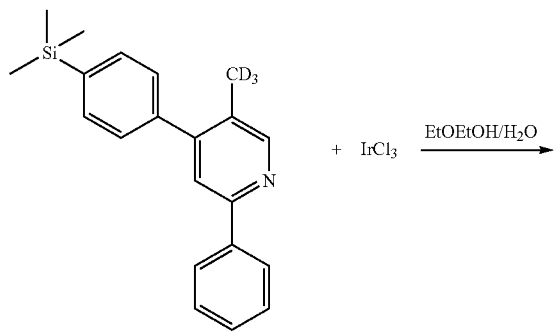

Intermediate 8

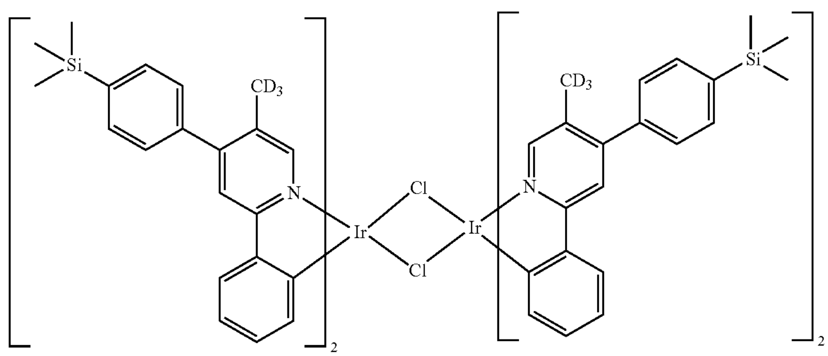

Intermediate 9

Intermediate 8 (5.8 g, 18.1 mmol), iridium trichloride (2.1 g, 6.0 mmol), 45 mL of ethoxyethanol and 15 mL of water were added in sequence to a dry 250 mL round-bottom flask, purged with $N_2$ three times, and heated and stirred to reflux overnight under $N_2$ protection. After the reaction ended, the reaction was cooled to room temperature and filtered. The upper solid was washed with methanol and pumped to dryness under reduced pressure to obtain Intermediate 9 (4.7 g, 88%).

Step 2:

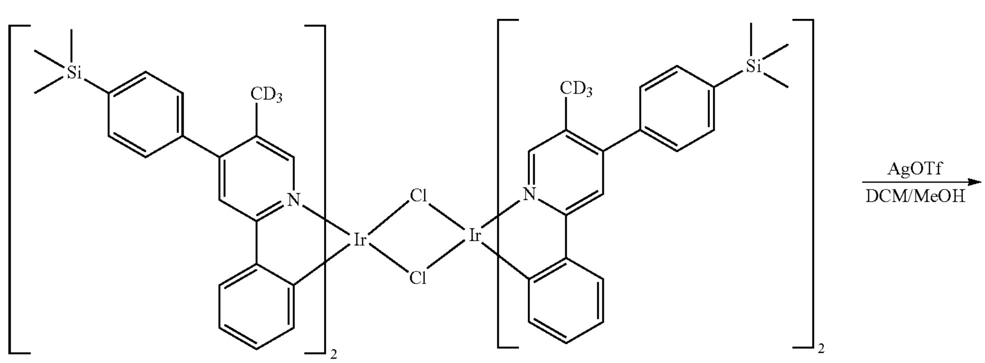

Intermediate 9

-continued

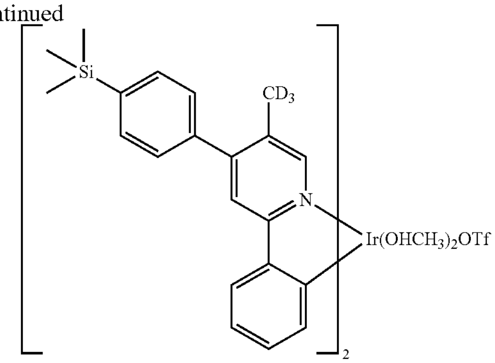

Intermediate 10

Intermediate 9 (4.7 g, 2.6 mmol), silver trifluoromethanesulfonate (1.5 g, 5.8 mmol), 125 mL of dichloromethane and 5 mL of methanol were added in sequence to a dry 250 mL round-bottom flask, purged with $N_2$ three times, and stirred for 5 h at room temperature under $N_2$ protection. After the reaction ended, the mixture was filtered through Celite and washed with dichloromethane. The filtrate was concentrated to obtain Intermediate 10 (6.2 g, 99%).

Step 3:

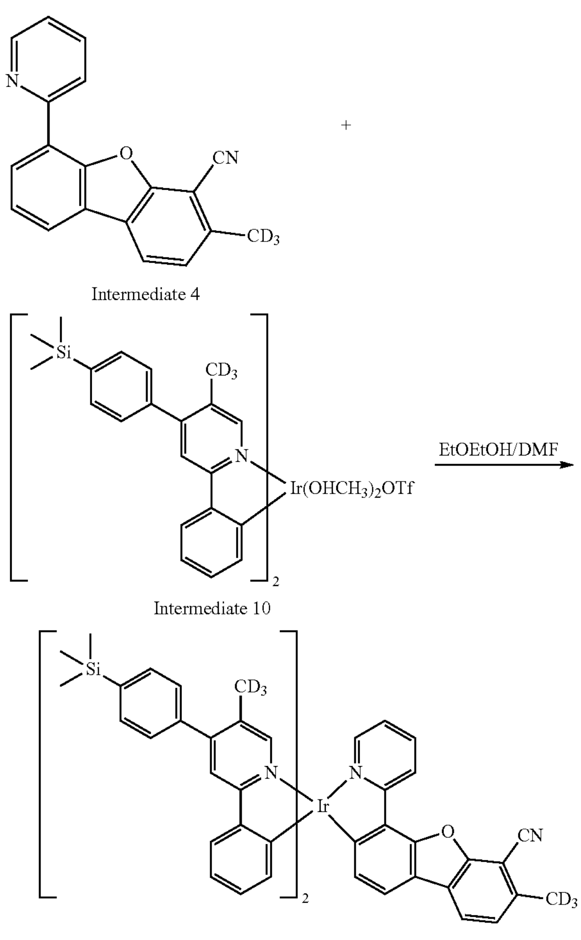

Intermediate 4

Intermediate 10

Metal Complex 2382

Intermediate 4 (1.5 g, 5.2 mmol), Intermediate 10 (4.2 g, 4.0 mmol), 50 mL of ethoxyethanol and 50 mL of N',N-dimethylformamide were added in sequence to a dry 250 mL round-bottom flask, purged with $N_2$ three times, and heated at 100° C. for 72 h under $N_2$ protection. After the reaction was cooled, the solvent was removed through rotary evaporation, methanol was added to the system, and the system was filtered through Celite. The system was washed twice with methanol and n-hexane, separately. A yellow solid on the Celite was dissolved in dichloromethane. The filtrate was collected, concentrated under reduced pressure, and separated and purified through column chromatography to obtain Metal Complex 2382 (1.8 g, 40%). The product was confirmed as the target product with a molecular weight of 1117.4.

Synthesis Example 4: Synthesis of Metal Complex 2196

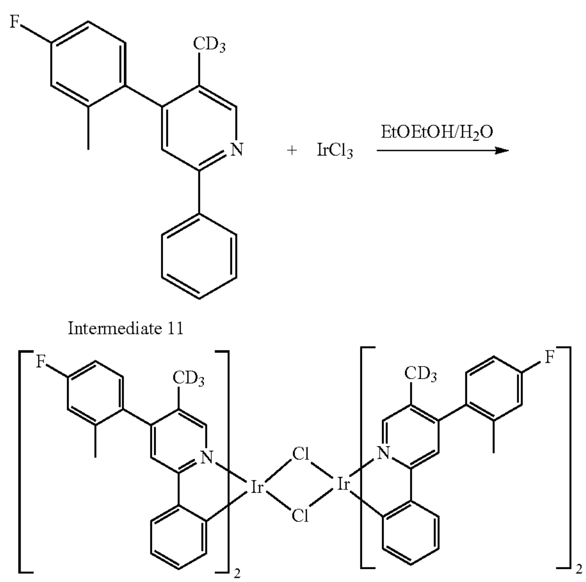

Intermediate 11

Intermediate 12

Intermediate 11 (4.8 g, 17.1 mmol), iridium trichloride (2.0 g, 5.7 mmol), 45 mL of ethoxyethanol and 15 mL of water were added in sequence to a dry 250 mL round-bottom flask, purged with $N_2$ three times, and heated and stirred to reflux overnight under $N_2$ protection. After the reaction ended, the reaction was cooled to room temperature and filtered. The upper solid was washed with methanol and pumped to dryness under reduced pressure to obtain Intermediate 12 (3.9 g, 88%).

Step 2:

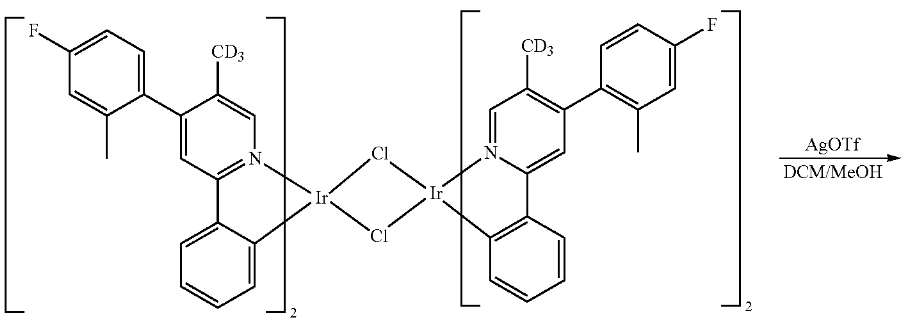

Intermediate 12

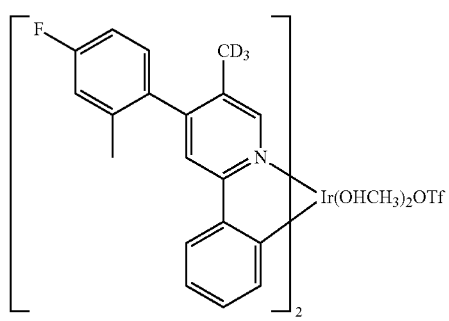

Intermediate 13

Intermediate 12 (3.9 g, 2.5 mmol), silver trifluoromethanesulfonate (1.4 g, 5.4 mmol), 125 mL of dichloromethane and 5 mL of methanol were added in sequence to a dry 250 mL round-bottom flask, purged with $N_2$ three times, and stirred for 5 h at room temperature under $N_2$ protection. After the reaction ended, the mixture was filtered through Celite and washed with dichloromethane. The filtrate was concentrated to obtain Intermediate 13 (4.6 g, 84%).

Step 3:

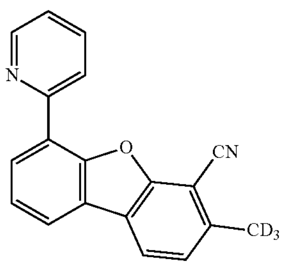

Intermediate 4

+

-continued

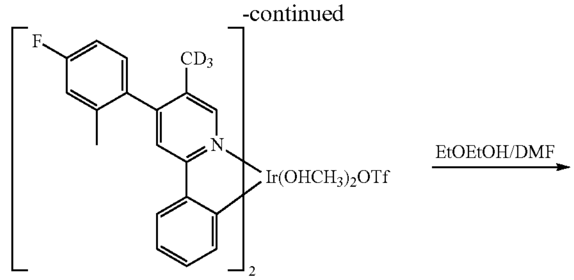

Intermediate 13

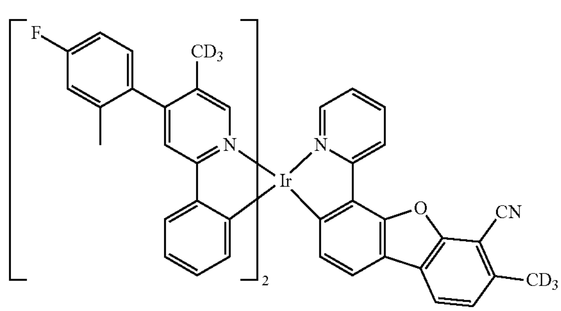

Metal Complex 2196

Intermediate 4 (1.8 g, 6.2 mmol), Intermediate 13 (4.6 g, 4.8 mmol), 50 ml, of ethoxyethanol and 50 mL of N',N-dimethylformamide were added in sequence to a dry 250 mL round-bottom flask, purged with $N_2$ three times, and heated at 100° C. for 72 h under $N_2$ protection. After the reaction was cooled, the solvent was removed through rotary evaporation, methanol was added to the system, and the system was filtered through Celite. The system was washed twice with methanol and n-hexane, separately. A yellow solid on the Celite was dissolved in dichloromethane. The filtrate was collected, concentrated under reduced pressure, and separated and purified through column chromatography to obtain Metal Complex 2196 (2.4 g, 48%). The product was confirmed as the target product with a molecular weight of 1037.3.

Synthesis Example 5: Synthesis of Metal Complex 1

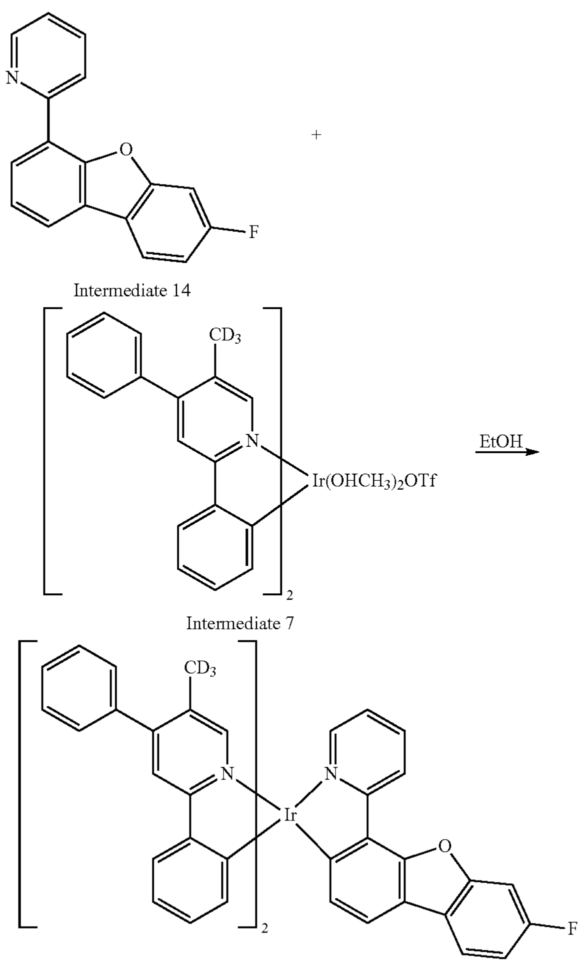

Metal Complex 1

Intermediate 14 (1.1 g, 4.3 mmol), Intermediate 7 (3.0 g, 3.3 mmol) and 120 mL of ethanol were added in sequence to a dry 250 mL round-bottom flask, purged with $N_2$ three times, and heated at 100° C. for 72 h under $N_2$ protection. After the reaction was cooled, the system was filtered through Celite and washed twice with methanol and n-hexane, separately. A yellow solid on the Celite was dissolved in dichloromethane. The filtrate was collected, concentrated under reduced pressure, and separated and purified through column chromatography to obtain Metal Complex 1 (0.9 g, 28%). The product was confirmed as the target product with a molecular weight of 949.3.

Synthesis Example 6: Synthesis of Metal Complex 68

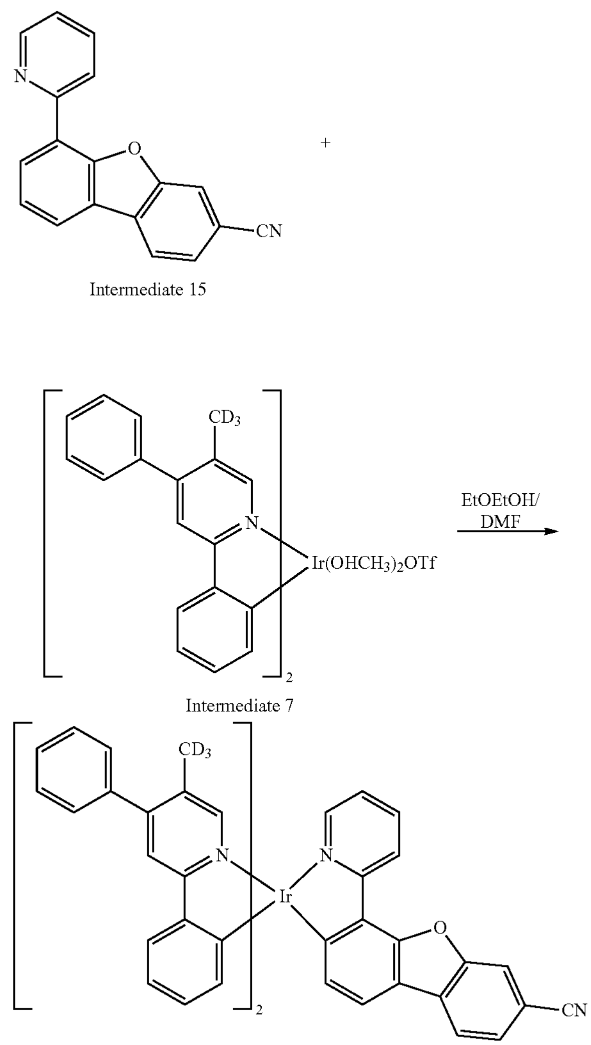

Metal Complex 68

Intermediate 15 (1.2 g, 4.3 mmol), Intermediate 7 (3.0 g, 3.3 mmol), 50 mL of ethoxyethanol and 50 mL of N',N-dimethylformamide were added in sequence to a dry 250 mL round-bottom flask, purged with $N_2$ three times, and heated at 100° C. for 72 h under $N_2$ protection. After the reaction was cooled, the solvent was removed through rotary evaporation, methanol was added to the system, and the system was filtered through Celite. The system was washed twice with methanol and n-hexane, separately. A yellow solid on the Celite was dissolved in dichloromethane. The filtrate was collected, concentrated under reduced pressure, and separated and purified through column chromatography to obtain Metal Complex 68 (1.3 g, 41%). The product was confirmed as the target product with a molecular weight of 956.3.

Synthesis Example 7: Synthesis of Metal Complex 135

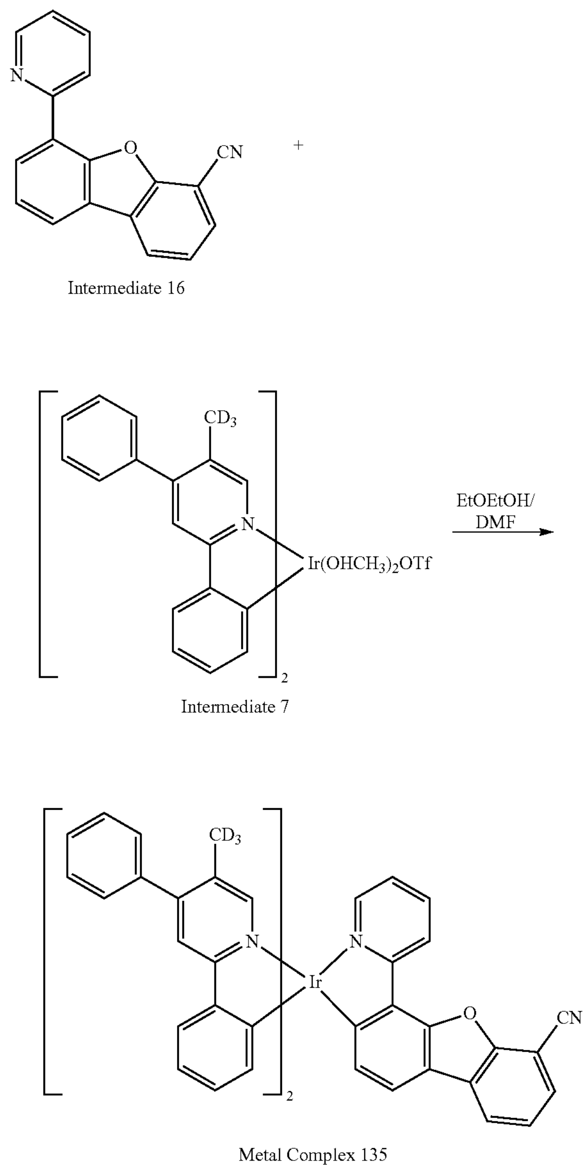

Intermediate 16 (1.0 g, 3.7 mmol), Intermediate 7 (2.5 g, 2.7 mmol), 50 mL of ethoxyethanol and 50 mL of N',N-dimethylformamide were added in sequence to a dry 250 mL round-bottom flask, purged with $N_2$ three times, and heated at 100° C. for 72 h under $N_2$ protection. After the reaction was cooled, the solvent was removed through rotary evaporation, methanol was added to the system, and the system was filtered through Celite. The system was washed twice with methanol and n-hexane, separately. A yellow solid on the Celite was dissolved in dichloromethane. The filtrate was collected, concentrated under reduced pressure, and separated and purified through column chromatography to obtain Metal Complex 135 (1.1 g, 43%). The product was confirmed as the target product with a molecular weight of 956.3.

Synthesis Example 8: Synthesis of Metal Complex 321

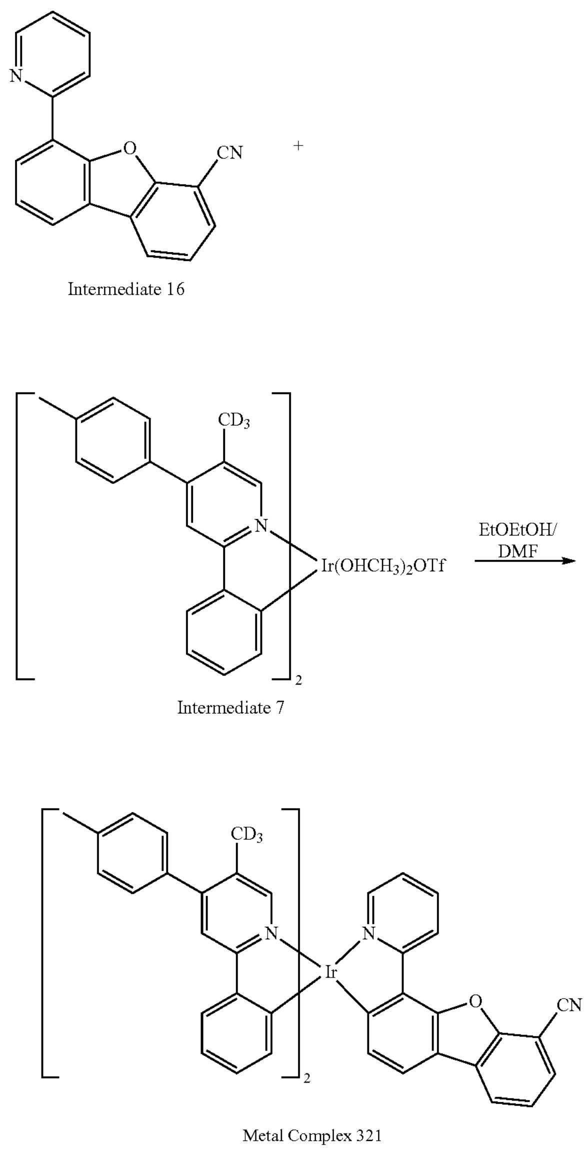

Intermediate 16 (1.3 g, 4.8 mmol), Intermediate 17 (3.6 g, 4.0 mmol), 50 mL of ethoxyethanol and 50 mL of N',N-dimethylformamide were added in sequence to a dry 250 mL round-bottom flask, purged with $N_2$ three times, and heated at 100° C. for 72 h under $N_2$ protection. After the reaction was cooled, the solvent was removed through rotary evaporation, methanol was added to the system, and the system was filtered through Celite. The system was washed twice with methanol and n-hexane, separately. A yellow solid on the Celite was dissolved in dichloromethane. The filtrate was collected, concentrated under reduced pressure, and separated and purified through column chromatography to obtain Metal Complex 321 (1.6 g, 41%). The product was confirmed as the target product with a molecular weight of 984.3.

Synthesis Example 9: Synthesis of Metal Complex 879

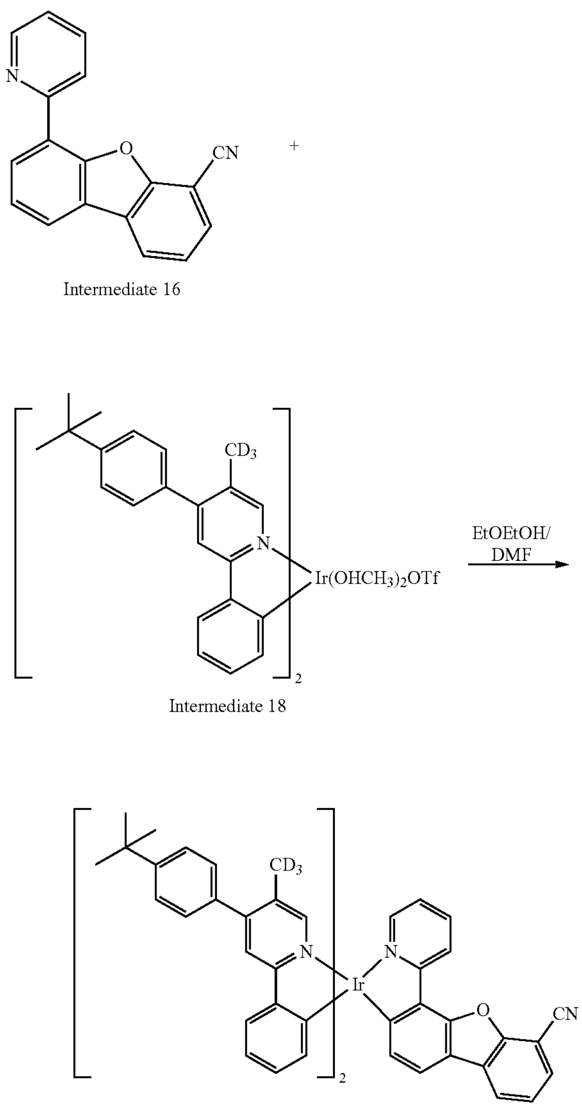

Intermediate 16

Intermediate 18

Metal Complex 879

Intermediate 16 (1.2 g, 4.4 mmol), Intermediate 18 (3.7 g, 3.7 mmol), 50 mL of ethoxyethanol and 50 mL of N',N-dimethylformamide were added in sequence to a dry 250 mL round-bottom flask, purged with $N_2$ three times, and heated at 100° C. for 72 h under $N_2$ protection. After the reaction was cooled, the solvent was removed through rotary evaporation, methanol was added to the system, and the system was filtered through Celite. The system was washed twice with methanol and n-hexane, separately. A yellow solid on the Celite was dissolved in dichloromethane. The filtrate was collected, concentrated under reduced pressure, and separated and purified through column chromatography to obtain Metal Complex 879 (2.3 g, 58%). The product was confirmed as the target product with a molecular weight of 1068.4.

Synthesis Example 10: Synthesis of Metal Complex 812

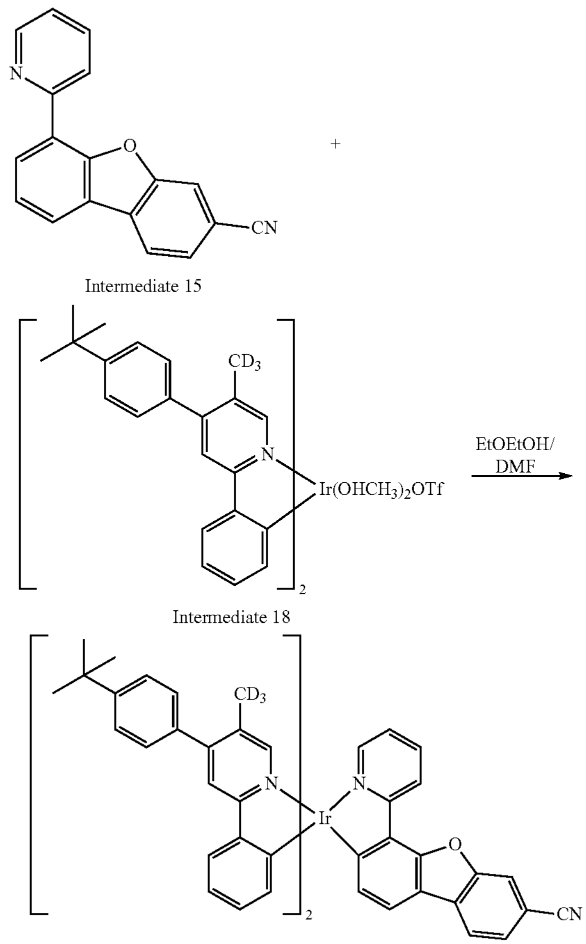

Intermediate 15

Intermediate 18

Metal Complex 812

Intermediate 15 (1.6 g, 6.0 mmol), Intermediate 18 (4.0 g, 4.0 mmol), 50 mL of ethoxyethanol and 50 mL of N',N-dimethylformamide were added in sequence to a dry 250 mL round-bottom flask, purged with $N_2$ three times, and heated at 100° C. for 72 h under $N_2$ protection. After the reaction was cooled, the solvent was removed through rotary evaporation, methanol was added to the system, and the system was filtered through Celite. The system was washed twice with methanol and n-hexane, separately. A yellow solid on the Celite was dissolved in dichloromethane. The filtrate was collected, concentrated under reduced pressure, and separated and purified through column chromatography to obtain Metal Complex 812 (1.3 g, 41%). The product was confirmed as the target product with a molecular weight of 1068.4.

Those skilled in the art will appreciate that the above preparation methods are merely exemplary. Those skilled in the art can obtain other compound structures of the present disclosure through the modifications of the preparation methods.

Device Example 1

First, a glass substrate having an Indium Tin Oxide (ITO) anode with a thickness of 80 nm was cleaned and then treated with oxygen plasma and UV ozone. After the treatment, the substrate was dried in a glovebox to remove moisture. Then, the substrate was mounted on a substrate holder and placed in a vacuum chamber. Organic layers specified below were sequentially deposited through vacuum thermal evaporation on the ITO anode at a rate of 0.2 to 2 Angstroms per second and a vacuum degree of about $10^{-8}$ torr. Compound HI was used as a hole injection layer (HIL). Compound HT was used as a hole transporting layer (HTL). Compound EB was used as an electron blocking layer (EBL). Metal Complex 2010 of the present disclosure was doped in Compound EB and Compound HB, all of which were co-deposited for use as an emissive layer (EML). On the EML, Compound HB was deposited for use as a hole blocking layer (HBL). On the HBL, Compound ET and 8-hydroxyquinolinolato-lithium (Liq) were co-deposited for use as an electron transporting layer (ETL). Finally, 8-hydroxyquinolinolato-lithium (Liq) was deposited as an electron injection layer with a thickness of 1 nm and Al was deposited as a cathode with a thickness of 120 nm. The device was transferred back to the glovebox and encapsulated with a glass lid and a moisture getter to complete the device.

Device Example 2

The implementation mode in Device Example 2 was the same as that in Device Example 1, except that in the EML, Metal Complex 2010 of the present disclosure was replaced with Metal Complex 150 of the present disclosure.

Device Example 3

The implementation mode in Device Example 3 was the same as that in Device Example 1, except that in the EML, Metal Complex 2010 of the present disclosure was replaced with Metal Complex 2382 of the present disclosure.

Device Example 4

The implementation mode in Device Example 4 was the same as that in Device Example 1, except that in the EML, Metal Complex 2010 of the present disclosure was replaced with Metal Complex 2196 of the present disclosure.

Device Comparative Example 1

The implementation mode in Device Comparative Example 1 was the same as that in Device Example 1, except that in the EML, Metal Complex 2010 of the present disclosure was replaced with Comparative Compound GD1.

Device Comparative Example 2

The implementation mode in Device Comparative Example 2 was the same as that in Device Example 1, except that in the EML, Metal Complex 2010 of the present disclosure was replaced with Comparative Compound GD2.

Device Comparative Example 3

The implementation mode in Device Comparative Example 3 was the same as that in Device Example 1, except that in the EML, Metal Complex 2010 of the present disclosure was replaced with Comparative Compound GD3.

Detailed structures and thicknesses of layers of the devices are shown in the following table. Layers using more than one material were obtained by doping different compounds at their weight ratio as recorded.

TABLE 1

Device structures in Device Examples 1 to 4 and Device Comparative Examples 1 to 3

| Device ID | HIL | HTL | EBL | EML | HBL | ETL |
|---|---|---|---|---|---|---|
| Example 1 | Compound HI (100 Å) | Compound HT (350 Å) | Compound EB (50 Å) | Compound EB:Compound HB:Metal Complex 2010 (46:46:8) (400 Å) | Compound HB (50 Å) | Compound ET:Liq (40:60) (350 Å) |
| Example 2 | Compound HI (100 Å) | Compound HT (350 Å) | Compound EB (50 Å) | Compound EB:Compound HB:Metal Complex 150 (46:46:8) (400 Å) | Compound HB (50 Å) | Compound ET:Liq (40:60) (350 Å) |
| Example 3 | Compound HI (100 Å) | Compound HT (350 Å) | Compound EB (50 Å) | Compound EB:Compound HB:Metal Complex 2382 (46:46:8) (400 Å) | Compound HB (50 Å) | Compound ET:Liq (40:60) (350 Å) |
| Example 4 | Compound HI (100 Å) | Compound HT (350 Å) | Compound EB (50 Å) | Compound EB:Compound HB:Metal Complex 2196 (46:46:8) (400 Å) | Compound HB (50 Å) | Compound ET:Liq (40:60) (350 Å) |
| Comparative Example 1 | Compound HI (100 Å) | Compound HT (350 Å) | Compound EB (50 Å) | Compound EB:Compound HB:Compound GD1 (46:46:8) (400 Å) | Compound HB (50 Å) | Compound ET:Liq (40:60) (350 Å) |
| Comparative Example 2 | Compound HI (100 Å) | Compound HT (350 Å) | Compound EB (50 Å) | Compound EB:Compound HB:Compound GD2 (46:46:8) (400 Å) | Compound HB (50 Å) | Compound ET:Liq (40:60) (350 Å) |

TABLE 1-continued

| Device structures in Device Examples 1 to 4 and Device Comparative Examples 1 to 3 | | | | | | |
|---|---|---|---|---|---|---|
| Device ID | HIL | HTL | EBL | EML | HBL | ETL |
| Comparative Example 3 | Compound HI (100 Å) | Compound HT (350 Å) | Compound EB (50 Å) | Compound EB:Compound HB:Compound GD3 (46:46:8) (400 Å) | Compound HB (50 Å) | Compound ET:Liq (40:60) (350 Å) |

The structures of the materials used in the devices are shown as follows:

Compound HI

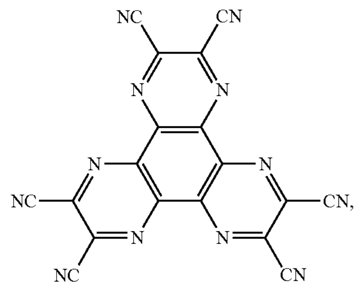

Compound HT

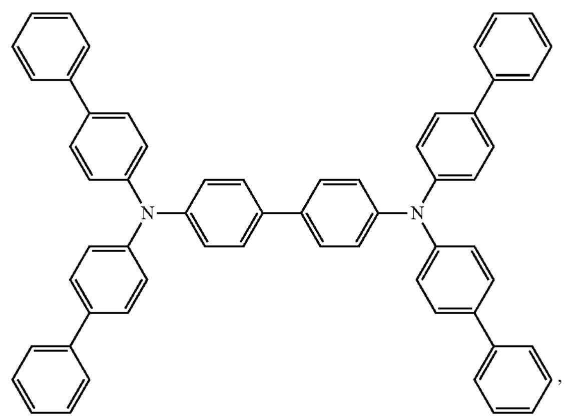

Compound EB

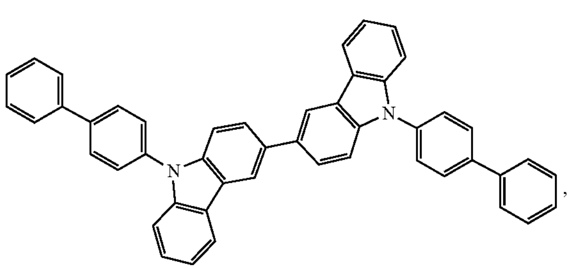

-continued

Compound HB

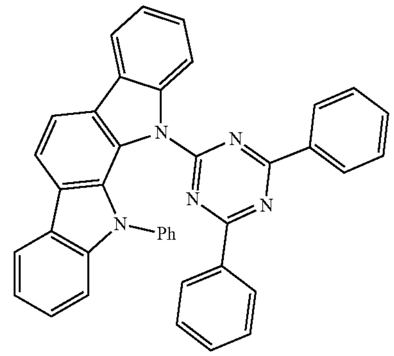

Metal Complex 2010

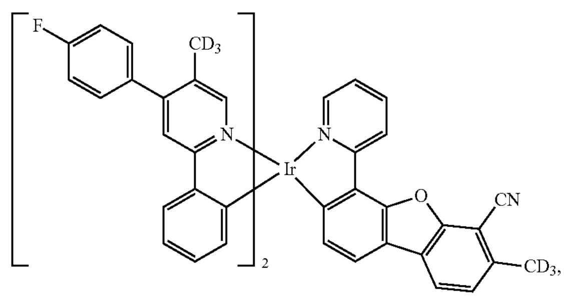

Metal Complex 150

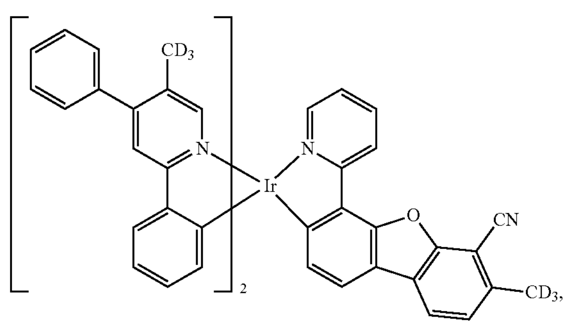

Metal Complex 2382

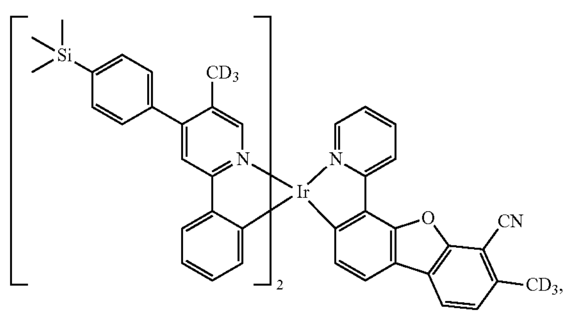

-continued

Metal Complex 2196

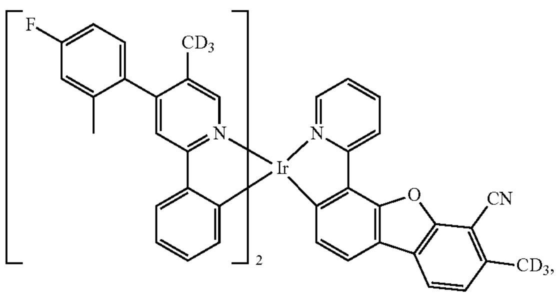

GD1

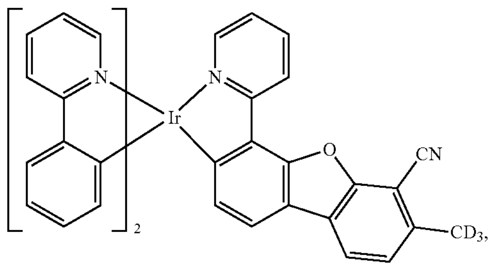

GD2

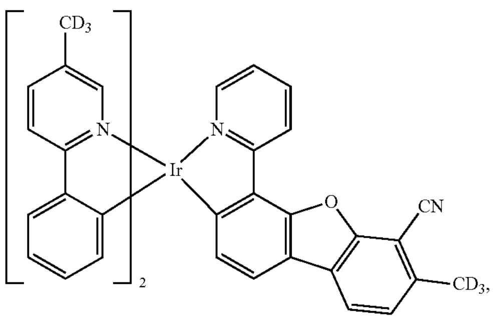

GD3

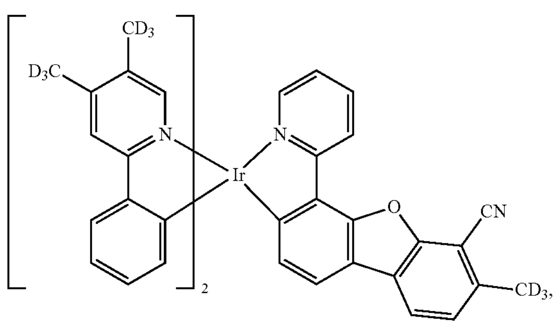

Compound ET

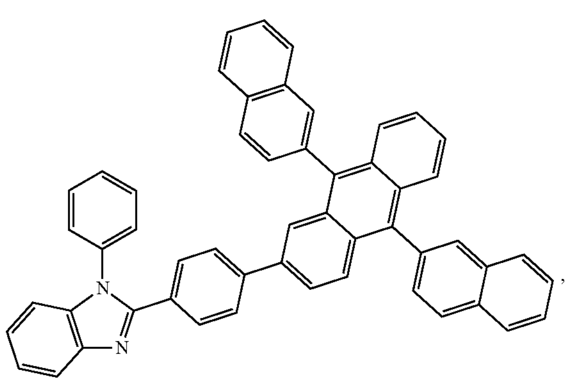

-continued

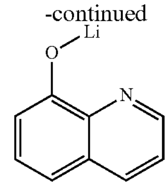

Liq

Current-voltage-luminance (IVL) characteristics of the devices were measured. The CIE data, current efficiency (CE), power efficiency (PE) and external quantum efficiency (EQE) of each device were measured at 1000 cd/m$^2$. The data was recorded and shown in Table 2.

TABLE 2

Device data of Device Examples 1 to 4 and Device Comparative Examples 1 to 3

| Device ID | CIE (x, y) | CE (cd/A) | PE (lm/W) | EQE (%) |
|---|---|---|---|---|
| Example 1 | (0.340, 0.630) | 93 | 111 | 24.54 |
| Example 2 | (0.343, 0.629) | 93 | 110 | 24.26 |
| Example 3 | (0.348, 0.624) | 93 | 110 | 24.79 |
| Example 4 | (0.325, 0.640) | 93 | 109 | 24.16 |
| Comparative Example 1 | (0.324, 0.641) | 88 | 101 | 22.94 |
| Comparative Example 2 | (0.345, 0.628) | 89 | 105 | 23.27 |
| Comparative Example 3 | (0.360, 0.619) | 89 | 104 | 23.09 |

Discussion

Table 2 shows that compared with Comparative Examples 1 to 3, Examples 1 to 4 have significantly improved CE, PE and EQE, where the EQE of all Examples 1 to 4 is higher than 24% and at a leading level in the industry. The dibenzofuryl pyridine ligands of Examples 1 to 4 and Comparative Examples 1 to 3 all have a cyano substitution at the same position, except that the phenylpyridine ligands of Examples 1 to 4 have unsubstituted aryl or substituted aryl with different groups at the para-position of N of pyridine while the phenylpyridine ligands of Comparative Examples 1 to 3 have no aryl at the para-position of N of pyridine. This comparison clearly proves that the metal complex having both a ligand $L_a$ and a ligand $L_b$ in the present disclosure has unexpected superiority.

Device Example 5

First, a glass substrate having an Indium Tin Oxide (ITO) anode with a thickness of 80 nm was cleaned and then treated with oxygen plasma and UV ozone. After the treatment, the substrate was dried in a glovebox to remove moisture. Then, the substrate was mounted on a substrate holder and placed in a vacuum chamber. Organic layers specified below were sequentially deposited through vacuum thermal evaporation on the ITO anode at a rate of 0.2 to 2 Angstroms per second and a vacuum degree of about $10^{-8}$ torr. Compound HI was used as a hole injection layer (HIL). Compound HT was used as a hole transporting layer (HTL). Compound EB was used as an electron blocking layer (EBL). Metal Complex 1 of the present disclosure was doped in Compound EB and Compound H1, all of which were co-deposited for use as an emissive layer (EML). On the EML, Compound HB was deposited for use as a hole blocking layer (HBL). On the HBL, Compound ET and 8-hydroxyquinolinolato-lithium (Liq) were co-deposited for use as an electron transporting layer (ETL). Finally, 8-hydroxyquinolinolato-lithium (Liq) was deposited as an electron injection layer with a thickness of 1 nm and Al was deposited as a cathode with a thickness of 120 nm. The device was transferred back to the glovebox and encapsulated with a glass lid and a moisture getter to complete the device.

Device Example 6

The implementation mode in Device Example 6 was the same as that in Device Example 5, except that in the EML, Metal Complex 1 of the present disclosure was replaced with Metal Complex 68 of the present disclosure.

Device Example 7

The implementation mode in Device Example 7 was the same as that in Device Example 5, except that in the EML, Metal Complex 1 of the present disclosure was replaced with Metal Complex 812 of the present disclosure.

Device Example 8

The implementation mode in Device Example 8 was the same as that in Device Example 5, except that in the EML, Metal Complex 1 of the present disclosure was replaced with Metal Complex 135 of the present disclosure.

Device Example 9

The implementation mode in Device Example 9 was the same as that in Device Example 5, except that in the EML, Metal Complex 1 of the present disclosure was replaced with Metal Complex 321 of the present disclosure.

Device Example 10

The implementation mode in Device Example 10 was the same as that in Device Example 5, except that in the EML, Metal Complex 1 of the present disclosure was replaced with Metal Complex 879 of the present disclosure.

Device Comparative Example 4

The implementation mode in Device Comparative Example 4 was the same as that in Device Example 5, except that in the EML, Metal Complex 1 of the present disclosure was replaced with Comparative Compound GD4.

Device Comparative Example 5

The implementation mode in Device Comparative Example 5 was the same as that in Device Example 5, except that in the EML, Metal Complex 1 of the present disclosure was replaced with Comparative Compound GD5.

Detailed structures and thicknesses of layers of the devices are shown in the following table. Layers using more than one material were obtained by doping different compounds at their weight ratio as recorded.

TABLE 3

Device structures in Device Examples 5 to 10 and Device Comparative Examples 4 and 5

| Device ID | HIL | HTL | EBL | EML | HBL | ETL |
|---|---|---|---|---|---|---|
| Example 5 | Compound HI (100 Å) | Compound HT (350 Å) | Compound EB (50 Å) | Compound EB:Compound H1:Compound 1 (47:47:6) (400 Å) | Compound HB (50 Å) | Compound ET:Liq (40:60) (350 Å) |
| Example 6 | Compound HI (100 Å) | Compound HT (350 Å) | Compound EB (50 Å) | Compound EB:Compound H1:Compound 68 (47:47:6) (400 Å) | Compound HB (50 Å) | Compound ET:Liq (40:60) (350 Å) |
| Example 7 | Compound HI (100 Å) | Compound HT (350 Å) | Compound EB (50 Å) | Compound EB:Compound H1:Compound 812 (47:47:6) (400 Å) | Compound HB (50 Å) | Compound ET:Liq (40:60) (350 Å) |
| Example 8 | Compound HI (100 Å) | Compound HT (350 Å) | Compound EB (50 Å) | Compound EB:Compound H1:Compound 135 (47:47:6) (400 Å) | Compound HB (50 Å) | Compound ET:Liq (40:60) (350 Å) |
| Example 9 | Compound HI (100 Å) | Compound HT (350 Å) | Compound EB (50 Å) | Compound EB:Compound H1:Compound 321 (47:47:6) (400 Å) | Compound HB (50 Å) | Compound ET:Liq (40:60) (350 Å) |
| Example 10 | Compound HI (100 Å) | Compound HT (350 Å) | Compound EB (50 Å) | Compound EB:Compound H1:Compound 879 (47:47:6) (400 Å) | Compound HB (50 Å) | Compound ET:Liq (40:60) (350 Å) |
| Comparative Example 4 | Compound HI (100 Å) | Compound HT (350 Å) | Compound EB (50 Å) | Compound EB:Compound H1:Compound GD4 (47:47:6) (400 Å) | Compound HB (50 Å) | Compound ET:Liq (40:60) (350 Å) |
| Comparative Example 5 | Compound HI (100 Å) | Compound HT (350 Å) | Compound EB (50 Å) | Compound EB:Compound | Compound HB (50 Å) | Compound ET:Liq |

TABLE 3-continued
Device structures in Device Examples 5 to 10 and Device Comparative Examples 4 and 5
| Device ID | HIL | HTL | EBL | EML | HBL | ETL |
|---|---|---|---|---|---|---|
| | | | | H1:Compound GD5 (47:47:6) (400 Å) | | (40:60) (350 Å) |
The structures of the new materials used in the devices are shown as follows:
Compound H1
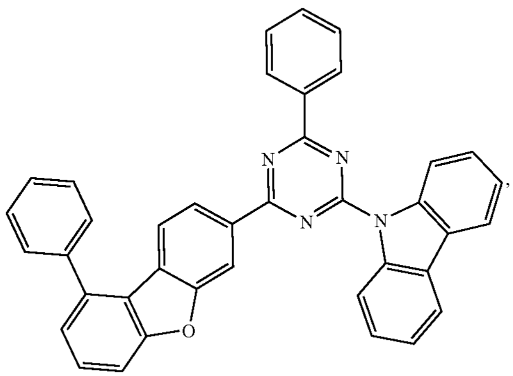
Metal Complex 1
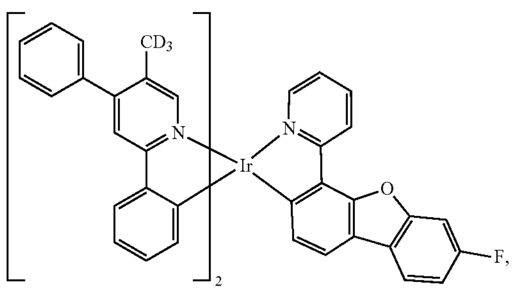
Metal Complex 68
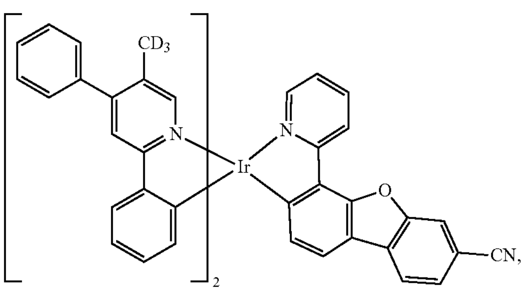
Metal Complex 812
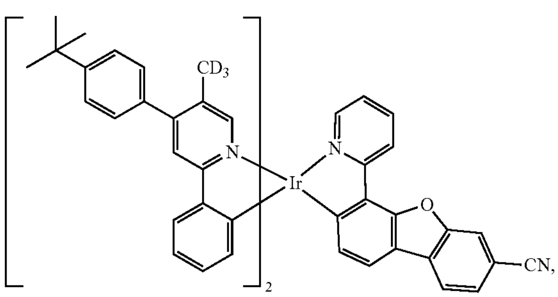
-continued
Metal Complex 135
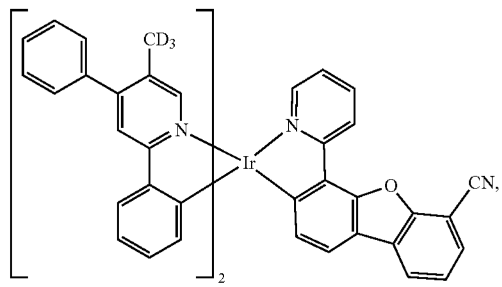
Metal Complex 321
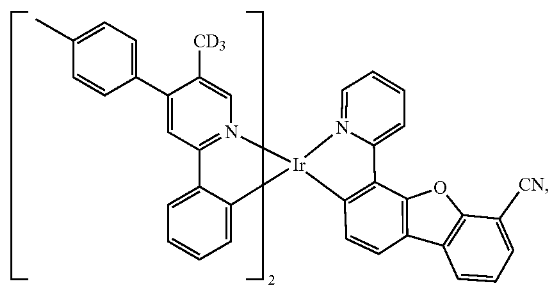
Metal Complex 879
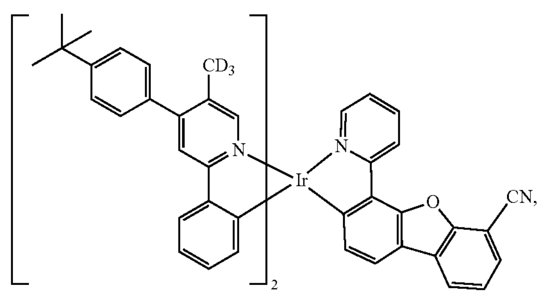
Compound GD4
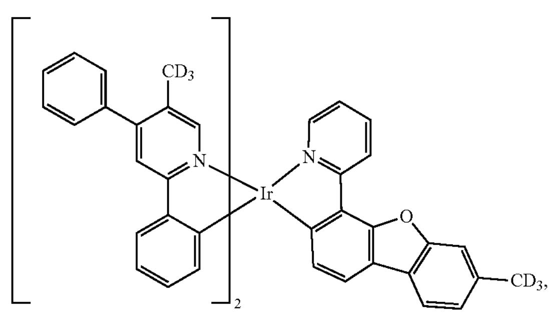

-continued

Compound GD5

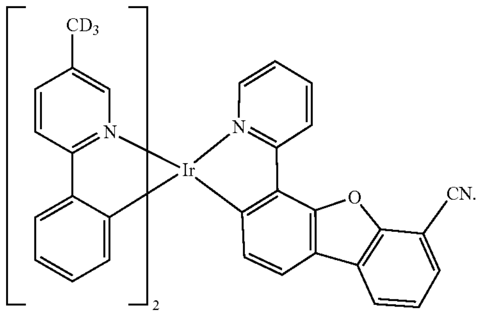

IVL characteristics of the devices were measured. The CIE data, $\lambda_{max}$, driving voltage (Voltage), current efficiency (CE), power efficiency (PE) and external quantum efficiency (EQE) of each device were measured at 1000 cd/m$^2$. The data was recorded and shown in Table 4.

TABLE 4

Device data of Device Examples 5 to 10 and Device Comparative Examples 4 and 5

| Device ID | CIE (x, y) | $\lambda_{max}$ (nm) | Voltage (V) | CE (cd/A) | PE (lm/W) | EQE (%) |
|---|---|---|---|---|---|---|
| Example 5 | (0.360, 0.616) | 531 | 2.81 | 88 | 98 | 23.18 |
| Example 6 | (0.343, 0.632) | 530 | 2.60 | 101 | 122 | 25.86 |
| Example 7 | (0.342, 0.633) | 530 | 2.67 | 97 | 114 | 25.09 |
| Example 8 | (0.335, 0.634) | 526 | 2.60 | 97 | 118 | 25.55 |
| Example 9 | (0.333, 0.636) | 527 | 2.65 | 98 | 116 | 25.51 |
| Example 10 | (0.333, 0.635) | 526 | 2.62 | 97 | 116 | 25.70 |
| Comparative Example 4 | (0.377, 0.603) | 534 | 3.04 | 85 | 88 | 22.71 |
| Comparative Example 5 | (0.341, 0.630) | 525 | 2.75 | 93 | 107 | 24.18 |

Discussion

Table 4 shows the excellent performance of the devices using the metal complexes of the present disclosure. All Examples 8 to 10 have higher CE, PE and EQE and lower voltage than Comparative Example 5, where the EQE of Examples 8 to 10 is higher than 25%. The dibenzofuryl pyridine ligands of Examples 8 to 10 and Comparative Example 5 all have a cyano substitution at the same position, except that the phenylpyridine ligands of Examples 8 to 10 have unsubstituted aryl or substituted aryl with different groups at a para-position of N of pyridine while the phenylpyridine ligand of Comparative Example 5 has no aryl at the para-position of N of pyridine. This comparison clearly proves that the co-existence of the ligand $L_a$ and the ligand $L_b$ in the present disclosure has unexpected superiority.

Table 4 also shows that Examples 6 and 7 have higher CE, PE and EQE and lower voltage than Comparative Example 4, where the EQE of Examples 6 and 7 is higher than 25%. The phenylpyridine ligands of Examples 6 and 7 and Comparative Example 4 all have aryl at the para-position of N of pyridine, except that the dibenzofuran ligands of Examples 6 and 7 have cyano while the dibenzofuran ligand of Comparative Example 4 has alkyl at the same position. This comparison once again clearly proves that the co-existence of the ligand $L_a$ and the ligand $L_b$ in the present disclosure has unexpected superiority. Similarly, the EQE of Example 5 reaches 23.18%, and Example 5 has higher CE and PE and lower voltage than Comparative Example 4. The phenylpyridine ligands of Example 5 and Comparative Example 4 both have aryl at the para-position of N of pyridine, except that the dibenzofuran ligand of Example 5 has a fluorine substitution while the dibenzofuran ligand of Comparative Example 4 has alkyl at the same position.

In summary, the preceding results show that the metal complex having both the ligand $L_a$ and the ligand $L_b$ in the present disclosure can improve performance, especially EQE, when applied to an organic electroluminescent device.

It should be understood that various embodiments described herein are merely examples and not intended to limit the scope of the present disclosure. Therefore, it is apparent to those skilled in the art that the present disclosure as claimed may include variations from specific embodiments and preferred embodiments described herein. Many of materials and structures described herein may be substituted with other materials and structures without departing from the spirit of the present disclosure. It should be understood that various theories as to why the present disclosure works are not intended to be limitative.

What is claimed is:

1. A metal complex having a general formula of $M(L_a)_m(L_b)_n(L_c)_q$;

wherein m is 1 or 2, n is 1 or 2, and q is 0 or 1; when m is 2, two $L_a$ are identical or different;

when n is 2, two $L_b$ are identical or different; and $L_a$, $L_b$ and L can be optionally joined to form a multidentate ligand;

$L_a$ has a structure represented by Formula 1 and $L_b$ has a structure represented by Formula 2:

Formula 1

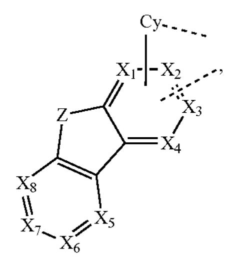

Formula 2

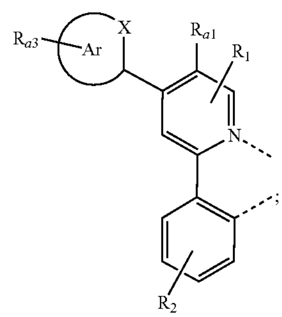

wherein the metal M is selected from a metal with a relative atomic mass greater than 40;

Cy is, at each occurrence identically or differently, selected from substituted or unsubstituted aryl having 5 to 24 ring atoms or substituted or unsubstituted heteroaryl having 5 to 24 ring atoms; and the Cy is joined to the metal M by a metal-carbon bond or a metal-nitrogen bond;

Z is, at each occurrence identically or differently, selected from the group consisting of O, S, Se, $NR_z$, $CR_zR_z$ and $SiR_zR_z$; when two $R_z$ are present at the same time, the two $R_z$ are identical or different;

$X_1$ to $X_8$ are, at each occurrence identically or differently, selected from C, or $CR_x$, and at least one of $X_1$ to $X_4$ is C and joined to Cy;

at least one of $X_1$ to $X_8$ is $CR_x$, and the Rx is cyano or fluorine;

$X_1$, $X_2$, $X_3$ or $X_4$ is joined to the metal M by a metal-carbon bond;

X is, at each occurrence identically or differently, selected from the group consisting of $CR_{a2}$, $NR_{a2}$, N, O and S;

the ring Ar is, at each occurrence identically or differently, selected from the group consisting of: substituted or unsubstituted aryl having 6 to 30 carbon atoms, substituted or unsubstituted heteroaryl having 3 to 30 carbon atoms and combinations thereof, $R_{a3}$, $R_1$ and $R_2$ represent, at each occurrence identically or differently, mono-substitution, multiple substitutions or non-substitution;

$R_{a2}$, $R_{a3}$, $R_1$, $R_2$, $R_z$ and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $R_{a1}$ and $R_{a2}$ is selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, adjacent substituents $R_x$, $R_z$ can be optionally joined to form a ring;

adjacent substituents $R_1$, $R_{a1}$, $R_{a2}$, $R_{a3}$ can be optionally joined to form a ring;

$L_c$ is, at each occurrence identically or differently, selected from a structure represented by any one of the group consisting of the following:

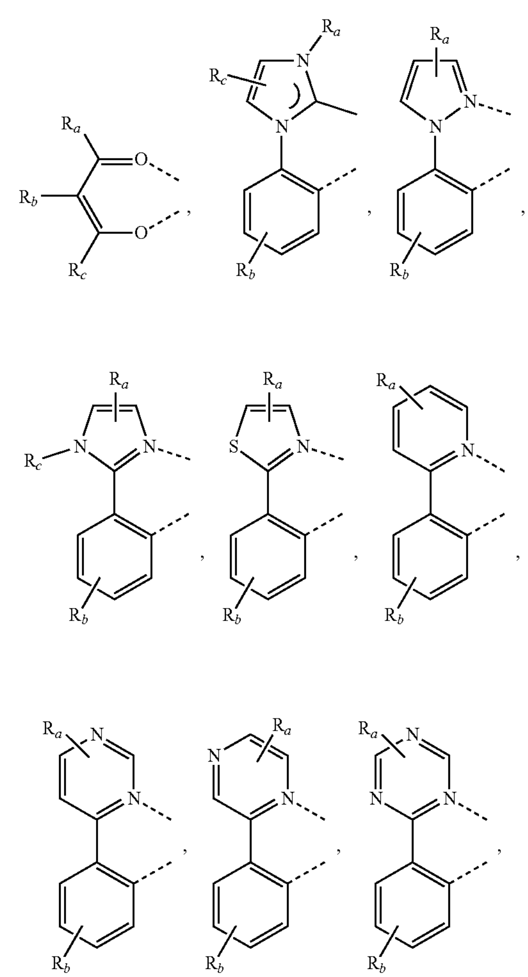

-continued

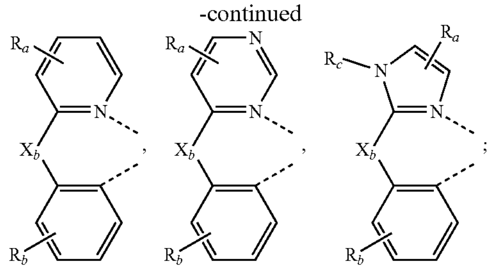

wherein $R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{C1}R_{C2}$;

$R_a$, $R_b$, $R_c$, $R_{N1}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, and adjacent substituents $R_a$, $R_b$, $R_c$, $R_{N1}$, $R_{C1}$ and $R_{C2}$ can be optionally joined to form a ring.

2. The metal complex of claim 1, wherein m is 1 and n is 2; or n is 1 and m is 2.

3. The metal complex of claim 1, wherein the metal M is, at each occurrence identically or differently, selected from the group consisting of Cu, Ag, Au, Ru, Rh, Pd, Os, Ir and Pt;

preferably, the metal M is, at each occurrence identically or differently, selected from Pt or Ir;

more preferably, the metal M is Jr.

4. The metal complex of claim 1, wherein X is, at each occurrence identically or differently, selected from $CR_{a2}$.

5. The metal complex of claim 1, wherein Z is, at each occurrence identically or differently, selected from O or S; preferably, Z is selected from O.

6. The metal complex of claim 1, wherein Cy is selected from any one of the group consisting of the following structures:

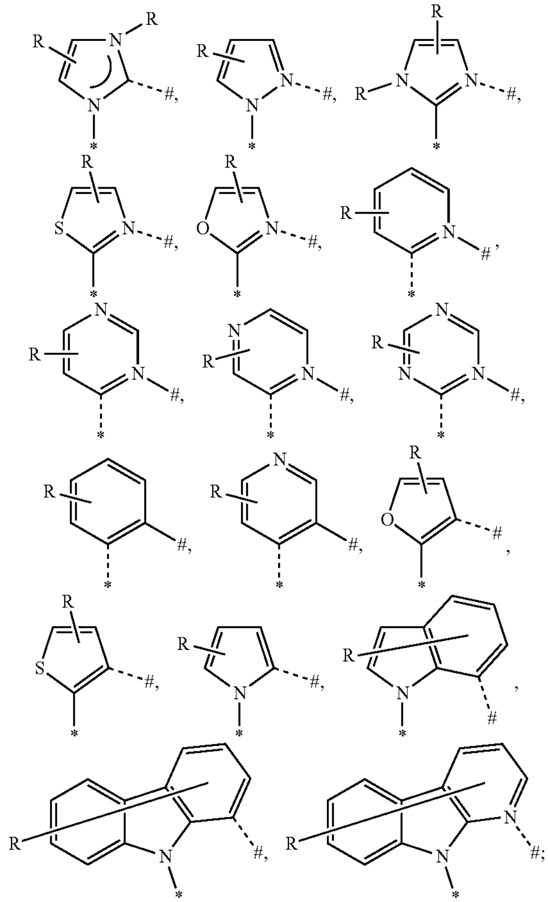

wherein

R represents, at each occurrence identically or differently, mono-substitution, multiple substitutions or non-substitution;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a hydroxyl group, a sulfinyl group, a sulfonyl group, a phosphino group and combinations thereof;

adjacent substituents R can be optionally joined to form a ring;

preferably, Cy is

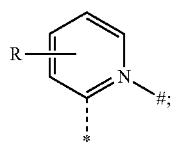

wherein '#' represents a position where Cy is joined to the metal M, and '☆' represents a position where Cy is joined to $X_1$, $X_2$, $X_3$ or $X_4$ in Formula 1.

7. The metal complex of claim 1, wherein at least one of $X_1$ to $X_8$ is $CR_x$, and the $R_x$ is cyano or fluorine; and other $R_x$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, cyano and combinations thereof.

8. The metal complex of claim 1, wherein the ligand $L_a$ is selected from the following structure:

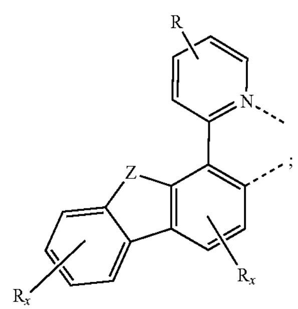

wherein

Z is, at each occurrence identically or differently, selected from O, S or Se;

R represents, at each occurrence identically or differently, mono-substitution, multiple substitutions or non-substitution;

$R_x$ represents, at each occurrence identically or differently, mono-substitution or multiple substitutions;

R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, at least one of $R_x$ is cyano or fluorine;

adjacent substituents R, $R_x$ can be optionally joined to form a ring;

preferably, there is at least another one $R_x$ in the above structure, and the $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, cyano and combinations thereof.

9. The metal complex of claim 1, wherein the ligand $L_a$ is selected from the following structure:

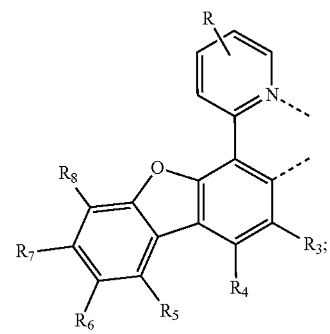

wherein

R represents, at each occurrence identically or differently, mono-substitution, multiple substitutions or non-substitution;

$R_3$ to $R_8$ and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a hydroxyl group, a sulfinyl group, a sulfonyl group, a phosphino group and combinations thereof, adjacent substituents $R_3$ to $R_8$ and R can be optionally joined to form a ring;

at least one of $R_3$ to $R_8$ is cyano or fluorine;

preferably, at least one of $R_5$ to $R_8$ is cyano or fluorine;

more preferably, $R_7$ or $R_8$ is cyano, or $R_7$ is fluorine.

10. The metal complex of claim 6, wherein R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof.

11. The metal complex of claim 1, wherein $L_a$ is, at each occurrence identically or differently, selected from any one of the group consisting of the following:

$L_{a1}$

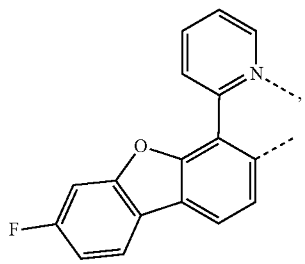

$L_{a2}$

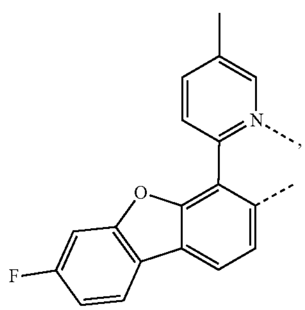

$L_{a3}$

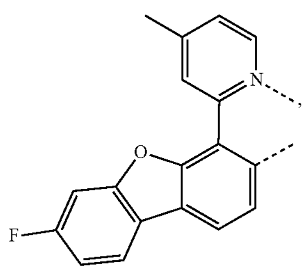

$L_{a4}$

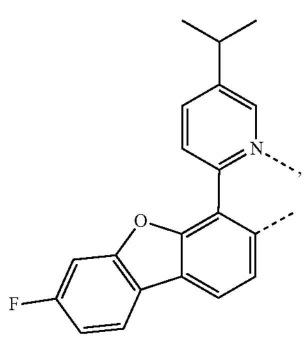

-continued $L_{a5}$

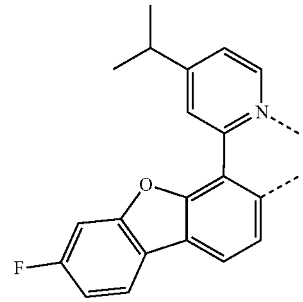

$L_{a6}$

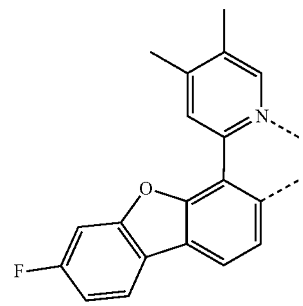

$L_{a7}$

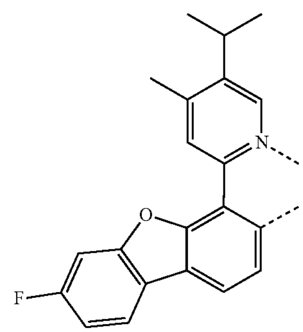

$L_{a8}$

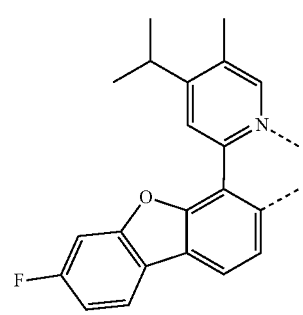

$L_{a9}$

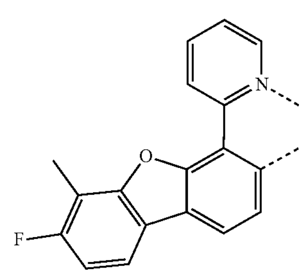

-continued
$L_{a10}$
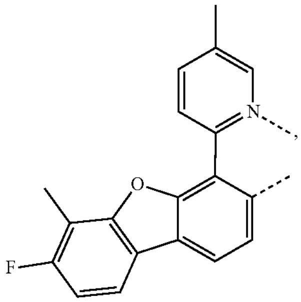
$L_{a11}$
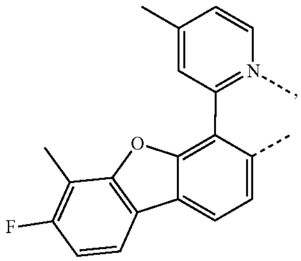
$L_{a12}$
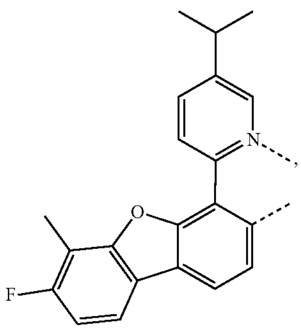
$L_{a13}$
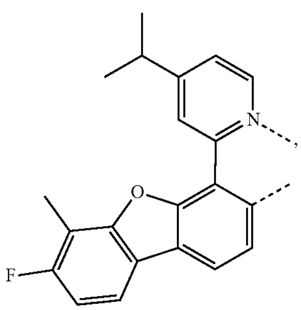
$L_{a14}$
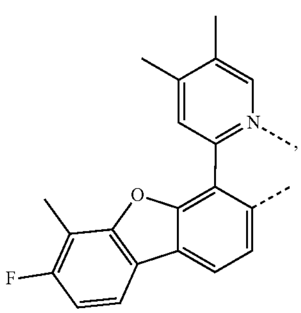
-continued
$L_{a15}$
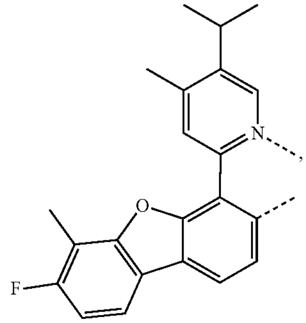
$L_{a16}$
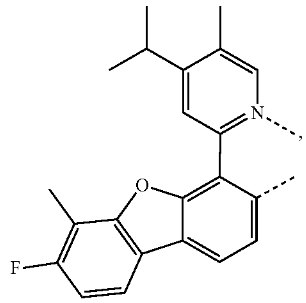
$L_{a17}$
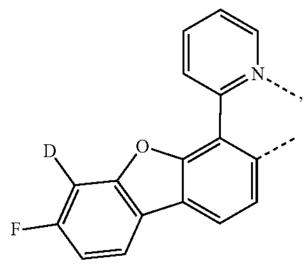
$L_{a18}$
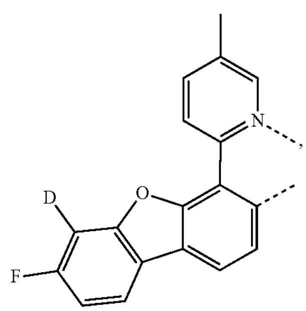
$L_{a19}$
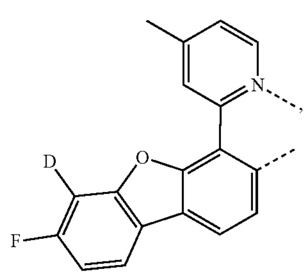

-continued
$L_{a20}$
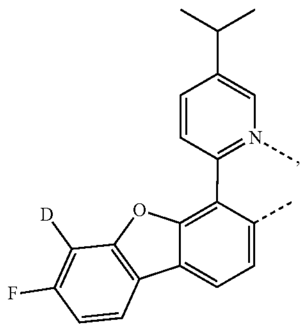
$L_{a21}$
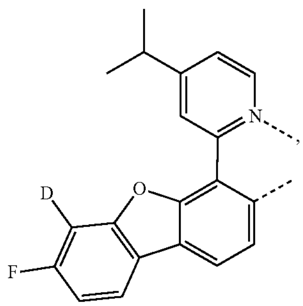
$L_{a22}$
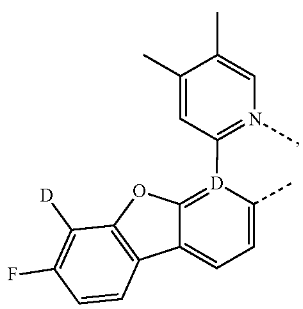
$L_{a23}$
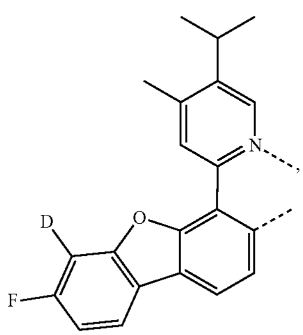
$L_{a24}$
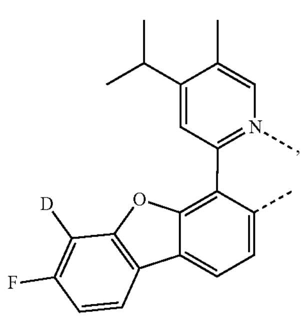
-continued
$L_{a25}$
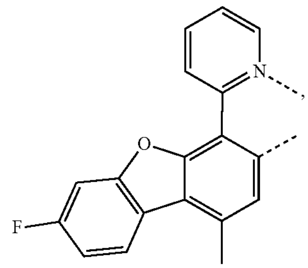
$L_{a26}$
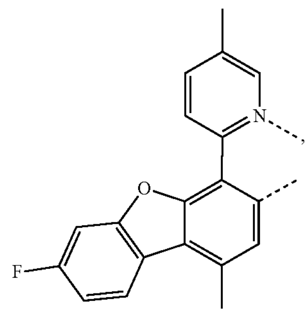
$L_{a27}$
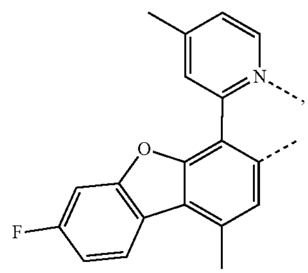
$L_{a28}$
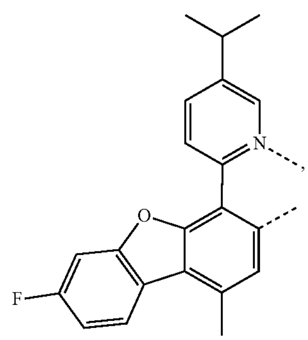
$L_{a29}$
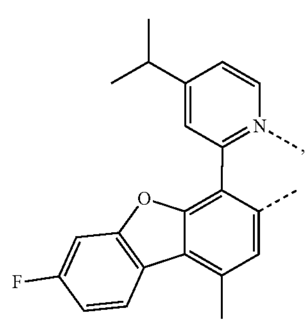

76
-continued
$L_{a30}$
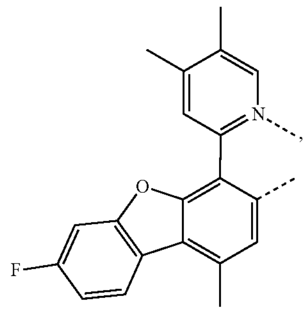
$L_{a31}$
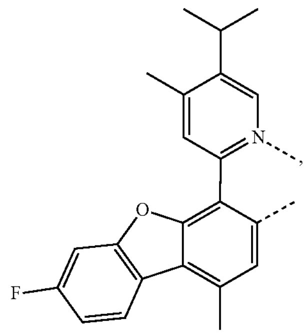
$L_{a32}$
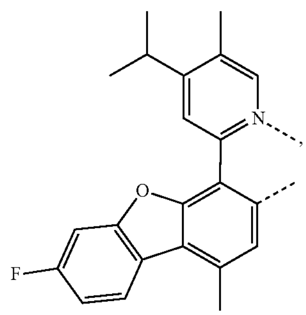
$L_{a33}$
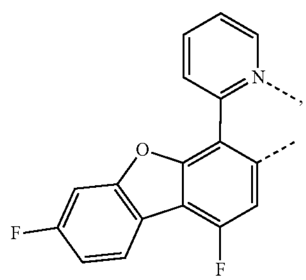
$L_{a34}$
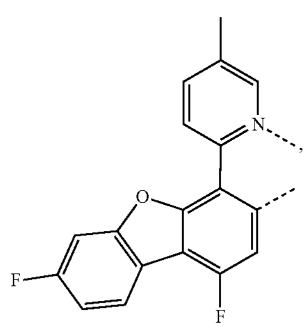
$L_{a35}$
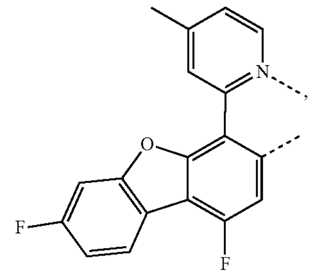
$L_{a36}$
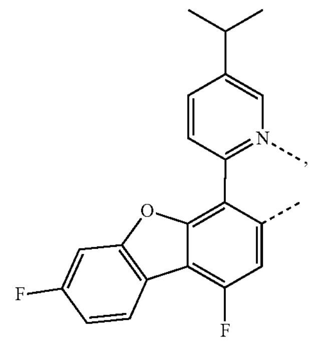
$L_{a37}$
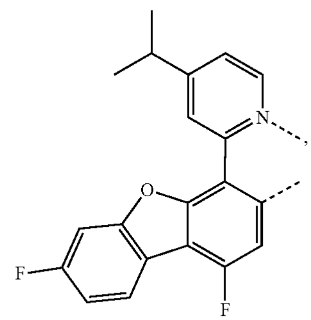
$L_{a38}$
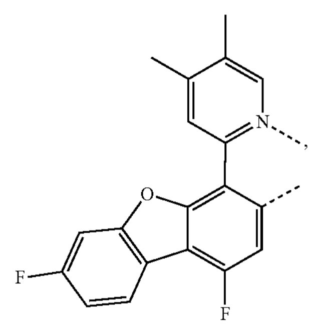
$L_{a39}$
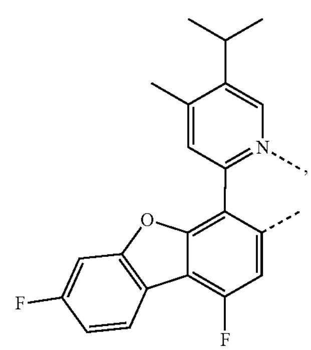

-continued
$L_{a40}$
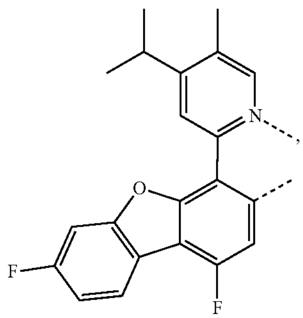
$L_{a41}$
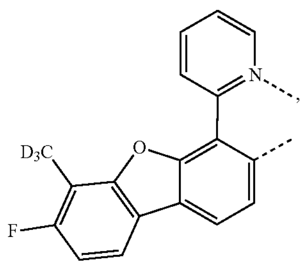
$L_{a42}$
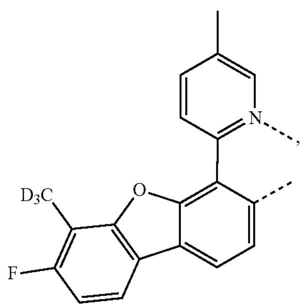
$L_{a43}$
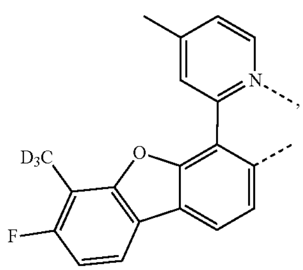
$L_{a44}$
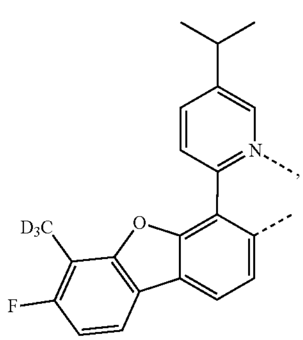
-continued
$L_{a45}$
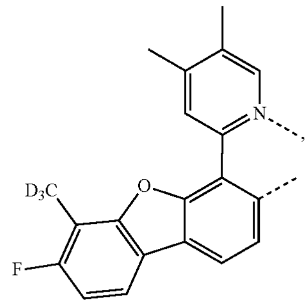
$L_{a46}$
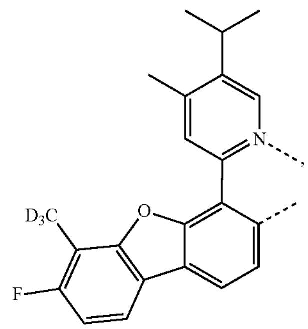
$L_{a47}$
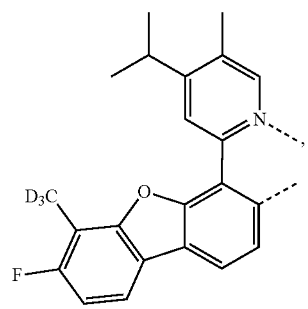
$L_{a48}$
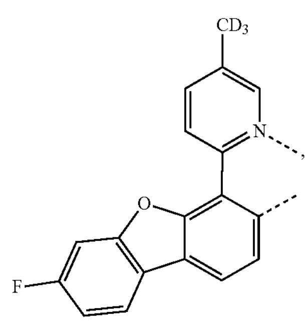
$L_{a49}$
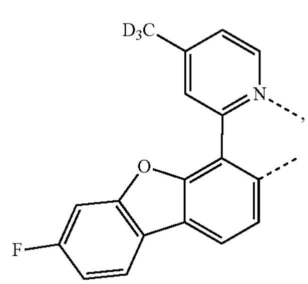

$L_{a50}$
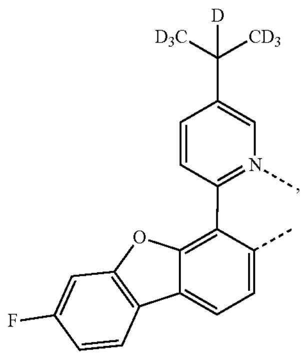
$L_{a51}$
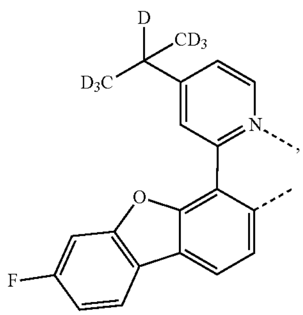
$L_{a52}$
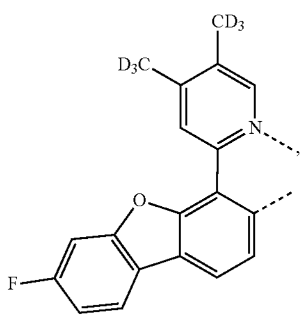
$L_{a53}$
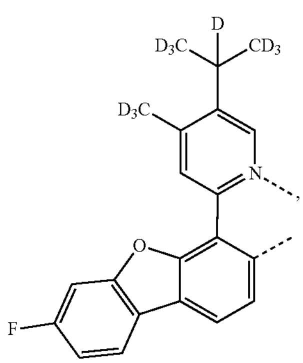
$L_{a54}$
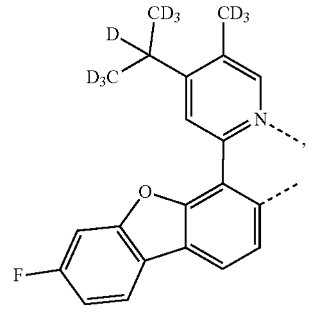
$L_{a55}$
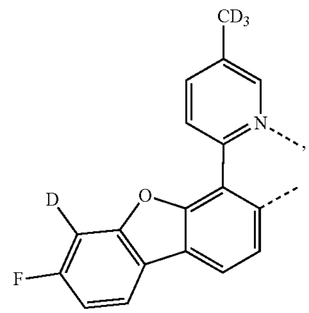
$L_{a56}$
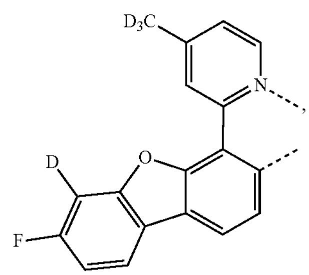
$L_{a57}$
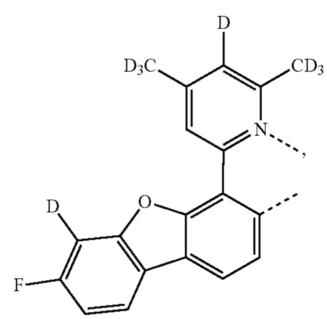
$L_{a58}$
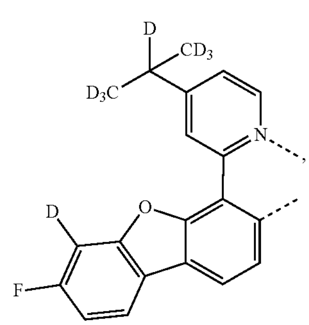

-continued
$L_{a59}$
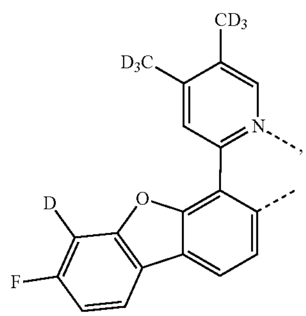
$L_{a60}$
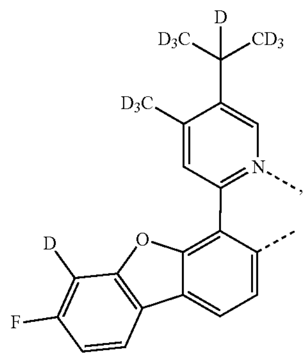
$L_{a61}$
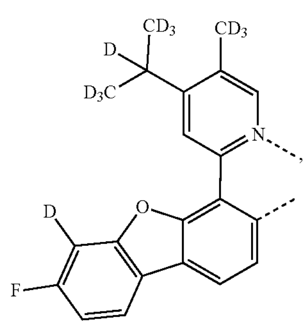
$L_{a62}$
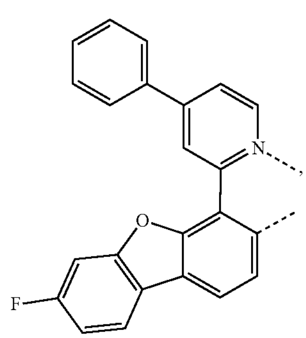
-continued
$L_{a63}$
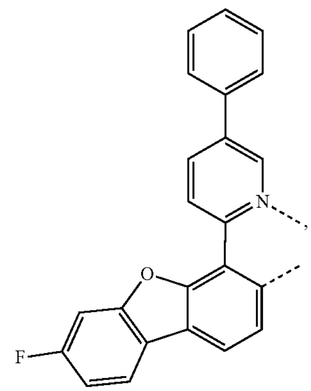
$L_{a64}$
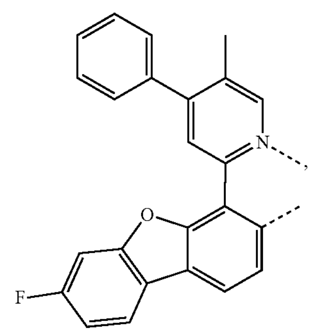
$L_{a65}$
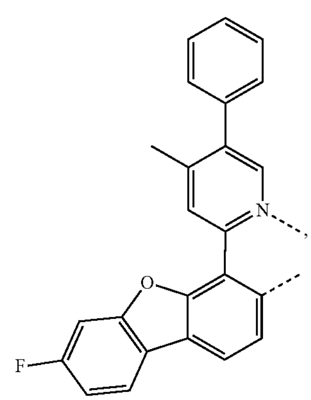
$L_{a66}$
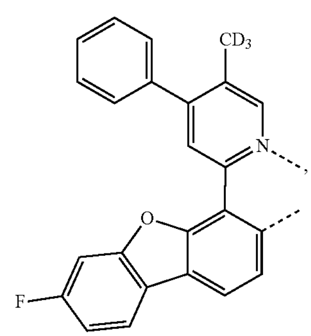

$L_{a67}$
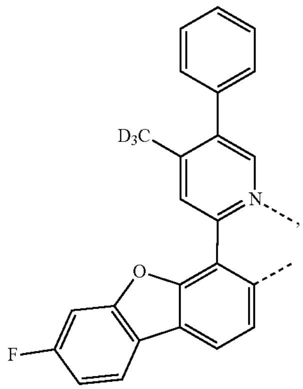
$L_{a68}$
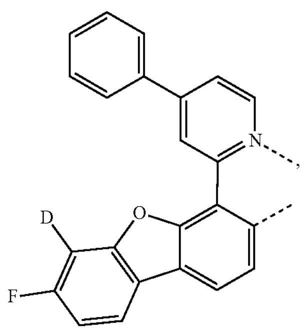
$L_{a69}$
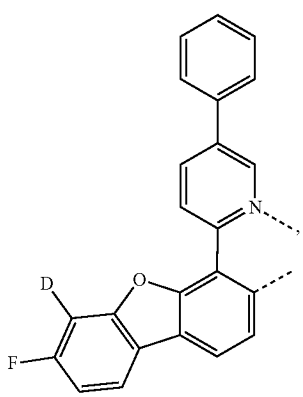
$L_{a70}$
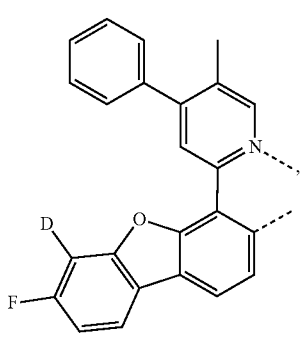
$L_{a71}$
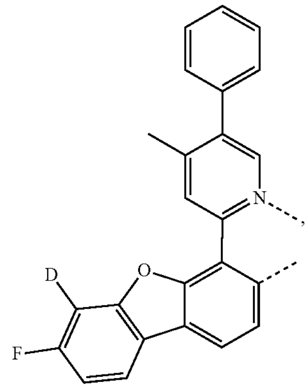
$L_{a72}$
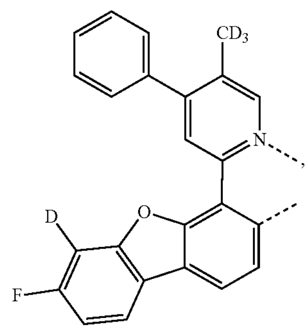
$L_{a73}$
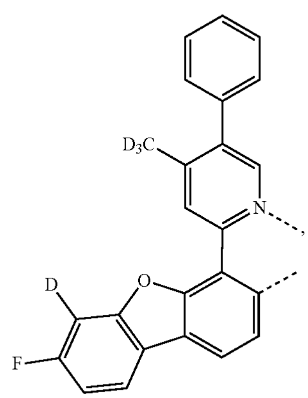
$L_{a74}$
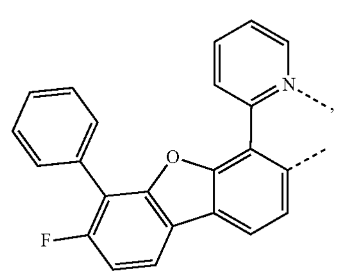

-continued
$L_{a75}$
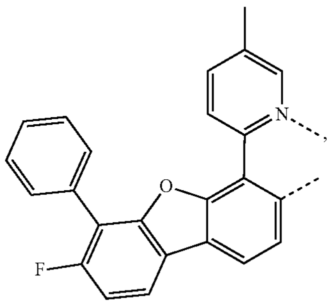
$L_{a76}$
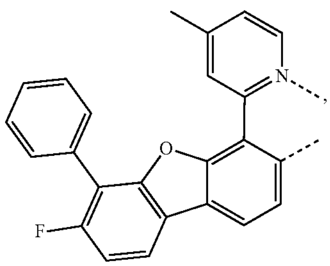
$L_{a77}$
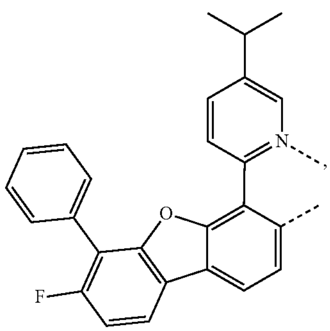
$L_{a78}$
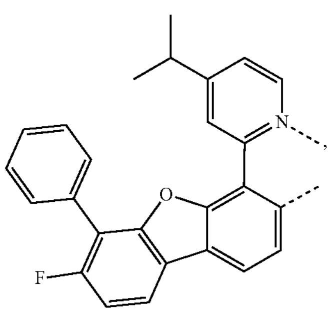
$L_{a79}$
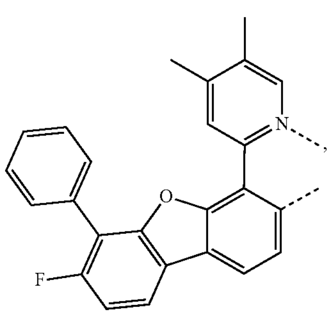
-continued
$L_{a80}$
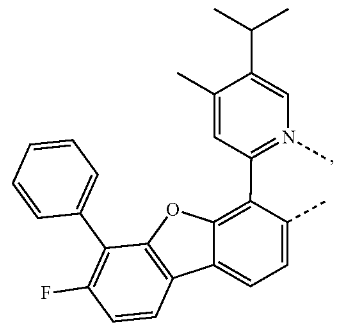
$L_{a81}$
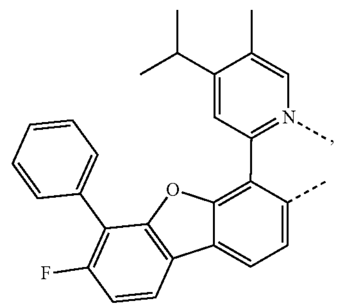
$L_{a82}$
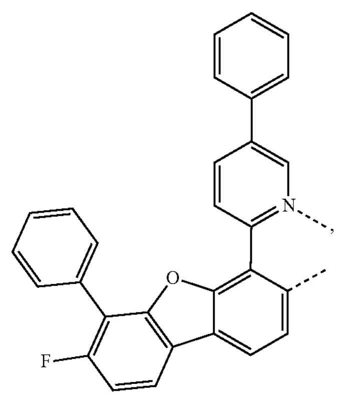
$L_{a83}$
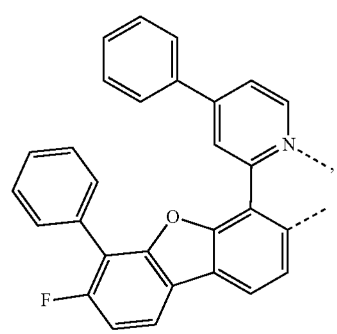
$L_{a84}$
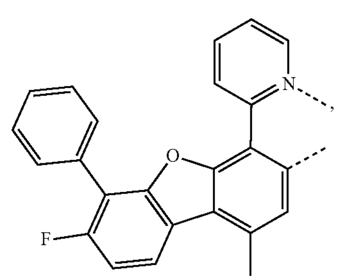

$L_{a85}$
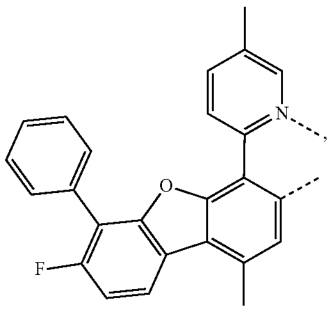
$L_{a86}$
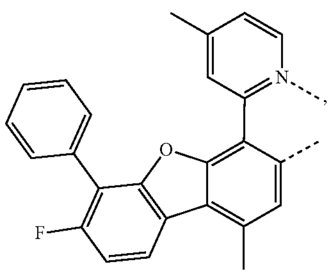
$L_{a87}$
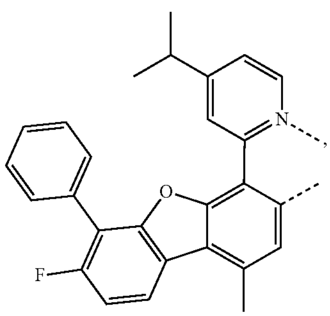
$L_{a88}$
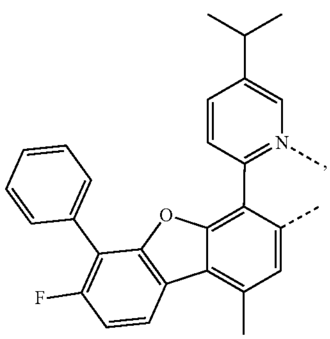
$L_{a89}$
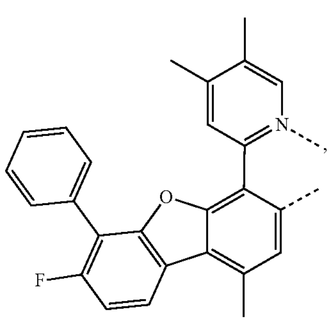
$L_{a90}$
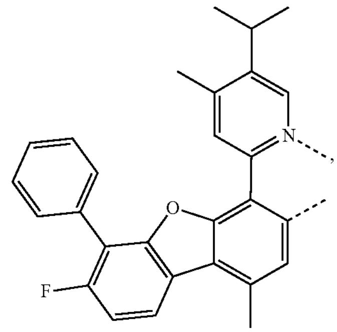
$L_{a91}$
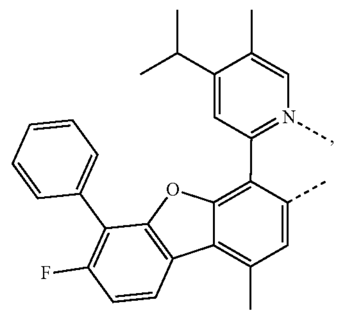
$L_{a92}$
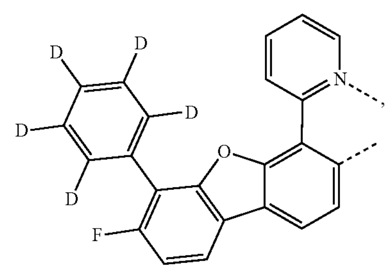
$L_{a93}$
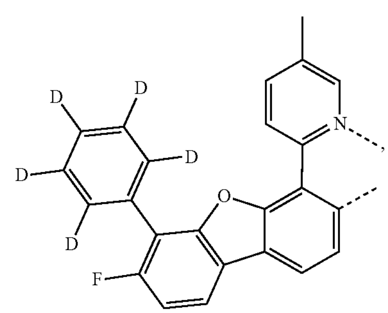
$L_{a94}$
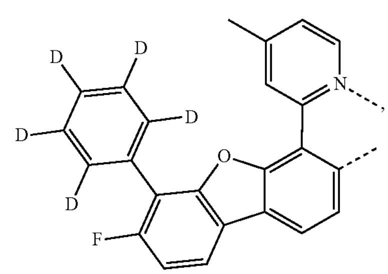

-continued
$L_{a95}$
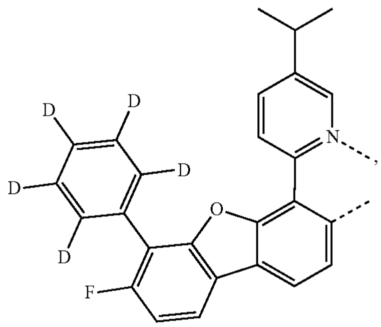
$L_{a96}$
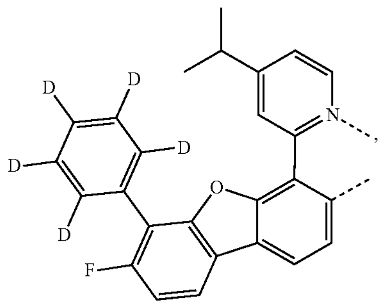
$L_{a97}$
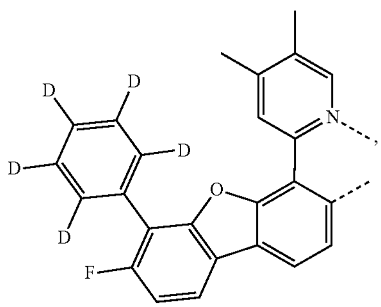
$L_{a98}$
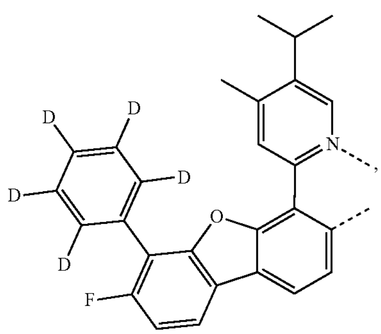
$L_{a99}$
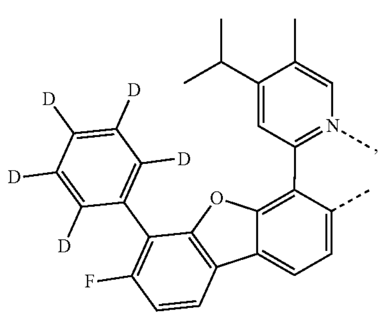
-continued
$L_{a100}$
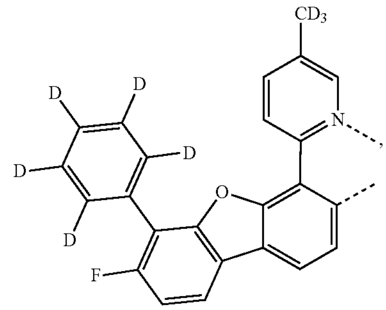
$L_{a101}$
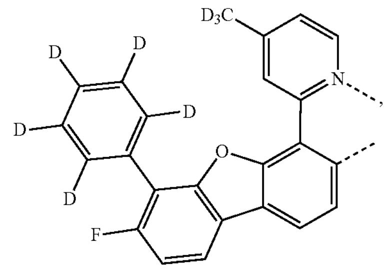
$L_{a102}$
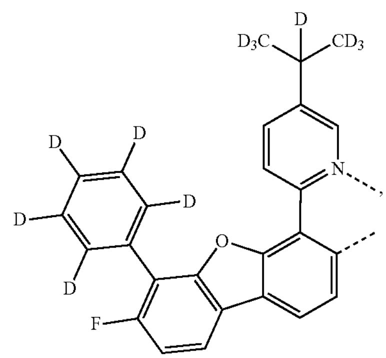
$L_{a103}$
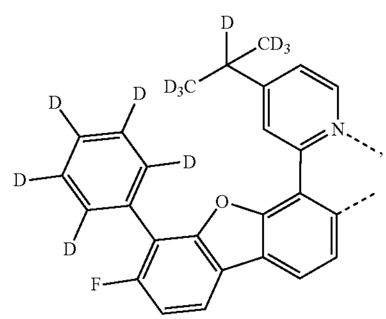
$L_{a104}$
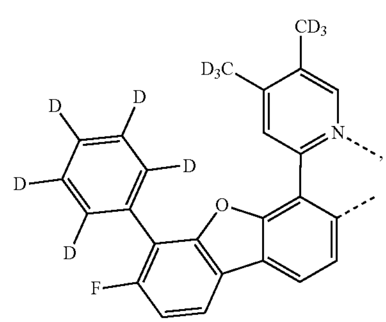

$L_{a105}$
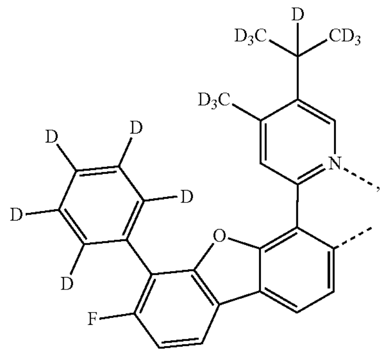
$L_{a106}$
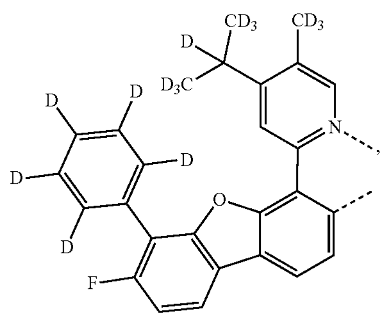
$L_{a107}$
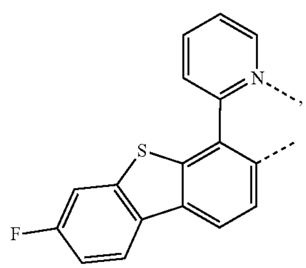
$L_{a108}$
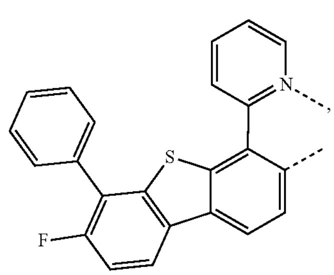
$L_{a109}$
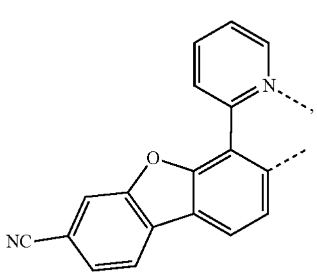
$L_{a110}$
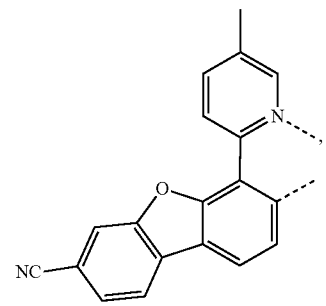
$L_{a111}$
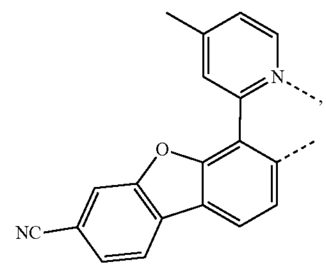
$L_{a112}$
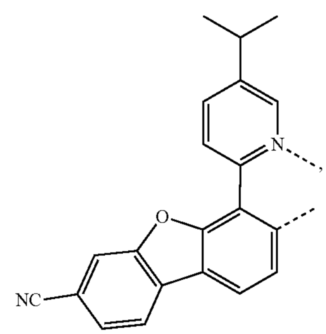
$L_{a113}$
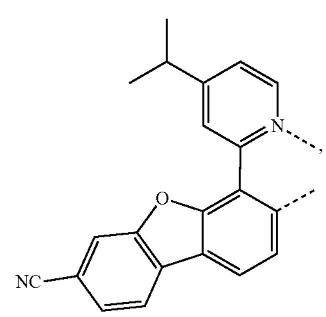
$L_{a114}$
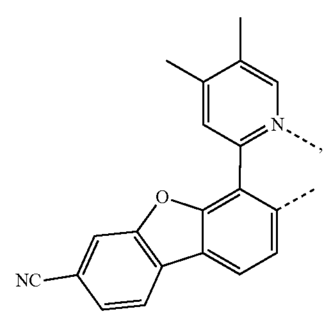

-continued
$L_{a115}$
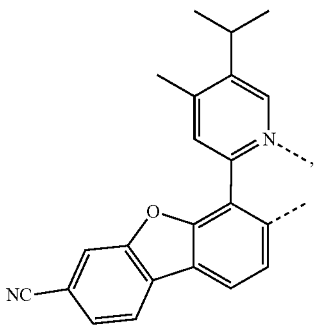
$L_{a116}$
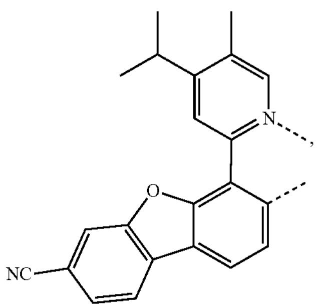
$L_{a117}$
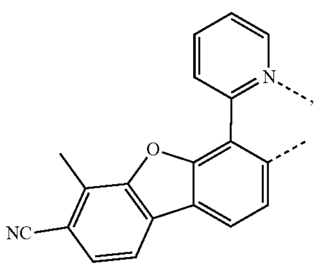
$L_{a118}$
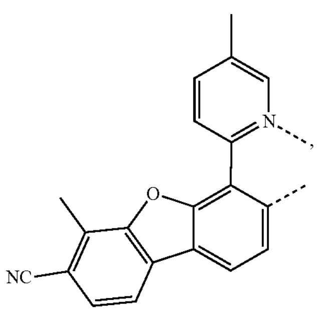
$L_{a119}$
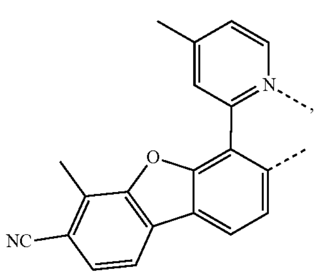
-continued
$L_{a120}$
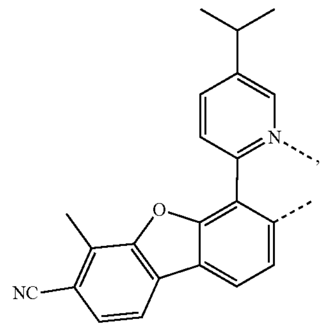
$L_{a121}$
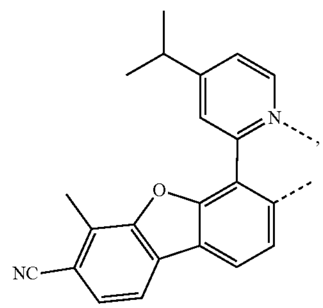
$L_{a122}$
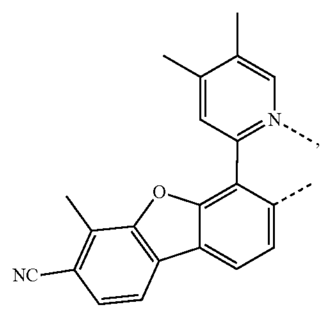
$L_{a123}$
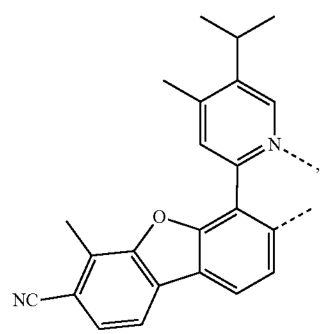
$L_{a124}$
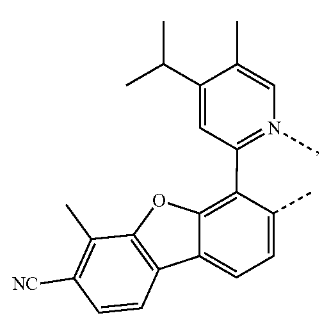

-continued
$L_{a125}$
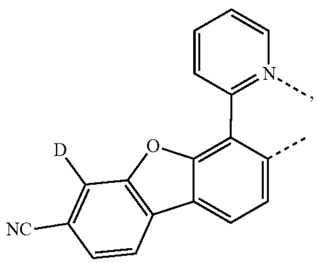
$L_{a126}$
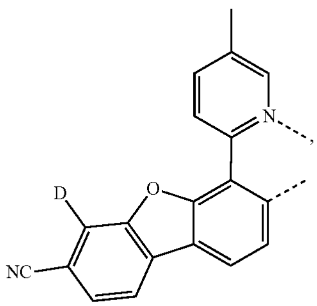
$L_{a127}$
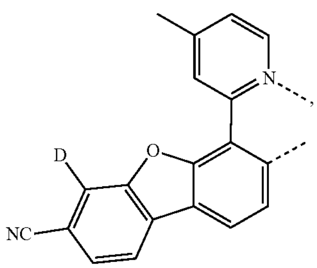
$L_{a128}$
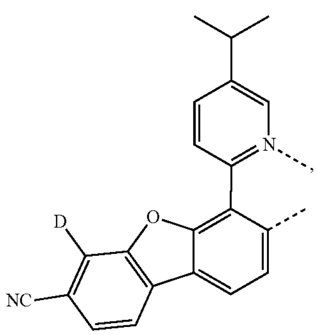
$L_{a129}$
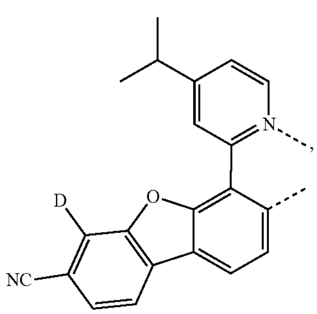
-continued
$L_{a130}$
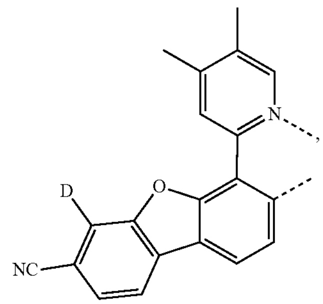
$L_{a131}$
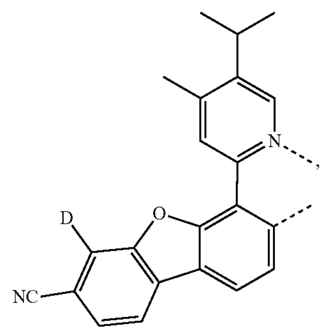
$L_{a132}$
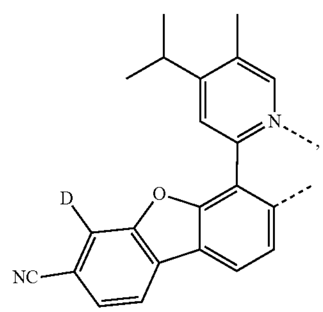
$L_{a133}$
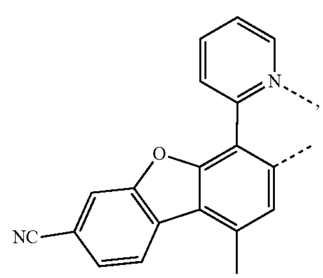
$L_{a134}$
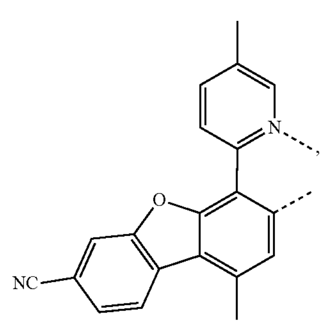

-continued
$L_{a135}$
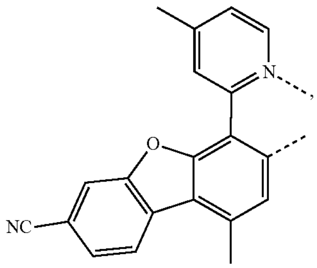
$L_{a136}$
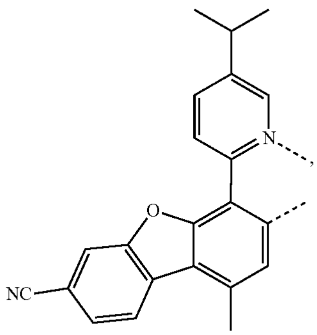
$L_{a137}$
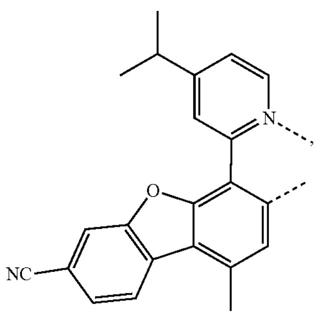
$L_{a138}$
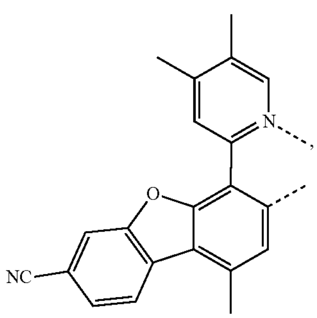
$L_{a139}$
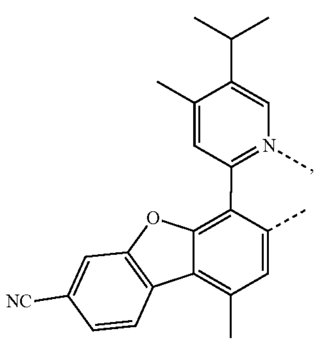
-continued
$L_{a140}$
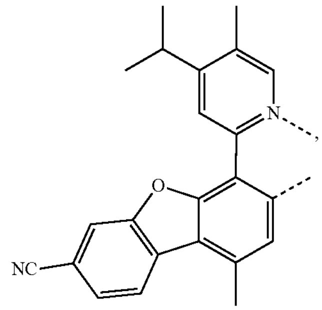
$L_{a141}$
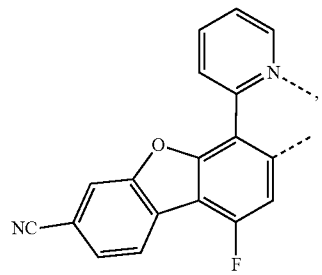
$L_{a142}$
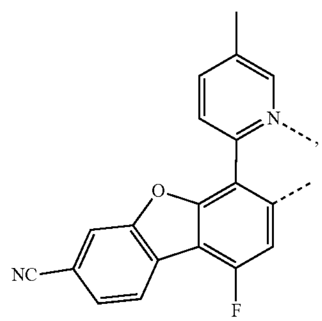
$L_{a143}$
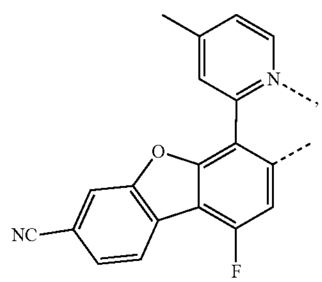
$L_{a144}$
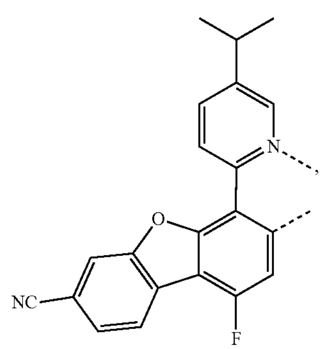

-continued
$L_{a145}$
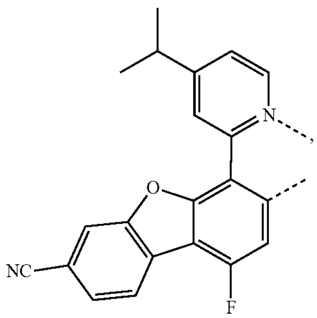
$L_{a146}$
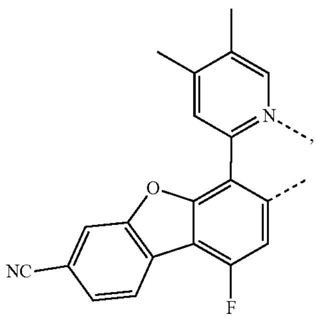
$L_{a147}$
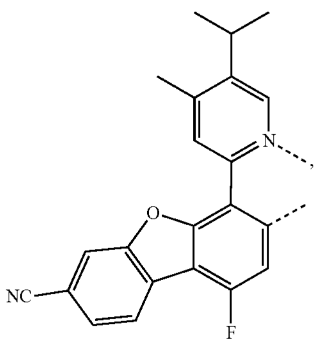
$L_{a148}$
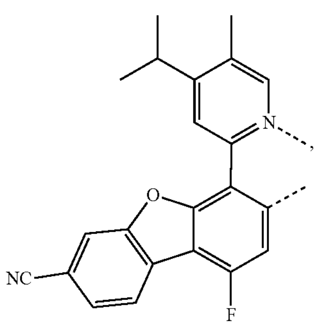
$L_{a149}$
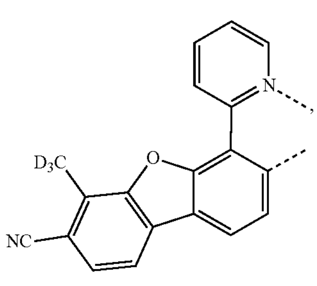
-continued
$L_{a150}$
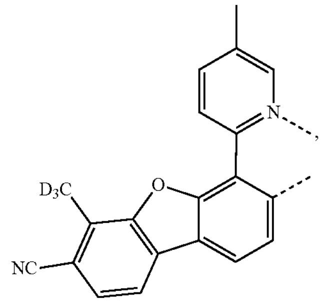
$L_{a151}$
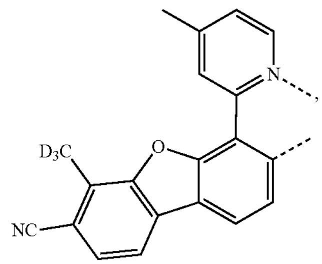
$L_{a152}$
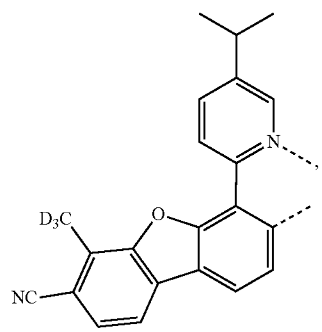
$L_{a153}$
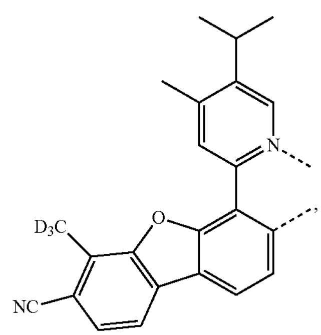
$L_{a154}$
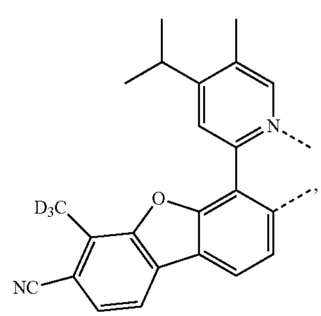

$L_{a155}$
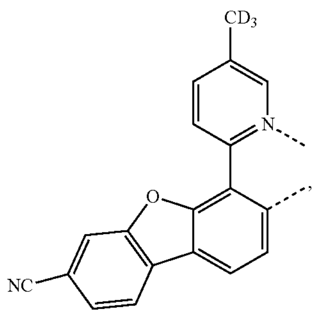
$L_{a156}$
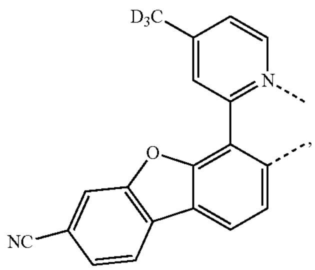
$L_{a157}$
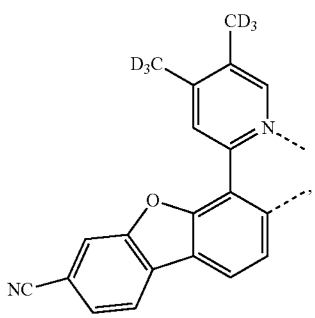
$L_{a158}$
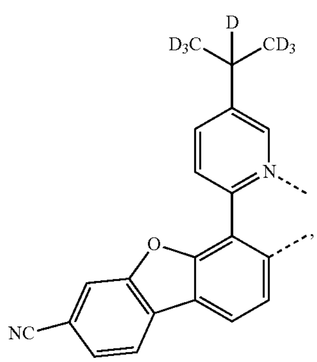
$L_{a159}$
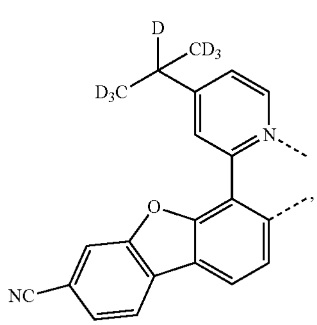
$L_{a160}$
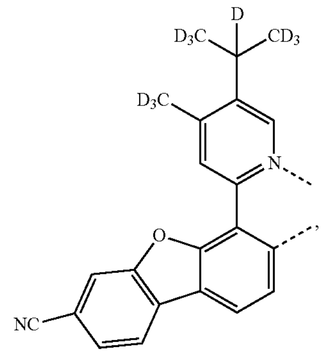
$L_{a161}$
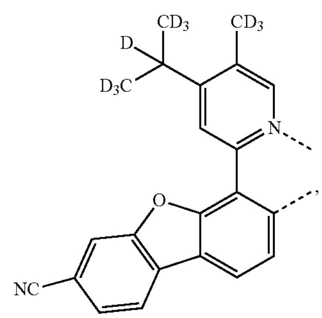
$L_{a162}$
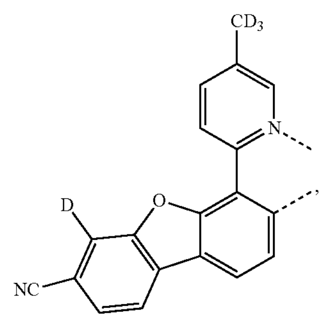
$L_{a163}$
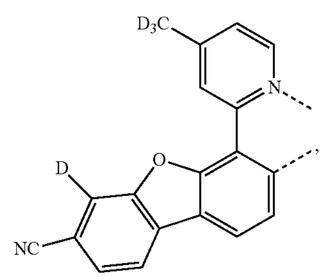
$L_{a164}$
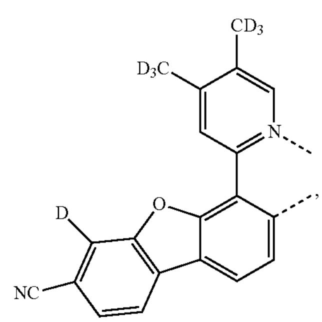

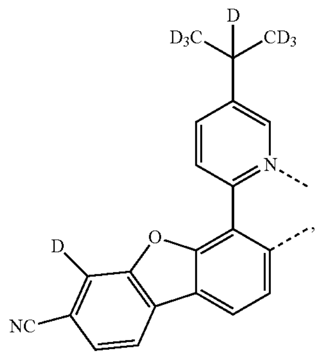
$L_{a165}$
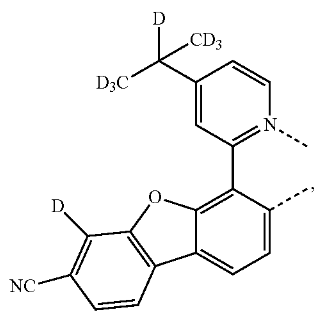
$L_{a166}$
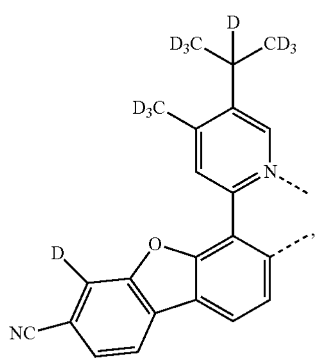
$L_{a167}$
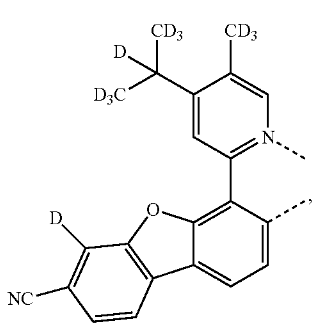
$L_{a168}$
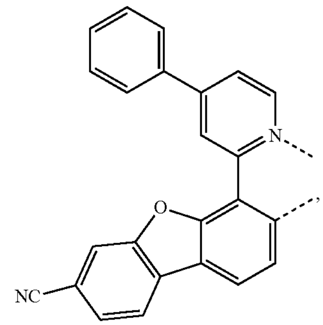
$L_{a169}$
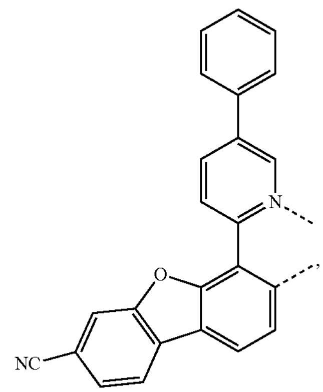
$L_{a170}$
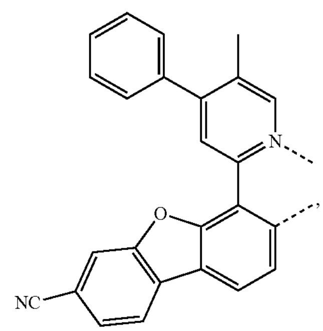
$L_{a171}$
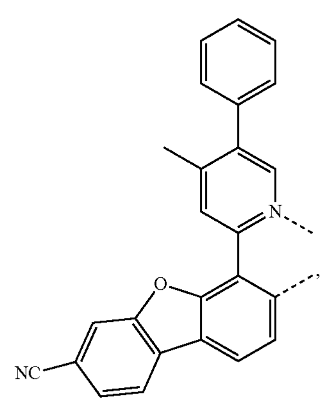
$L_{a172}$ $L_{a173}$
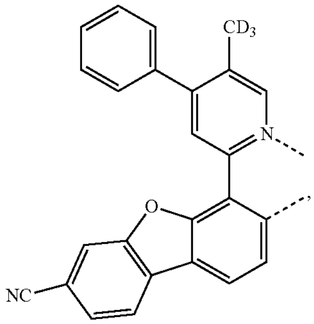
$L_{a174}$
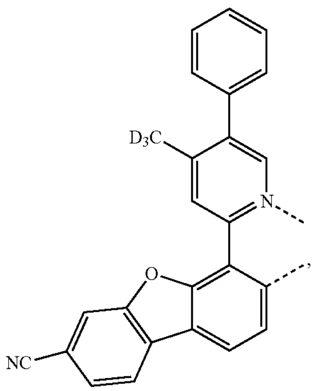
$L_{a175}$
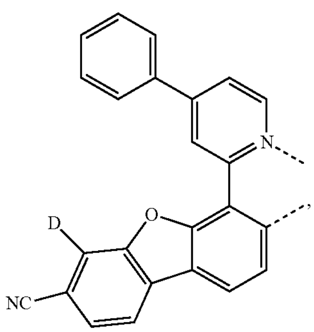
$L_{a176}$
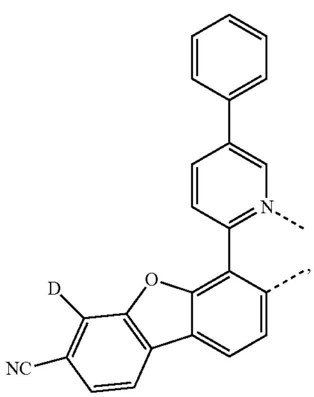
$L_{a177}$
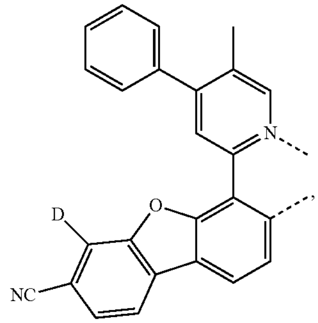
$L_{a178}$
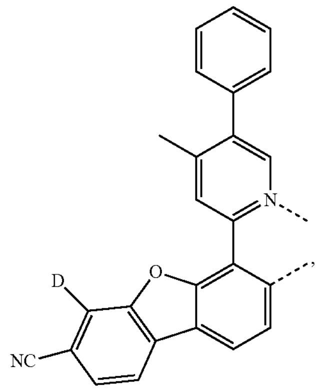
$L_{a179}$
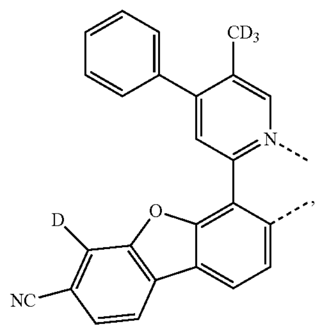
$L_{a180}$
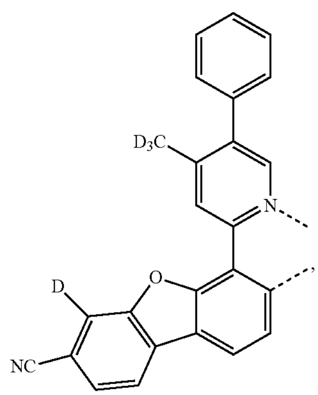

-continued
$L_{a181}$
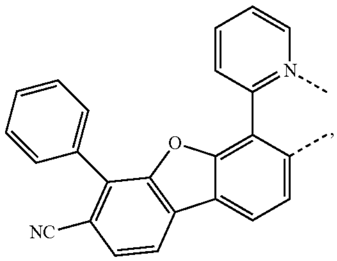
$L_{a182}$
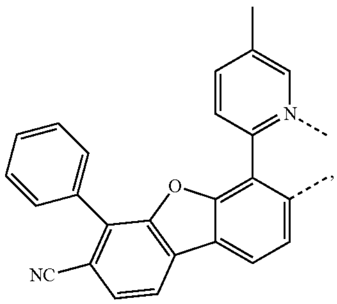
$L_{a183}$
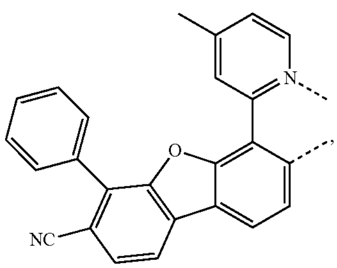
$L_{a184}$
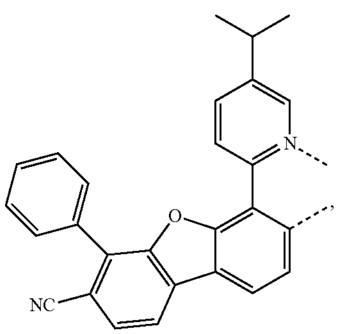
$L_{a185}$
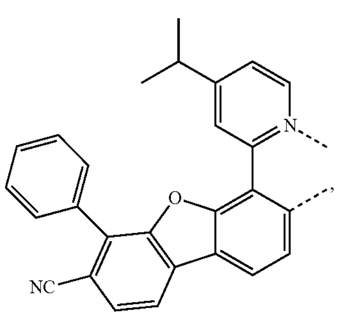
-continued
$L_{a186}$
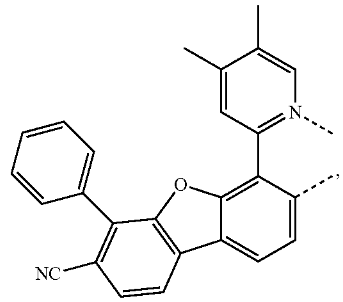
$L_{a187}$
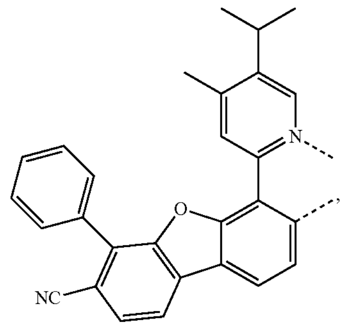
$L_{a188}$
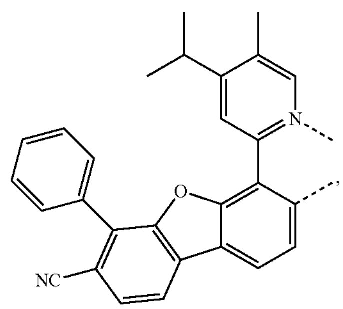
$L_{a189}$
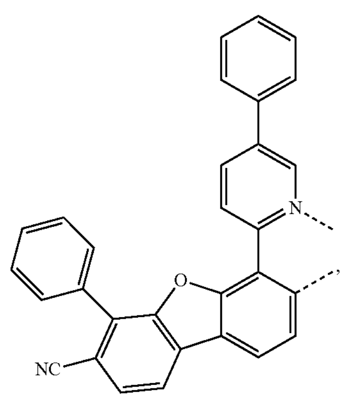

-continued
$L_{a190}$
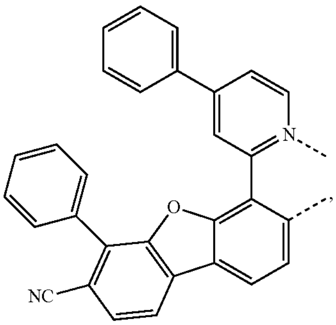
$L_{a191}$
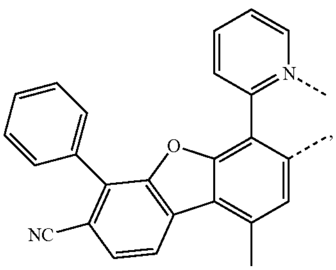
$L_{a192}$
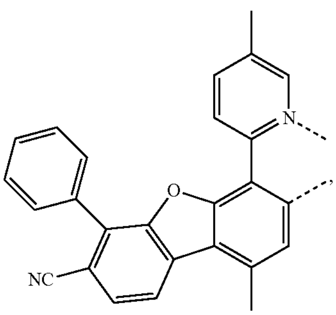
$L_{a193}$
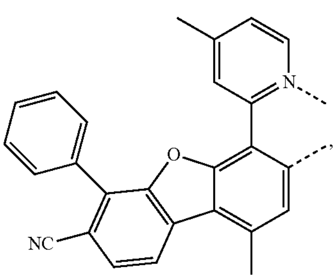
$L_{a194}$
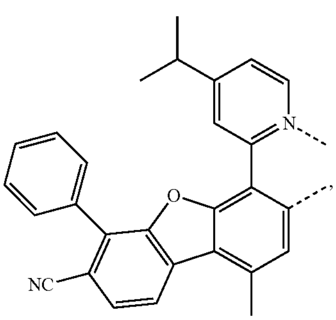
-continued
$L_{a195}$
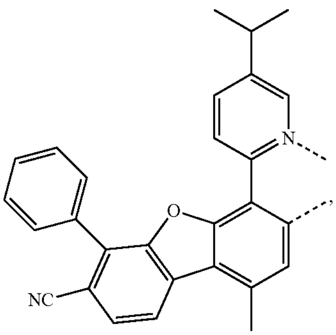
$L_{a196}$
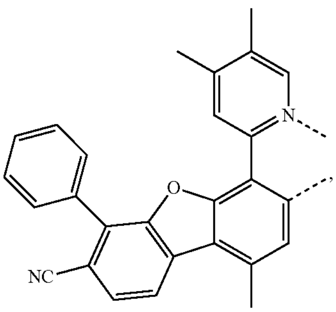
$L_{a197}$
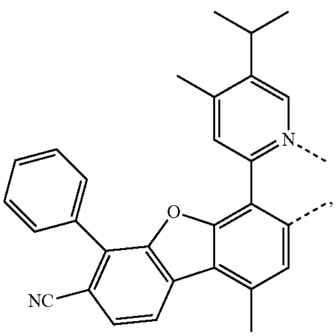
$L_{a198}$
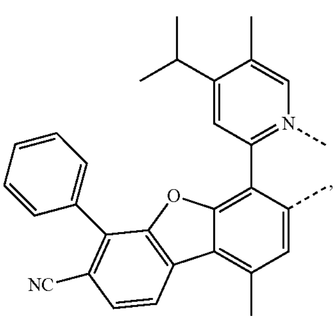
$L_{a199}$
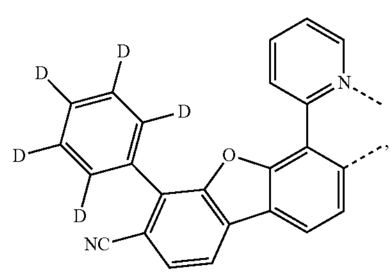

$L_{a200}$
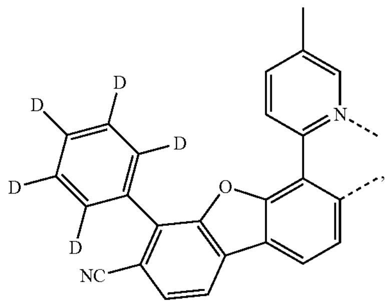
$L_{a201}$
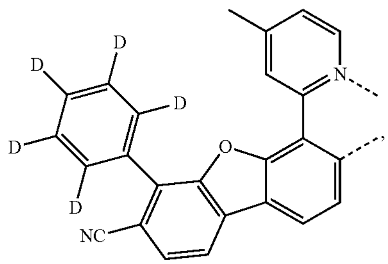
$L_{a202}$
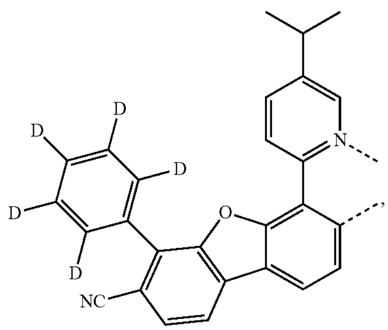
$L_{a203}$
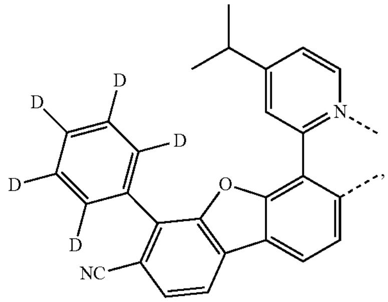
$L_{a204}$
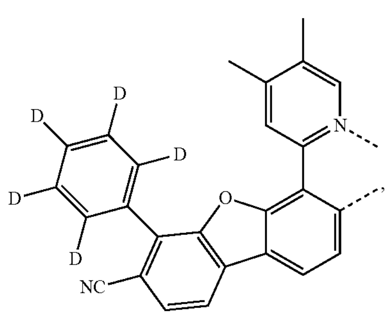
$L_{a205}$
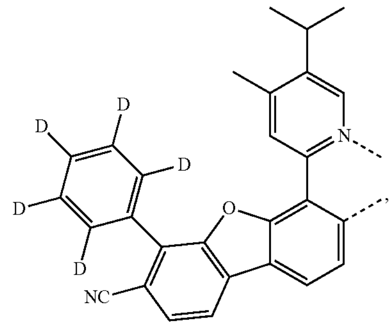
$L_{a206}$
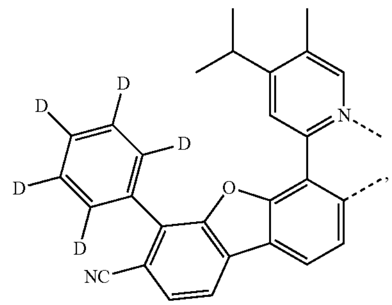
$L_{a207}$
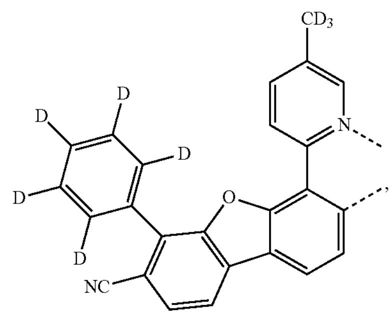
$L_{a208}$
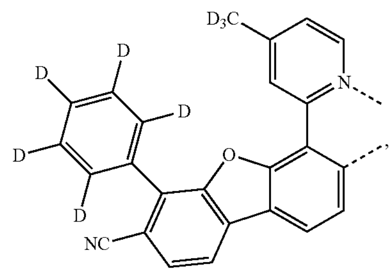
$L_{a209}$
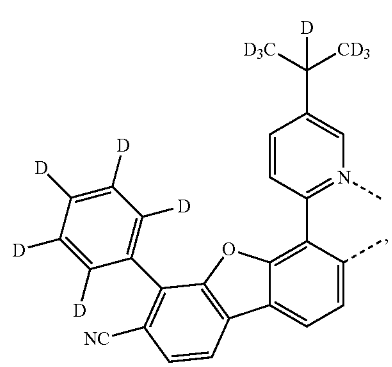

-continued
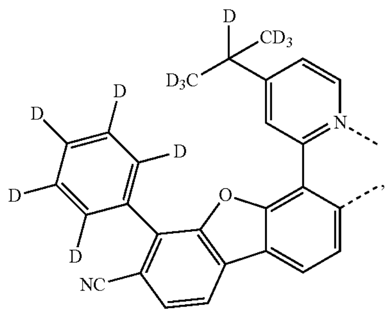
L$_{a210}$
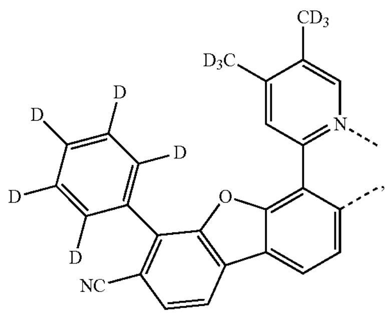
L$_{a211}$
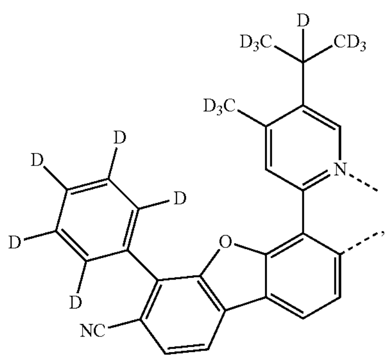
L$_{a212}$
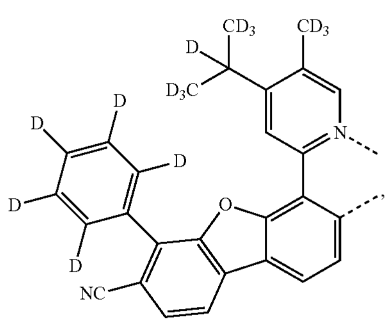
L$_{a213}$
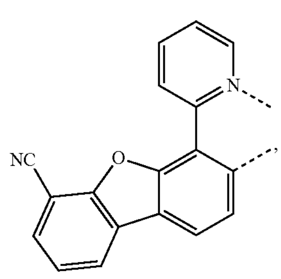
L$_{a214}$
-continued
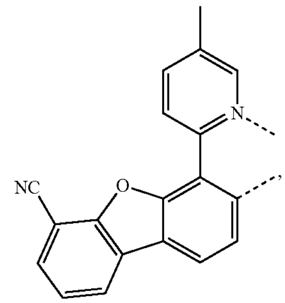
L$_{a215}$
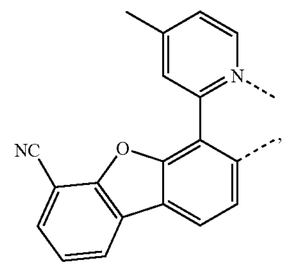
L$_{a216}$
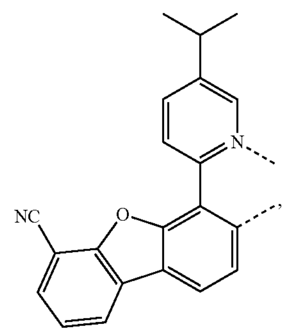
L$_{a217}$
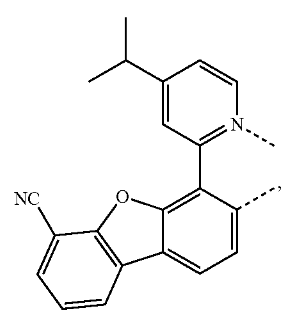
L$_{a218}$
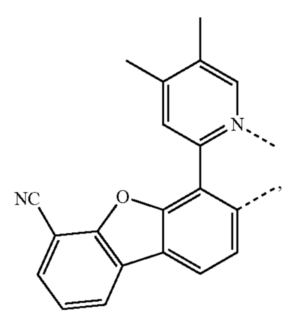
L$_{a219}$ La220
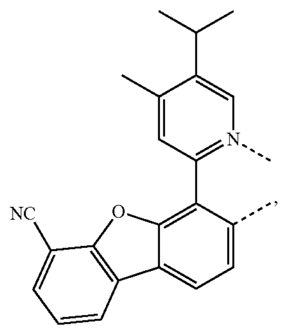
La221
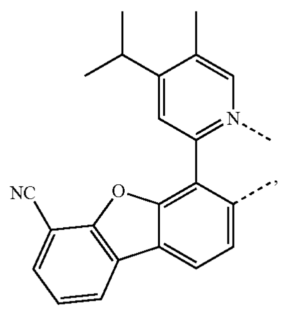
La222
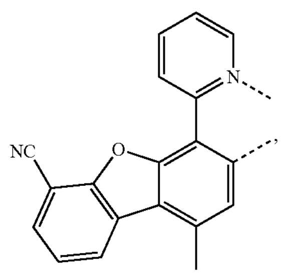
La223
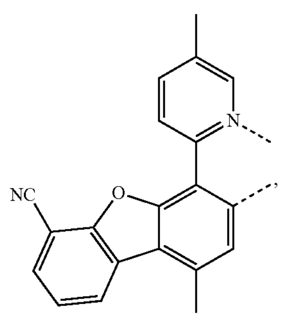
La224
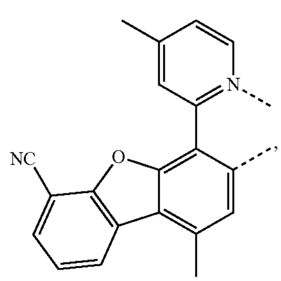
La225
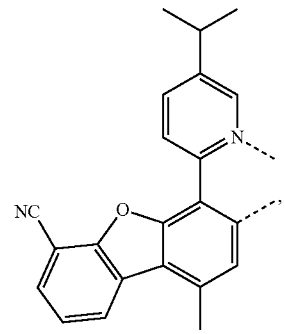
La226
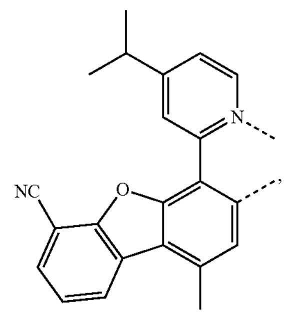
La227
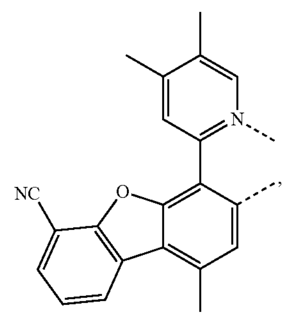
La228
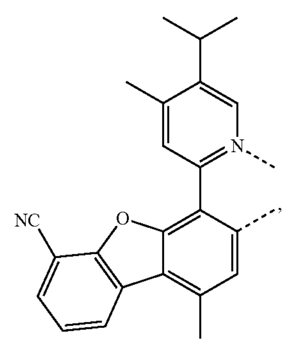
La229
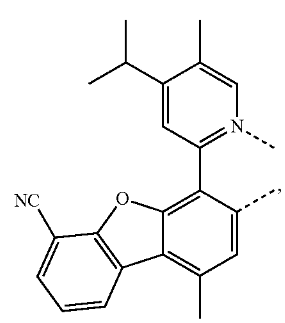

-continued
$L_{a230}$
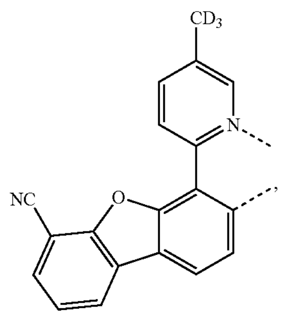
$L_{a231}$
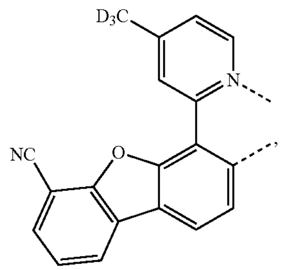
$L_{a232}$
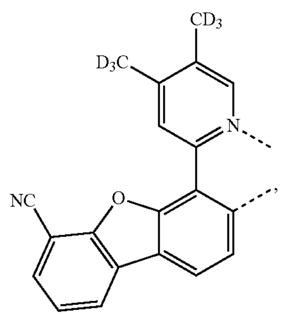
$L_{a233}$
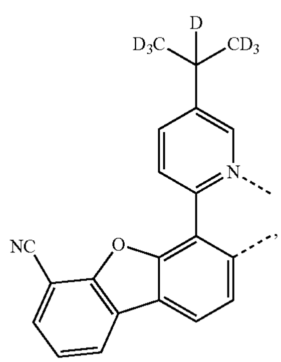
$L_{a234}$
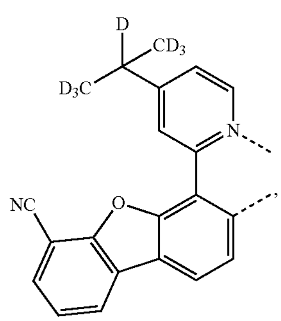
-continued
$L_{a235}$
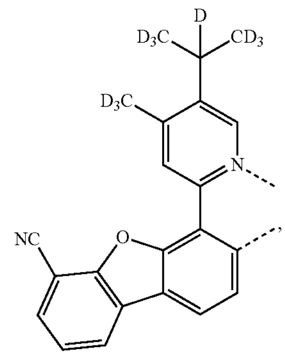
$L_{a236}$
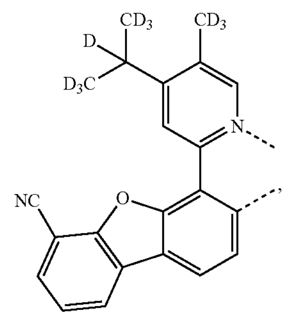
$L_{a237}$
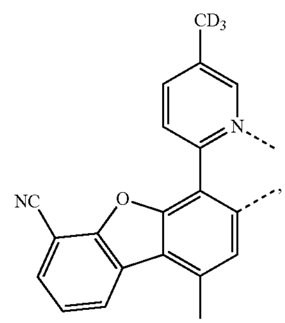
$L_{a238}$
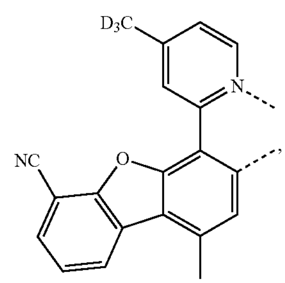
$L_{a239}$
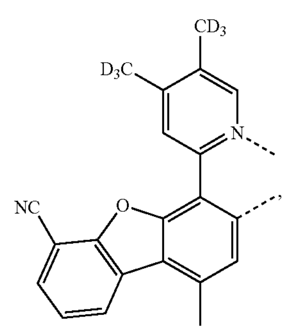

-continued
$L_{a240}$
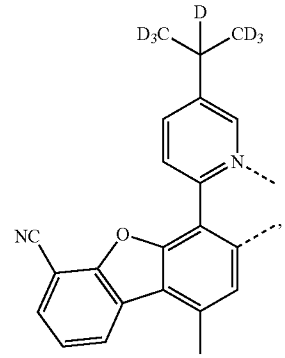
$L_{a241}$
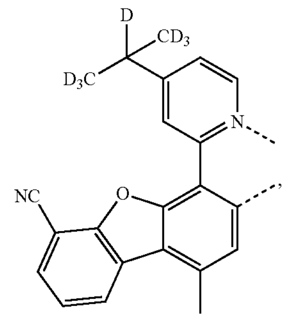
$L_{a242}$
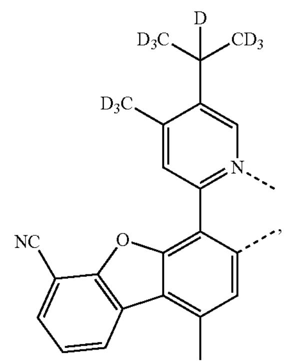
$L_{a243}$
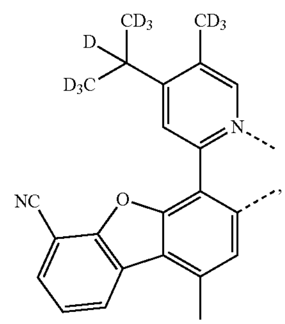
$L_{a244}$
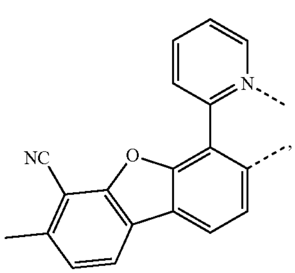
-continued
$L_{a245}$
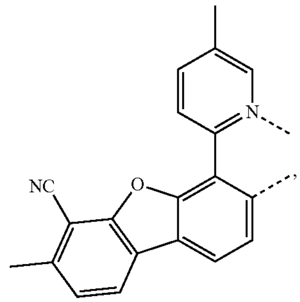
$L_{a246}$
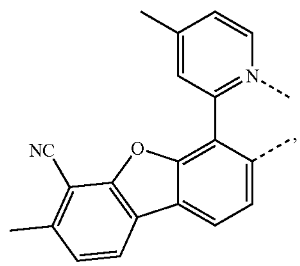
$L_{a247}$
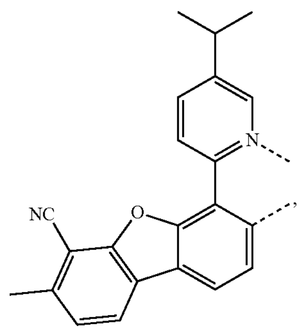
$L_{a248}$
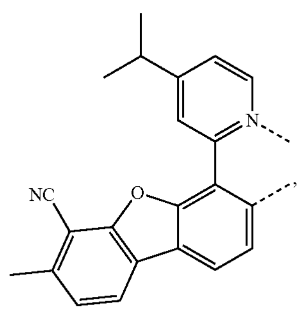
$L_{a249}$
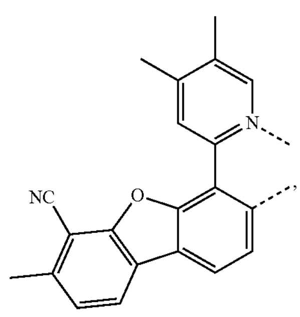

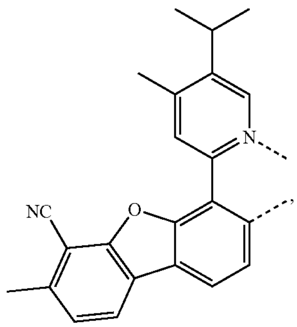
$L_{a250}$
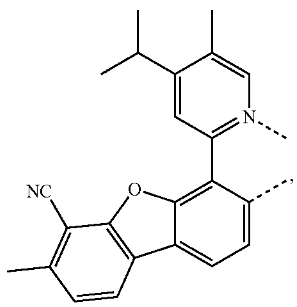
$L_{a251}$
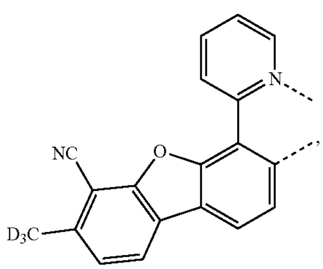
$L_{a252}$
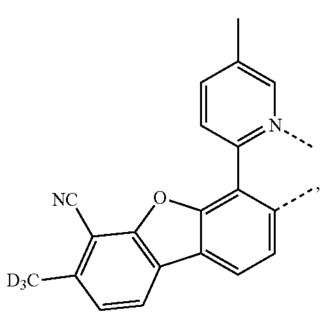
$L_{a253}$
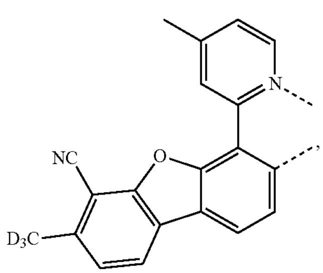
$L_{a254}$
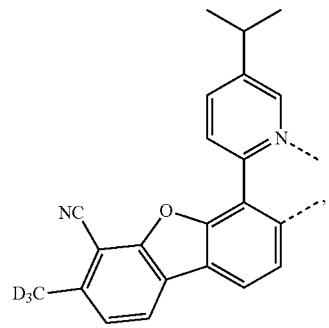
$L_{a255}$
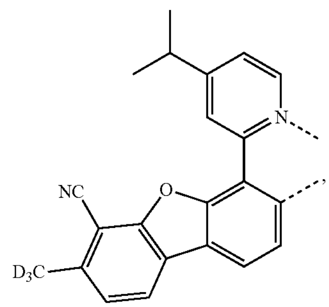
$L_{a256}$
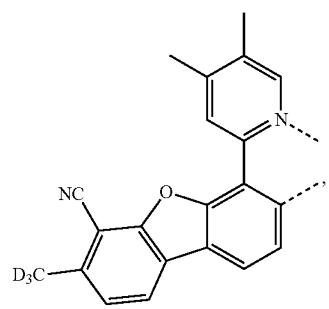
$L_{a257}$
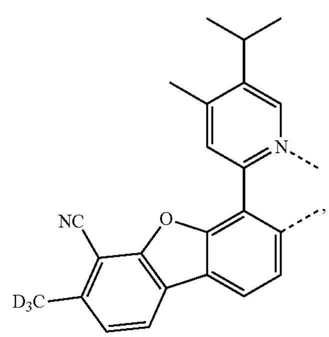
$L_{a258}$
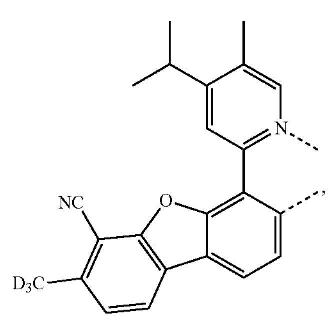
$L_{a259}$ -continued
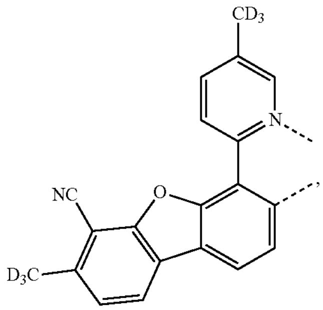
$L_{a260}$
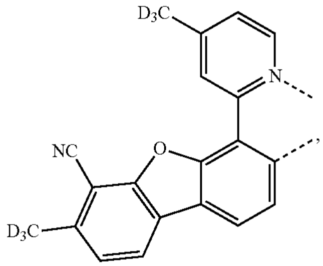
$L_{a261}$
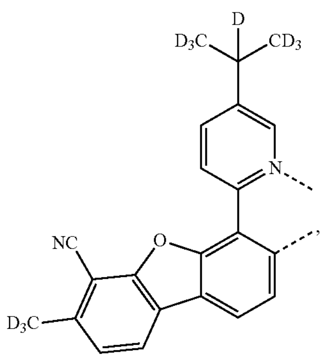
$L_{a262}$
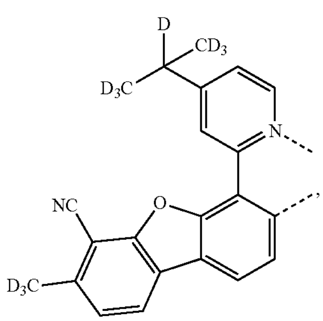
$L_{a263}$
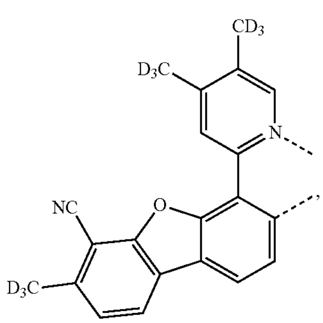
$L_{a264}$
-continued
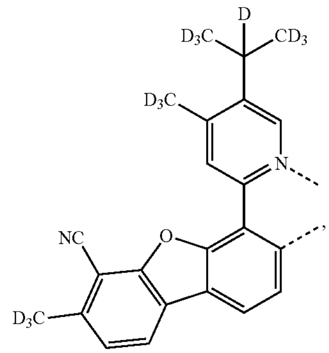
$L_{a265}$
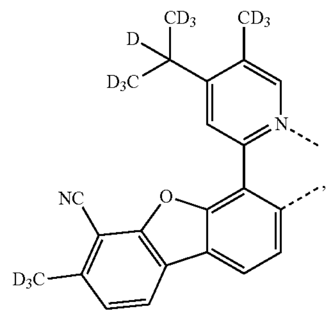
$L_{a266}$
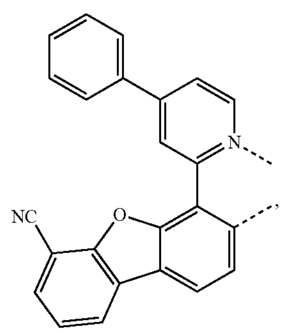
$L_{a267}$
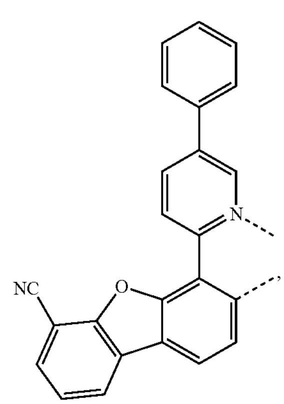
$L_{a268}$ -continued
$L_{a269}$
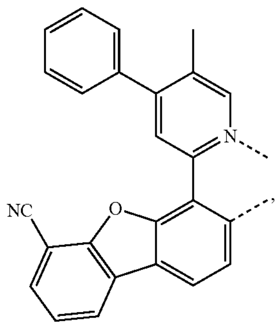
$L_{a270}$
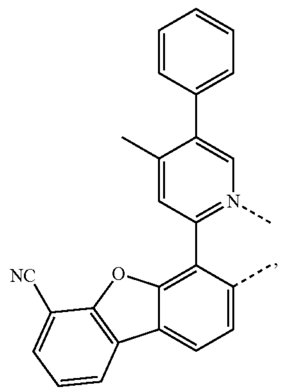
$L_{a271}$
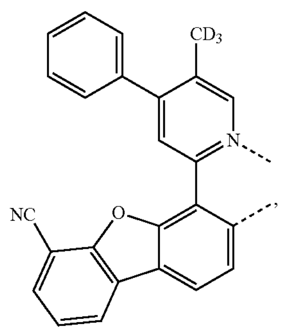
$L_{a272}$
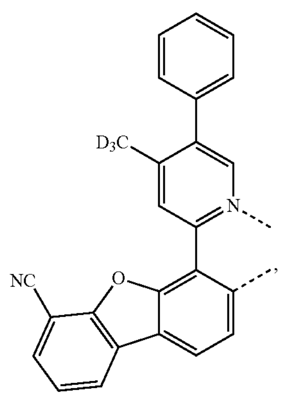
-continued
$L_{a273}$
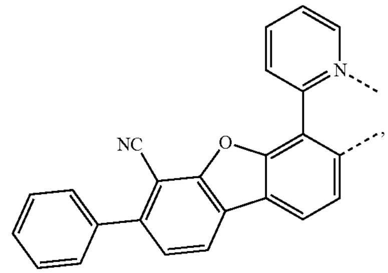
$L_{a274}$
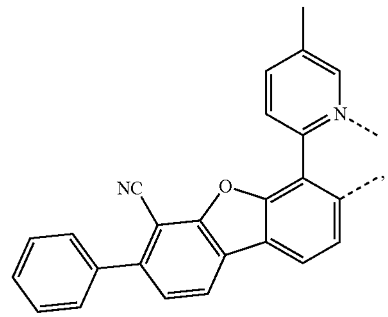
$L_{a275}$
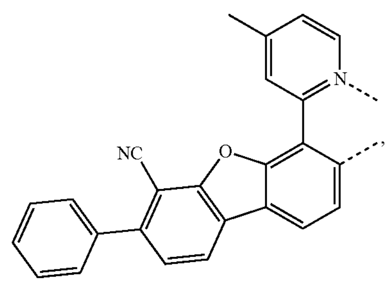
$L_{a276}$
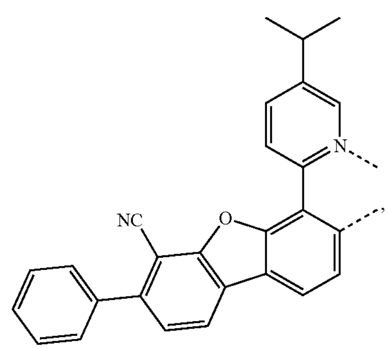
$L_{a277}$
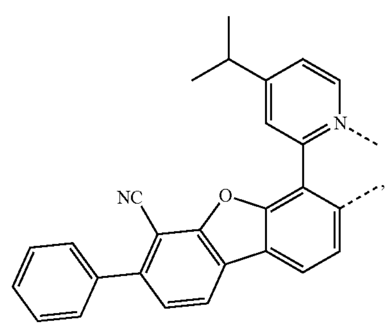

-continued
$L_{a278}$
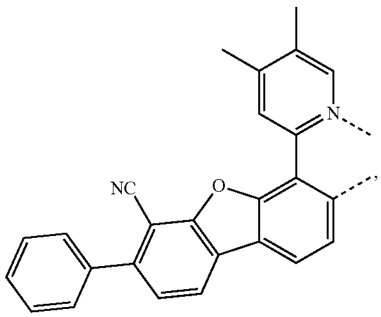
$L_{a279}$
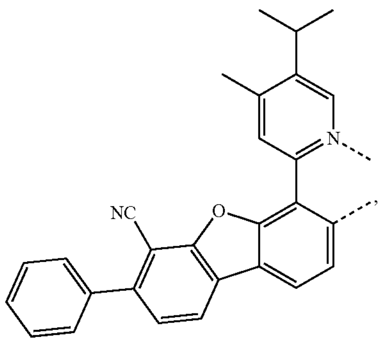
$L_{a280}$
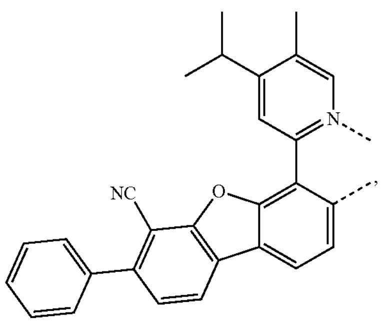
$L_{a281}$
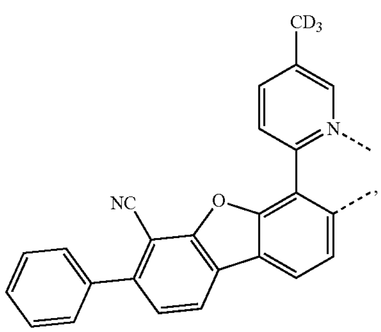
$L_{a282}$
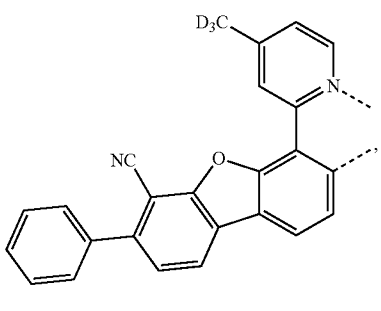
-continued
$L_{a283}$
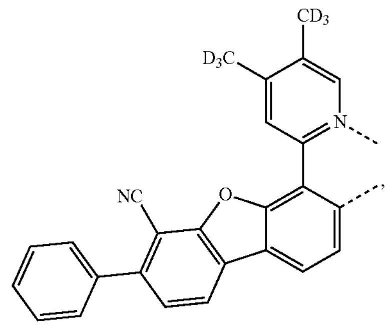
$L_{a284}$
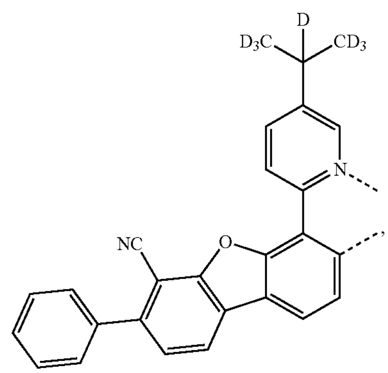
$L_{a285}$
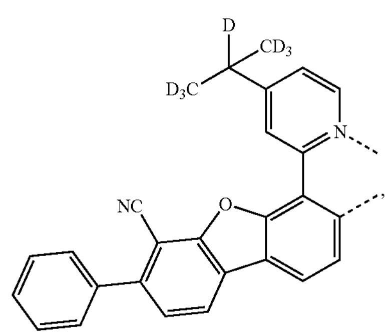
$L_{a286}$
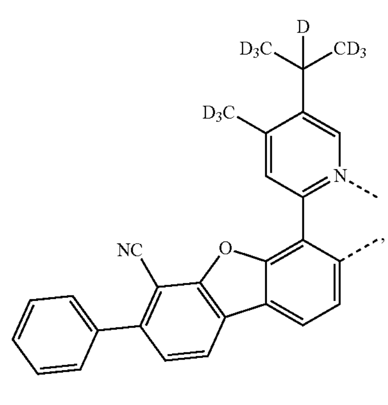

$L_{a287}$
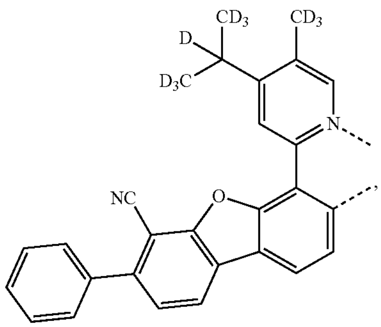
$L_{a288}$
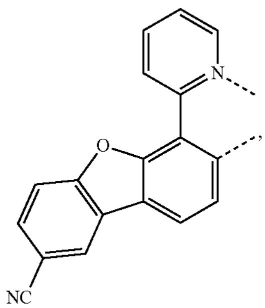
$L_{a289}$
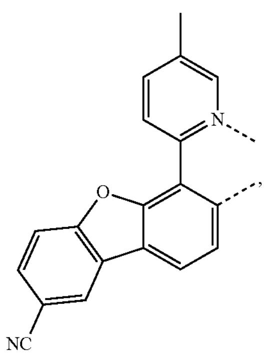
$L_{a290}$
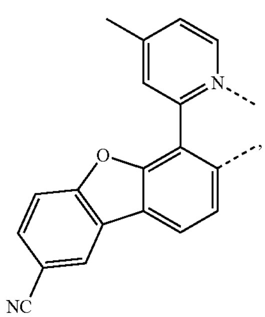
$L_{a291}$
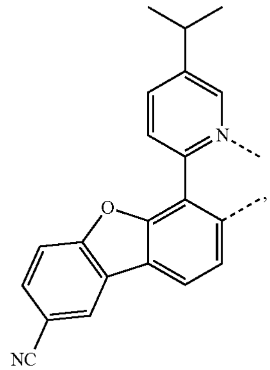
$L_{a292}$
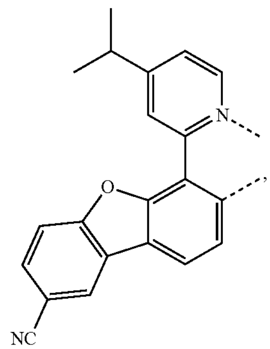
$L_{a293}$
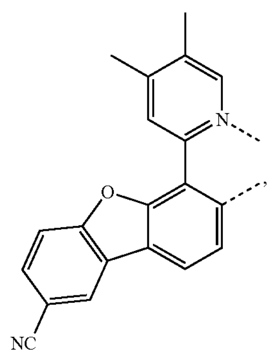
$L_{a294}$
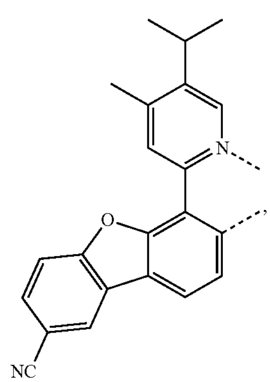

$L_{a295}$
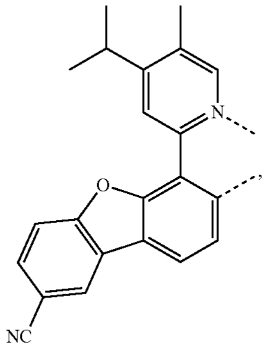
$L_{a296}$
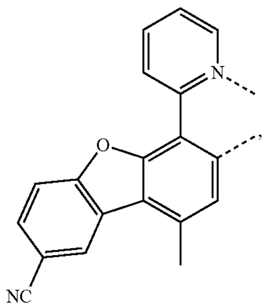
$L_{a297}$
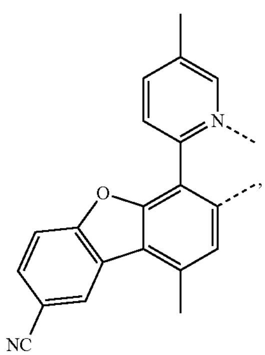
$L_{a298}$
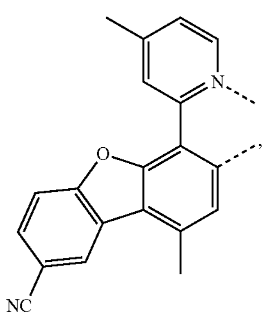
$L_{a299}$
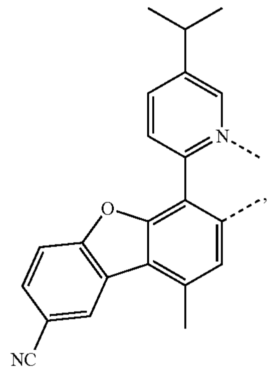
$L_{a300}$
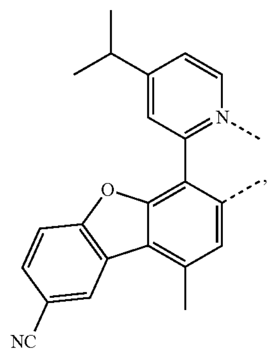
$L_{a301}$
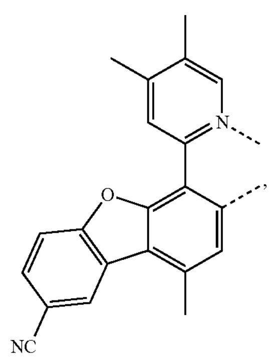
$L_{a302}$
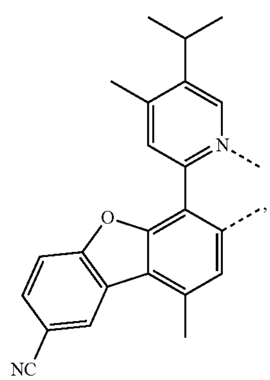

-continued
$L_{a303}$
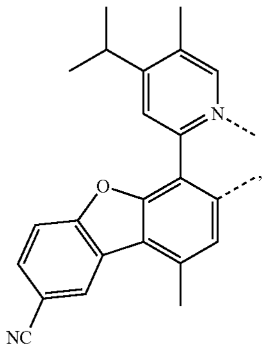
$L_{a304}$
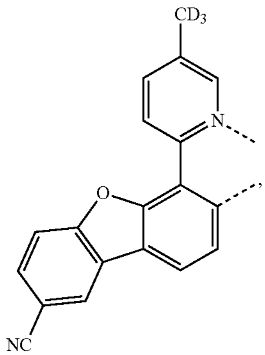
$L_{a305}$
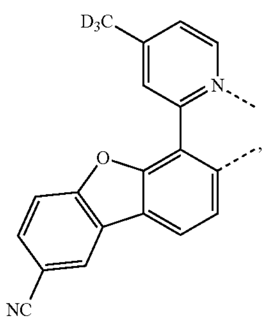
$L_{a306}$
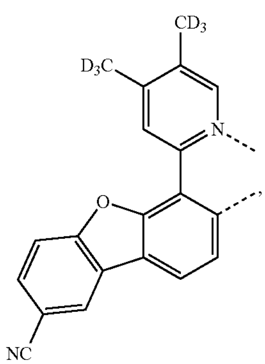
-continued
$L_{a307}$
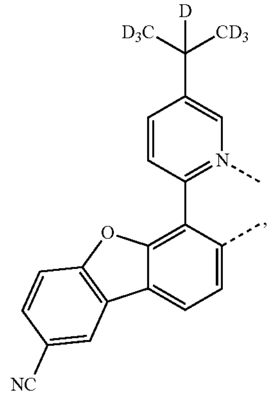
$L_{a308}$
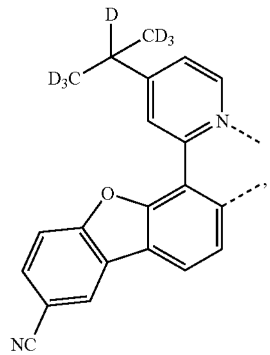
$L_{a309}$
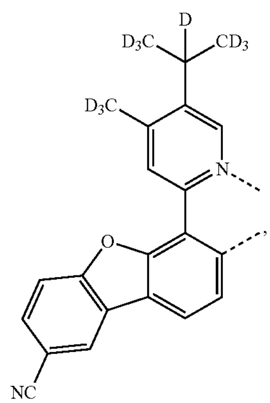
$L_{a310}$
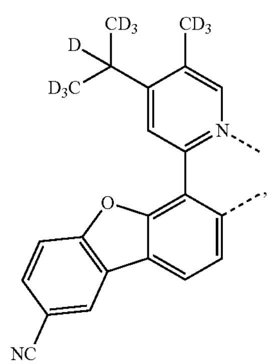

-continued
$L_{a311}$
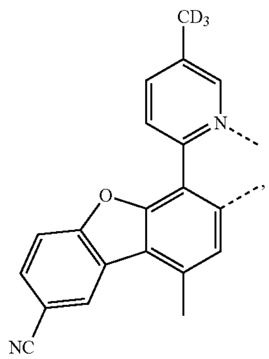
$L_{a312}$
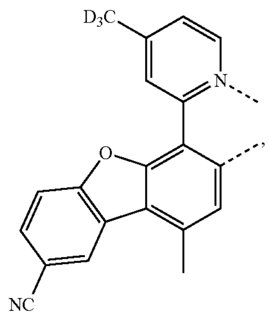
$L_{a313}$
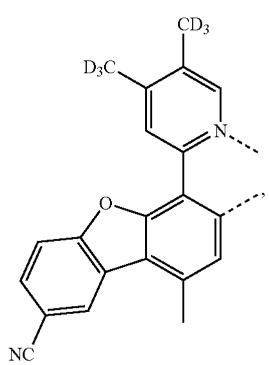
$L_{a314}$
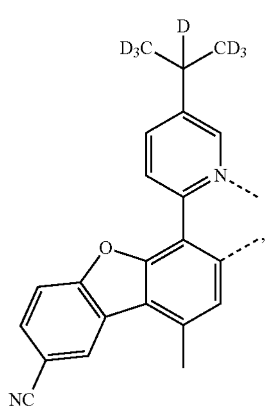
-continued
$L_{a315}$
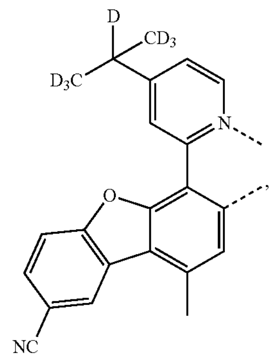
$L_{a316}$
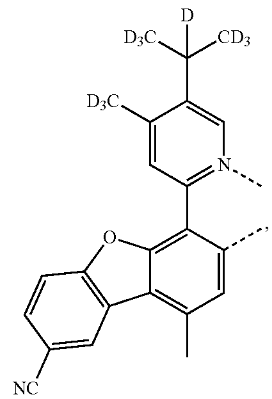
$L_{a317}$
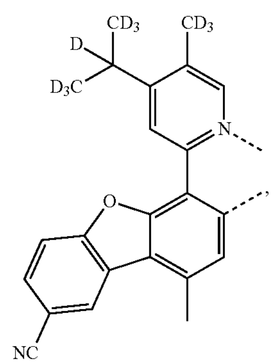
$L_{a318}$
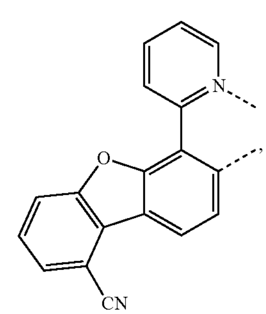

-continued $L_{a319}$

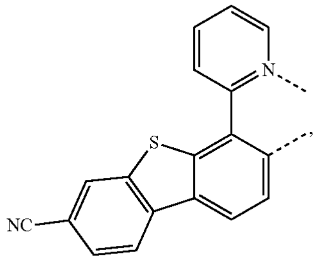

$L_{a320}$

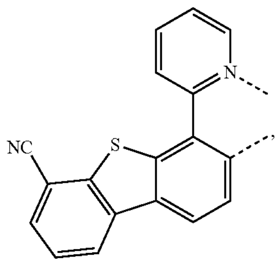

$L_{a321}$

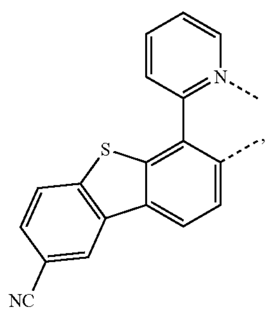

$L_{a322}$

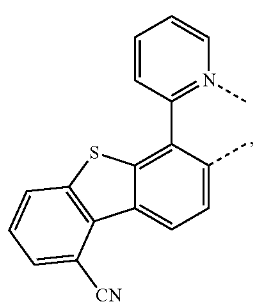

$L_{a323}$

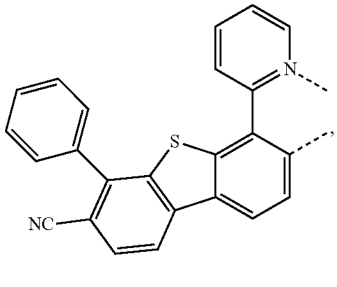

-continued $L_{a324}$

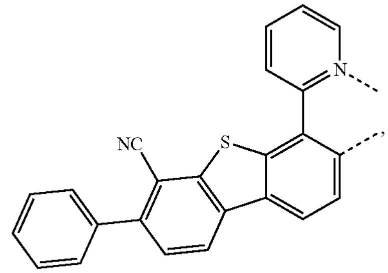

$L_{a325}$

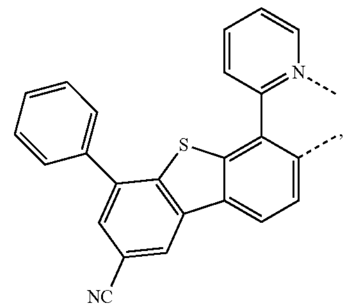

$L_{a326}$

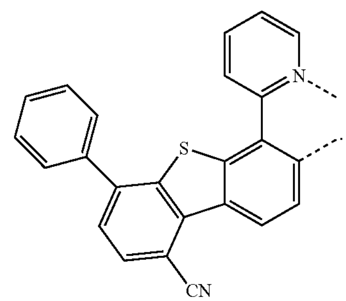

12. The metal complex of claim 1, wherein $R_{a1}$ is, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

13. The metal complex of claim 1, wherein $R_{a1}$ is, at each occurrence identically or differently, selected from halogen, substituted or unsubstituted alkyl having 1 to 20 carbon atoms, substituted or unsubstituted cycloalkyl having 3 to 20 ring carbon atoms or a combination thereof, optionally, hydrogen in the above groups can be partially or fully deuterated;

preferably, $R_{a1}$ is, at each occurrence identically or differently, selected from fluorine, methyl, ethyl, propyl, isopropyl, butyl, isobutyl, t-butyl, pentyl, neopentyl, cyclopentyl, cyclohexyl or a combination thereof, optionally, hydrogen in the above groups can be partially or fully deuterated;

more preferably, $R_{a1}$ is selected from methyl or deuterated methyl.

14. The metal complex of claim 1, wherein $R_{a2}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms and combinations thereof;

preferably, $R_{a2}$ is, at each occurrence identically or differently, selected from hydrogen, deuterium, fluorine, methyl, ethyl, propyl, isopropyl, butyl, isobutyl, t-butyl, pentyl, neopentyl, cyclopentyl, cyclohexyl, phenyl or a combination thereof, optionally, hydrogen in the above groups can be partially or fully deuterated;

more preferably, $R_{a2}$ is selected from hydrogen, deuterium, methyl or deuterated methyl.

15. The metal complex of claim 1, wherein $R_{a1}$ and $R_{a2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms and combinations thereof; and at least one of $R_{a1}$ and $R_{a2}$ is selected from the group consisting of: halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms and combinations thereof, preferably, $R_{a1}$ is selected from substituted or unsubstituted alkyl having 1 to 10 carbon atoms, and $R_{a2}$ is hydrogen or deuterium; or $R_{a2}$ is selected from substituted or unsubstituted alkyl having 1 to 10 carbon atoms or substituted or unsubstituted aryl having 6 to 12 carbon atoms, and $R_{a1}$ is hydrogen or deuterium.

16. The metal complex of claim 1, wherein $R_{a3}$ is, at each occurrence identically or differently, selected from the group consisting of: hydrogen, deuterium, halogen, cyano, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms and combinations thereof, preferably, $R_{a3}$ is, at each occurrence identically or differently, selected from the group consisting of: hydrogen, deuterium, fluorine, cyano, substituted or unsubstituted alkyl having 1 to 6 carbon atoms, substituted or unsubstituted cycloalkyl having 3 to 6 ring carbon atoms, substituted or unsubstituted aryl having 6 to 18 carbon atoms, substituted or unsubstituted heteroaryl having 3 to 18 carbon atoms, substituted or unsubstituted alkylsilyl having 3 to 10 carbon atoms and combinations thereof, more preferably, $R_{a3}$ is, at each occurrence identically or differently, selected from hydrogen, deuterium, fluorine, cyano, methyl, deuterated methyl, isopropyl, deuterated isopropyl, t-butyl, deuterated t-butyl, cyclopentyl, deuterated cyclopentyl, cyclohexyl, deuterated cyclohexyl, trimethylsilyl, phenyl or a combination thereof.

17. The metal complex of claim 1, wherein the ring Ar is selected from substituted or unsubstituted aryl having 6 to 12 carbon atoms, substituted or unsubstituted heteroaryl having 3 to 12 carbon atoms or a combination thereof, preferably, the ring Ar is substituted or unsubstituted phenyl;

more preferably, the ring Ar is unsubstituted phenyl.

18. The metal complex of claim 1, wherein $R_1$ and $R_2$ are, at each occurrence identically or differently, selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms or a combination thereof.

19. The metal complex of claim 11, wherein $L_b$ is, at each occurrence identically or differently, selected from the group consisting of the following:

$L_{b1}$

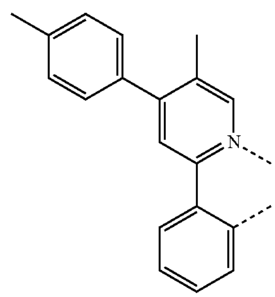

$L_{b2}$

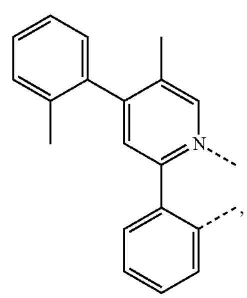

$L_{b3}$

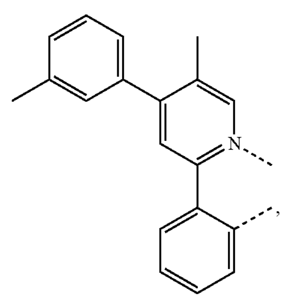

$L_{b4}$

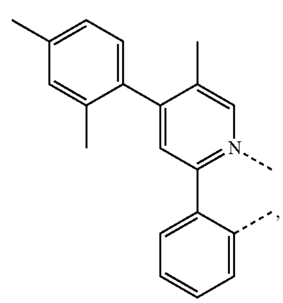

-continued
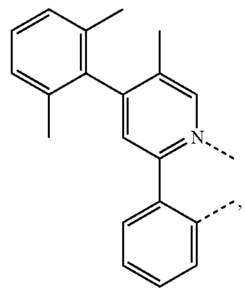
$L_{b5}$
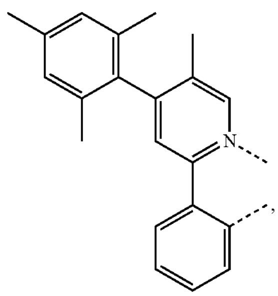
$L_{b6}$
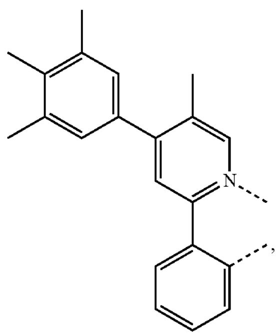
$L_{b7}$
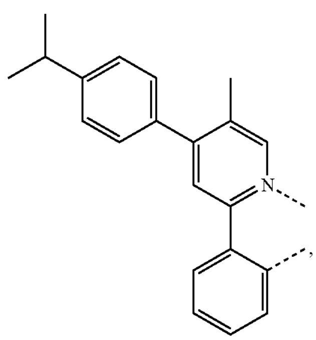
$L_{b8}$
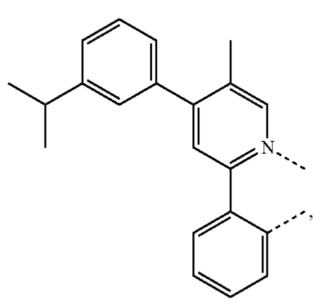
$L_{b9}$
-continued
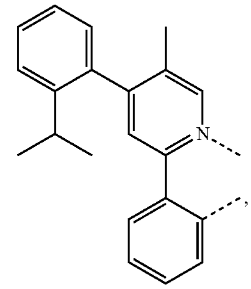
$L_{b10}$
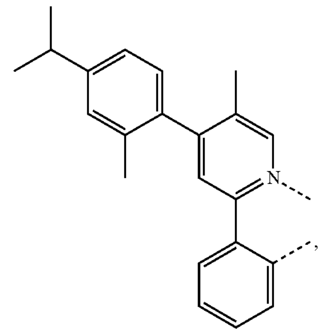
$L_{b11}$
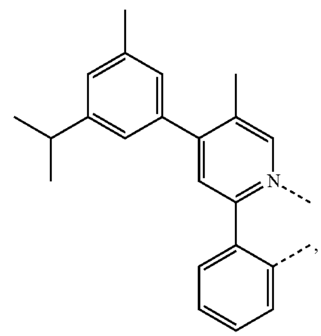
$L_{b12}$
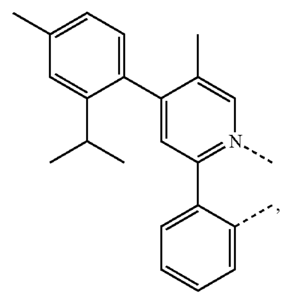
$L_{b13}$
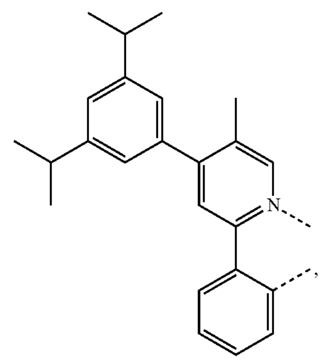
$L_{b14}$ $L_{b15}$
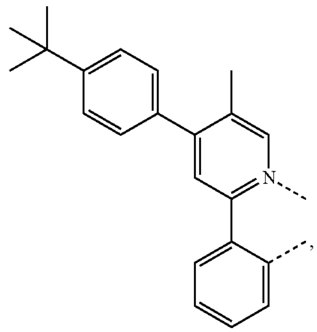
$L_{b16}$
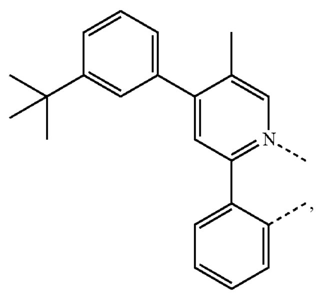
$L_{b17}$
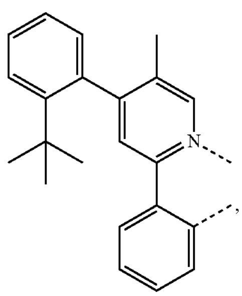
$L_{b18}$
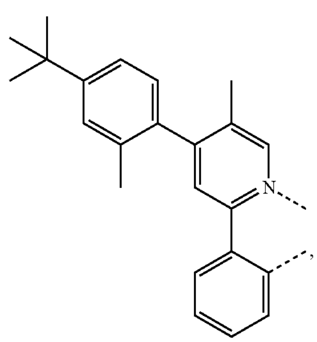
$L_{b19}$
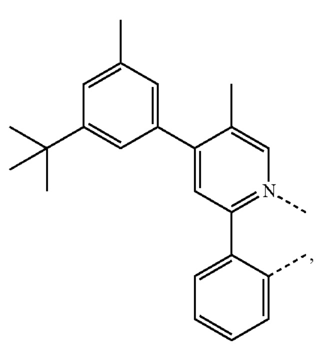
$L_{b20}$
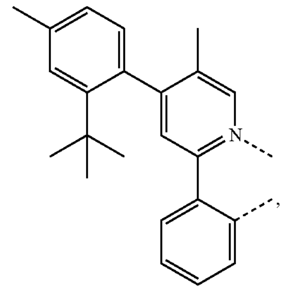
$L_{b21}$
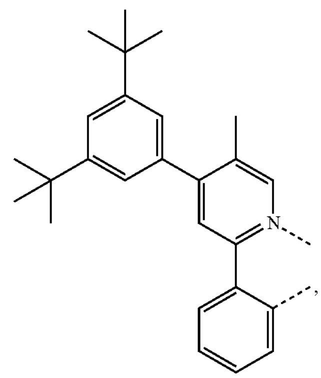
$L_{b22}$
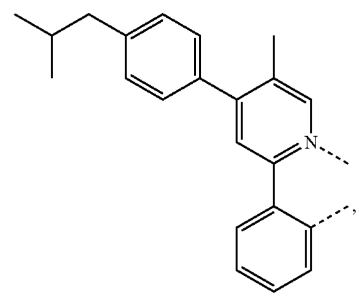
$L_{b23}$
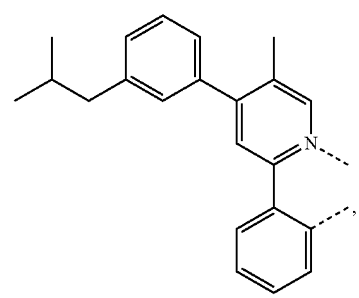
$L_{b24}$
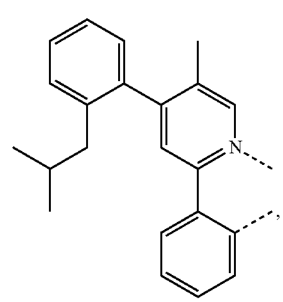

-continued
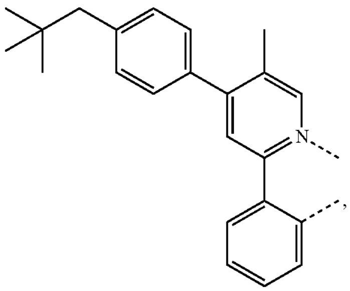
$L_{b25}$
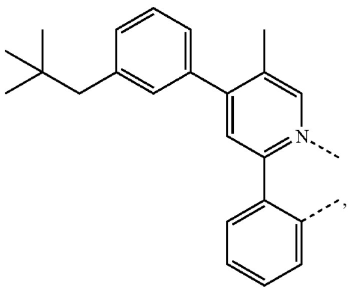
$L_{b26}$
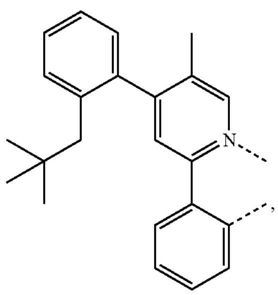
$L_{b27}$
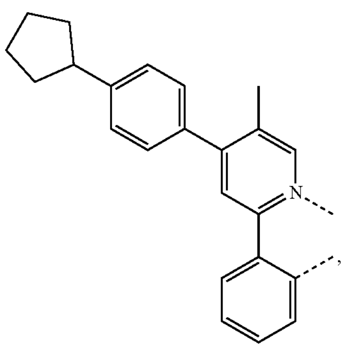
$L_{b28}$
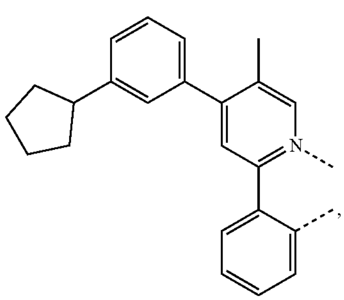
$L_{b29}$
-continued
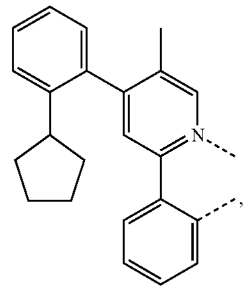
$L_{b30}$
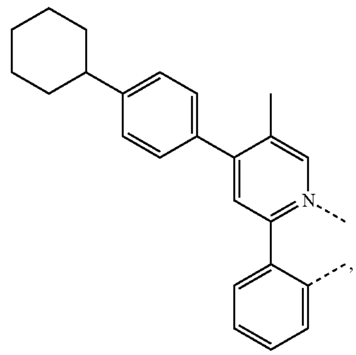
$L_{b31}$
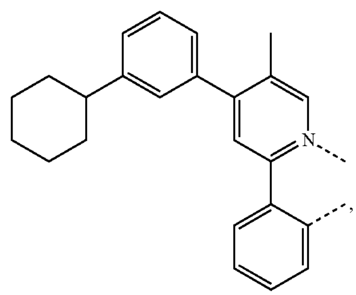
$L_{b32}$
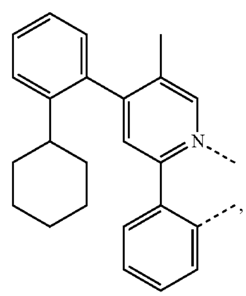
$L_{b33}$
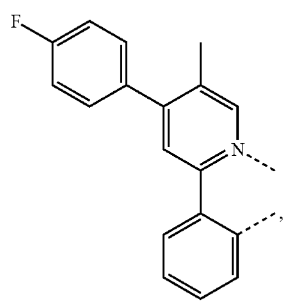
$L_{b34}$ $L_{b35}$
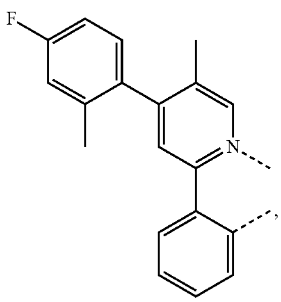
$L_{b36}$
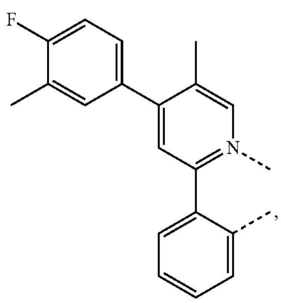
$L_{b37}$
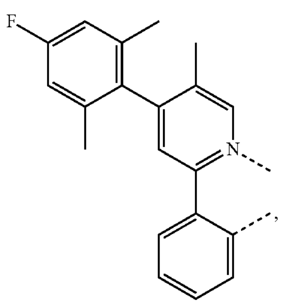
$L_{b38}$
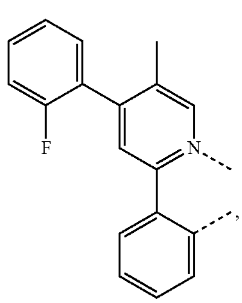
$L_{b39}$
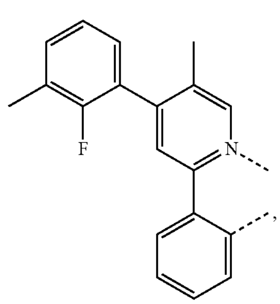
$L_{b40}$
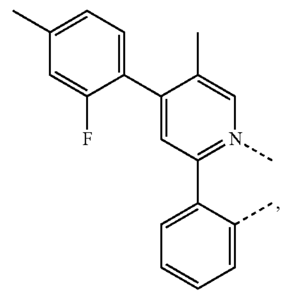
$L_{b41}$
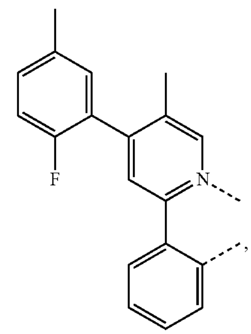
$L_{b42}$
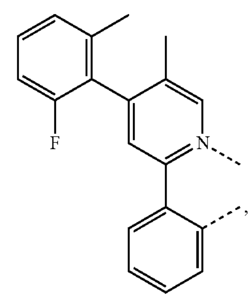
$L_{b43}$
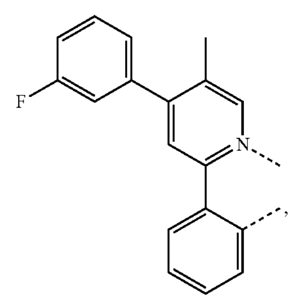
$L_{b44}$
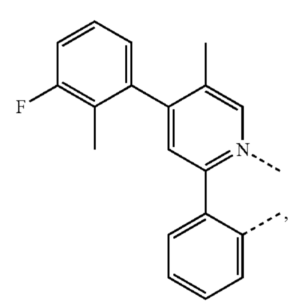

-continued
$L_{b45}$
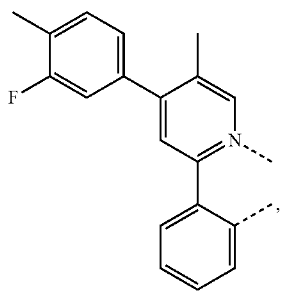
$L_{b46}$
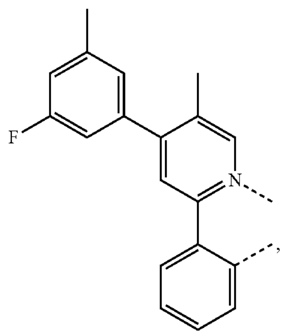
$L_{b47}$
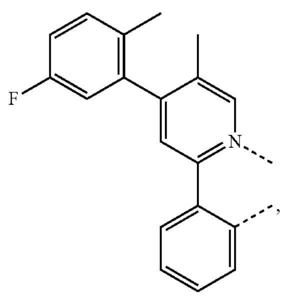
$L_{b48}$
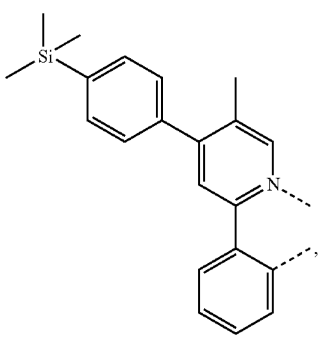
$L_{b49}$
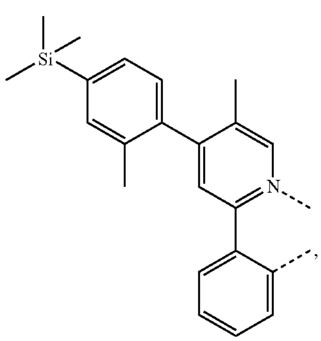
-continued
$L_{b50}$
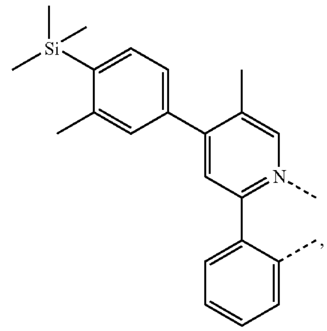
$L_{b51}$
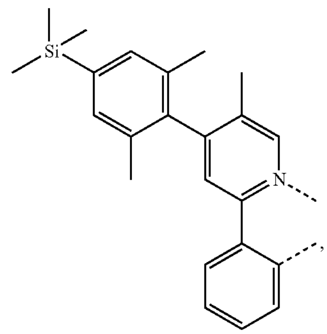
$L_{b52}$
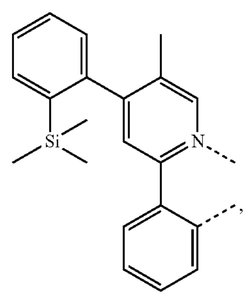
$L_{b53}$
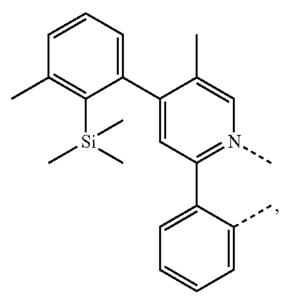
$L_{b54}$
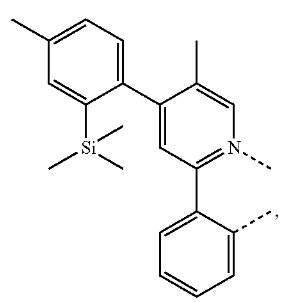

-continued
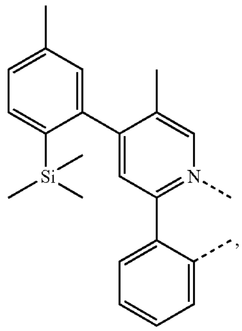
$L_{b55}$
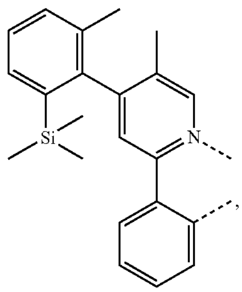
$L_{b56}$
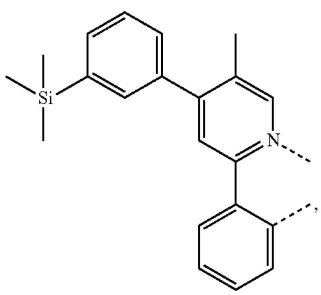
$L_{b57}$
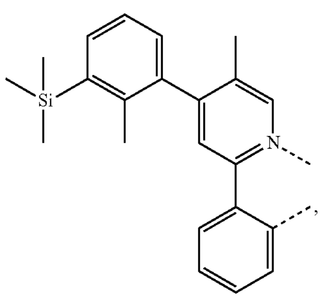
$L_{b58}$
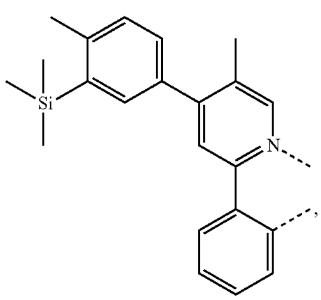
$L_{b59}$
-continued
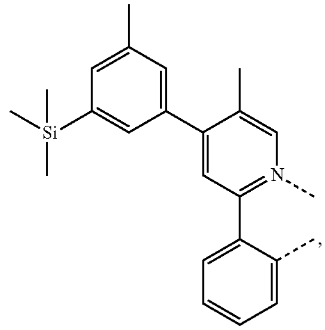
$L_{b60}$
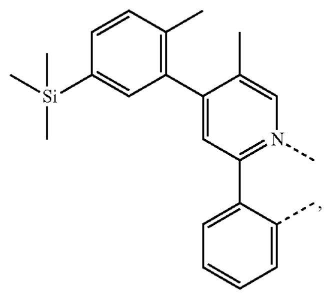
$L_{b61}$
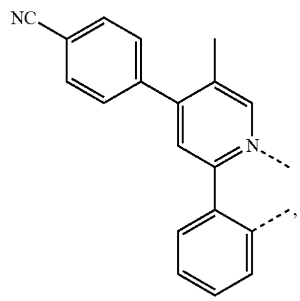
$L_{b62}$
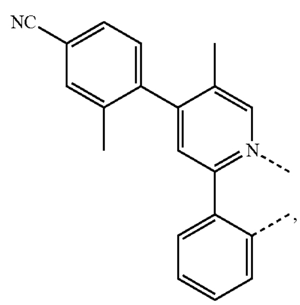
$L_{b63}$
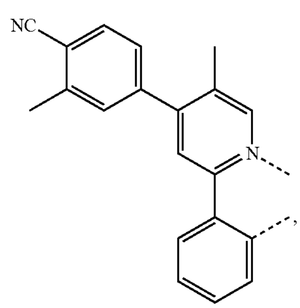
$L_{b64}$ $L_{b65}$
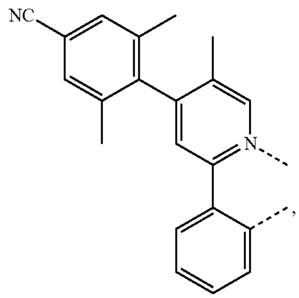
$L_{b66}$
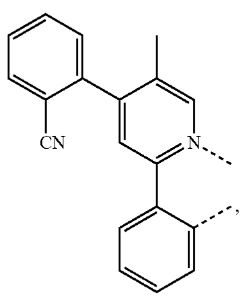
$L_{b67}$
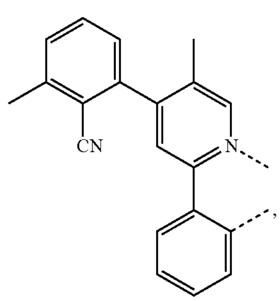
$L_{b68}$
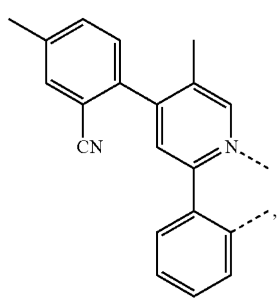
$L_{b69}$
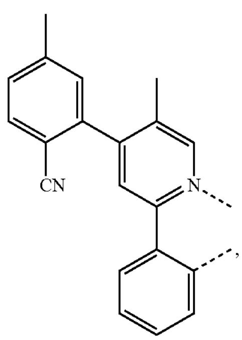
$L_{b70}$
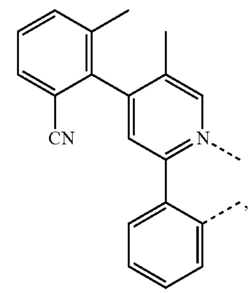
$L_{b71}$
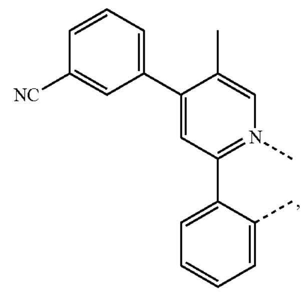
$L_{b72}$
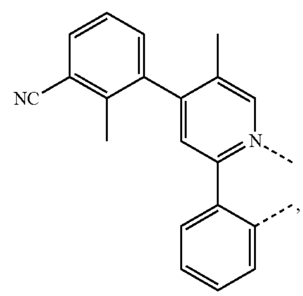
$L_{b73}$
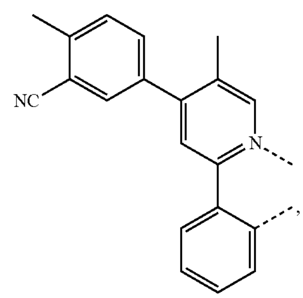
$L_{b74}$
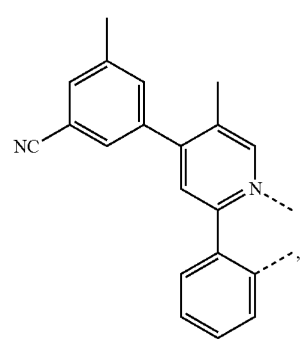

-continued
$L_{b75}$
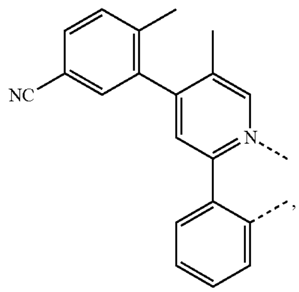
$L_{b76}$
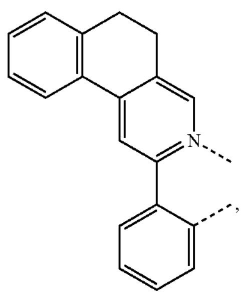
$L_{b77}$
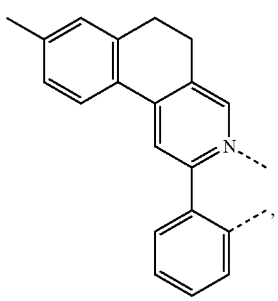
$L_{b78}$
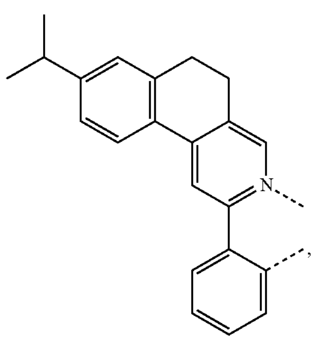
$L_{b79}$
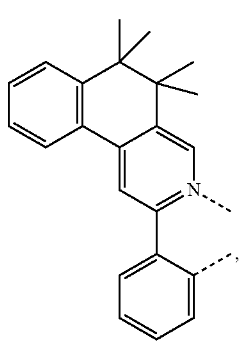
-continued
$L_{b80}$
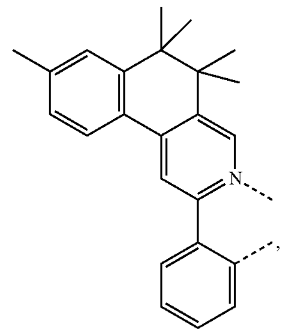
$L_{b81}$
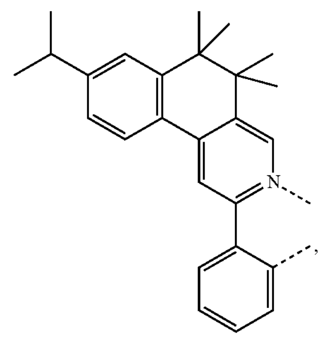
$L_{b82}$
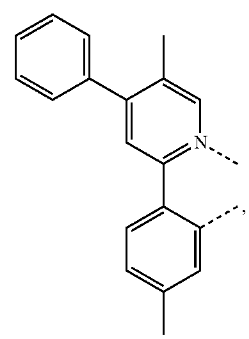
$L_{b83}$
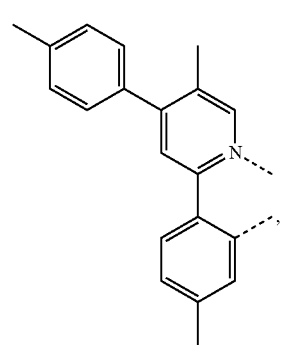

-continued
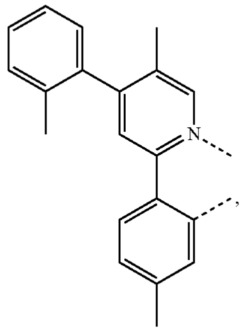
$L_{b84}$
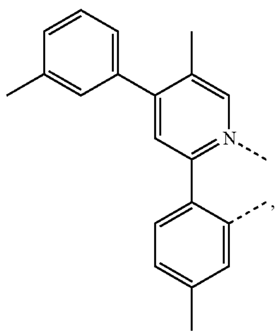
$L_{b85}$
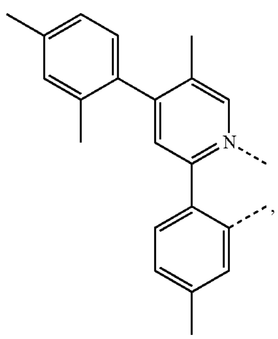
$L_{b86}$
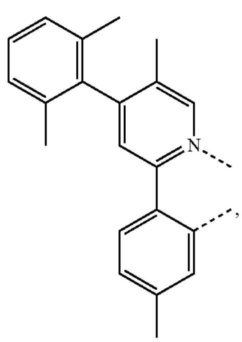
$L_{b87}$
-continued
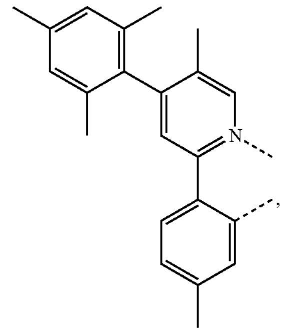
$L_{b88}$
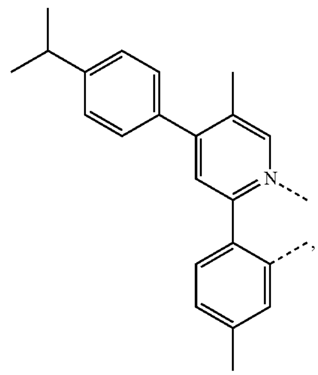
$L_{b89}$
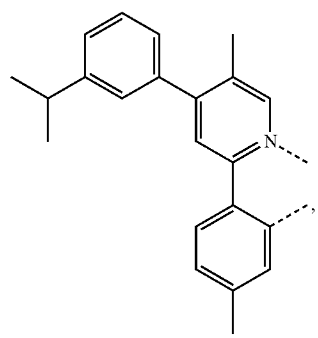
$L_{b90}$
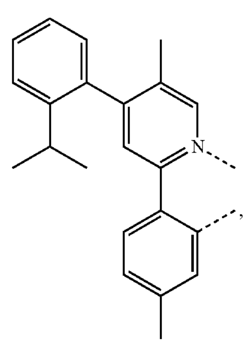
$L_{b91}$ -continued
$L_{b92}$
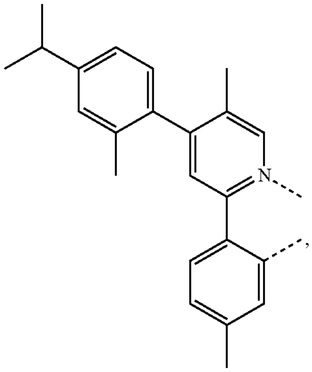
$L_{b93}$
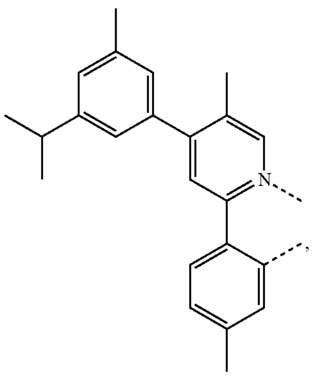
$L_{b94}$
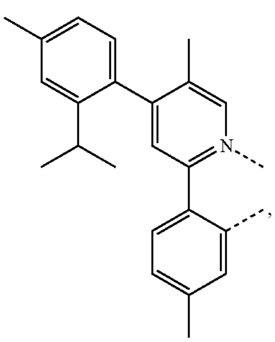
$L_{b95}$
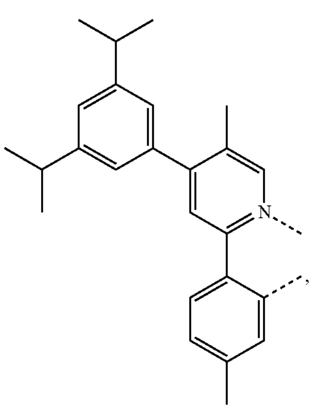
-continued
$L_{b96}$
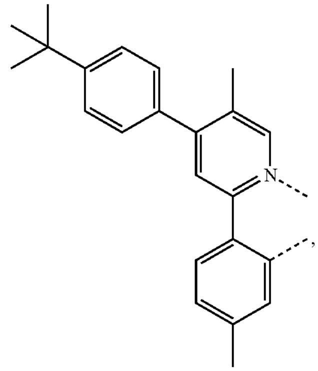
$L_{b97}$
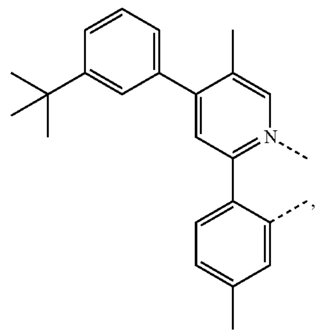
$L_{b98}$
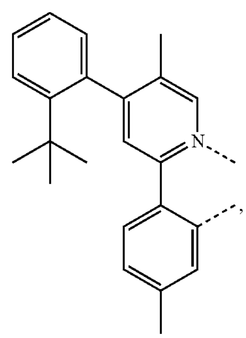
$L_{b99}$
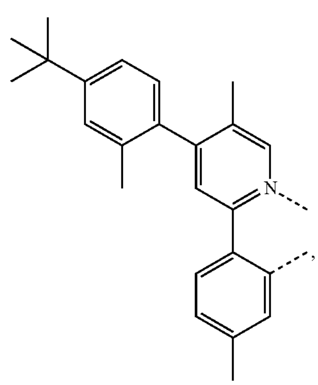

-continued
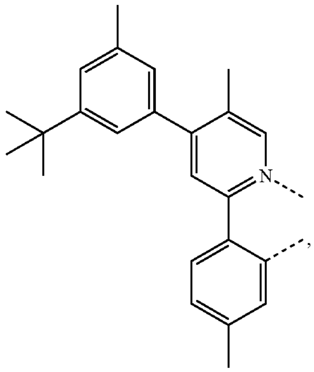
$L_{b100}$
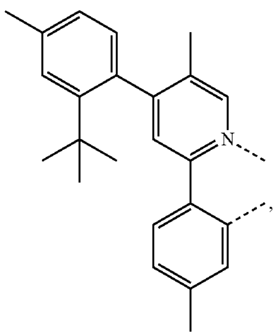
$L_{b101}$
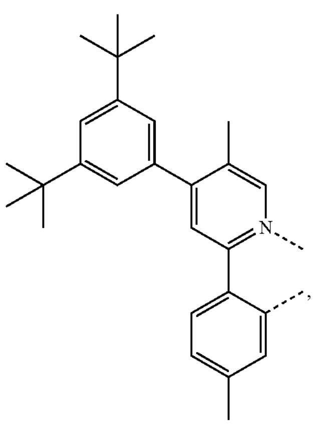
$L_{b102}$
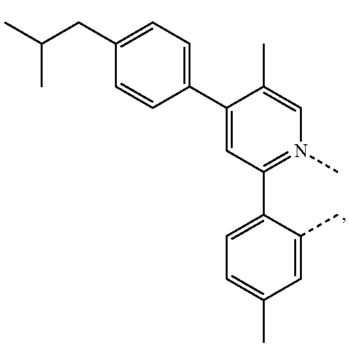
$L_{b103}$
-continued
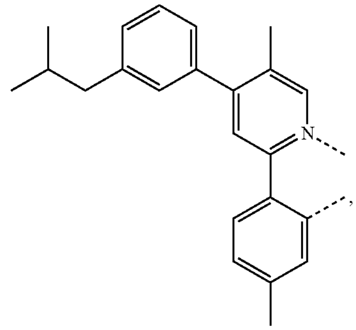
$L_{b104}$
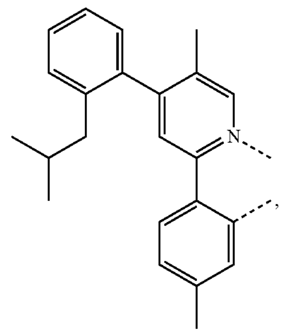
$L_{b105}$
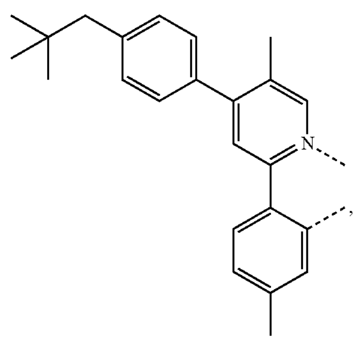
$L_{b106}$
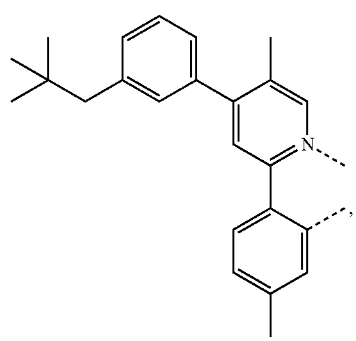
$L_{b107}$ -continued
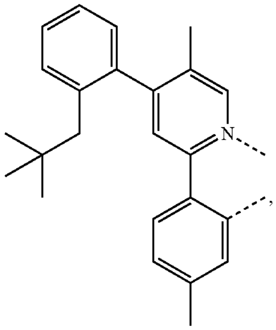
$L_{b108}$
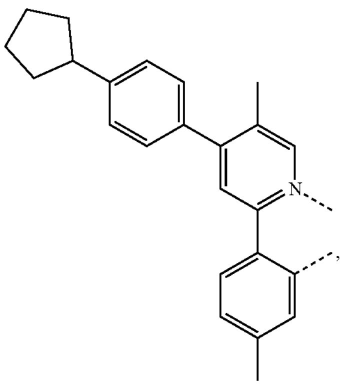
$L_{b109}$
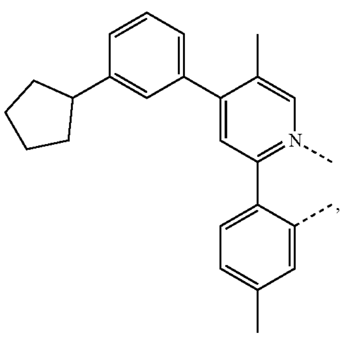
$L_{b110}$
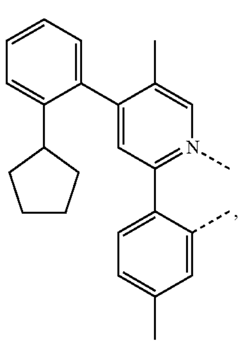
$L_{b111}$
-continued
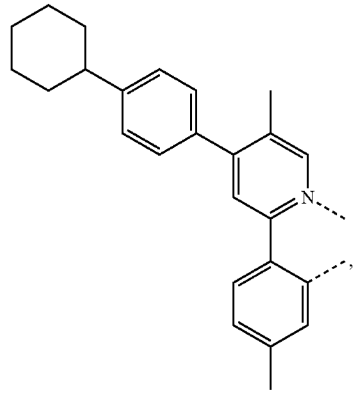
$L_{b112}$
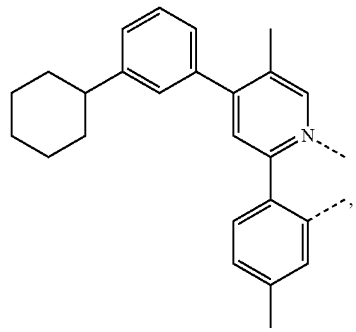
$L_{b113}$
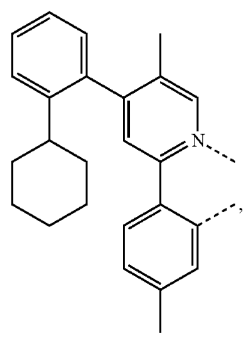
$L_{b114}$
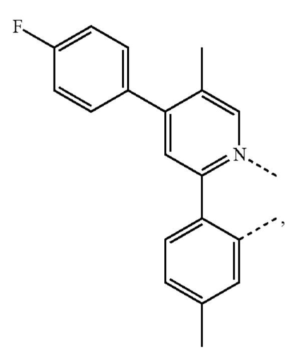
$L_{b115}$ -continued
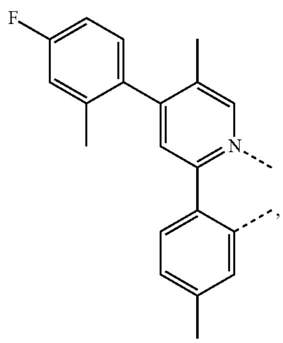
$L_{b116}$
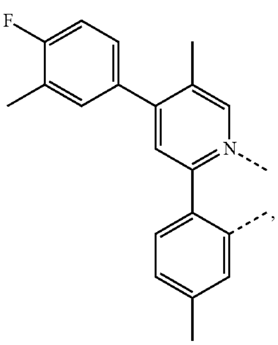
$L_{b117}$
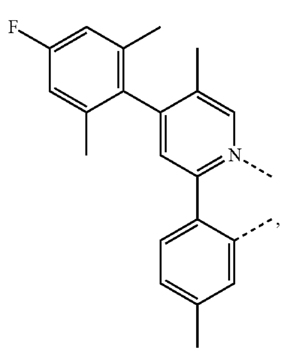
$L_{b118}$
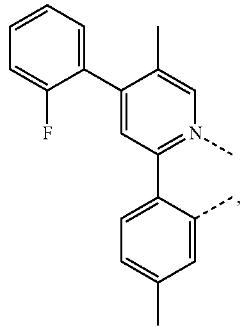
$L_{b119}$
-continued
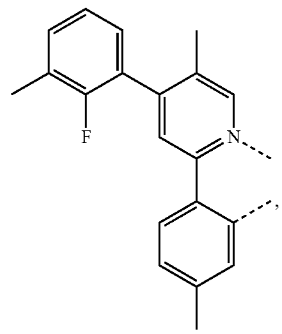
$L_{b120}$
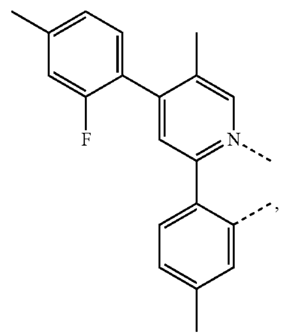
$L_{b121}$
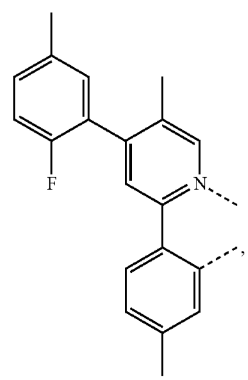
$L_{b122}$
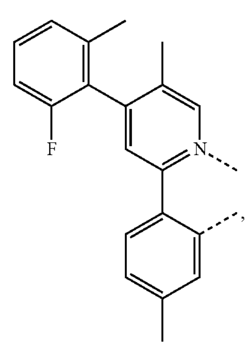
$L_{b123}$

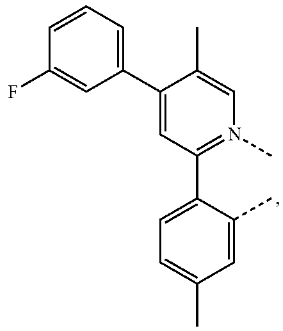
$L_{b124}$
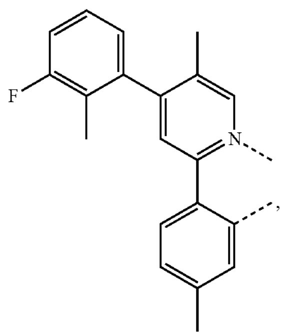
$L_{b125}$
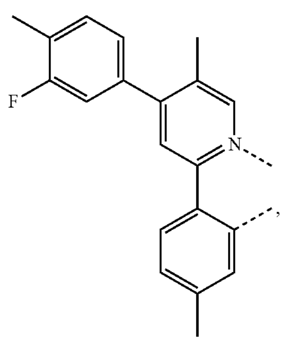
$L_{b126}$
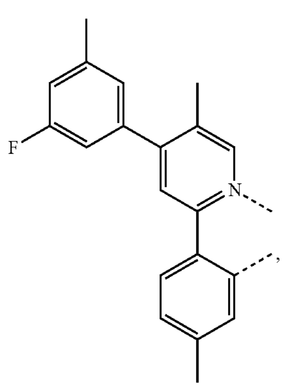
$L_{b127}$
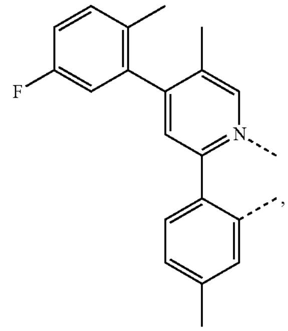
$L_{b128}$
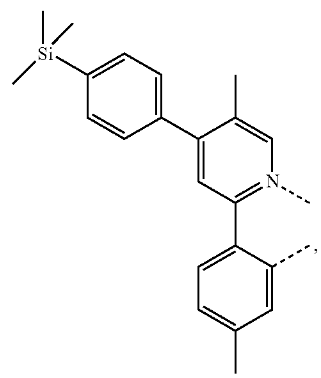
$L_{b129}$
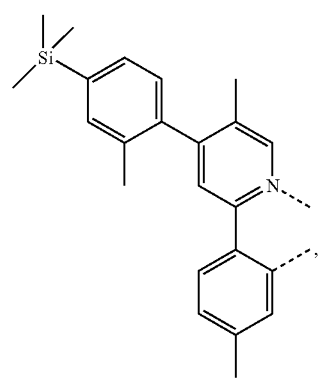
$L_{b130}$
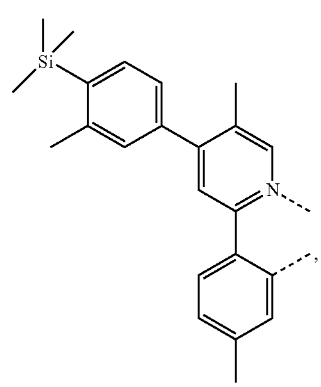
$L_{b131}$ -continued
$L_{b132}$
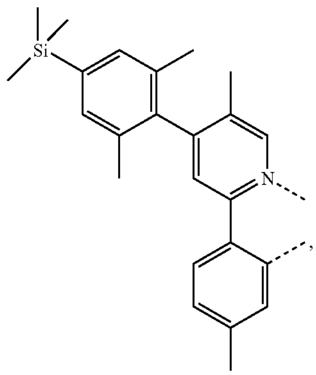
$L_{b133}$
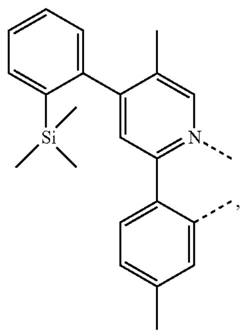
$L_{b134}$
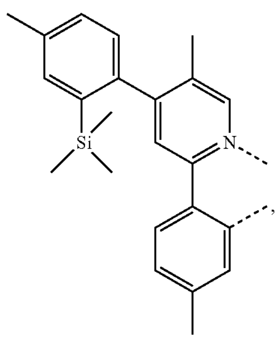
$L_{b135}$
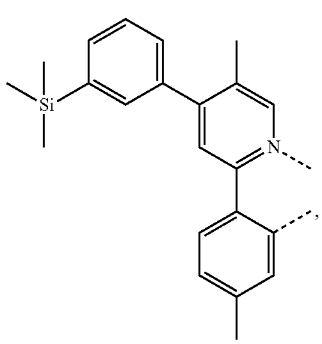
-continued
$L_{b136}$
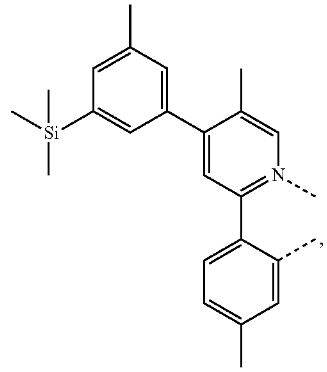
$L_{b137}$
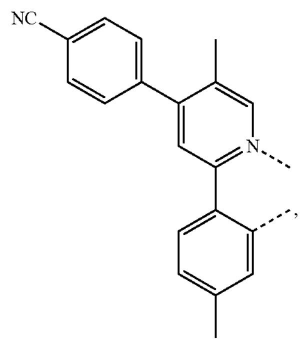
$L_{b138}$
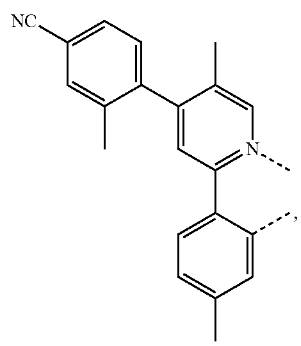
$L_{b139}$
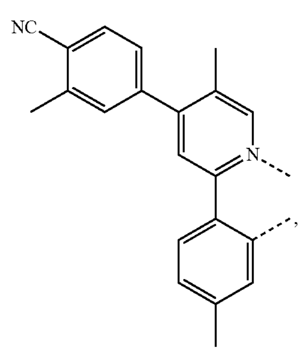

-continued
$L_{b140}$
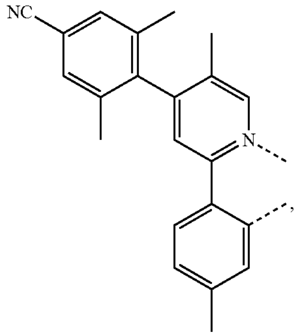
$L_{b141}$
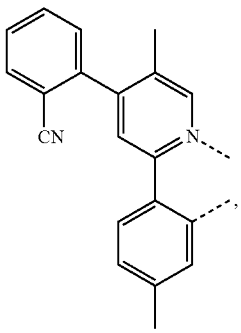
$L_{b142}$
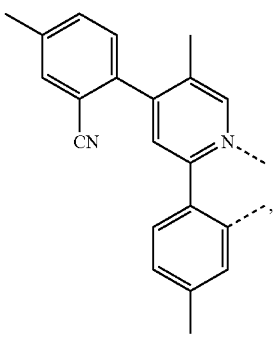
$L_{b143}$
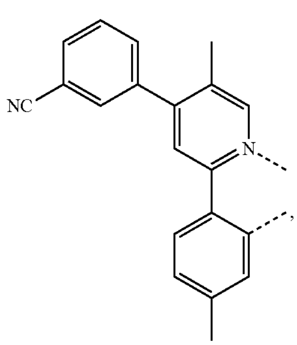
-continued
$L_{b144}$
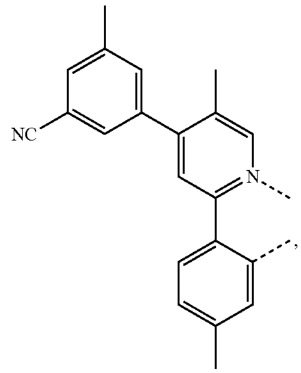
$L_{b145}$
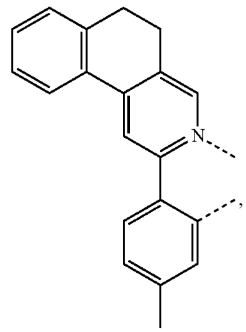
$L_{b146}$
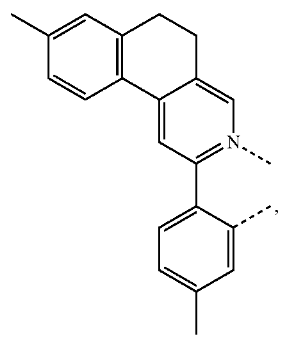
$L_{b147}$
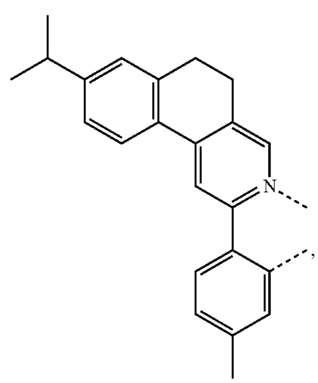

-continued
$L_{b148}$
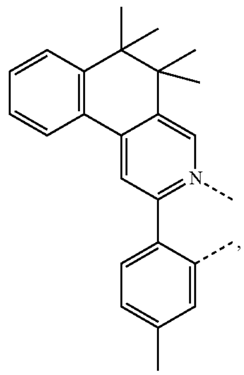
$L_{b149}$
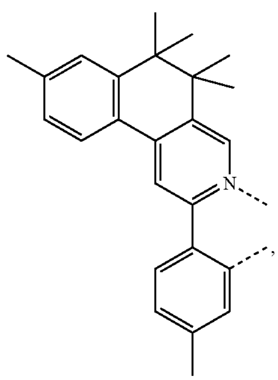
$L_{b150}$
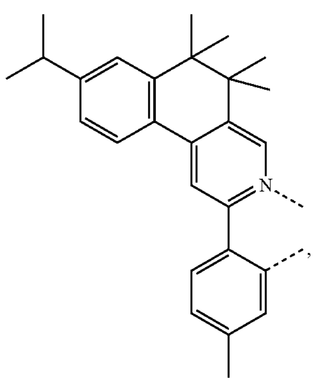
$L_{b151}$
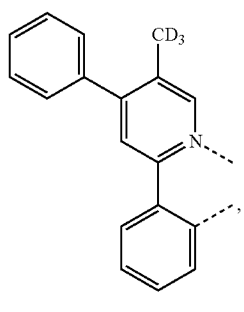
-continued
$L_{b152}$
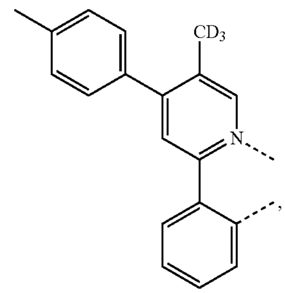
$L_{b153}$
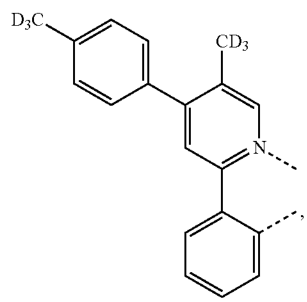
$L_{b154}$
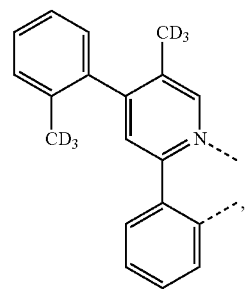
$L_{b155}$
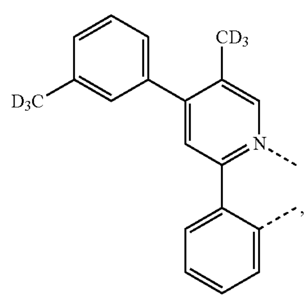
$L_{b156}$
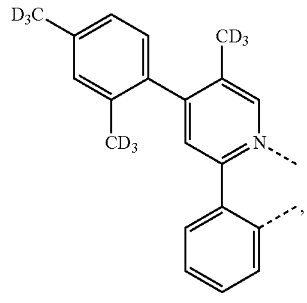

L$_{b157}$
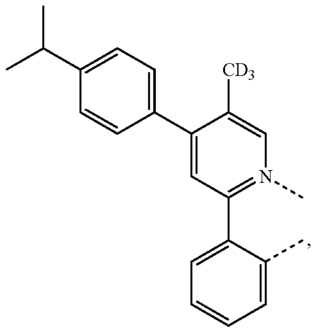
L$_{b158}$
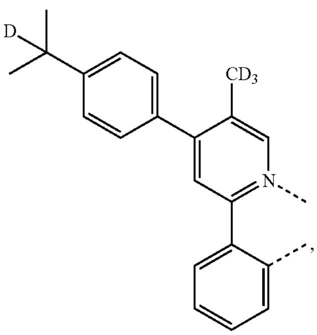
L$_{b159}$
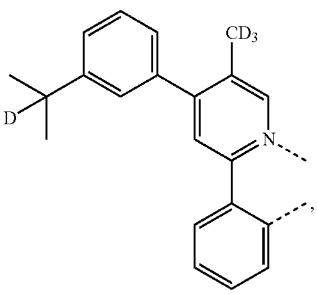
L$_{b160}$
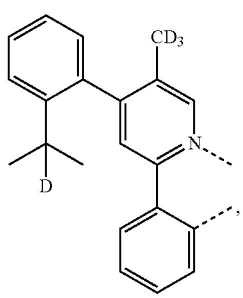
L$_{b161}$
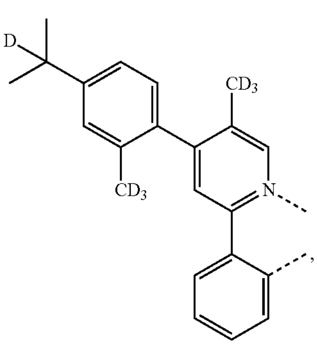
L$_{b162}$
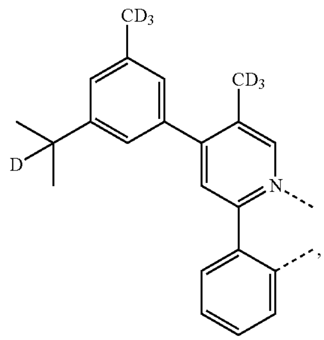
L$_{b163}$
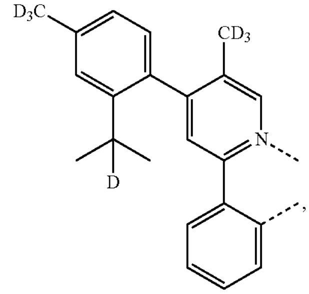
L$_{b164}$
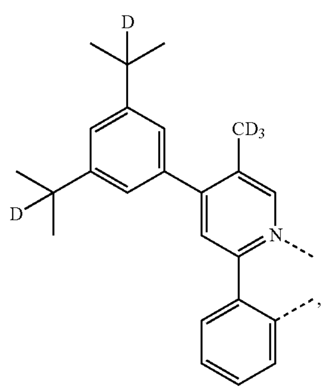
L$_{b165}$
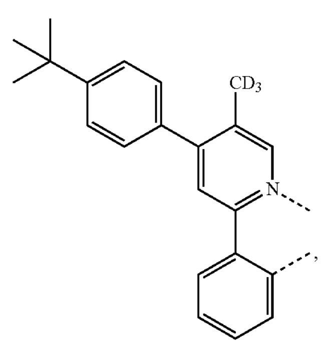

-continued
$L_{b166}$
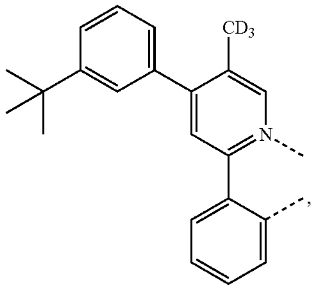
$L_{b167}$
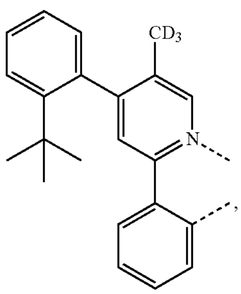
$L_{b168}$
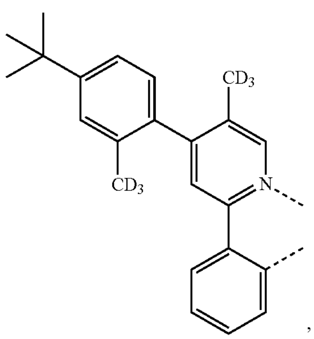
$L_{b169}$
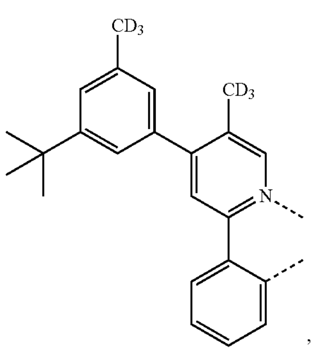
-continued
$L_{b170}$
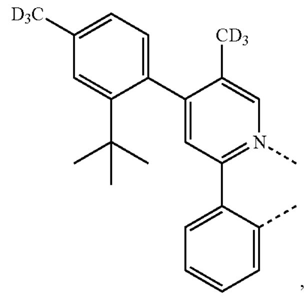
$L_{b171}$
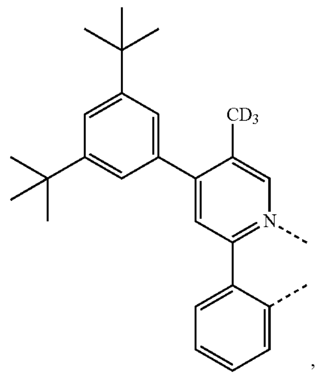
$L_{b172}$
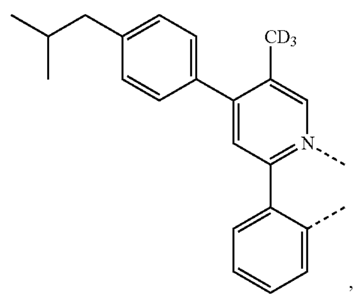
$L_{b173}$
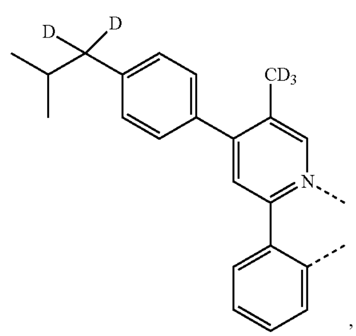
$L_{b174}$
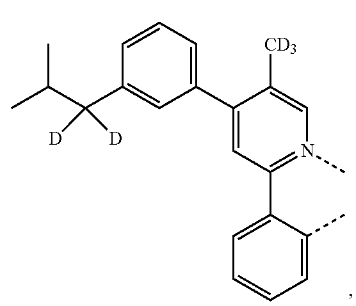

-continued
$L_{b175}$
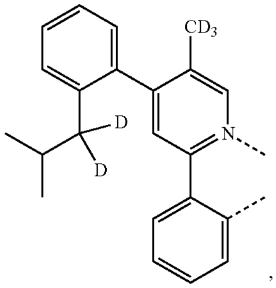
$L_{b176}$
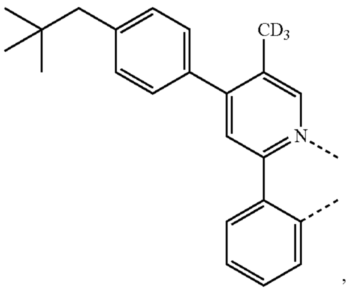
$L_{b177}$
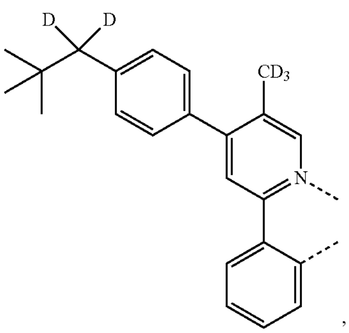
$L_{b178}$
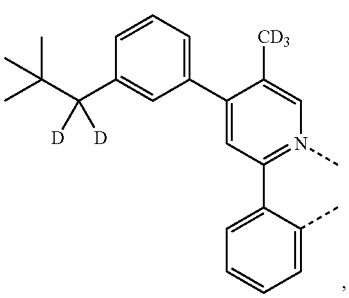
$L_{b179}$
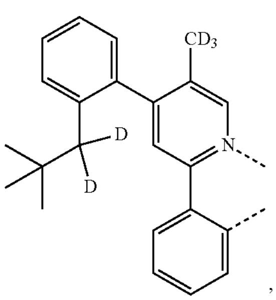
-continued
$L_{b180}$
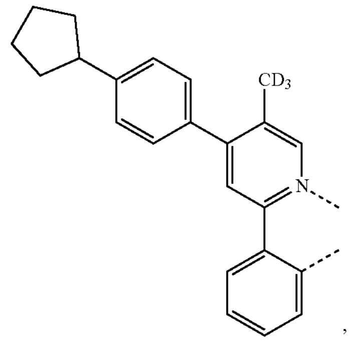
$L_{b181}$
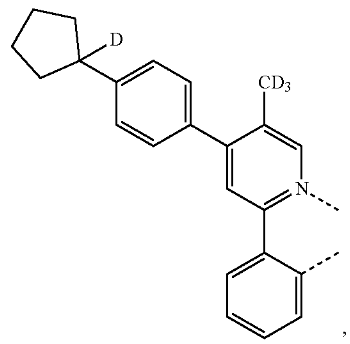
$L_{b182}$
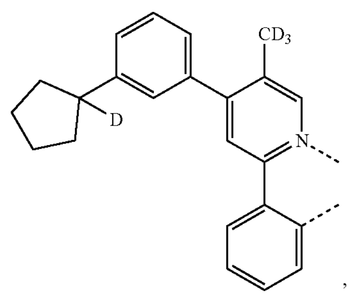
$L_{b183}$
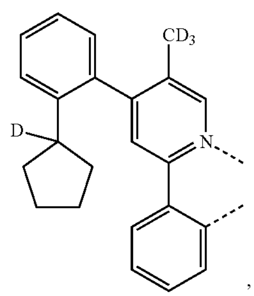
$L_{b184}$
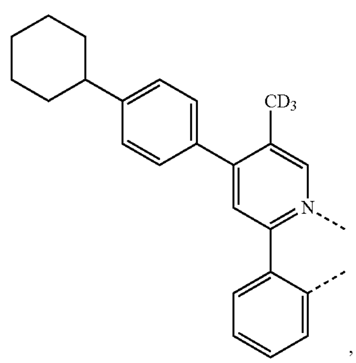

-continued
$L_{b185}$
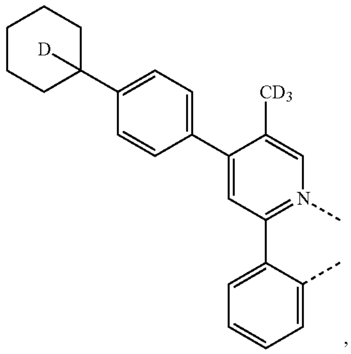
$L_{b186}$
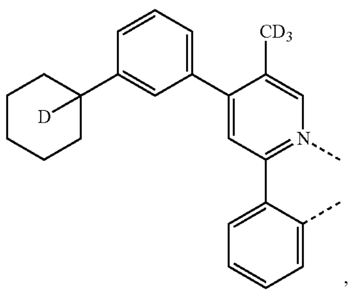
$L_{b187}$
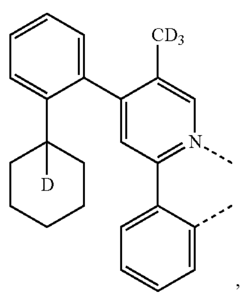
$L_{b188}$
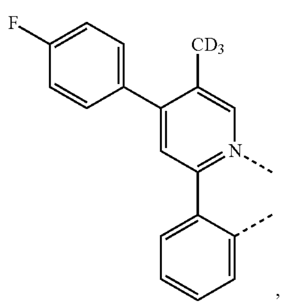
$L_{b189}$
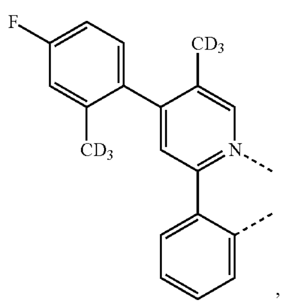
-continued
$L_{b190}$
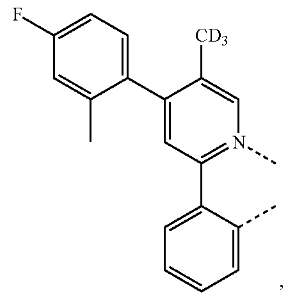
$L_{b191}$
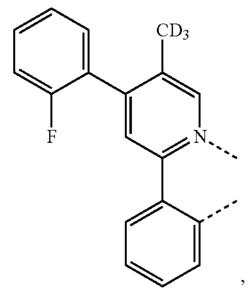
$L_{b192}$
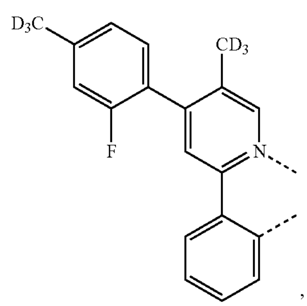
$L_{b193}$
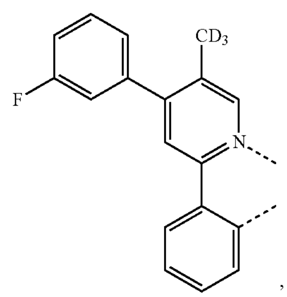
$L_{b194}$
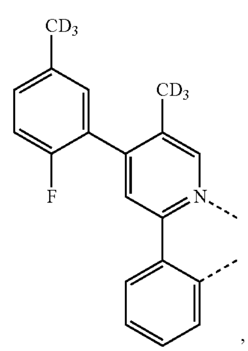

-continued
$L_{b195}$
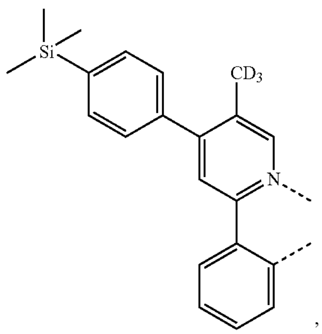
$L_{b196}$
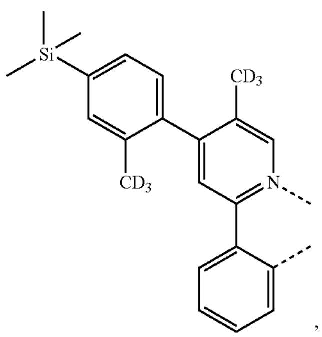
$L_{b197}$
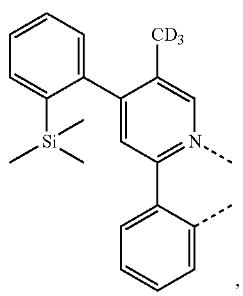
$L_{b198}$
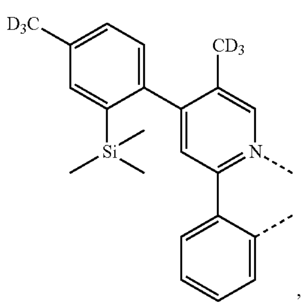
$L_{b199}$
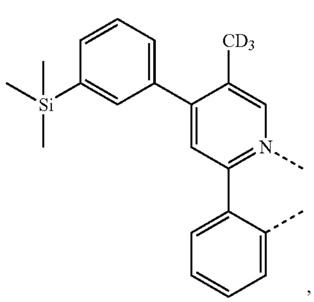
-continued
$L_{b200}$
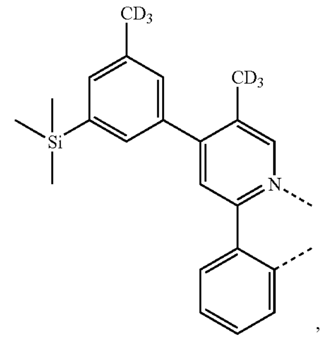
$L_{b201}$
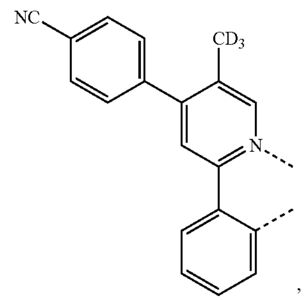
$L_{b202}$
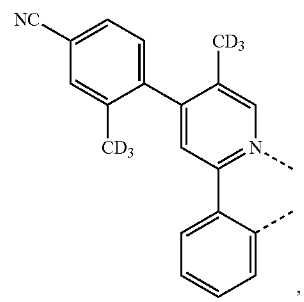
$L_{b203}$
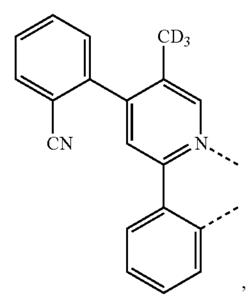
$L_{b204}$
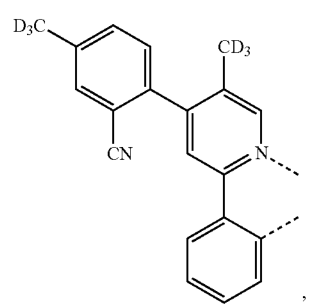

$L_{b205}$
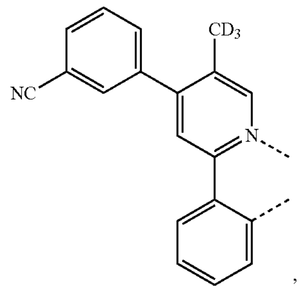
$L_{b206}$
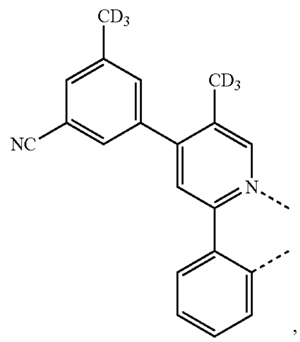
$L_{b207}$
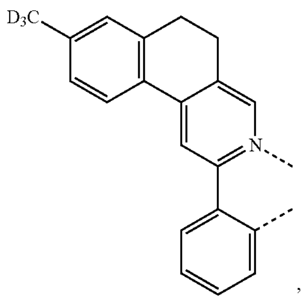
$L_{b208}$
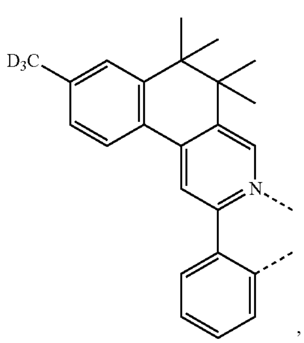
$L_{b209}$
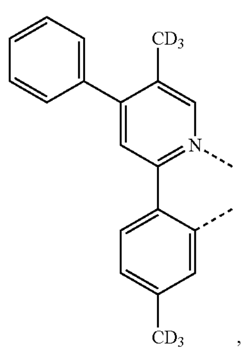
$L_{b210}$
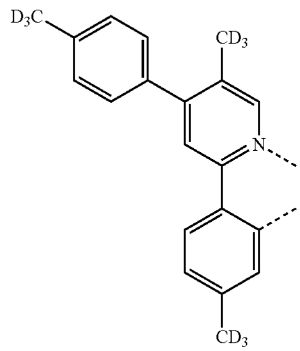
$L_{b211}$
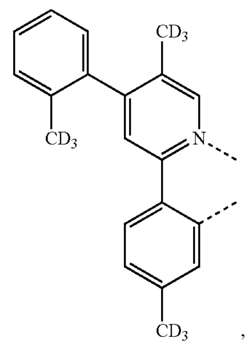
$L_{b212}$
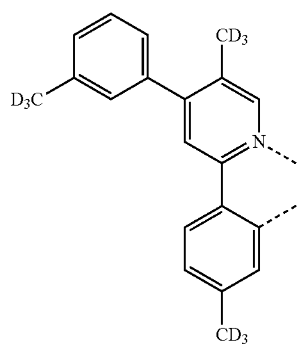
$L_{b213}$
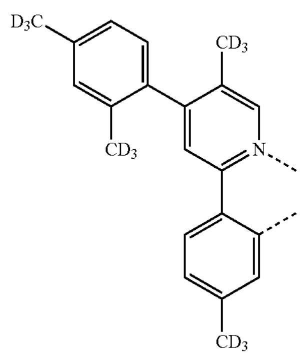

-continued
$L_{b214}$
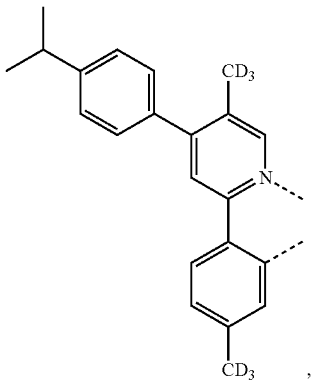
$L_{b215}$
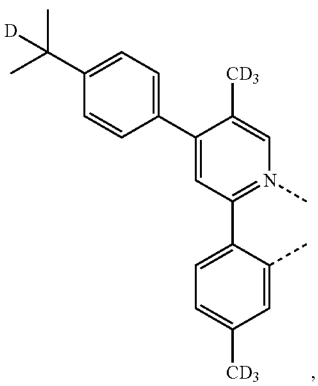
$L_{b216}$
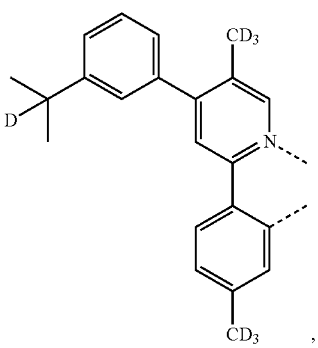
$L_{b217}$
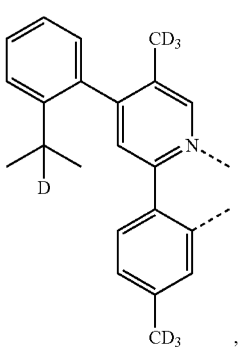
-continued
$L_{b218}$
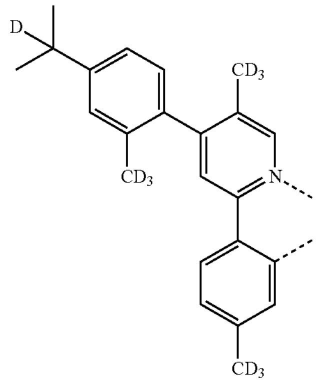
$L_{b219}$
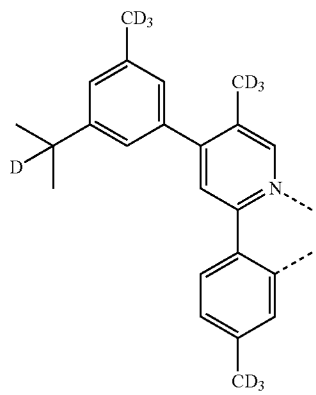
$L_{b220}$
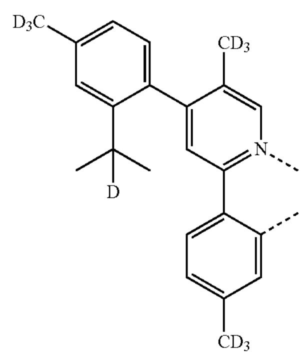
$L_{b221}$
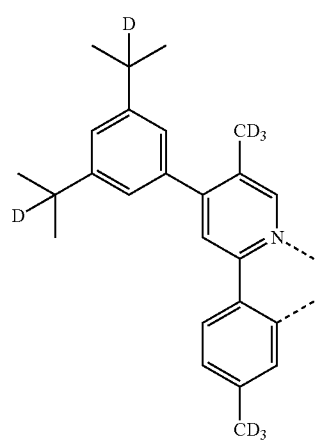

-continued
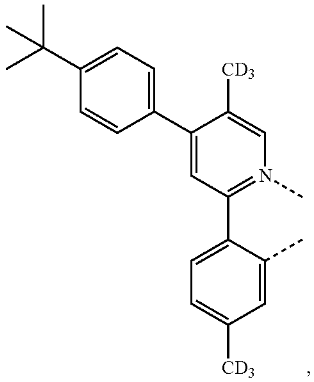
$L_{b222}$
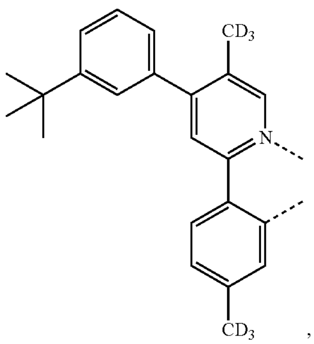
$L_{b223}$
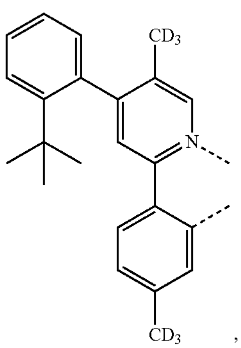
$L_{b224}$
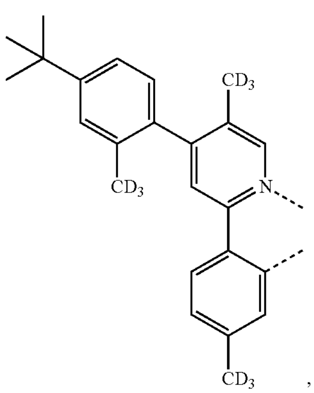
$L_{b225}$
-continued
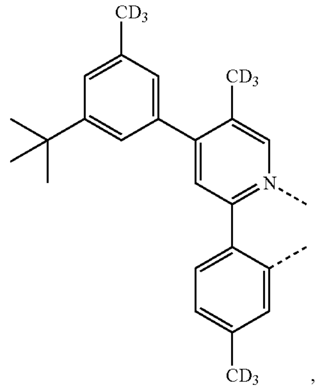
$L_{b226}$
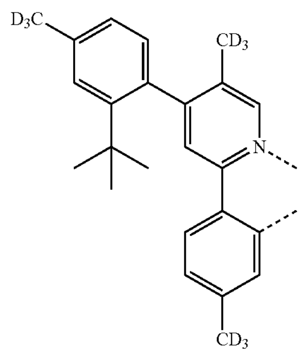
$L_{b227}$
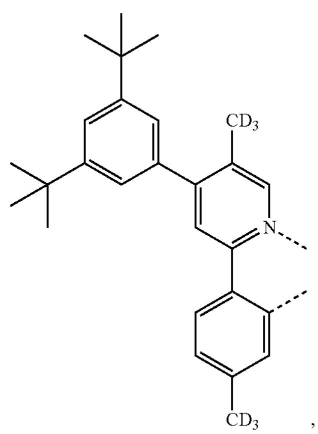
$L_{b228}$
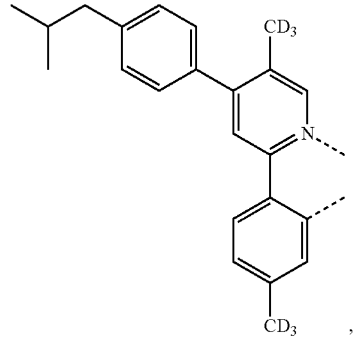
$L_{b229}$ -continued
$L_{b230}$
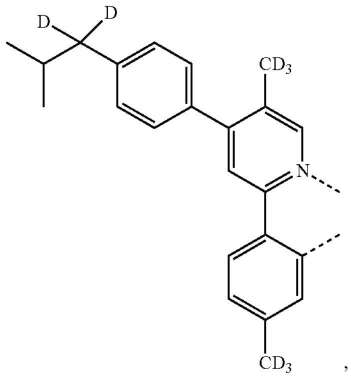
$L_{b231}$
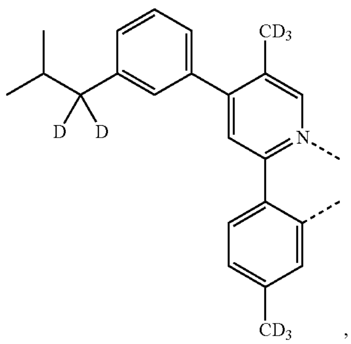
$L_{b232}$
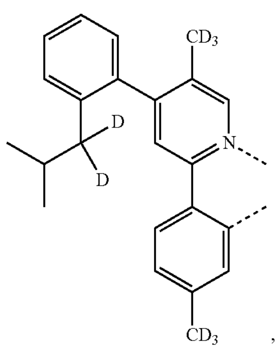
$L_{b233}$
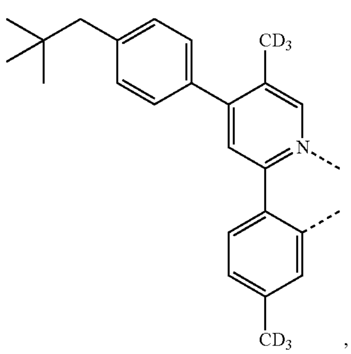
-continued
$L_{b234}$
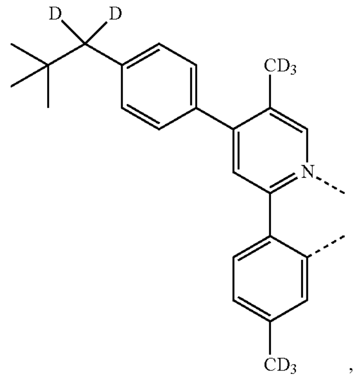
$L_{b235}$
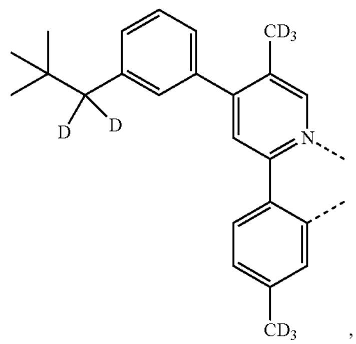
$L_{b236}$
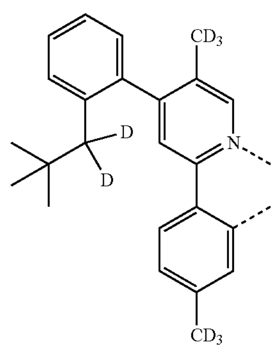
$L_{b237}$
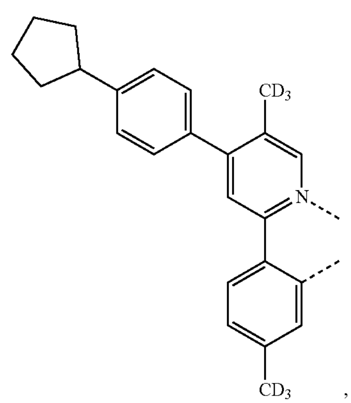

-continued
$L_{b238}$
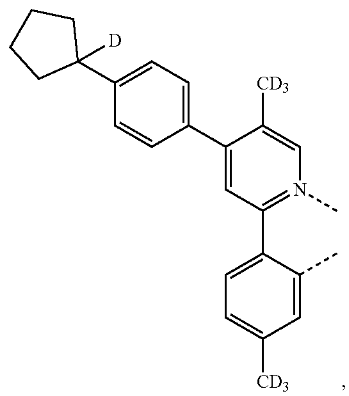
$L_{b239}$
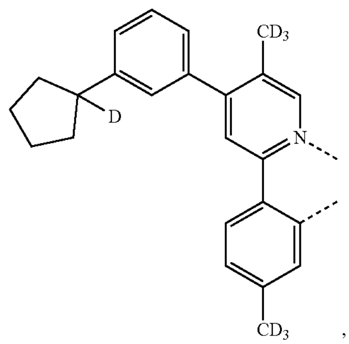
$L_{b240}$
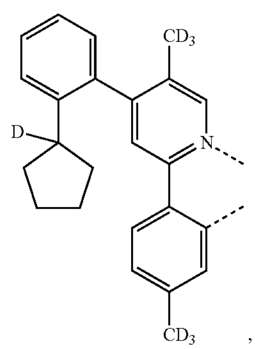
$L_{b241}$
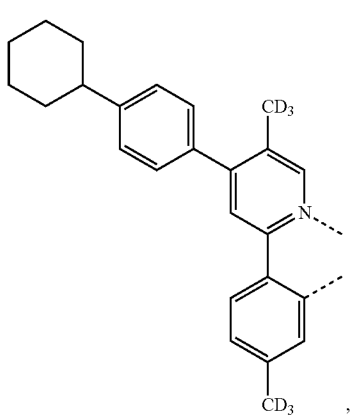
-continued
$L_{b242}$
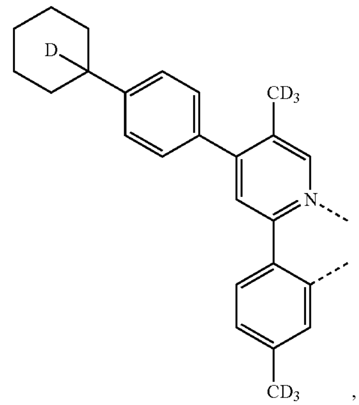
$L_{b243}$
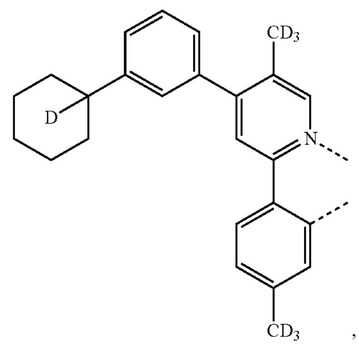
$L_{b244}$
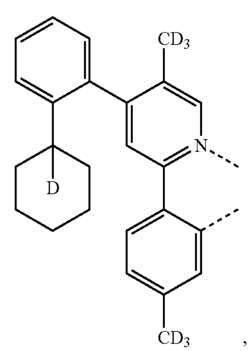
$L_{b245}$
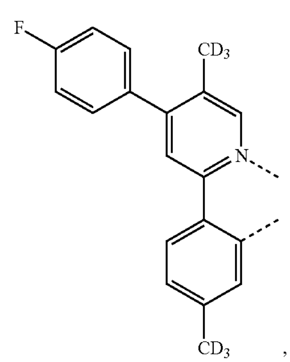

-continued
$L_{b246}$
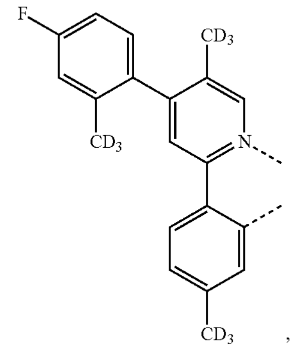
$L_{b247}$
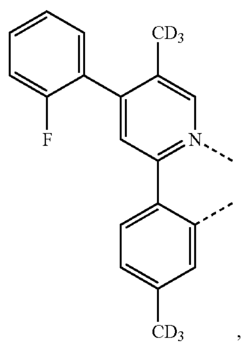
$L_{b248}$
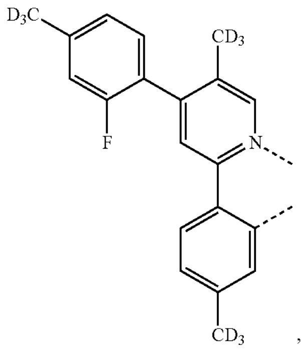
$L_{b249}$
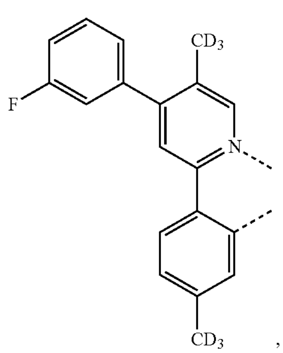
-continued
$L_{b250}$
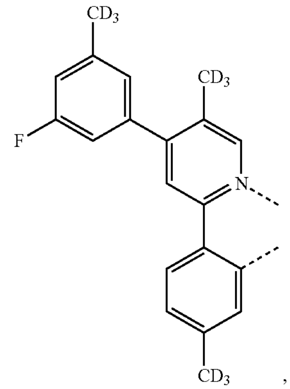
$L_{b251}$
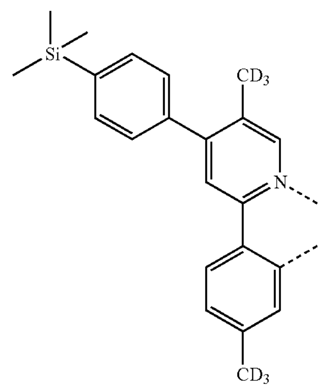
$L_{b252}$
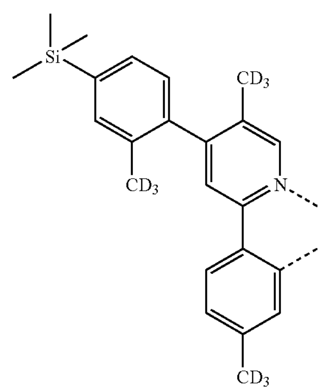
$L_{b253}$
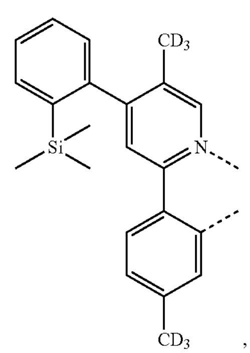

-continued
$L_{b254}$
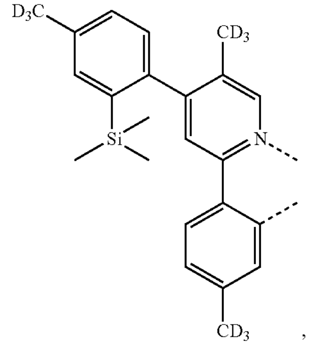
$L_{b255}$
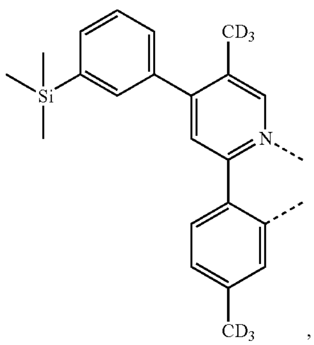
$L_{b256}$
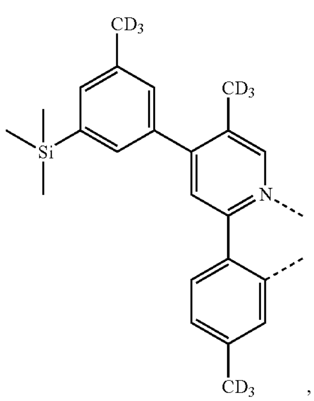
$L_{b257}$
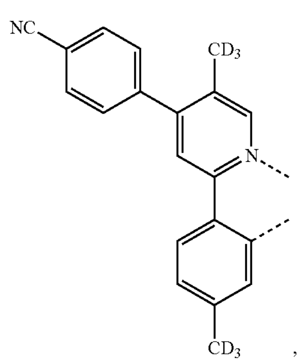
-continued
$L_{b258}$
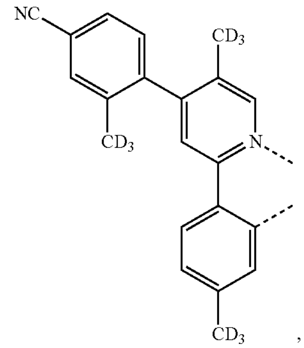
$L_{b259}$
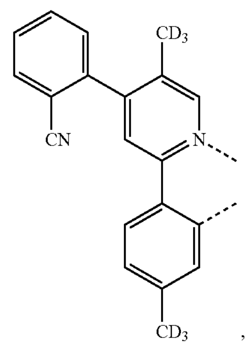
$L_{b260}$
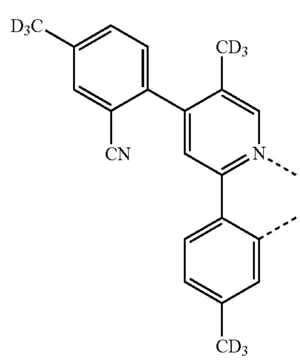
$L_{b261}$
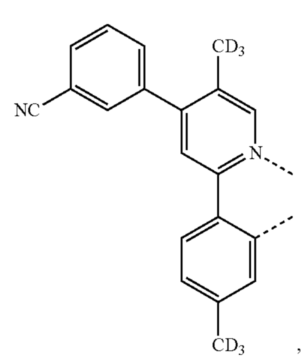

L$_{b262}$
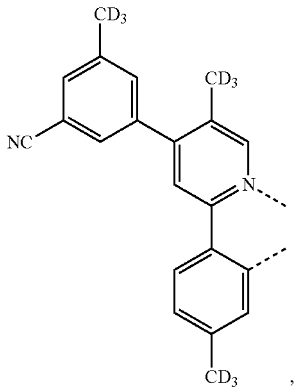
L$_{b263}$
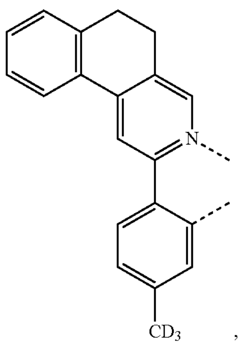
L$_{b264}$
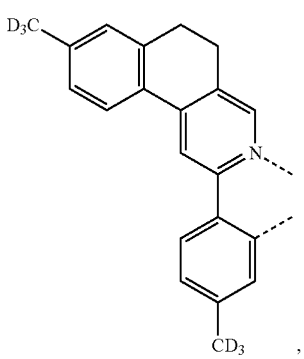
L$_{b265}$
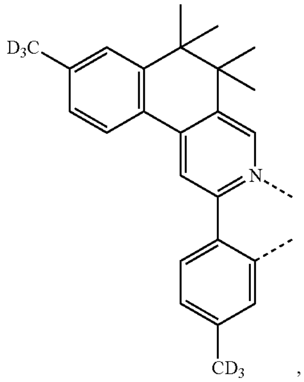
L$_{b266}$
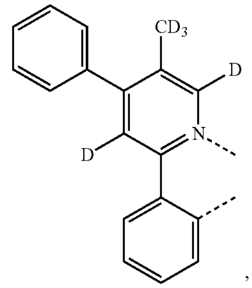
L$_{b267}$
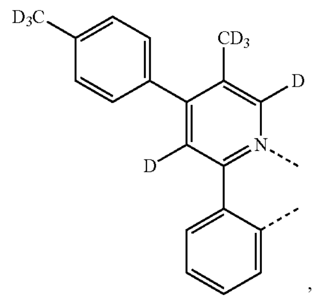
L$_{b268}$
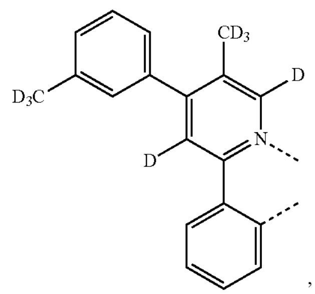
L$_{b269}$
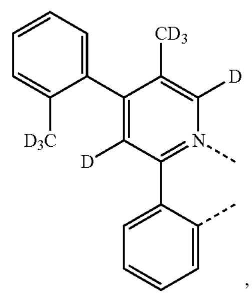
L$_{b270}$
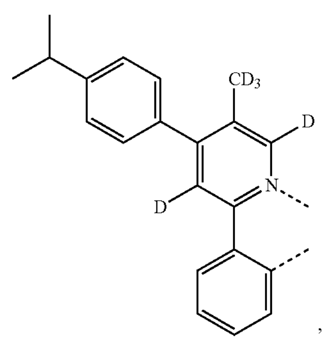

-continued
$L_{b271}$
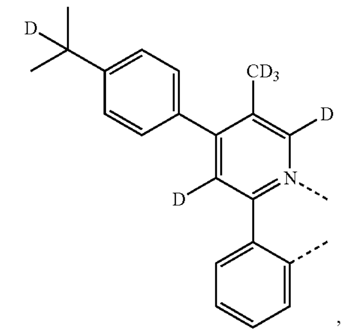
$L_{b272}$
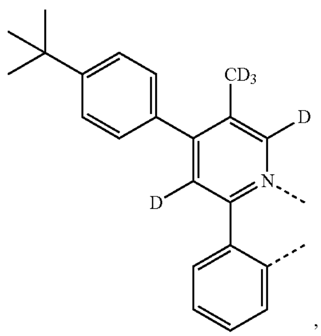
$L_{b273}$
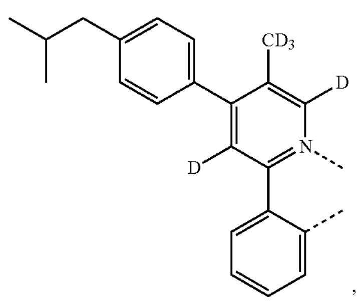
$L_{b274}$
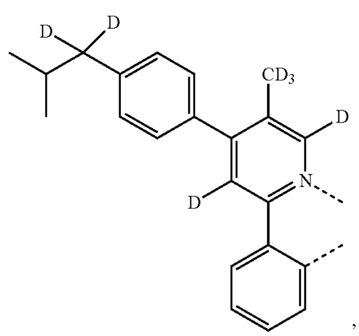
$L_{b275}$
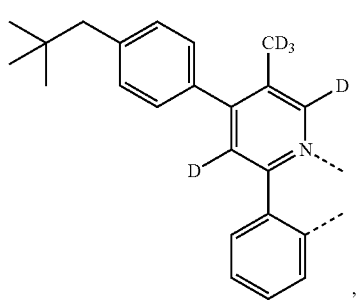
-continued
$L_{b276}$
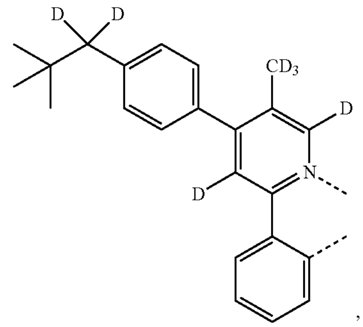
$L_{b277}$
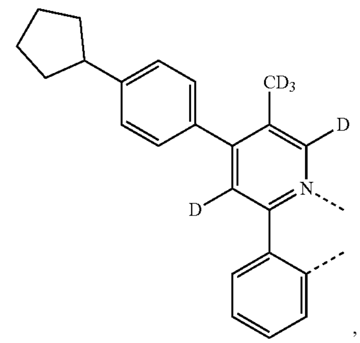
$L_{b278}$
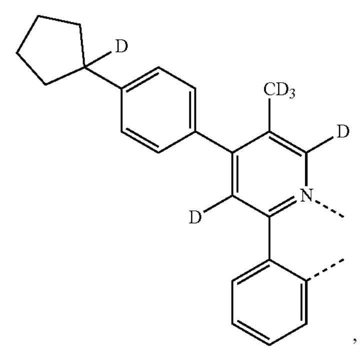
$L_{b279}$
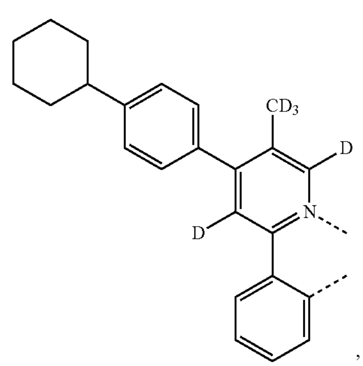

204
-continued
$L_{b280}$
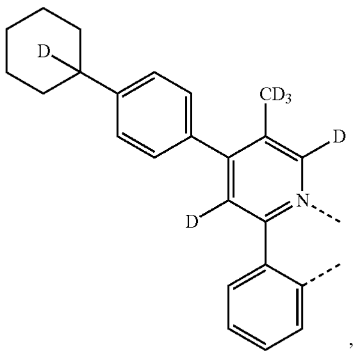
$L_{b281}$
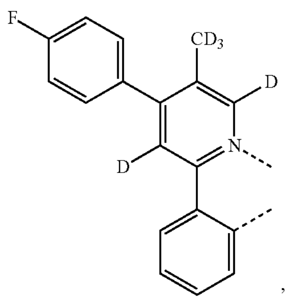
$L_{b282}$
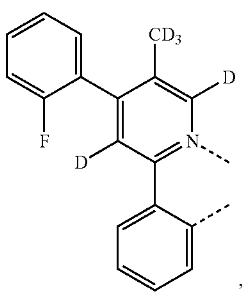
$L_{b283}$
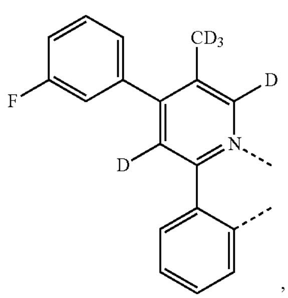
$L_{b284}$
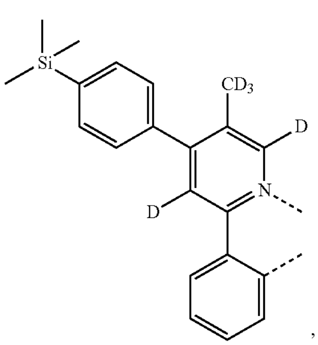
$L_{b285}$
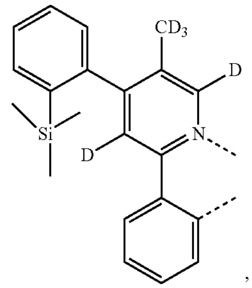
$L_{b286}$
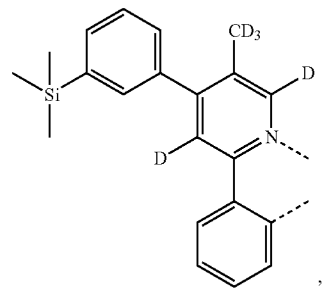
$L_{b287}$
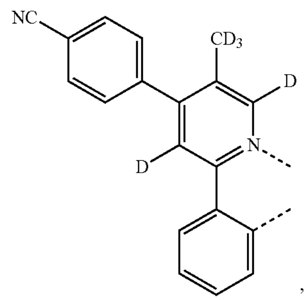
$L_{b288}$
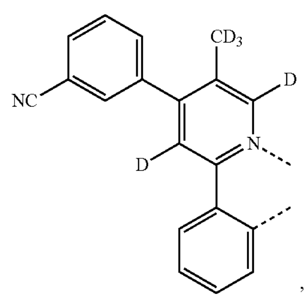
$L_{b289}$
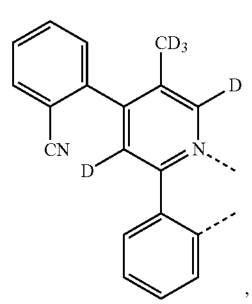

-continued
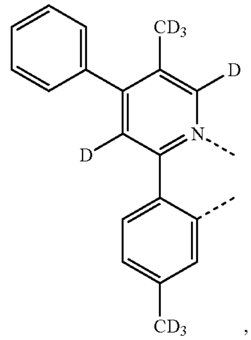
$L_{b290}$
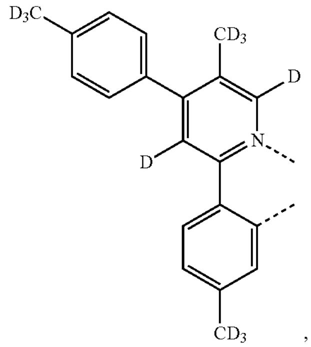
$L_{b291}$
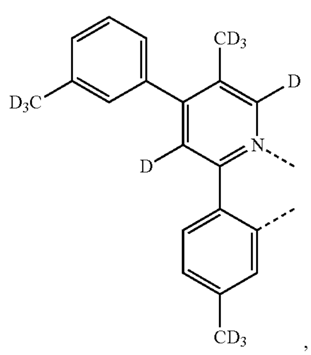
$L_{b292}$
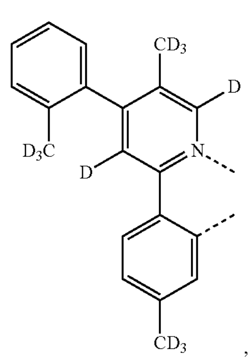
$L_{b293}$
-continued
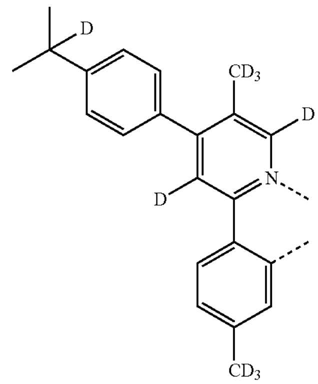
$L_{b294}$
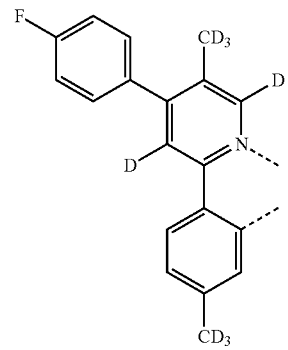
$L_{b295}$
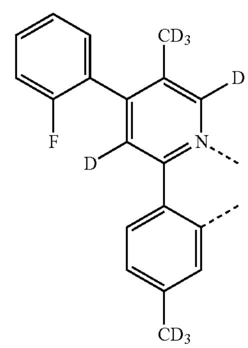
$L_{b296}$
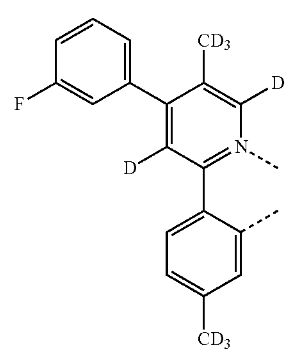
$L_{b297}$ -continued
$L_{b298}$
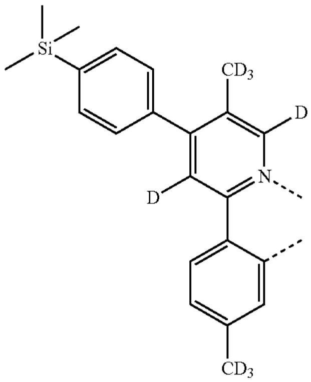
,
$L_{b299}$
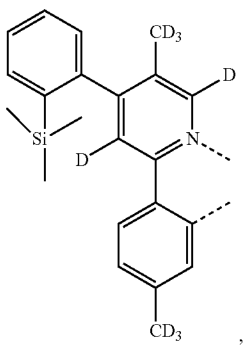
,
$L_{b300}$
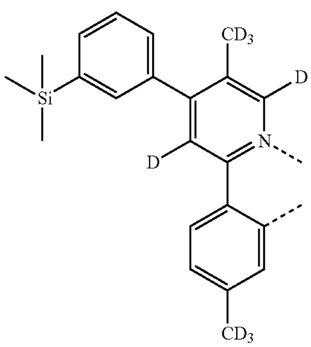
,
$L_{b301}$
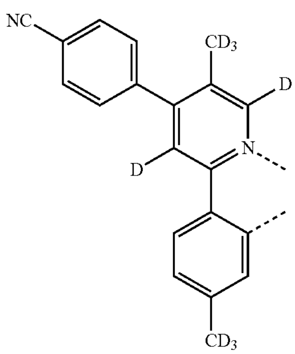
,
-continued
$L_{b302}$
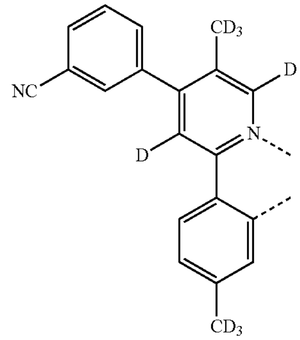
,
$L_{b303}$
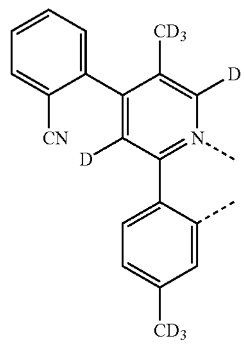
,
$L_{b304}$
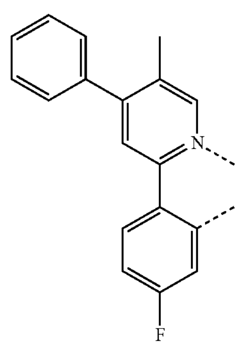
,
$L_{b305}$
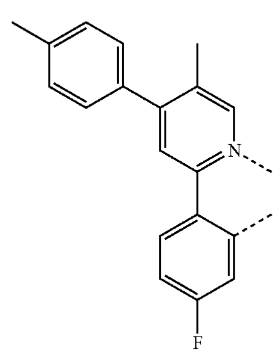
, -continued
$L_{b306}$
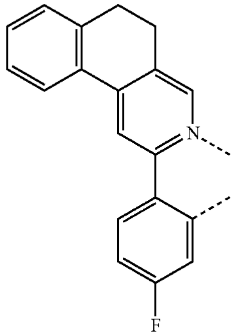
,
$L_{b307}$
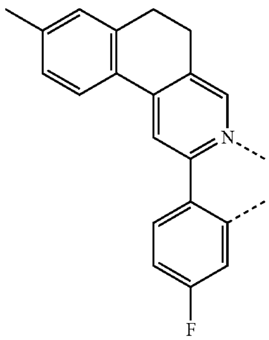
,
$L_{b308}$
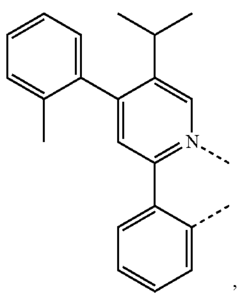
,
$L_{b309}$
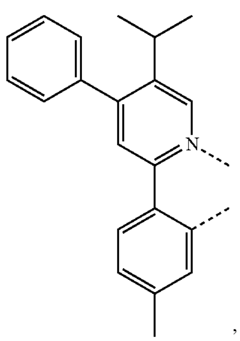
,
$L_{b310}$
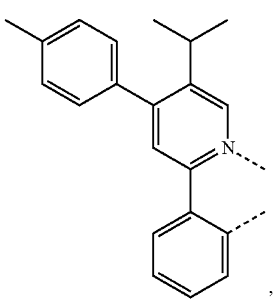
,
-continued
$L_{b311}$
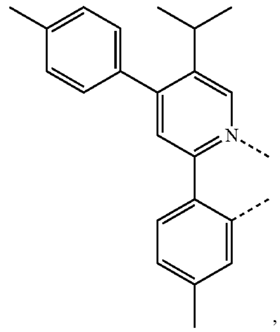
,
$L_{b312}$
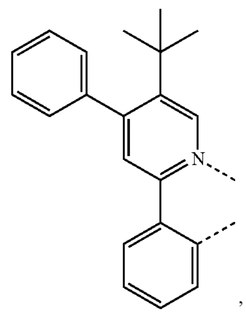
,
$L_{b313}$
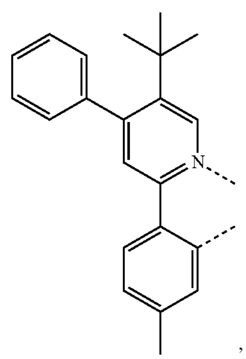
,
$L_{b314}$
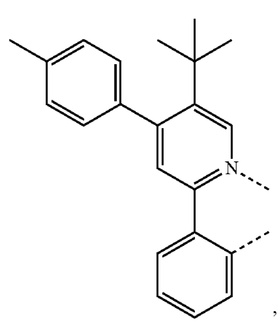
, $L_{b315}$
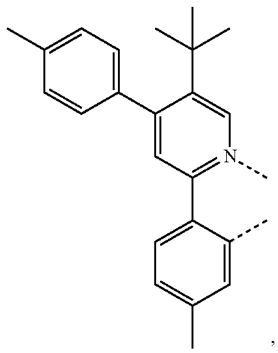
$L_{b316}$
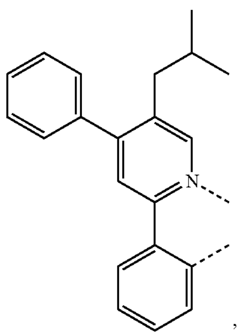
$L_{b317}$
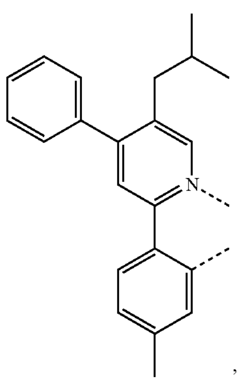
$L_{b318}$
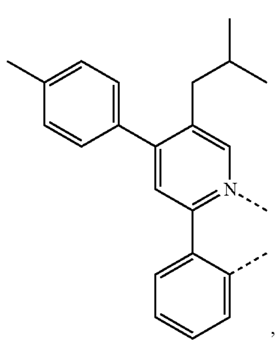
$L_{b319}$
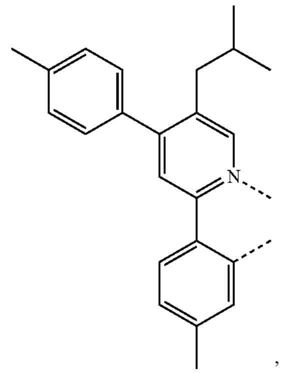
$L_{b320}$
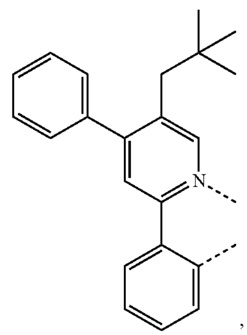
$L_{b321}$
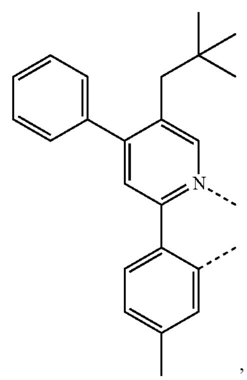
$L_{b322}$
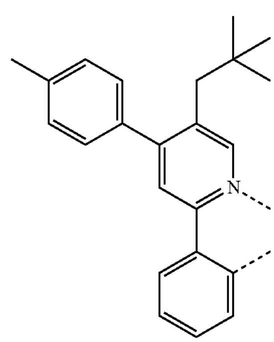

$L_{b323}$
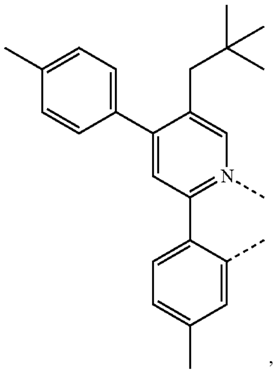
$L_{b324}$
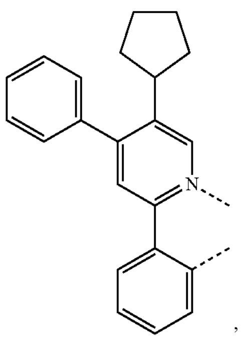
$L_{b325}$
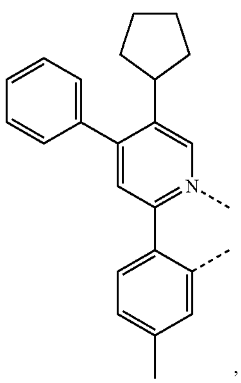
$L_{b326}$
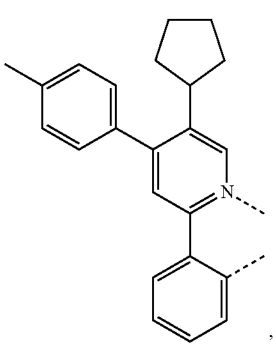
$L_{b327}$
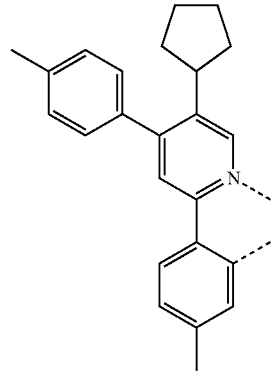
$L_{b328}$
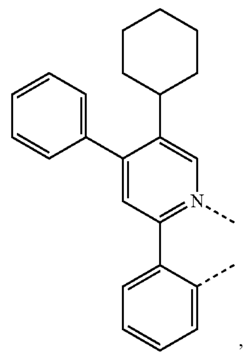
$L_{b329}$
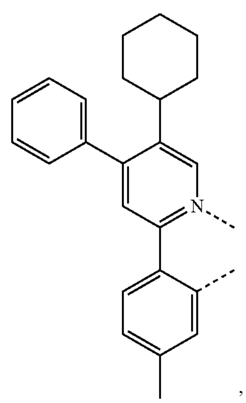
$L_{b330}$
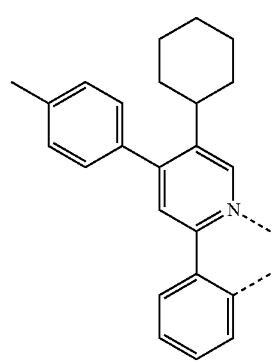

-continued
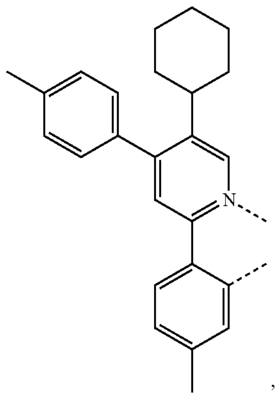
$L_{b331}$
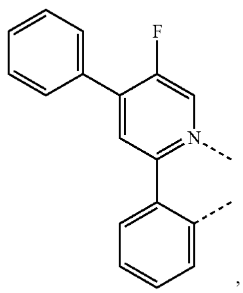
$L_{b332}$
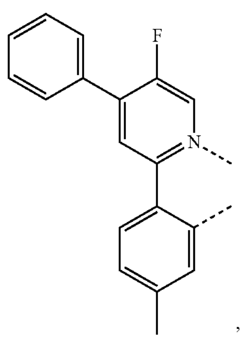
$L_{b333}$
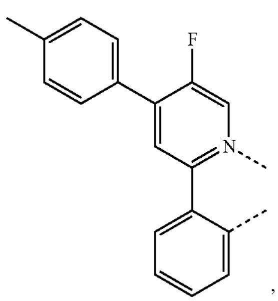
$L_{b334}$
-continued
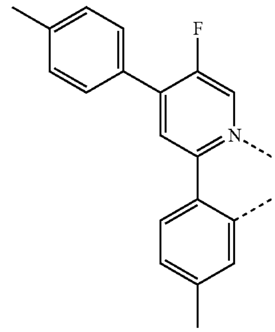
$L_{b335}$
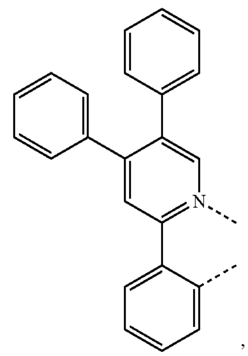
$L_{b340}$
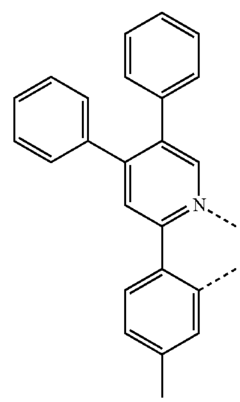
$L_{b341}$
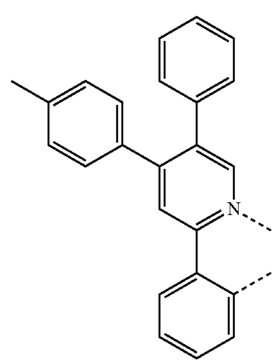
$L_{b342}$ -continued
L$_{b343}$
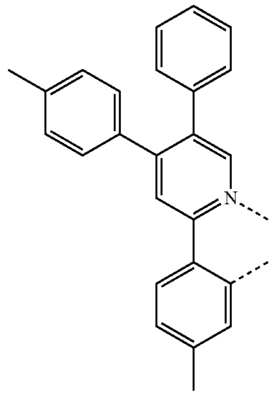
,
L$_{b344}$
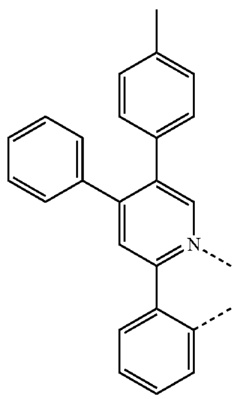
,
L$_{b345}$
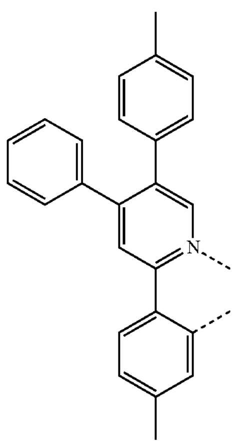
,
L$_{b346}$
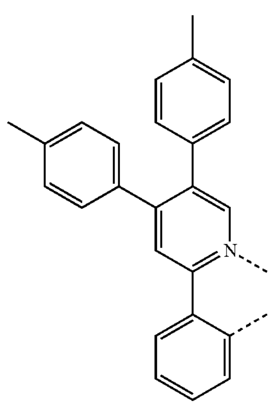
,
-continued
L$_{b347}$
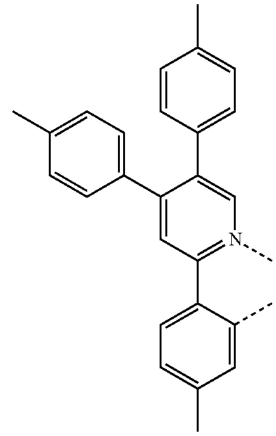
,
L$_{b348}$
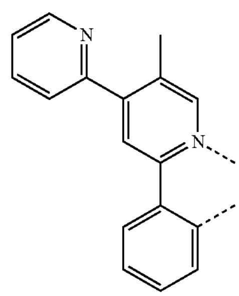
,
L$_{b349}$
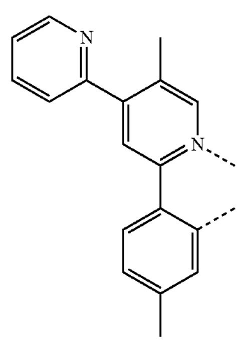
,
L$_{b350}$
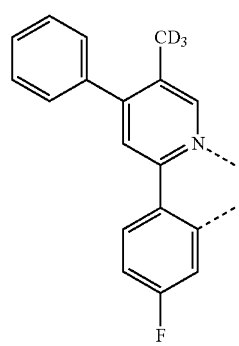
, $L_{b351}$
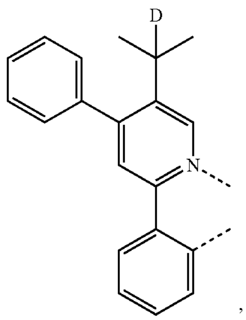
$L_{b352}$
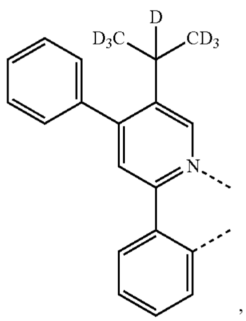
$L_{b353}$
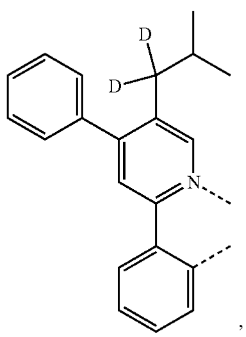
$L_{b354}$
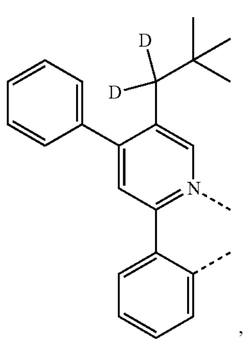
$L_{b355}$
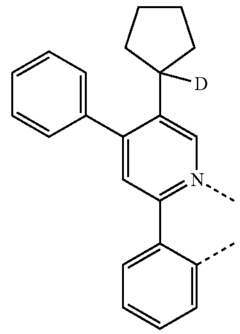
$L_{b356}$
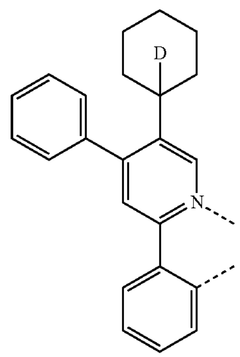
$L_{b357}$
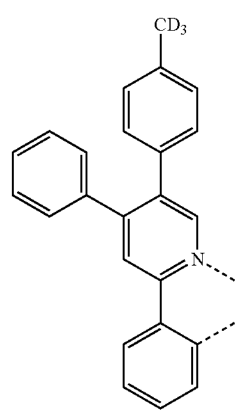
$L_{b358}$
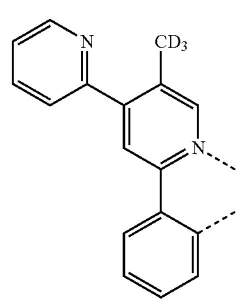

-continued
$L_{b359}$
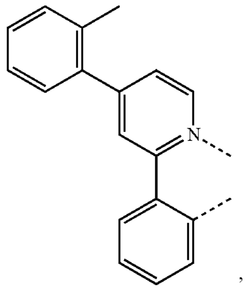
$L_{b360}$
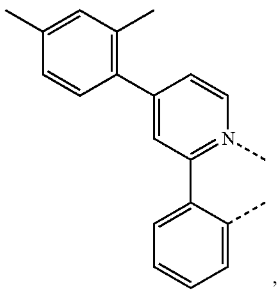
$L_{b361}$
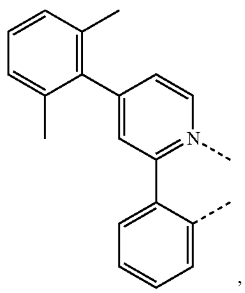
$L_{b362}$
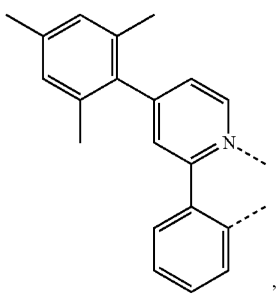
$L_{b363}$
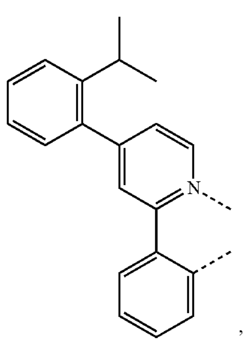
-continued
$L_{b364}$
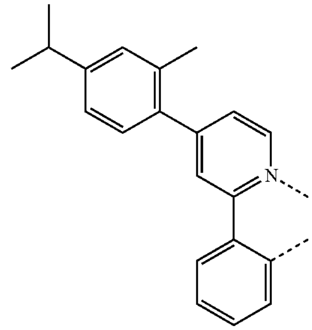
$L_{b365}$
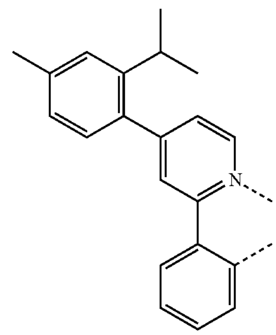
$L_{b366}$
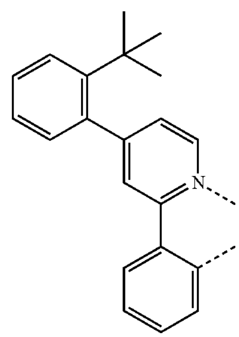
$L_{b367}$
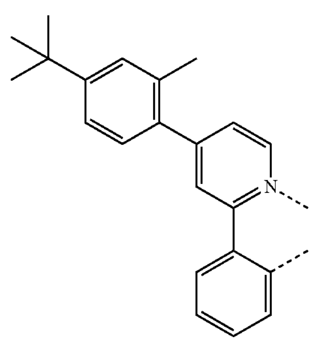

-continued
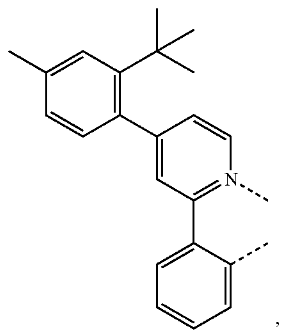
$L_{b368}$
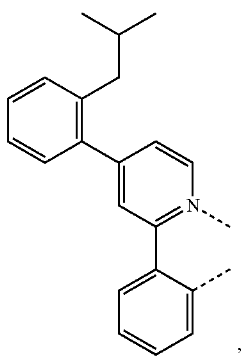
$L_{b369}$
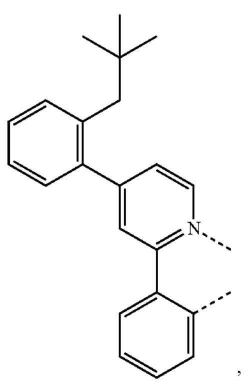
$L_{b370}$
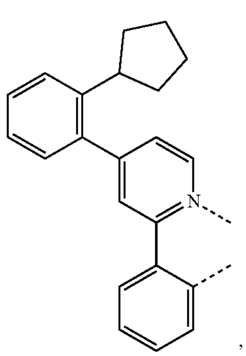
$L_{b371}$
-continued
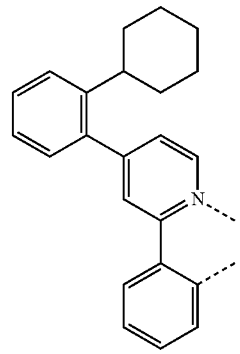
$L_{b372}$
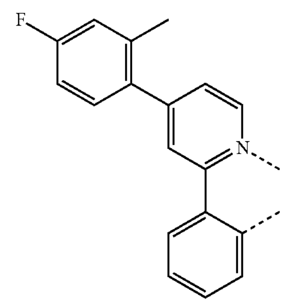
$L_{b373}$
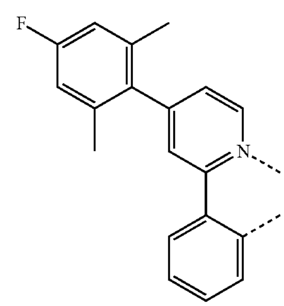
$L_{b374}$
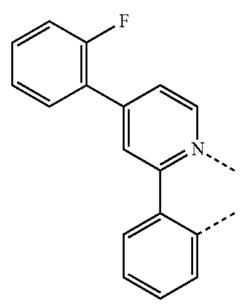
$L_{b375}$
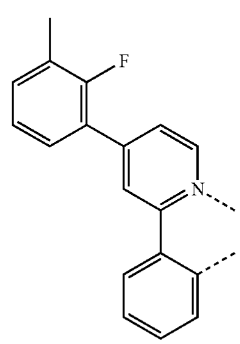
$L_{b376}$ -continued
$L_{b377}$
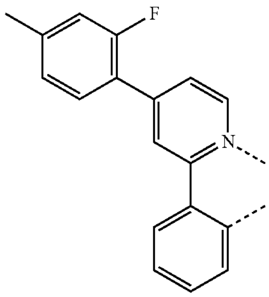
,
$L_{b378}$
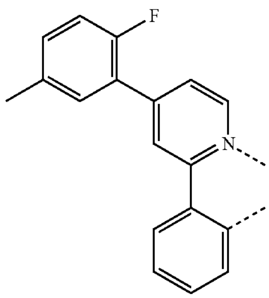
,
$L_{b379}$
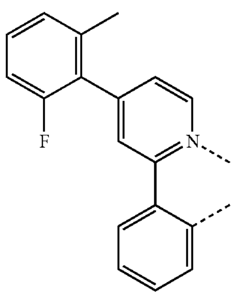
,
$L_{b380}$
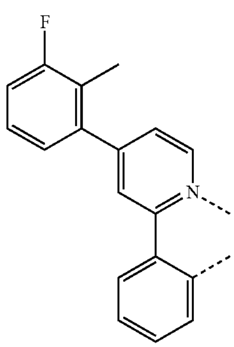
,
$L_{b381}$
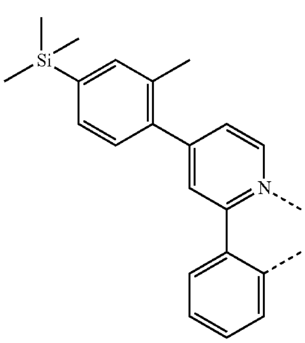
,
-continued
$L_{b382}$
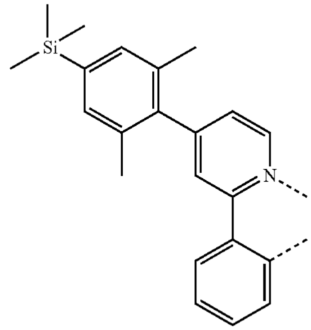
,
$L_{b383}$
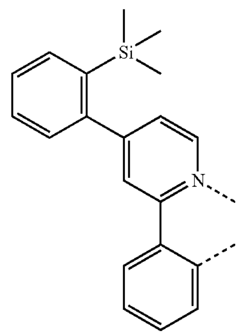
,
$L_{b384}$
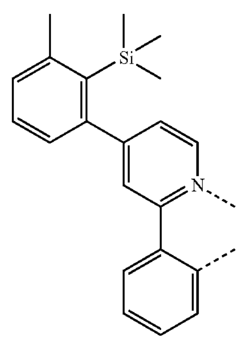
,
$L_{b385}$
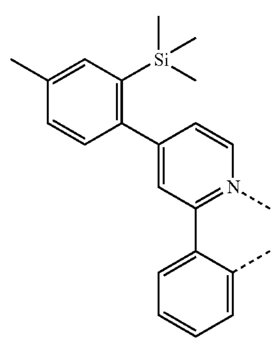
, -continued
$L_{b386}$
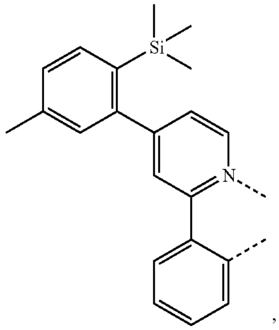
$L_{b387}$
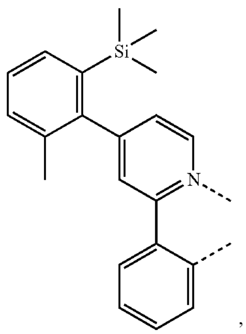
$L_{b388}$
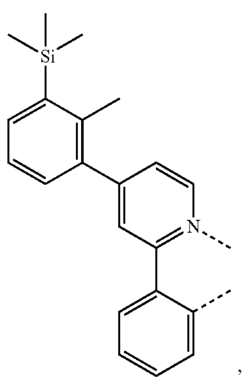
$L_{b389}$
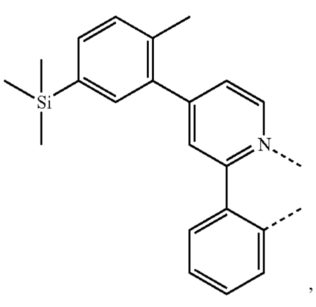
-continued
$L_{b390}$
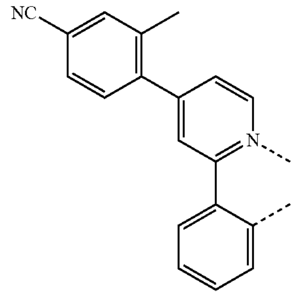
$L_{b391}$
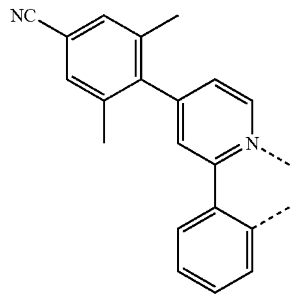
$L_{b392}$
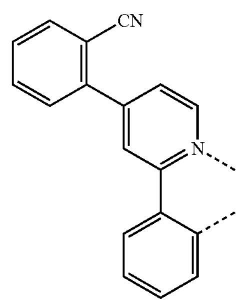
$L_{b393}$
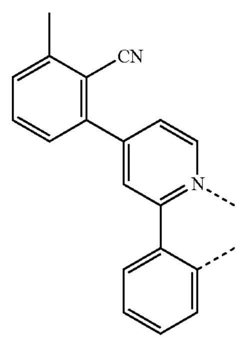
$L_{b394}$
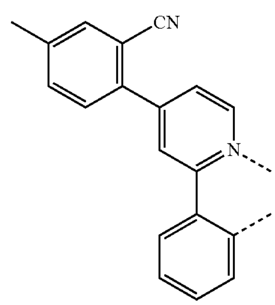

-continued
$L_{b395}$
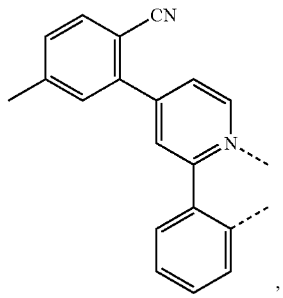
$L_{b396}$
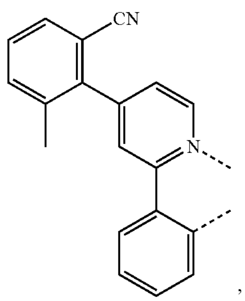
$L_{b397}$
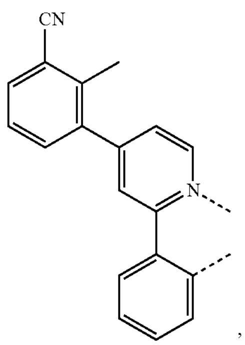
$L_{b398}$
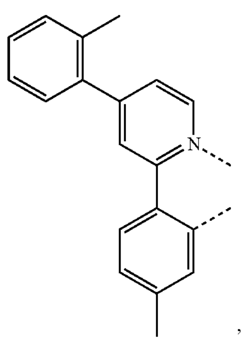
$L_{b399}$
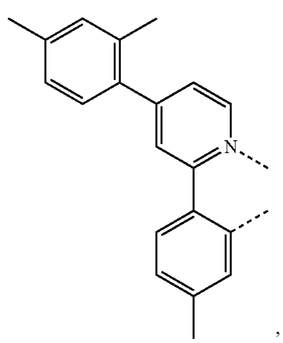
-continued
$L_{b400}$
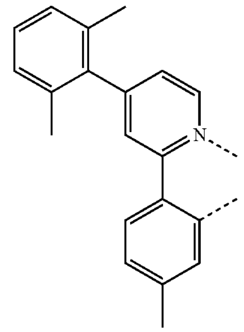
$L_{b401}$
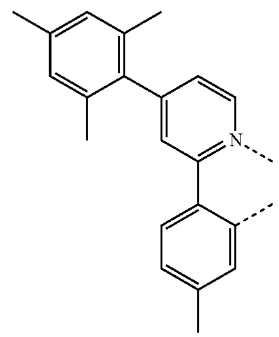
$L_{b402}$
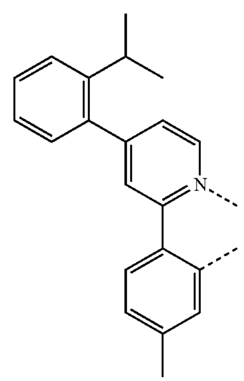
$L_{b403}$
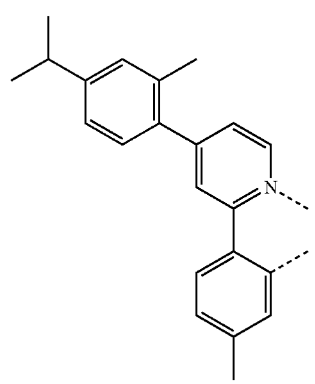

-continued
$L_{b404}$
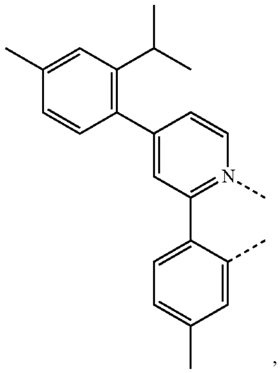
$L_{b405}$
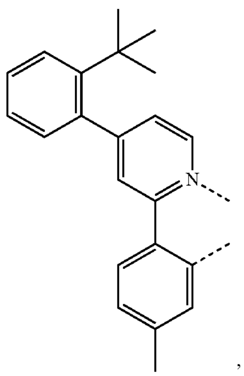
$L_{b406}$
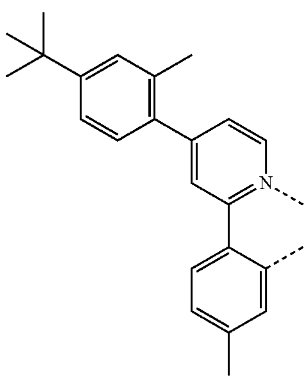
$L_{b407}$
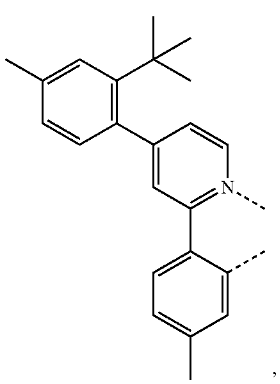
-continued
$L_{b408}$
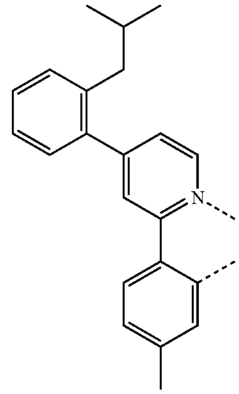
$L_{b409}$
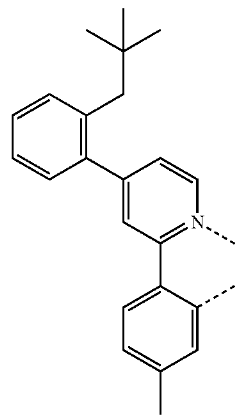
$L_{b410}$
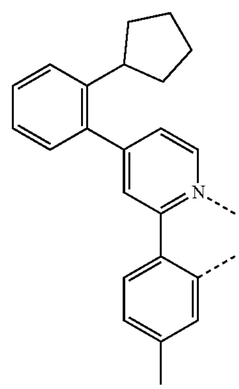
$L_{b411}$
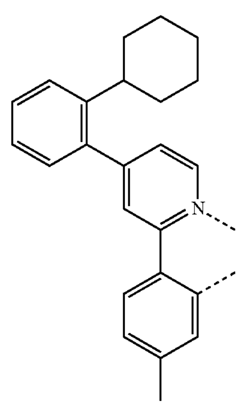

-continued
$L_{b412}$
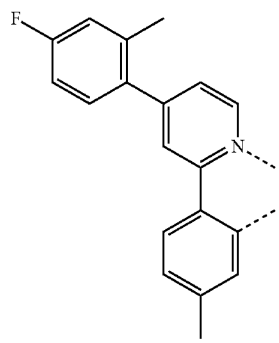
,
$L_{b413}$
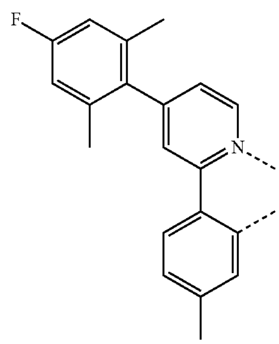
,
$L_{b414}$
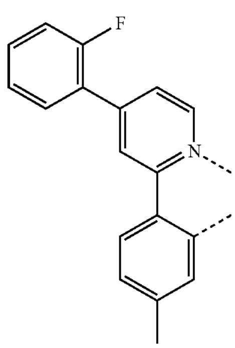
,
$L_{b415}$
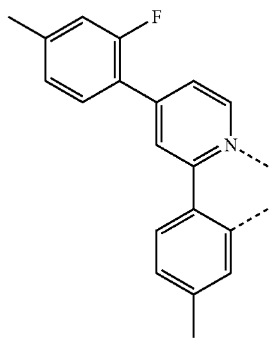
,
-continued
$L_{b416}$
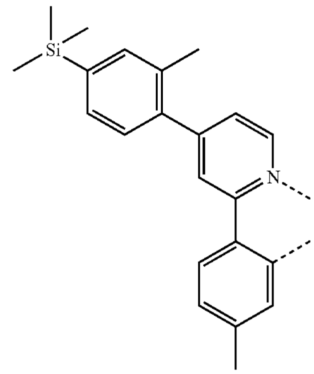
,
$L_{b417}$
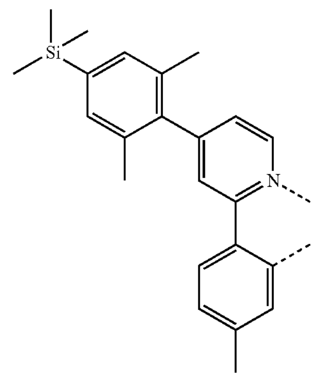
,
$L_{b418}$
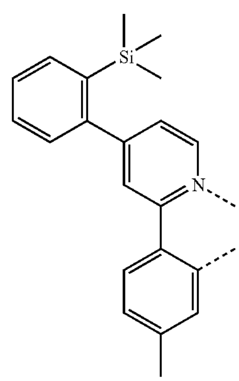
,
$L_{b419}$
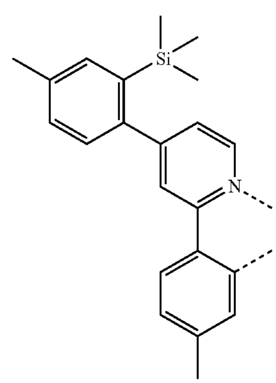
, -continued
$L_{b420}$
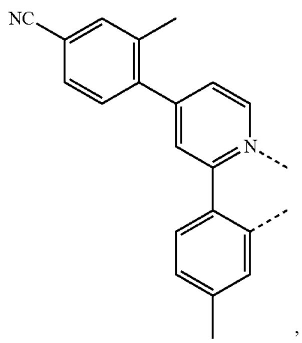
$L_{b421}$
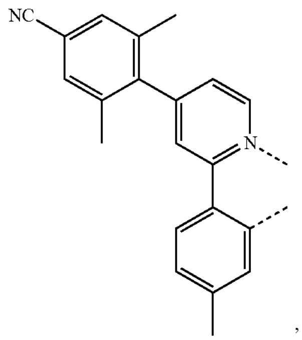
$L_{b422}$
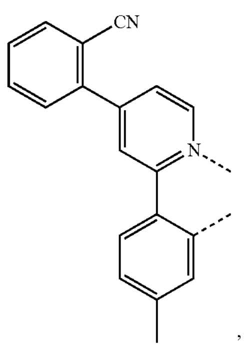
$L_{b423}$
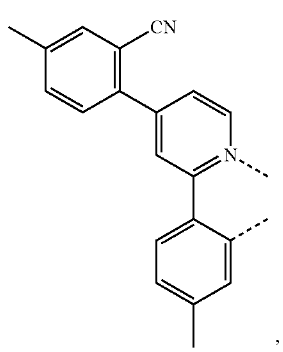
-continued
$L_{b424}$
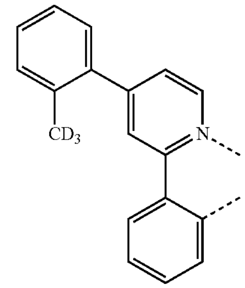
$L_{b425}$
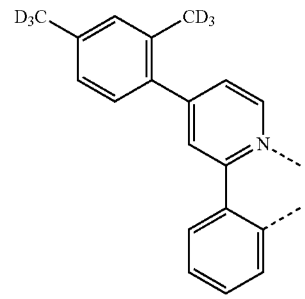
$L_{b426}$
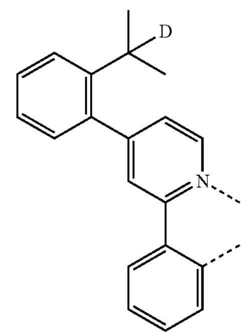
$L_{b427}$
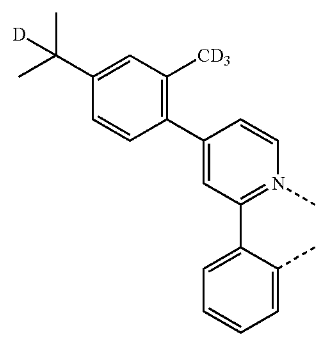
$L_{b428}$
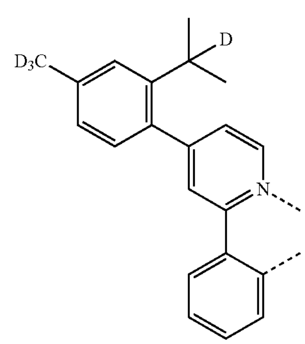

L$_{b429}$
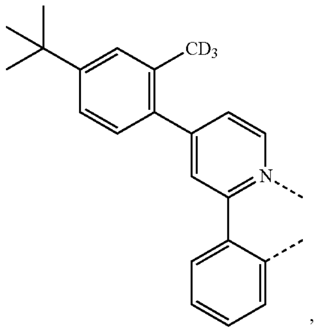
L$_{b430}$
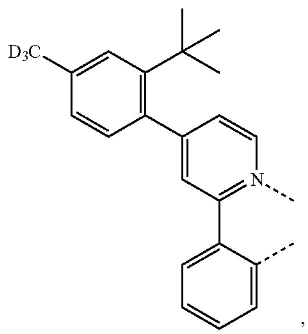
L$_{b431}$
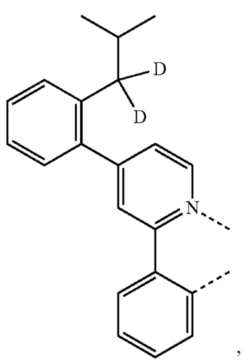
L$_{b432}$
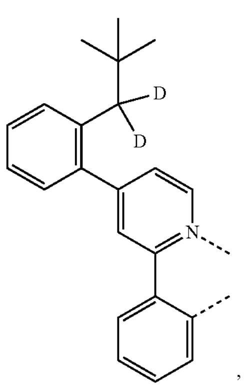
L$_{b433}$
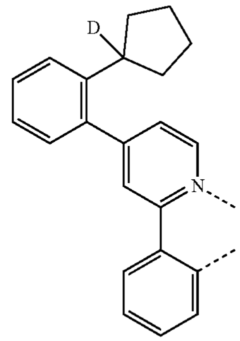
L$_{b434}$
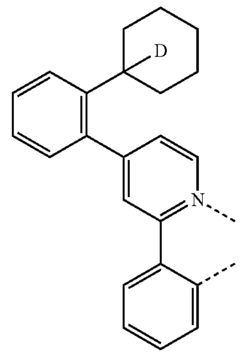
L$_{b435}$
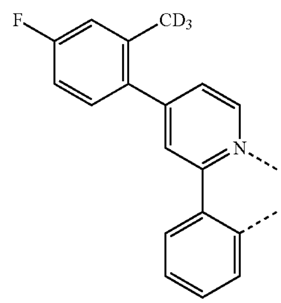
L$_{b436}$
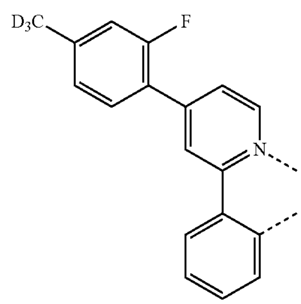
L$_{b437}$
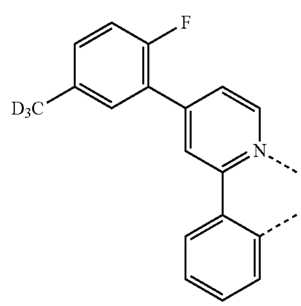

-continued
$L_{b438}$
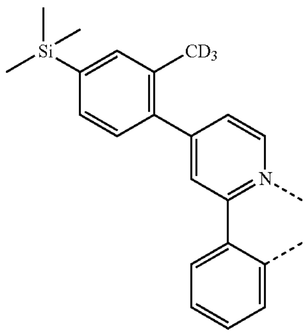
,
$L_{b439}$
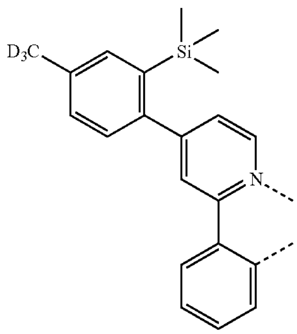
,
$L_{b440}$
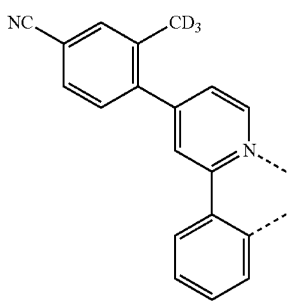
,
$L_{b441}$
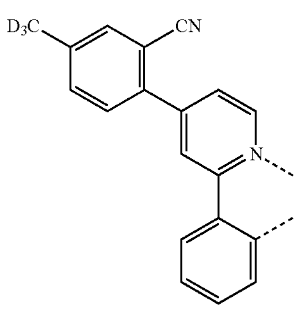
,
$L_{b442}$
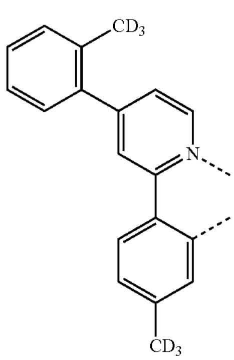
,
-continued
$L_{b443}$
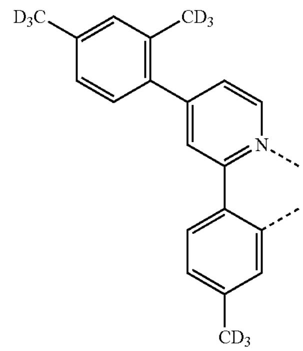
,
$L_{b444}$
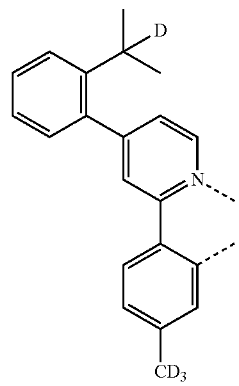
,
$L_{b445}$
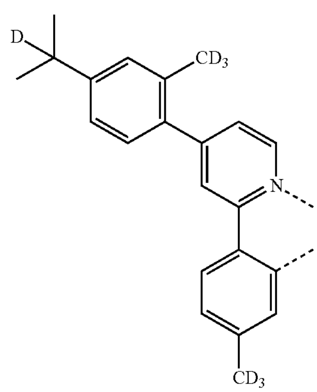
,
$L_{b446}$
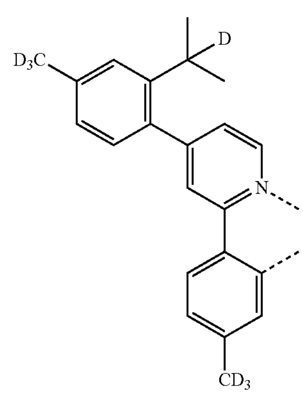
, -continued
$L_{b447}$
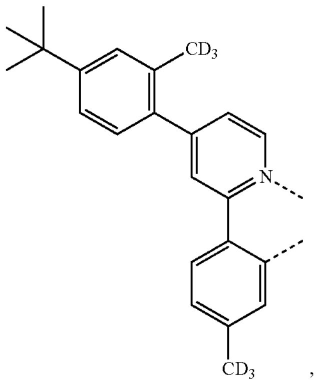
$L_{b448}$
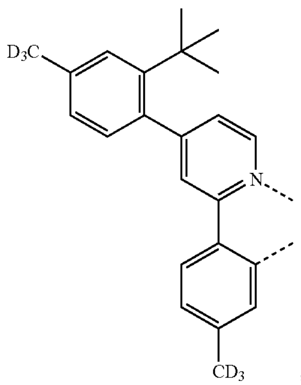
$L_{b449}$
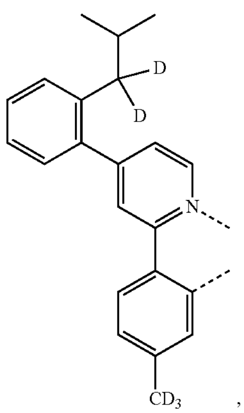
$L_{b450}$
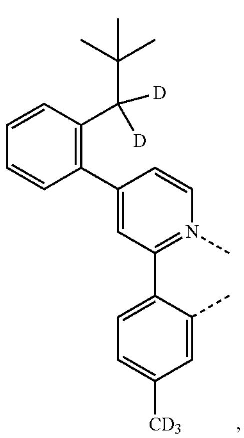
-continued
$L_{b451}$
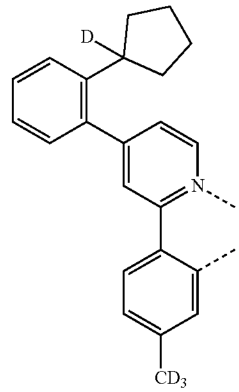
$L_{b452}$
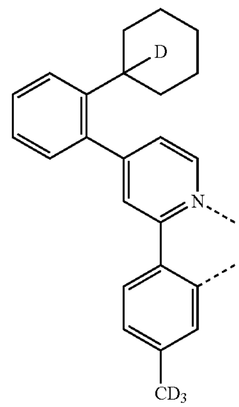
$L_{b453}$
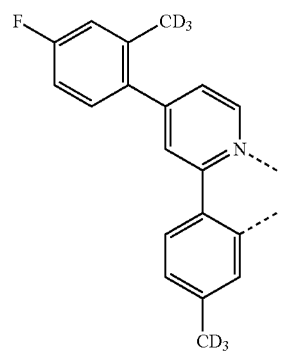
$L_{b454}$
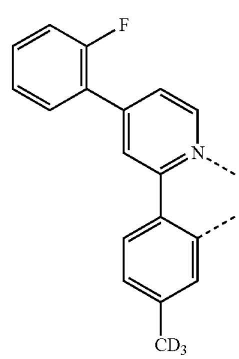

L$_{b455}$
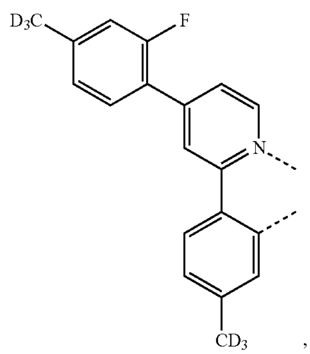
L$_{b456}$
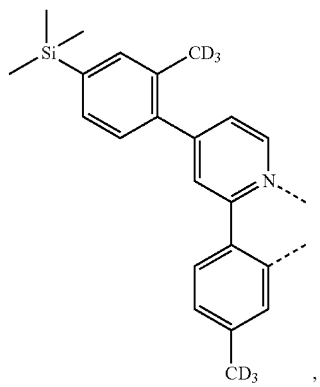
L$_{b457}$
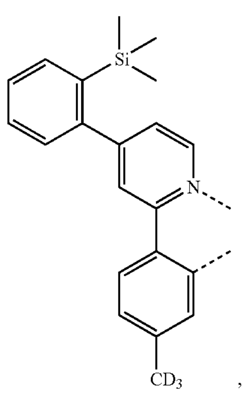
L$_{b458}$
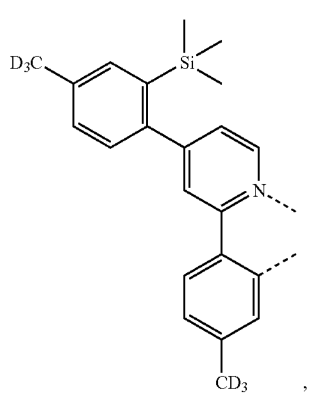
L$_{b459}$
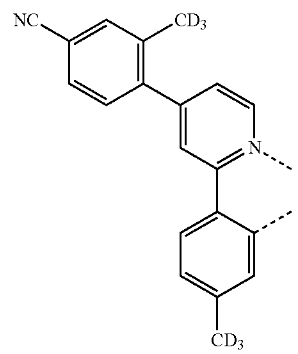
L$_{b460}$
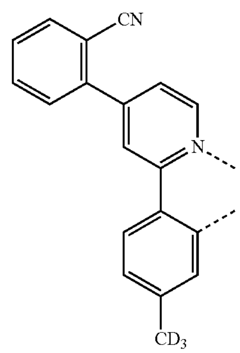
L$_{b461}$
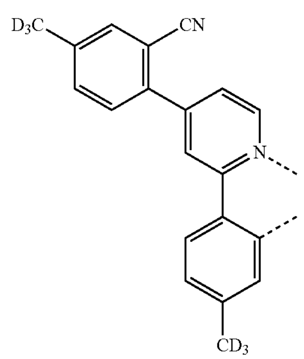
L$_{b462}$
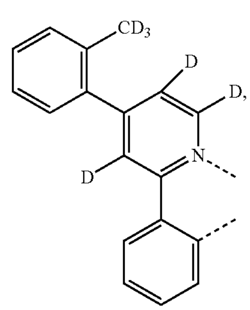

L$_{b463}$
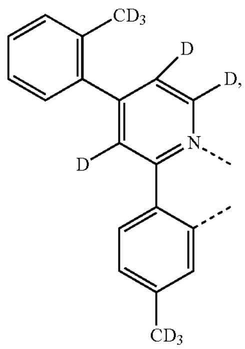
L$_{b464}$
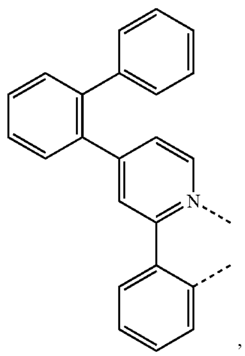
L$_{b465}$
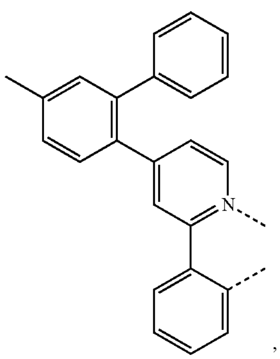
L$_{b466}$
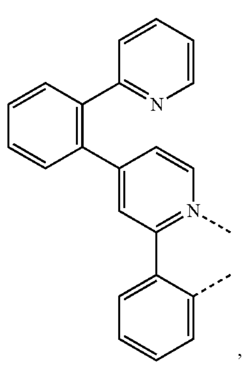
L$_{b467}$
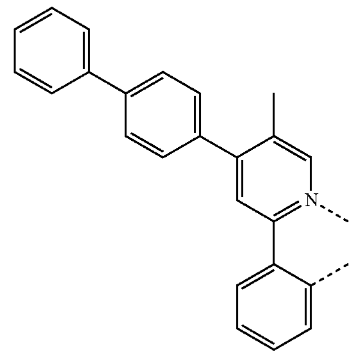
L$_{b468}$
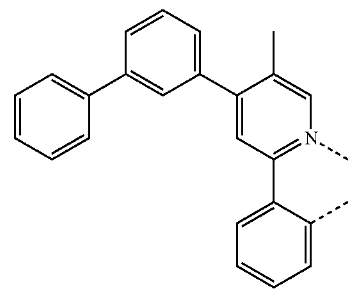
L$_{b469}$
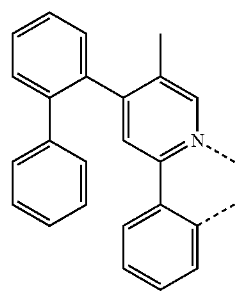
L$_{b470}$
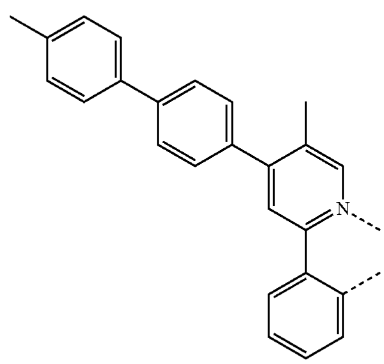
L$_{b471}$
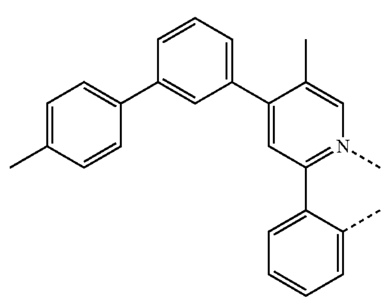

-continued
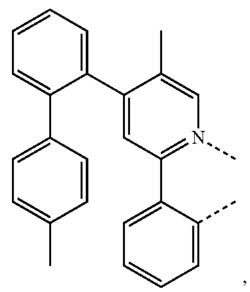
$L_{b472}$
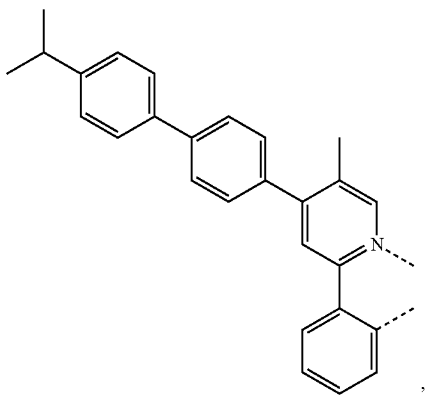
$L_{b473}$
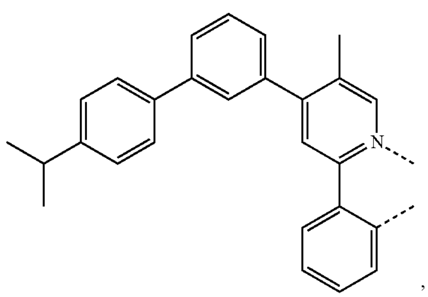
$L_{b474}$
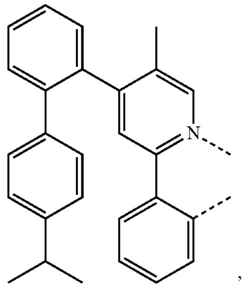
$L_{b475}$
-continued
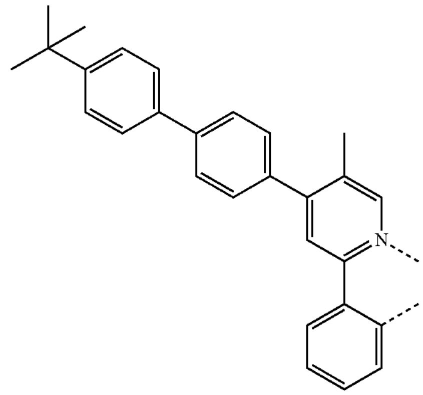
$L_{b476}$
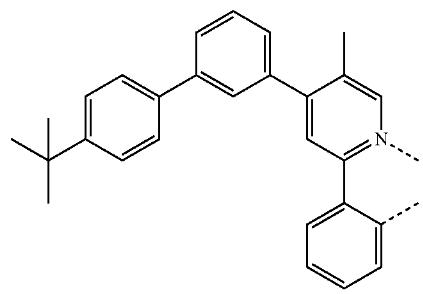
$L_{b477}$
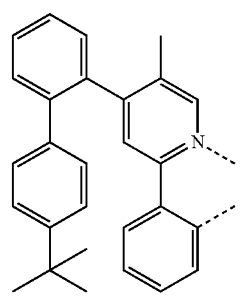
$L_{b478}$
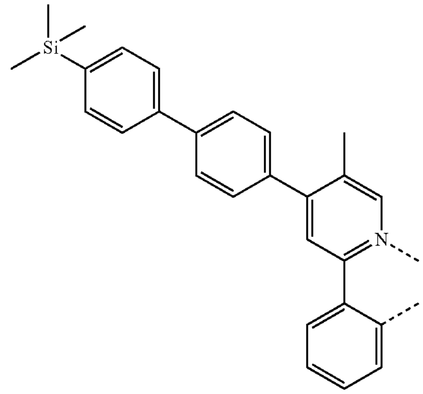
$L_{b479}$ $L_{b480}$
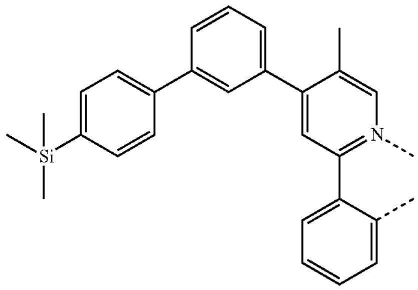
,
$L_{b481}$
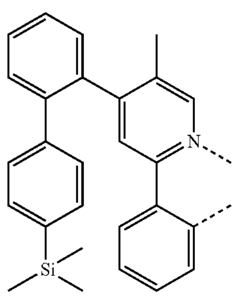
,
$L_{b482}$
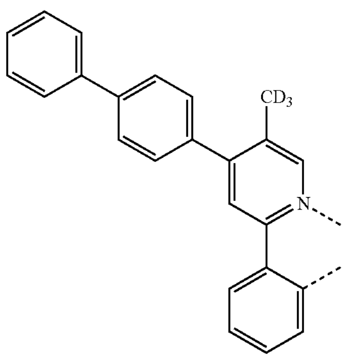
,
$L_{b483}$
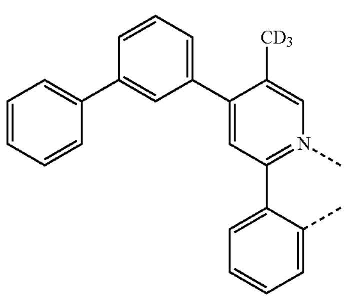
,
$L_{b484}$
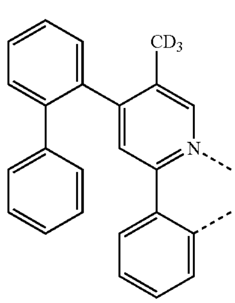
,
$L_{b485}$
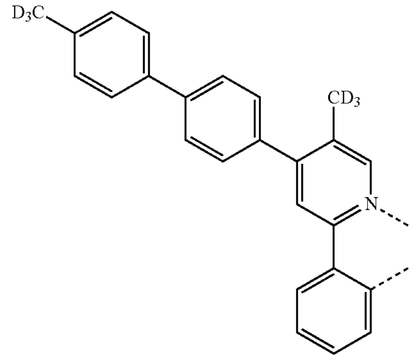
,
$L_{b486}$
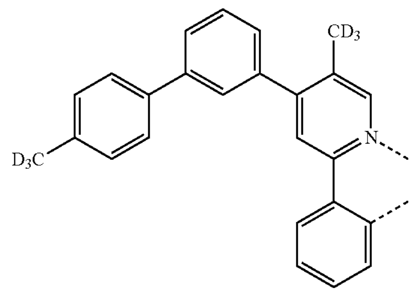
,
$L_{b487}$
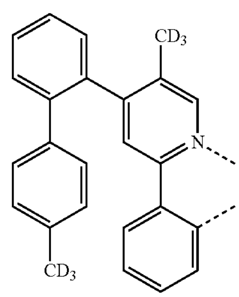
,
$L_{b488}$
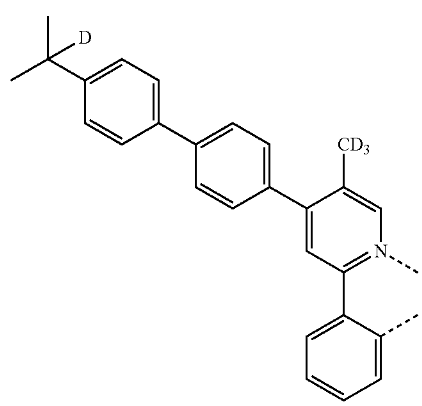
, -continued
$L_{b489}$
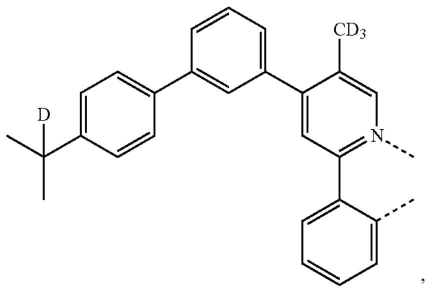
$L_{b490}$
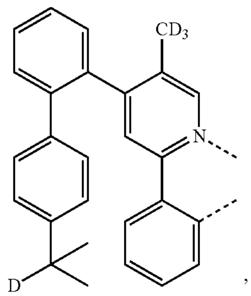
$L_{b491}$
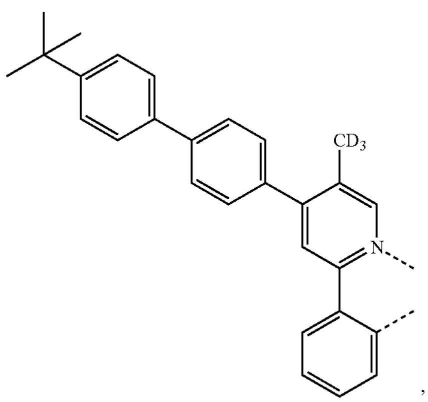
$L_{b492}$
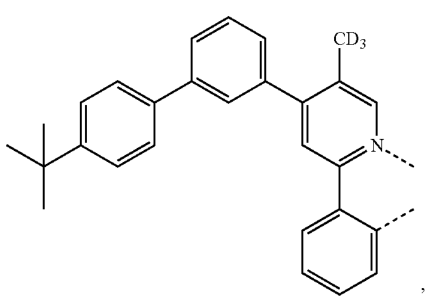
$L_{b493}$
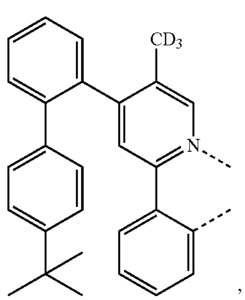
-continued
$L_{b494}$
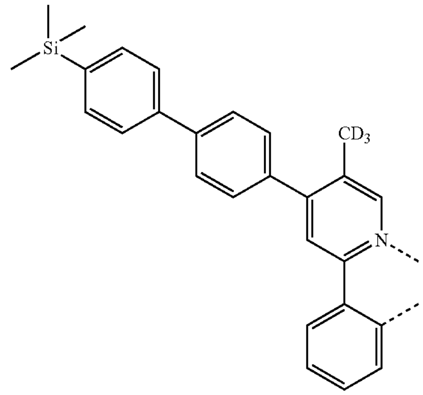
$L_{b495}$
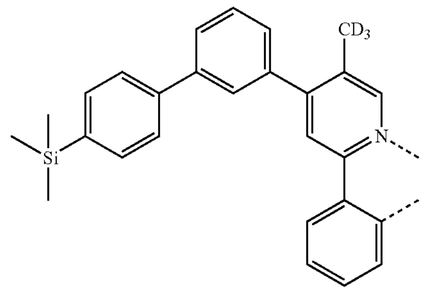
$L_{b496}$
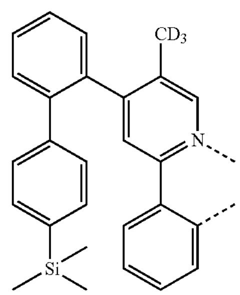
$L_{b497}$
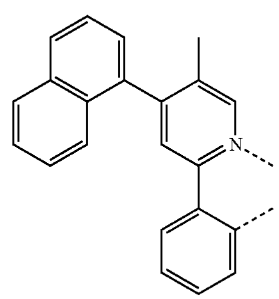
$L_{b498}$
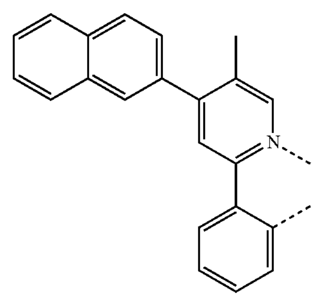

$L_{b499}$
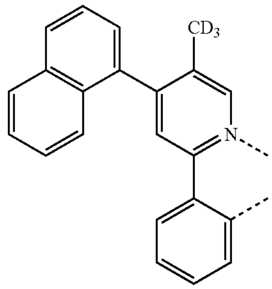
,
$L_{b500}$
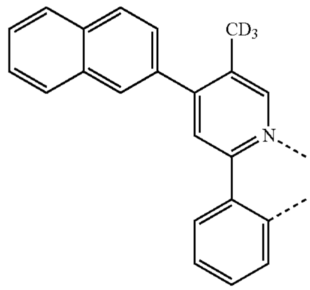
,
$L_{b501}$
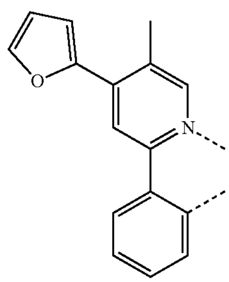
,
$L_{b502}$
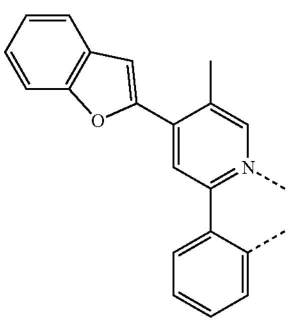
,
$L_{b503}$
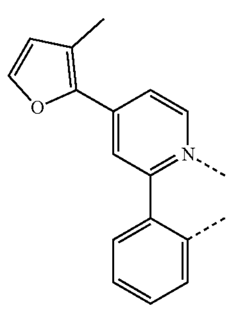
,
$L_{b504}$
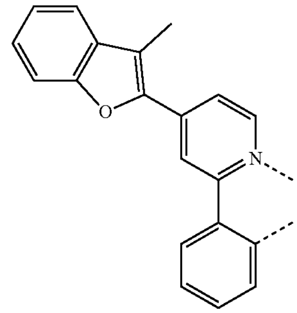
,
$L_{b505}$
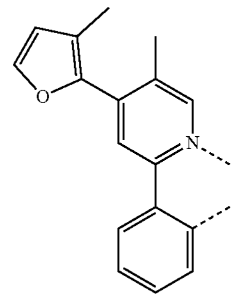
,
$L_{b506}$
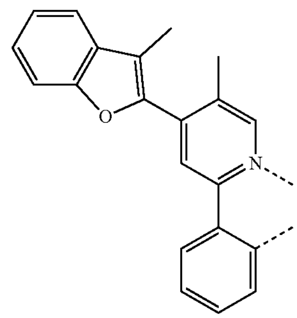
,
$L_{b507}$
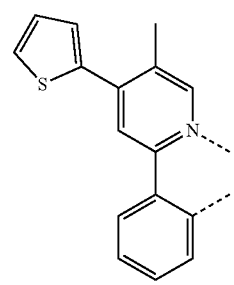
,
$L_{b508}$
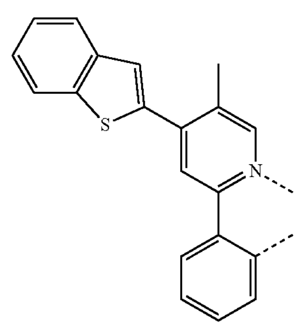
, -continued
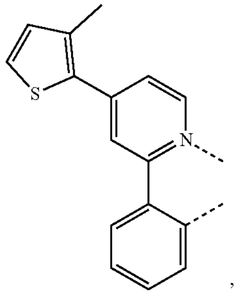
$L_{b509}$
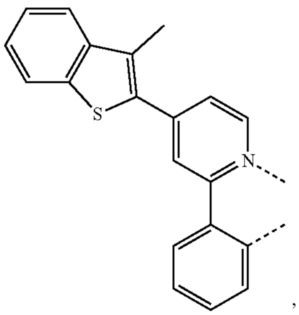
$L_{b510}$
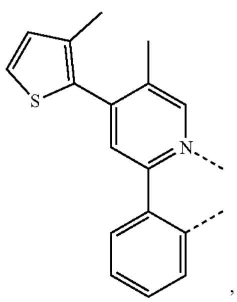
$L_{b511}$
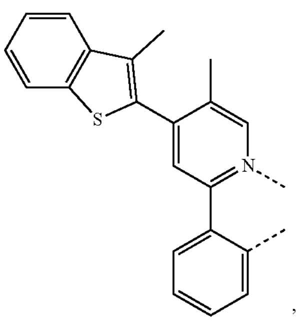
$L_{b512}$
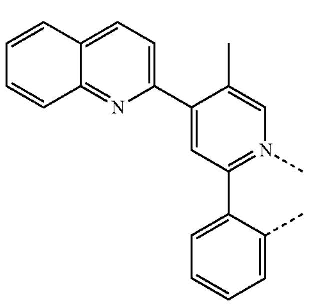
$L_{b513}$
-continued
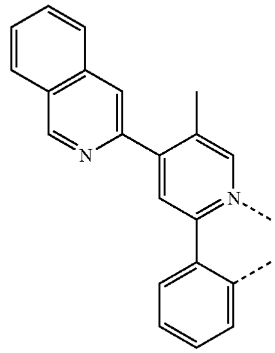
$L_{b514}$
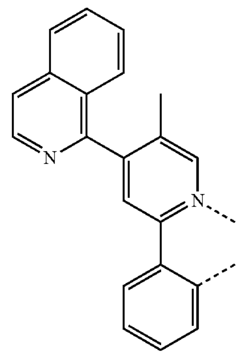
$L_{b515}$
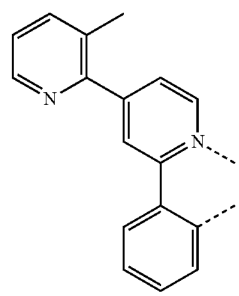
$L_{b516}$
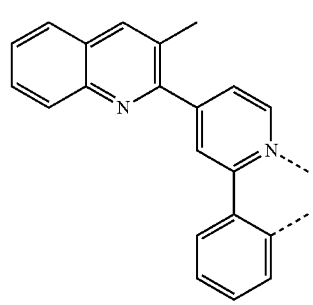
$L_{b517}$ -continued
$L_{b518}$
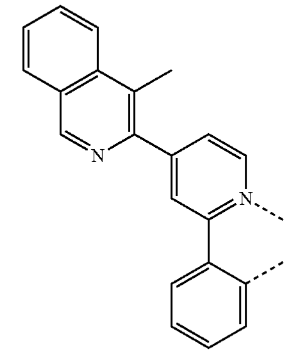
,
$L_{b519}$
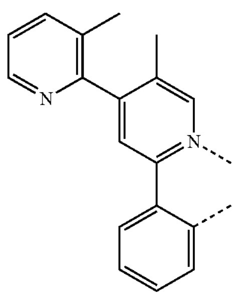
,
$L_{b520}$
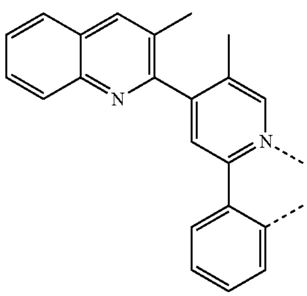
,
$L_{b521}$
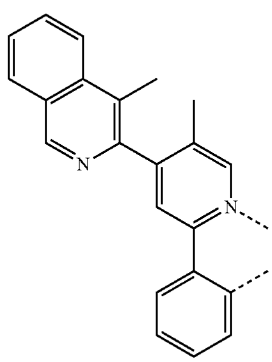
,
$L_{b522}$
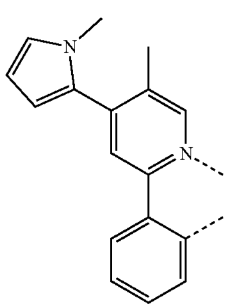
,
-continued
$L_{b523}$
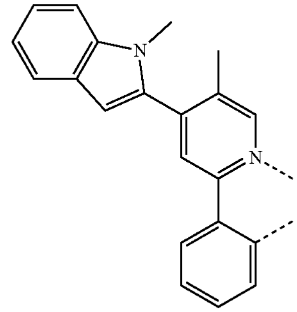
,
$L_{b524}$
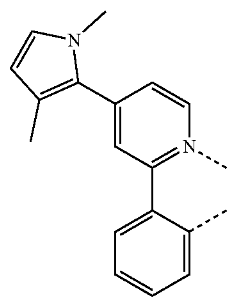
,
$L_{b525}$
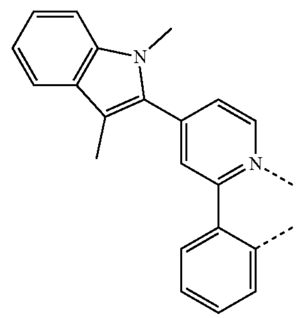
,
$L_{b526}$
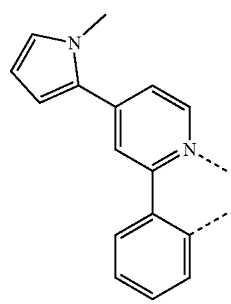
,
$L_{b527}$
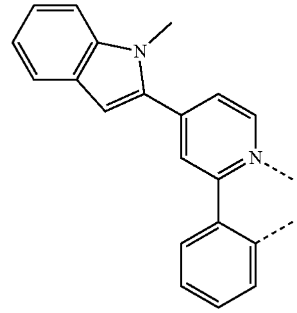
, $L_{b528}$
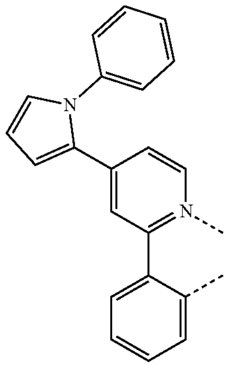
,
$L_{b529}$
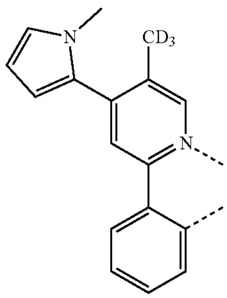
,
$L_{b530}$
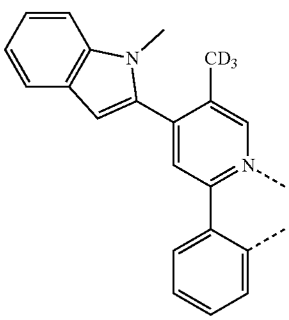
,
$L_{b531}$
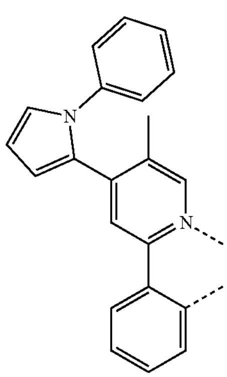
,
$L_{b532}$
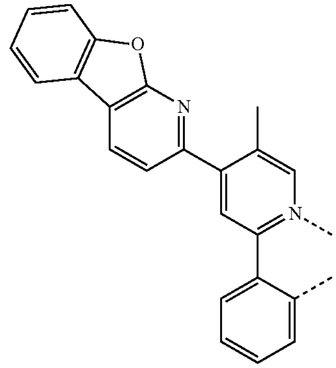
,
$L_{b533}$
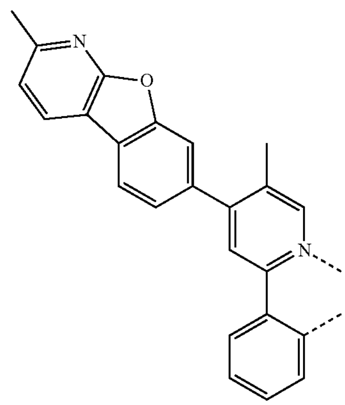
,
$L_{b534}$
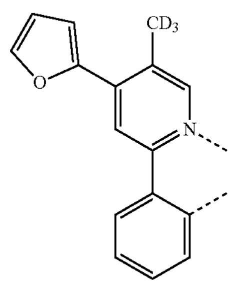
,
$L_{b535}$
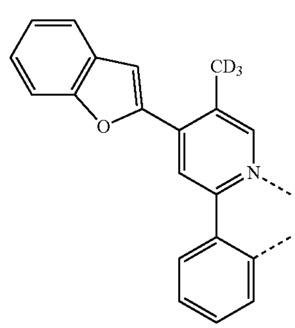
, -continued
$L_{b536}$
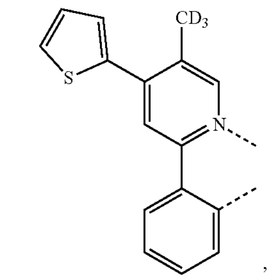
$L_{b537}$
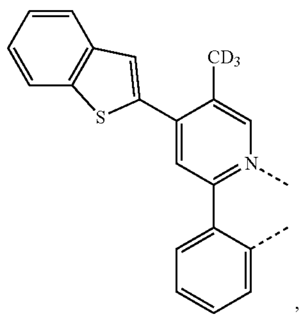
$L_{b538}$
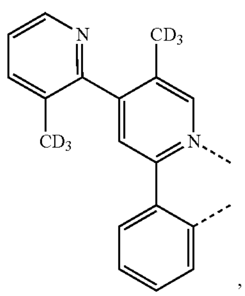
$L_{b539}$
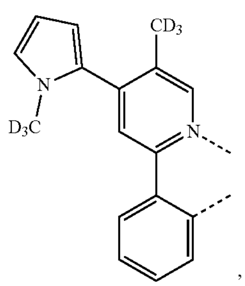
$L_{b540}$
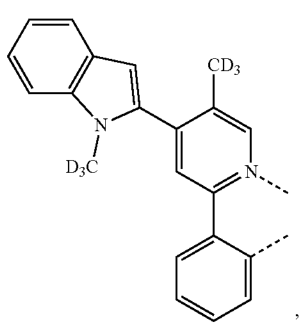
-continued
$L_{b541}$
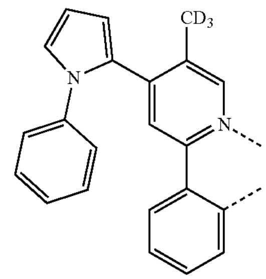
$L_{b542}$
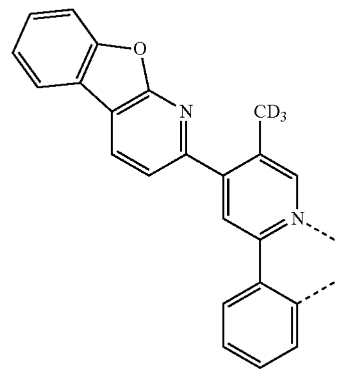
$L_{b543}$
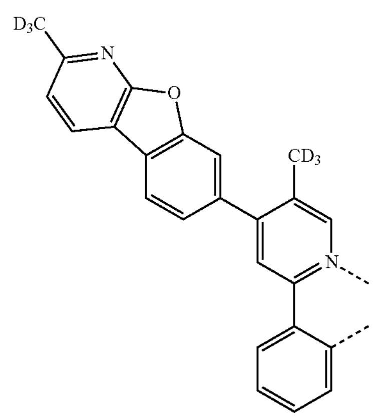
$L_{b544}$
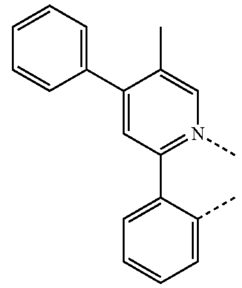

-continued $L_{b545}$

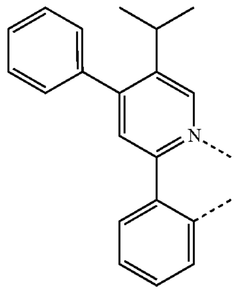

.

20. The metal complex of claim 19, wherein the metal complex has a structure of $Ir(L_a)_2(L_b)$ or $Ir(L_a)(L_b)_2$, wherein $L_a$ is, at each occurrence identically or differently, selected from any one or two of the group consisting of $L_{a1}$ to $L_{a326}$ and $L_b$ is, at each occurrence identically or differently, selected from any one or two of the group consisting of $L_{b1}$ to $L_{b335}$, to $L_{b340}$ to $L_{b545}$;

preferably, the metal complex is selected from the group consisting of Metal Complex 1 to Metal Complex 3348, wherein Metal Complex 1 to Metal Complex 3348 have the structure of $Ir(L_a)(L_b)_2$, wherein the two $L_b$ are identical and $L_a$ and $L_b$ correspond to structures shown in the following table, respectively:

| Metal Complex | $L_a$ | $L_b$ | Metal Complex | $L_a$ | $L_b$ |
|---|---|---|---|---|---|
| 1 | $L_{a1}$ | $L_{b151}$ | 2 | $L_{a2}$ | $L_{b151}$ |
| 3 | $L_{a3}$ | $L_{b151}$ | 4 | $L_{a4}$ | $L_{b151}$ |
| 5 | $L_{a5}$ | $L_{b151}$ | 6 | $L_{a6}$ | $L_{b151}$ |
| 7 | $L_{a7}$ | $L_{b151}$ | 8 | $L_{a8}$ | $L_{b151}$ |
| 9 | $L_{a17}$ | $L_{b151}$ | 10 | $L_{a18}$ | $L_{b151}$ |
| 11 | $L_{a19}$ | $L_{b151}$ | 12 | $L_{a20}$ | $L_{b151}$ |
| 13 | $L_{a21}$ | $L_{b151}$ | 14 | $L_{a22}$ | $L_{b151}$ |
| 15 | $L_{a23}$ | $L_{b151}$ | 16 | $L_{a24}$ | $L_{b151}$ |
| 17 | $L_{a48}$ | $L_{b151}$ | 18 | $L_{a49}$ | $L_{b151}$ |
| 19 | $L_{a50}$ | $L_{b151}$ | 20 | $L_{a51}$ | $L_{b151}$ |
| 21 | $L_{a52}$ | $L_{b151}$ | 22 | $L_{a53}$ | $L_{b151}$ |
| 23 | $L_{a54}$ | $L_{b151}$ | 24 | $L_{a55}$ | $L_{b151}$ |
| 25 | $L_{a56}$ | $L_{b151}$ | 26 | $L_{a57}$ | $L_{b151}$ |
| 27 | $L_{a58}$ | $L_{b151}$ | 28 | $L_{a59}$ | $L_{b151}$ |
| 29 | $L_{a60}$ | $L_{b151}$ | 30 | $L_{a61}$ | $L_{b151}$ |
| 31 | $L_{a62}$ | $L_{b151}$ | 32 | $L_{a63}$ | $L_{b151}$ |
| 33 | $L_{a64}$ | $L_{b151}$ | 34 | $L_{a65}$ | $L_{b151}$ |
| 35 | $L_{a66}$ | $L_{b151}$ | 36 | $L_{a67}$ | $L_{b151}$ |
| 37 | $L_{a68}$ | $L_{b151}$ | 38 | $L_{a69}$ | $L_{b151}$ |
| 39 | $L_{a70}$ | $L_{b151}$ | 40 | $L_{a71}$ | $L_{b151}$ |
| 41 | $L_{a72}$ | $L_{b151}$ | 42 | $L_{a73}$ | $L_{b151}$ |
| 43 | $L_{a74}$ | $L_{b151}$ | 44 | $L_{a75}$ | $L_{b151}$ |
| 45 | $L_{a76}$ | $L_{b151}$ | 46 | $L_{a77}$ | $L_{b151}$ |
| 47 | $L_{a78}$ | $L_{b151}$ | 48 | $L_{a79}$ | $L_{b151}$ |
| 49 | $L_{a80}$ | $L_{b151}$ | 50 | $L_{a81}$ | $L_{b151}$ |
| 51 | $L_{a82}$ | $L_{b151}$ | 52 | $L_{a83}$ | $L_{b151}$ |
| 53 | $L_{a92}$ | $L_{b151}$ | 54 | $L_{a93}$ | $L_{b151}$ |
| 55 | $L_{a94}$ | $L_{b151}$ | 56 | $L_{a95}$ | $L_{b151}$ |
| 57 | $L_{a96}$ | $L_{b151}$ | 58 | $L_{a97}$ | $L_{b151}$ |
| 59 | $L_{a98}$ | $L_{b151}$ | 60 | $L_{a99}$ | $L_{b151}$ |
| 61 | $L_{a100}$ | $L_{b151}$ | 62 | $L_{a101}$ | $L_{b151}$ |
| 63 | $L_{a102}$ | $L_{b151}$ | 64 | $L_{a103}$ | $L_{b151}$ |
| 65 | $L_{a104}$ | $L_{b151}$ | 66 | $L_{a105}$ | $L_{b151}$ |
| 67 | $L_{a106}$ | $L_{b151}$ | 68 | $L_{a109}$ | $L_{b151}$ |
| 69 | $L_{a110}$ | $L_{b151}$ | 70 | $L_{a111}$ | $L_{b151}$ |
| 71 | $L_{a112}$ | $L_{b151}$ | 72 | $L_{a113}$ | $L_{b151}$ |
| 73 | $L_{a114}$ | $L_{b151}$ | 74 | $L_{a115}$ | $L_{b151}$ |
| 75 | $L_{a116}$ | $L_{b151}$ | 76 | $L_{a125}$ | $L_{b151}$ |
| 77 | $L_{a126}$ | $L_{b151}$ | 78 | $L_{a127}$ | $L_{b151}$ |
| 79 | $L_{a128}$ | $L_{b151}$ | 80 | $L_{a129}$ | $L_{b151}$ |
| 81 | $L_{a130}$ | $L_{b151}$ | 82 | $L_{a131}$ | $L_{b151}$ |
| 83 | $L_{a132}$ | $L_{b151}$ | 84 | $L_{a155}$ | $L_{b151}$ |
| 85 | $L_{a156}$ | $L_{b151}$ | 86 | $L_{a157}$ | $L_{b151}$ |

-continued

| Metal Complex | $L_a$ | $L_b$ | Metal Complex | $L_a$ | $L_b$ |
|---|---|---|---|---|---|
| 87 | $L_{a158}$ | $L_{b151}$ | 88 | $L_{a159}$ | $L_{b151}$ |
| 89 | $L_{a160}$ | $L_{b151}$ | 90 | $L_{a161}$ | $L_{b151}$ |
| 91 | $L_{a162}$ | $L_{b151}$ | 92 | $L_{a163}$ | $L_{b151}$ |
| 93 | $L_{a164}$ | $L_{b151}$ | 94 | $L_{a165}$ | $L_{b151}$ |
| 95 | $L_{a166}$ | $L_{b151}$ | 96 | $L_{a167}$ | $L_{b151}$ |
| 97 | $L_{a168}$ | $L_{b151}$ | 98 | $L_{a169}$ | $L_{b151}$ |
| 99 | $L_{a170}$ | $L_{b151}$ | 100 | $L_{a171}$ | $L_{b151}$ |
| 101 | $L_{a172}$ | $L_{b151}$ | 102 | $L_{a173}$ | $L_{b151}$ |
| 103 | $L_{a174}$ | $L_{b151}$ | 104 | $L_{a175}$ | $L_{b151}$ |
| 105 | $L_{a176}$ | $L_{b151}$ | 106 | $L_{a177}$ | $L_{b151}$ |
| 107 | $L_{a178}$ | $L_{b151}$ | 108 | $L_{a179}$ | $L_{b151}$ |
| 109 | $L_{a180}$ | $L_{b151}$ | 110 | $L_{a181}$ | $L_{b151}$ |
| 111 | $L_{a182}$ | $L_{b151}$ | 112 | $L_{a183}$ | $L_{b151}$ |
| 113 | $L_{a184}$ | $L_{b151}$ | 114 | $L_{a185}$ | $L_{b151}$ |
| 115 | $L_{a186}$ | $L_{b151}$ | 116 | $L_{a187}$ | $L_{b151}$ |
| 117 | $L_{a188}$ | $L_{b151}$ | 118 | $L_{a189}$ | $L_{b151}$ |
| 119 | $L_{a190}$ | $L_{b151}$ | 120 | $L_{a199}$ | $L_{b151}$ |
| 121 | $L_{a200}$ | $L_{b151}$ | 122 | $L_{a201}$ | $L_{b151}$ |
| 123 | $L_{a202}$ | $L_{b151}$ | 124 | $L_{a203}$ | $L_{b151}$ |
| 125 | $L_{a204}$ | $L_{b151}$ | 126 | $L_{a205}$ | $L_{b151}$ |
| 127 | $L_{a206}$ | $L_{b151}$ | 128 | $L_{a207}$ | $L_{b151}$ |
| 129 | $L_{a208}$ | $L_{b151}$ | 130 | $L_{a209}$ | $L_{b151}$ |
| 131 | $L_{a210}$ | $L_{b151}$ | 132 | $L_{a211}$ | $L_{b151}$ |
| 133 | $L_{a212}$ | $L_{b151}$ | 134 | $L_{a213}$ | $L_{b151}$ |
| 135 | $L_{a214}$ | $L_{b151}$ | 136 | $L_{a215}$ | $L_{b151}$ |
| 137 | $L_{a216}$ | $L_{b151}$ | 138 | $L_{a217}$ | $L_{b151}$ |
| 139 | $L_{a218}$ | $L_{b151}$ | 140 | $L_{a219}$ | $L_{b151}$ |
| 141 | $L_{a220}$ | $L_{b151}$ | 142 | $L_{a221}$ | $L_{b151}$ |
| 143 | $L_{a230}$ | $L_{b151}$ | 144 | $L_{a231}$ | $L_{b151}$ |
| 145 | $L_{a232}$ | $L_{b151}$ | 146 | $L_{a233}$ | $L_{b151}$ |
| 147 | $L_{a234}$ | $L_{b151}$ | 148 | $L_{a235}$ | $L_{b151}$ |
| 149 | $L_{a236}$ | $L_{b151}$ | 150 | $L_{a252}$ | $L_{b151}$ |
| 151 | $L_{a253}$ | $L_{b151}$ | 152 | $L_{a254}$ | $L_{b151}$ |
| 153 | $L_{a255}$ | $L_{b151}$ | 154 | $L_{a256}$ | $L_{b151}$ |
| 155 | $L_{a257}$ | $L_{b151}$ | 156 | $L_{a258}$ | $L_{b151}$ |
| 157 | $L_{a259}$ | $L_{b151}$ | 158 | $L_{a260}$ | $L_{b151}$ |
| 159 | $L_{a261}$ | $L_{b151}$ | 160 | $L_{a262}$ | $L_{b151}$ |
| 161 | $L_{a263}$ | $L_{b151}$ | 162 | $L_{a264}$ | $L_{b151}$ |
| 163 | $L_{a265}$ | $L_{b151}$ | 164 | $L_{a266}$ | $L_{b151}$ |
| 165 | $L_{a267}$ | $L_{b151}$ | 166 | $L_{a268}$ | $L_{b151}$ |
| 167 | $L_{a269}$ | $L_{b151}$ | 168 | $L_{a270}$ | $L_{b151}$ |
| 169 | $L_{a271}$ | $L_{b151}$ | 170 | $L_{a272}$ | $L_{b151}$ |
| 171 | $L_{a273}$ | $L_{b151}$ | 172 | $L_{a274}$ | $L_{b151}$ |
| 173 | $L_{a275}$ | $L_{b151}$ | 174 | $L_{a276}$ | $L_{b151}$ |
| 175 | $L_{a277}$ | $L_{b151}$ | 176 | $L_{a278}$ | $L_{b151}$ |
| 177 | $L_{a279}$ | $L_{b151}$ | 178 | $L_{a280}$ | $L_{b151}$ |
| 179 | $L_{a281}$ | $L_{b151}$ | 180 | $L_{a282}$ | $L_{b151}$ |
| 181 | $L_{a283}$ | $L_{b151}$ | 182 | $L_{a284}$ | $L_{b151}$ |
| 183 | $L_{a285}$ | $L_{b151}$ | 184 | $L_{a286}$ | $L_{b151}$ |
| 185 | $L_{a287}$ | $L_{b151}$ | 186 | $L_{a288}$ | $L_{b151}$ |
| 187 | $L_{a1}$ | $L_{b152}$ | 188 | $L_{a2}$ | $L_{b152}$ |
| 189 | $L_{a3}$ | $L_{b152}$ | 190 | $L_{a4}$ | $L_{b152}$ |
| 191 | $L_{a5}$ | $L_{b152}$ | 192 | $L_{a6}$ | $L_{b152}$ |
| 193 | $L_{a7}$ | $L_{b152}$ | 194 | $L_{a8}$ | $L_{b152}$ |
| 195 | $L_{a17}$ | $L_{b152}$ | 196 | $L_{a18}$ | $L_{b152}$ |
| 197 | $L_{a19}$ | $L_{b152}$ | 198 | $L_{a20}$ | $L_{b152}$ |
| 199 | $L_{a21}$ | $L_{b152}$ | 200 | $L_{a22}$ | $L_{b152}$ |
| 201 | $L_{a23}$ | $L_{b152}$ | 202 | $L_{a24}$ | $L_{b152}$ |
| 203 | $L_{a48}$ | $L_{b152}$ | 204 | $L_{a49}$ | $L_{b152}$ |
| 205 | $L_{a50}$ | $L_{b152}$ | 206 | $L_{a51}$ | $L_{b152}$ |
| 207 | $L_{a52}$ | $L_{b152}$ | 208 | $L_{a53}$ | $L_{b152}$ |
| 209 | $L_{a54}$ | $L_{b152}$ | 210 | $L_{a55}$ | $L_{b152}$ |
| 211 | $L_{a56}$ | $L_{b152}$ | 212 | $L_{a57}$ | $L_{b152}$ |
| 213 | $L_{a58}$ | $L_{b152}$ | 214 | $L_{a59}$ | $L_{b152}$ |
| 215 | $L_{a60}$ | $L_{b152}$ | 216 | $L_{a61}$ | $L_{b152}$ |
| 217 | $L_{a62}$ | $L_{b152}$ | 218 | $L_{a63}$ | $L_{b152}$ |
| 219 | $L_{a64}$ | $L_{b152}$ | 220 | $L_{a65}$ | $L_{b152}$ |
| 221 | $L_{a66}$ | $L_{b152}$ | 222 | $L_{a67}$ | $L_{b152}$ |
| 223 | $L_{a68}$ | $L_{b152}$ | 224 | $L_{a69}$ | $L_{b152}$ |
| 225 | $L_{a70}$ | $L_{b152}$ | 226 | $L_{a71}$ | $L_{b152}$ |
| 227 | $L_{a72}$ | $L_{b152}$ | 228 | $L_{a73}$ | $L_{b152}$ |
| 229 | $L_{a74}$ | $L_{b152}$ | 230 | $L_{a75}$ | $L_{b152}$ |
| 231 | $L_{a76}$ | $L_{b152}$ | 232 | $L_{a77}$ | $L_{b152}$ |
| 233 | $L_{a78}$ | $L_{b152}$ | 234 | $L_{a79}$ | $L_{b152}$ |
| 235 | $L_{a80}$ | $L_{b152}$ | 236 | $L_{a81}$ | $L_{b152}$ |
| 237 | $L_{a82}$ | $L_{b152}$ | 238 | $L_{a83}$ | $L_{b152}$ |

-continued

| Metal Complex | $L_a$ | $L_b$ | Metal Complex | $L_a$ | $L_b$ |
|---|---|---|---|---|---|
| 239 | $L_{a92}$ | $L_{b152}$ | 240 | $L_{a93}$ | $L_{b152}$ |
| 241 | $L_{a94}$ | $L_{b152}$ | 242 | $L_{a95}$ | $L_{b152}$ |
| 243 | $L_{a96}$ | $L_{b152}$ | 244 | $L_{a97}$ | $L_{b152}$ |
| 245 | $L_{a98}$ | $L_{b152}$ | 246 | $L_{a99}$ | $L_{b152}$ |
| 247 | $L_{a100}$ | $L_{b152}$ | 248 | $L_{a101}$ | $L_{b152}$ |
| 249 | $L_{a102}$ | $L_{b152}$ | 250 | $L_{a103}$ | $L_{b152}$ |
| 251 | $L_{a104}$ | $L_{b152}$ | 252 | $L_{a105}$ | $L_{b152}$ |
| 253 | $L_{a106}$ | $L_{b152}$ | 254 | $L_{a109}$ | $L_{b152}$ |
| 255 | $L_{a110}$ | $L_{b152}$ | 256 | $L_{a111}$ | $L_{b152}$ |
| 257 | $L_{a112}$ | $L_{b152}$ | 258 | $L_{a113}$ | $L_{b152}$ |
| 259 | $L_{a114}$ | $L_{b152}$ | 260 | $L_{a115}$ | $L_{b152}$ |
| 261 | $L_{a116}$ | $L_{b152}$ | 262 | $L_{a125}$ | $L_{b152}$ |
| 263 | $L_{a126}$ | $L_{b152}$ | 264 | $L_{a127}$ | $L_{b152}$ |
| 265 | $L_{a128}$ | $L_{b152}$ | 266 | $L_{a129}$ | $L_{b152}$ |
| 267 | $L_{a130}$ | $L_{b152}$ | 268 | $L_{a131}$ | $L_{b152}$ |
| 269 | $L_{a132}$ | $L_{b152}$ | 270 | $L_{a155}$ | $L_{b152}$ |
| 271 | $L_{a156}$ | $L_{b152}$ | 272 | $L_{a157}$ | $L_{b152}$ |
| 273 | $L_{a158}$ | $L_{b152}$ | 274 | $L_{a159}$ | $L_{b152}$ |
| 275 | $L_{a160}$ | $L_{b152}$ | 276 | $L_{a161}$ | $L_{b152}$ |
| 277 | $L_{a162}$ | $L_{b152}$ | 278 | $L_{a163}$ | $L_{b152}$ |
| 279 | $L_{a164}$ | $L_{b152}$ | 280 | $L_{a165}$ | $L_{b152}$ |
| 281 | $L_{a166}$ | $L_{b152}$ | 282 | $L_{a167}$ | $L_{b152}$ |
| 283 | $L_{a168}$ | $L_{b152}$ | 284 | $L_{a169}$ | $L_{b152}$ |
| 285 | $L_{a170}$ | $L_{b152}$ | 286 | $L_{a171}$ | $L_{b152}$ |
| 287 | $L_{a172}$ | $L_{b152}$ | 288 | $L_{a173}$ | $L_{b152}$ |
| 289 | $L_{a174}$ | $L_{b152}$ | 290 | $L_{a175}$ | $L_{b152}$ |
| 291 | $L_{a176}$ | $L_{b152}$ | 292 | $L_{a177}$ | $L_{b152}$ |
| 293 | $L_{a178}$ | $L_{b152}$ | 294 | $L_{a179}$ | $L_{b152}$ |
| 295 | $L_{a180}$ | $L_{b152}$ | 296 | $L_{a181}$ | $L_{b152}$ |
| 297 | $L_{a182}$ | $L_{b152}$ | 298 | $L_{a183}$ | $L_{b152}$ |
| 299 | $L_{a184}$ | $L_{b152}$ | 300 | $L_{a185}$ | $L_{b152}$ |
| 301 | $L_{a186}$ | $L_{b152}$ | 302 | $L_{a187}$ | $L_{b152}$ |
| 303 | $L_{a188}$ | $L_{b152}$ | 304 | $L_{a189}$ | $L_{b152}$ |
| 305 | $L_{a190}$ | $L_{b152}$ | 306 | $L_{a199}$ | $L_{b152}$ |
| 307 | $L_{a200}$ | $L_{b152}$ | 308 | $L_{a201}$ | $L_{b152}$ |
| 309 | $L_{a202}$ | $L_{b152}$ | 310 | $L_{a203}$ | $L_{b152}$ |
| 311 | $L_{a204}$ | $L_{b152}$ | 312 | $L_{a205}$ | $L_{b152}$ |
| 313 | $L_{a206}$ | $L_{b152}$ | 314 | $L_{a207}$ | $L_{b152}$ |
| 315 | $L_{a208}$ | $L_{b152}$ | 316 | $L_{a209}$ | $L_{b152}$ |
| 317 | $L_{a210}$ | $L_{b152}$ | 318 | $L_{a211}$ | $L_{b152}$ |
| 319 | $L_{a212}$ | $L_{b152}$ | 320 | $L_{a213}$ | $L_{b152}$ |
| 321 | $L_{a214}$ | $L_{b152}$ | 322 | $L_{a215}$ | $L_{b152}$ |
| 323 | $L_{a216}$ | $L_{b152}$ | 324 | $L_{a217}$ | $L_{b152}$ |
| 325 | $L_{a218}$ | $L_{b152}$ | 326 | $L_{a219}$ | $L_{b152}$ |
| 327 | $L_{a220}$ | $L_{b152}$ | 328 | $L_{a221}$ | $L_{b152}$ |
| 329 | $L_{a230}$ | $L_{b152}$ | 330 | $L_{a231}$ | $L_{b152}$ |
| 331 | $L_{a232}$ | $L_{b152}$ | 332 | $L_{a233}$ | $L_{b152}$ |
| 333 | $L_{a234}$ | $L_{b152}$ | 334 | $L_{a235}$ | $L_{b152}$ |
| 335 | $L_{a236}$ | $L_{b152}$ | 336 | $L_{a252}$ | $L_{b152}$ |
| 337 | $L_{a253}$ | $L_{b152}$ | 338 | $L_{a254}$ | $L_{b152}$ |
| 339 | $L_{a255}$ | $L_{b152}$ | 340 | $L_{a256}$ | $L_{b152}$ |
| 341 | $L_{a257}$ | $L_{b152}$ | 342 | $L_{a258}$ | $L_{b152}$ |
| 343 | $L_{a259}$ | $L_{b152}$ | 344 | $L_{a260}$ | $L_{b152}$ |
| 345 | $L_{a261}$ | $L_{b152}$ | 346 | $L_{a262}$ | $L_{b152}$ |
| 347 | $L_{a263}$ | $L_{b152}$ | 348 | $L_{a264}$ | $L_{b152}$ |
| 349 | $L_{a265}$ | $L_{b152}$ | 350 | $L_{a266}$ | $L_{b152}$ |
| 351 | $L_{a267}$ | $L_{b152}$ | 352 | $L_{a268}$ | $L_{b152}$ |
| 353 | $L_{a269}$ | $L_{b152}$ | 354 | $L_{a270}$ | $L_{b152}$ |
| 355 | $L_{a271}$ | $L_{b152}$ | 356 | $L_{a272}$ | $L_{b152}$ |
| 357 | $L_{a273}$ | $L_{b152}$ | 358 | $L_{a274}$ | $L_{b152}$ |
| 359 | $L_{a275}$ | $L_{b152}$ | 360 | $L_{a276}$ | $L_{b152}$ |
| 361 | $L_{a277}$ | $L_{b152}$ | 362 | $L_{a278}$ | $L_{b152}$ |
| 363 | $L_{a279}$ | $L_{b152}$ | 364 | $L_{a280}$ | $L_{b152}$ |
| 365 | $L_{a281}$ | $L_{b152}$ | 366 | $L_{a282}$ | $L_{b152}$ |
| 367 | $L_{a283}$ | $L_{b152}$ | 368 | $L_{a284}$ | $L_{b152}$ |
| 369 | $L_{a285}$ | $L_{b152}$ | 370 | $L_{a286}$ | $L_{b152}$ |
| 371 | $L_{a287}$ | $L_{b152}$ | 372 | $L_{a288}$ | $L_{b152}$ |
| 373 | $L_{a1}$ | $L_{b153}$ | 374 | $L_{a2}$ | $L_{b153}$ |
| 375 | $L_{a3}$ | $L_{b153}$ | 376 | $L_{a4}$ | $L_{b153}$ |
| 377 | $L_{a5}$ | $L_{b153}$ | 378 | $L_{a6}$ | $L_{b153}$ |
| 379 | $L_{a7}$ | $L_{b153}$ | 380 | $L_{a8}$ | $L_{b153}$ |
| 381 | $L_{a17}$ | $L_{b153}$ | 382 | $L_{a18}$ | $L_{b153}$ |
| 383 | $L_{a19}$ | $L_{b153}$ | 384 | $L_{a20}$ | $L_{b153}$ |
| 385 | $L_{a21}$ | $L_{b153}$ | 386 | $L_{a22}$ | $L_{b153}$ |
| 387 | $L_{a23}$ | $L_{b153}$ | 388 | $L_{a24}$ | $L_{b153}$ |
| 389 | $L_{a48}$ | $L_{b153}$ | 390 | $L_{a49}$ | $L_{b153}$ |

-continued

| Metal Complex | $L_a$ | $L_b$ | Metal Complex | $L_a$ | $L_b$ |
|---|---|---|---|---|---|
| 391 | $L_{a50}$ | $L_{b153}$ | 392 | $L_{a51}$ | $L_{b153}$ |
| 393 | $L_{a52}$ | $L_{b153}$ | 394 | $L_{a53}$ | $L_{b153}$ |
| 395 | $L_{a54}$ | $L_{b153}$ | 396 | $L_{a55}$ | $L_{b153}$ |
| 397 | $L_{a56}$ | $L_{b153}$ | 398 | $L_{a57}$ | $L_{b153}$ |
| 399 | $L_{a58}$ | $L_{b153}$ | 400 | $L_{a59}$ | $L_{b153}$ |
| 401 | $L_{a60}$ | $L_{b153}$ | 402 | $L_{a61}$ | $L_{b153}$ |
| 403 | $L_{a62}$ | $L_{b153}$ | 404 | $L_{a63}$ | $L_{b153}$ |
| 405 | $L_{a64}$ | $L_{b153}$ | 406 | $L_{a65}$ | $L_{b153}$ |
| 407 | $L_{a66}$ | $L_{b153}$ | 408 | $L_{a67}$ | $L_{b153}$ |
| 409 | $L_{a68}$ | $L_{b153}$ | 410 | $L_{a69}$ | $L_{b153}$ |
| 411 | $L_{a70}$ | $L_{b153}$ | 412 | $L_{a71}$ | $L_{b153}$ |
| 413 | $L_{a72}$ | $L_{b153}$ | 414 | $L_{a73}$ | $L_{b153}$ |
| 415 | $L_{a74}$ | $L_{b153}$ | 416 | $L_{a75}$ | $L_{b153}$ |
| 417 | $L_{a76}$ | $L_{b153}$ | 418 | $L_{a77}$ | $L_{b153}$ |
| 419 | $L_{a78}$ | $L_{b153}$ | 420 | $L_{a79}$ | $L_{b153}$ |
| 421 | $L_{a80}$ | $L_{b153}$ | 422 | $L_{a81}$ | $L_{b153}$ |
| 423 | $L_{a82}$ | $L_{b153}$ | 424 | $L_{a83}$ | $L_{b153}$ |
| 425 | $L_{a92}$ | $L_{b153}$ | 426 | $L_{a93}$ | $L_{b153}$ |
| 427 | $L_{a94}$ | $L_{b153}$ | 428 | $L_{a95}$ | $L_{b153}$ |
| 429 | $L_{a96}$ | $L_{b153}$ | 430 | $L_{a97}$ | $L_{b153}$ |
| 431 | $L_{a98}$ | $L_{b153}$ | 432 | $L_{a99}$ | $L_{b153}$ |
| 433 | $L_{a100}$ | $L_{b153}$ | 434 | $L_{a101}$ | $L_{b153}$ |
| 435 | $L_{a102}$ | $L_{b153}$ | 436 | $L_{a103}$ | $L_{b153}$ |
| 437 | $L_{a104}$ | $L_{b153}$ | 438 | $L_{a105}$ | $L_{b153}$ |
| 439 | $L_{a106}$ | $L_{b153}$ | 440 | $L_{a109}$ | $L_{b153}$ |
| 441 | $L_{a110}$ | $L_{b153}$ | 442 | $L_{a111}$ | $L_{b153}$ |
| 443 | $L_{a112}$ | $L_{b153}$ | 444 | $L_{a113}$ | $L_{b153}$ |
| 445 | $L_{a114}$ | $L_{b153}$ | 446 | $L_{a115}$ | $L_{b153}$ |
| 447 | $L_{a116}$ | $L_{b153}$ | 448 | $L_{a125}$ | $L_{b153}$ |
| 449 | $L_{a126}$ | $L_{b153}$ | 450 | $L_{a127}$ | $L_{b153}$ |
| 451 | $L_{a128}$ | $L_{b153}$ | 452 | $L_{a129}$ | $L_{b153}$ |
| 453 | $L_{a130}$ | $L_{b153}$ | 454 | $L_{a131}$ | $L_{b153}$ |
| 455 | $L_{a132}$ | $L_{b153}$ | 456 | $L_{a155}$ | $L_{b153}$ |
| 457 | $L_{a156}$ | $L_{b153}$ | 458 | $L_{a157}$ | $L_{b153}$ |
| 459 | $L_{a158}$ | $L_{b153}$ | 460 | $L_{a159}$ | $L_{b153}$ |
| 461 | $L_{a160}$ | $L_{b153}$ | 462 | $L_{a161}$ | $L_{b153}$ |
| 463 | $L_{a162}$ | $L_{b153}$ | 464 | $L_{a163}$ | $L_{b153}$ |
| 465 | $L_{a164}$ | $L_{b153}$ | 466 | $L_{a165}$ | $L_{b153}$ |
| 467 | $L_{a166}$ | $L_{b153}$ | 468 | $L_{a167}$ | $L_{b153}$ |
| 469 | $L_{a168}$ | $L_{b153}$ | 470 | $L_{a169}$ | $L_{b153}$ |
| 471 | $L_{a170}$ | $L_{b153}$ | 472 | $L_{a171}$ | $L_{b153}$ |
| 473 | $L_{a172}$ | $L_{b153}$ | 474 | $L_{a173}$ | $L_{b153}$ |
| 475 | $L_{a174}$ | $L_{b153}$ | 476 | $L_{a175}$ | $L_{b153}$ |
| 477 | $L_{a176}$ | $L_{b153}$ | 478 | $L_{a177}$ | $L_{b153}$ |
| 479 | $L_{a178}$ | $L_{b153}$ | 480 | $L_{a179}$ | $L_{b153}$ |
| 481 | $L_{a180}$ | $L_{b153}$ | 482 | $L_{a181}$ | $L_{b153}$ |
| 483 | $L_{a182}$ | $L_{b153}$ | 484 | $L_{a183}$ | $L_{b153}$ |
| 485 | $L_{a184}$ | $L_{b153}$ | 486 | $L_{a185}$ | $L_{b153}$ |
| 487 | $L_{a186}$ | $L_{b153}$ | 488 | $L_{a187}$ | $L_{b153}$ |
| 489 | $L_{a188}$ | $L_{b153}$ | 490 | $L_{a189}$ | $L_{b153}$ |
| 491 | $L_{a190}$ | $L_{b153}$ | 492 | $L_{a199}$ | $L_{b153}$ |
| 493 | $L_{a200}$ | $L_{b153}$ | 494 | $L_{a201}$ | $L_{b153}$ |
| 495 | $L_{a202}$ | $L_{b153}$ | 496 | $L_{a203}$ | $L_{b153}$ |
| 497 | $L_{a204}$ | $L_{b153}$ | 498 | $L_{a205}$ | $L_{b153}$ |
| 499 | $L_{a206}$ | $L_{b153}$ | 500 | $L_{a207}$ | $L_{b153}$ |
| 501 | $L_{a208}$ | $L_{b153}$ | 502 | $L_{a209}$ | $L_{b153}$ |
| 503 | $L_{a210}$ | $L_{b153}$ | 504 | $L_{a211}$ | $L_{b153}$ |
| 505 | $L_{a212}$ | $L_{b153}$ | 506 | $L_{a213}$ | $L_{b153}$ |
| 507 | $L_{a214}$ | $L_{b153}$ | 508 | $L_{a215}$ | $L_{b153}$ |
| 509 | $L_{a216}$ | $L_{b153}$ | 510 | $L_{a217}$ | $L_{b153}$ |
| 511 | $L_{a218}$ | $L_{b153}$ | 512 | $L_{a219}$ | $L_{b153}$ |
| 513 | $L_{a220}$ | $L_{b153}$ | 514 | $L_{a221}$ | $L_{b153}$ |
| 515 | $L_{a230}$ | $L_{b153}$ | 516 | $L_{a231}$ | $L_{b153}$ |
| 517 | $L_{a232}$ | $L_{b153}$ | 518 | $L_{a233}$ | $L_{b153}$ |
| 519 | $L_{a234}$ | $L_{b153}$ | 520 | $L_{a235}$ | $L_{b153}$ |
| 521 | $L_{a236}$ | $L_{b153}$ | 522 | $L_{a252}$ | $L_{b153}$ |
| 523 | $L_{a253}$ | $L_{b153}$ | 524 | $L_{a254}$ | $L_{b153}$ |
| 525 | $L_{a255}$ | $L_{b153}$ | 526 | $L_{a256}$ | $L_{b153}$ |
| 527 | $L_{a257}$ | $L_{b153}$ | 528 | $L_{a258}$ | $L_{b153}$ |
| 529 | $L_{a259}$ | $L_{b153}$ | 530 | $L_{a260}$ | $L_{b153}$ |
| 531 | $L_{a261}$ | $L_{b153}$ | 532 | $L_{a262}$ | $L_{b153}$ |
| 533 | $L_{a263}$ | $L_{b153}$ | 534 | $L_{a264}$ | $L_{b153}$ |
| 535 | $L_{a265}$ | $L_{b153}$ | 536 | $L_{a266}$ | $L_{b153}$ |
| 537 | $L_{a267}$ | $L_{b153}$ | 538 | $L_{a268}$ | $L_{b153}$ |
| 539 | $L_{a269}$ | $L_{b153}$ | 540 | $L_{a270}$ | $L_{b153}$ |
| 541 | $L_{a271}$ | $L_{b153}$ | 542 | $L_{a272}$ | $L_{b153}$ |

-continued

| Metal Complex | $L_a$ | $L_b$ | Metal Complex | $L_a$ | $L_b$ |
|---|---|---|---|---|---|
| 543 | $L_{a273}$ | $L_{b153}$ | 544 | $L_{a274}$ | $L_{b153}$ |
| 545 | $L_{a275}$ | $L_{b153}$ | 546 | $L_{a276}$ | $L_{b153}$ |
| 547 | $L_{a277}$ | $L_{b153}$ | 548 | $L_{a278}$ | $L_{b153}$ |
| 549 | $L_{a279}$ | $L_{b153}$ | 550 | $L_{a280}$ | $L_{b153}$ |
| 551 | $L_{a281}$ | $L_{b153}$ | 552 | $L_{a282}$ | $L_{b153}$ |
| 553 | $L_{a283}$ | $L_{b153}$ | 554 | $L_{a284}$ | $L_{b153}$ |
| 555 | $L_{a285}$ | $L_{b153}$ | 556 | $L_{a286}$ | $L_{b153}$ |
| 557 | $L_{a287}$ | $L_{b153}$ | 558 | $L_{a288}$ | $L_{b153}$ |
| 559 | $L_{a1}$ | $L_{b158}$ | 560 | $L_{a2}$ | $L_{b158}$ |
| 561 | $L_{a3}$ | $L_{b158}$ | 562 | $L_{a4}$ | $L_{b158}$ |
| 563 | $L_{a5}$ | $L_{b158}$ | 564 | $L_{a6}$ | $L_{b158}$ |
| 565 | $L_{a7}$ | $L_{b158}$ | 566 | $L_{a8}$ | $L_{b158}$ |
| 567 | $L_{a17}$ | $L_{b158}$ | 568 | $L_{a18}$ | $L_{b158}$ |
| 569 | $L_{a19}$ | $L_{b158}$ | 570 | $L_{a20}$ | $L_{b158}$ |
| 571 | $L_{a21}$ | $L_{b158}$ | 572 | $L_{a22}$ | $L_{b158}$ |
| 573 | $L_{a23}$ | $L_{b158}$ | 574 | $L_{a24}$ | $L_{b158}$ |
| 575 | $L_{a48}$ | $L_{b158}$ | 576 | $L_{a49}$ | $L_{b158}$ |
| 577 | $L_{a50}$ | $L_{b158}$ | 578 | $L_{a51}$ | $L_{b158}$ |
| 579 | $L_{a52}$ | $L_{b158}$ | 580 | $L_{a53}$ | $L_{b158}$ |
| 581 | $L_{a54}$ | $L_{b158}$ | 582 | $L_{a55}$ | $L_{b158}$ |
| 583 | $L_{a56}$ | $L_{b158}$ | 584 | $L_{a57}$ | $L_{b158}$ |
| 585 | $L_{a58}$ | $L_{b158}$ | 586 | $L_{a59}$ | $L_{b158}$ |
| 587 | $L_{a60}$ | $L_{b158}$ | 588 | $L_{a61}$ | $L_{b158}$ |
| 589 | $L_{a62}$ | $L_{b158}$ | 590 | $L_{a63}$ | $L_{b158}$ |
| 591 | $L_{a64}$ | $L_{b158}$ | 592 | $L_{a65}$ | $L_{b158}$ |
| 593 | $L_{a66}$ | $L_{b158}$ | 594 | $L_{a67}$ | $L_{b158}$ |
| 595 | $L_{a68}$ | $L_{b158}$ | 596 | $L_{a69}$ | $L_{b158}$ |
| 597 | $L_{a70}$ | $L_{b158}$ | 598 | $L_{a71}$ | $L_{b158}$ |
| 599 | $L_{a72}$ | $L_{b158}$ | 600 | $L_{a73}$ | $L_{b158}$ |
| 601 | $L_{a74}$ | $L_{b158}$ | 602 | $L_{a75}$ | $L_{b158}$ |
| 603 | $L_{a76}$ | $L_{b158}$ | 604 | $L_{a77}$ | $L_{b158}$ |
| 605 | $L_{a78}$ | $L_{b158}$ | 606 | $L_{a79}$ | $L_{b158}$ |
| 607 | $L_{a80}$ | $L_{b158}$ | 608 | $L_{a81}$ | $L_{b158}$ |
| 609 | $L_{a82}$ | $L_{b158}$ | 610 | $L_{a83}$ | $L_{b158}$ |
| 611 | $L_{a92}$ | $L_{b158}$ | 612 | $L_{a93}$ | $L_{b158}$ |
| 613 | $L_{a94}$ | $L_{b158}$ | 614 | $L_{a95}$ | $L_{b158}$ |
| 615 | $L_{a96}$ | $L_{b158}$ | 616 | $L_{a97}$ | $L_{b158}$ |
| 617 | $L_{a98}$ | $L_{b158}$ | 618 | $L_{a99}$ | $L_{b158}$ |
| 619 | $L_{a100}$ | $L_{b158}$ | 620 | $L_{a101}$ | $L_{b158}$ |
| 621 | $L_{a102}$ | $L_{b158}$ | 622 | $L_{a103}$ | $L_{b158}$ |
| 623 | $L_{a104}$ | $L_{b158}$ | 624 | $L_{a105}$ | $L_{b158}$ |
| 625 | $L_{a106}$ | $L_{b158}$ | 626 | $L_{a109}$ | $L_{b158}$ |
| 627 | $L_{a110}$ | $L_{b158}$ | 628 | $L_{a111}$ | $L_{b158}$ |
| 629 | $L_{a112}$ | $L_{b158}$ | 630 | $L_{a113}$ | $L_{b158}$ |
| 631 | $L_{a114}$ | $L_{b158}$ | 632 | $L_{a115}$ | $L_{b158}$ |
| 633 | $L_{a116}$ | $L_{b158}$ | 634 | $L_{a125}$ | $L_{b158}$ |
| 635 | $L_{a126}$ | $L_{b158}$ | 636 | $L_{a127}$ | $L_{b158}$ |
| 637 | $L_{a128}$ | $L_{b158}$ | 638 | $L_{a129}$ | $L_{b158}$ |
| 639 | $L_{a130}$ | $L_{b158}$ | 640 | $L_{a131}$ | $L_{b158}$ |
| 641 | $L_{a132}$ | $L_{b158}$ | 642 | $L_{a155}$ | $L_{b158}$ |
| 643 | $L_{a156}$ | $L_{b158}$ | 644 | $L_{a157}$ | $L_{b158}$ |
| 645 | $L_{a158}$ | $L_{b158}$ | 646 | $L_{a159}$ | $L_{b158}$ |
| 647 | $L_{a160}$ | $L_{b158}$ | 648 | $L_{a161}$ | $L_{b158}$ |
| 649 | $L_{a162}$ | $L_{b158}$ | 650 | $L_{a163}$ | $L_{b158}$ |
| 651 | $L_{a164}$ | $L_{b158}$ | 652 | $L_{a165}$ | $L_{b158}$ |
| 653 | $L_{a166}$ | $L_{b158}$ | 654 | $L_{a167}$ | $L_{b158}$ |
| 655 | $L_{a168}$ | $L_{b158}$ | 656 | $L_{a169}$ | $L_{b158}$ |
| 657 | $L_{a170}$ | $L_{b158}$ | 658 | $L_{a171}$ | $L_{b158}$ |
| 659 | $L_{a172}$ | $L_{b158}$ | 660 | $L_{a173}$ | $L_{b158}$ |
| 661 | $L_{a174}$ | $L_{b158}$ | 662 | $L_{a175}$ | $L_{b158}$ |
| 663 | $L_{a176}$ | $L_{b158}$ | 664 | $L_{a177}$ | $L_{b158}$ |
| 665 | $L_{a178}$ | $L_{b158}$ | 666 | $L_{a179}$ | $L_{b158}$ |
| 667 | $L_{a180}$ | $L_{b158}$ | 668 | $L_{a181}$ | $L_{b158}$ |
| 669 | $L_{a182}$ | $L_{b158}$ | 670 | $L_{a183}$ | $L_{b158}$ |
| 671 | $L_{a184}$ | $L_{b158}$ | 672 | $L_{a185}$ | $L_{b158}$ |
| 673 | $L_{a186}$ | $L_{b158}$ | 674 | $L_{a187}$ | $L_{b158}$ |
| 675 | $L_{a188}$ | $L_{b158}$ | 676 | $L_{a189}$ | $L_{b158}$ |
| 677 | $L_{a190}$ | $L_{b158}$ | 678 | $L_{a199}$ | $L_{b158}$ |
| 679 | $L_{a200}$ | $L_{b158}$ | 680 | $L_{a201}$ | $L_{b158}$ |
| 681 | $L_{a202}$ | $L_{b158}$ | 682 | $L_{a203}$ | $L_{b158}$ |
| 683 | $L_{a204}$ | $L_{b158}$ | 684 | $L_{a205}$ | $L_{b158}$ |
| 685 | $L_{a206}$ | $L_{b158}$ | 686 | $L_{a207}$ | $L_{b158}$ |
| 687 | $L_{a208}$ | $L_{b158}$ | 688 | $L_{a209}$ | $L_{b158}$ |
| 689 | $L_{a210}$ | $L_{b158}$ | 690 | $L_{a211}$ | $L_{b158}$ |
| 691 | $L_{a212}$ | $L_{b158}$ | 692 | $L_{a213}$ | $L_{b158}$ |
| 693 | $L_{a214}$ | $L_{b158}$ | 694 | $L_{a215}$ | $L_{b158}$ |

-continued

| Metal Complex | $L_a$ | $L_b$ | Metal Complex | $L_a$ | $L_b$ |
|---|---|---|---|---|---|
| 695 | $L_{a216}$ | $L_{b158}$ | 696 | $L_{a217}$ | $L_{b158}$ |
| 697 | $L_{a218}$ | $L_{b158}$ | 698 | $L_{a219}$ | $L_{b158}$ |
| 699 | $L_{a220}$ | $L_{b158}$ | 700 | $L_{a221}$ | $L_{b158}$ |
| 701 | $L_{a230}$ | $L_{b158}$ | 702 | $L_{a231}$ | $L_{b158}$ |
| 703 | $L_{a232}$ | $L_{b158}$ | 704 | $L_{a233}$ | $L_{b158}$ |
| 705 | $L_{a234}$ | $L_{b158}$ | 706 | $L_{a235}$ | $L_{b158}$ |
| 707 | $L_{a236}$ | $L_{b158}$ | 708 | $L_{a252}$ | $L_{b158}$ |
| 709 | $L_{a253}$ | $L_{b158}$ | 710 | $L_{a254}$ | $L_{b158}$ |
| 711 | $L_{a255}$ | $L_{b158}$ | 712 | $L_{a256}$ | $L_{b158}$ |
| 713 | $L_{a257}$ | $L_{b158}$ | 714 | $L_{a258}$ | $L_{b158}$ |
| 715 | $L_{a259}$ | $L_{b158}$ | 716 | $L_{a260}$ | $L_{b158}$ |
| 717 | $L_{a261}$ | $L_{b158}$ | 718 | $L_{a262}$ | $L_{b158}$ |
| 719 | $L_{a263}$ | $L_{b158}$ | 720 | $L_{a264}$ | $L_{b158}$ |
| 721 | $L_{a265}$ | $L_{b158}$ | 722 | $L_{a266}$ | $L_{b158}$ |
| 723 | $L_{a267}$ | $L_{b158}$ | 724 | $L_{a268}$ | $L_{b158}$ |
| 725 | $L_{a269}$ | $L_{b158}$ | 726 | $L_{a270}$ | $L_{b158}$ |
| 727 | $L_{a271}$ | $L_{b158}$ | 728 | $L_{a272}$ | $L_{b158}$ |
| 729 | $L_{a273}$ | $L_{b158}$ | 730 | $L_{a274}$ | $L_{b158}$ |
| 731 | $L_{a275}$ | $L_{b158}$ | 732 | $L_{a276}$ | $L_{b158}$ |
| 733 | $L_{a277}$ | $L_{b158}$ | 734 | $L_{a278}$ | $L_{b158}$ |
| 735 | $L_{a279}$ | $L_{b158}$ | 736 | $L_{a280}$ | $L_{b158}$ |
| 737 | $L_{a281}$ | $L_{b158}$ | 738 | $L_{a282}$ | $L_{b158}$ |
| 739 | $L_{a283}$ | $L_{b158}$ | 740 | $L_{a284}$ | $L_{b158}$ |
| 741 | $L_{a285}$ | $L_{b158}$ | 742 | $L_{a286}$ | $L_{b158}$ |
| 743 | $L_{a287}$ | $L_{b158}$ | 744 | $L_{a288}$ | $L_{b158}$ |
| 745 | $L_{a1}$ | $L_{b165}$ | 746 | $L_{a2}$ | $L_{b165}$ |
| 747 | $L_{a3}$ | $L_{b165}$ | 748 | $L_{a4}$ | $L_{b165}$ |
| 749 | $L_{a5}$ | $L_{b165}$ | 750 | $L_{a6}$ | $L_{b165}$ |
| 751 | $L_{a7}$ | $L_{b165}$ | 752 | $L_{a8}$ | $L_{b165}$ |
| 753 | $L_{a17}$ | $L_{b165}$ | 754 | $L_{a18}$ | $L_{b165}$ |
| 755 | $L_{a19}$ | $L_{b165}$ | 756 | $L_{a20}$ | $L_{b165}$ |
| 757 | $L_{a21}$ | $L_{b165}$ | 758 | $L_{a22}$ | $L_{b165}$ |
| 759 | $L_{a23}$ | $L_{b165}$ | 760 | $L_{a24}$ | $L_{b165}$ |
| 761 | $L_{a48}$ | $L_{b165}$ | 762 | $L_{a49}$ | $L_{b165}$ |
| 763 | $L_{a50}$ | $L_{b165}$ | 764 | $L_{a51}$ | $L_{b165}$ |
| 765 | $L_{a52}$ | $L_{b165}$ | 766 | $L_{a53}$ | $L_{b165}$ |
| 767 | $L_{a54}$ | $L_{b165}$ | 768 | $L_{a55}$ | $L_{b165}$ |
| 769 | $L_{a56}$ | $L_{b165}$ | 770 | $L_{a57}$ | $L_{b165}$ |
| 771 | $L_{a58}$ | $L_{b165}$ | 772 | $L_{a59}$ | $L_{b165}$ |
| 773 | $L_{a60}$ | $L_{b165}$ | 774 | $L_{a61}$ | $L_{b165}$ |
| 775 | $L_{a62}$ | $L_{b165}$ | 776 | $L_{a63}$ | $L_{b165}$ |
| 777 | $L_{a64}$ | $L_{b165}$ | 778 | $L_{a65}$ | $L_{b165}$ |
| 779 | $L_{a66}$ | $L_{b165}$ | 780 | $L_{a67}$ | $L_{b165}$ |
| 781 | $L_{a68}$ | $L_{b165}$ | 782 | $L_{a69}$ | $L_{b165}$ |
| 783 | $L_{a70}$ | $L_{b165}$ | 784 | $L_{a71}$ | $L_{b165}$ |
| 785 | $L_{a72}$ | $L_{b165}$ | 786 | $L_{a73}$ | $L_{b165}$ |
| 787 | $L_{a74}$ | $L_{b165}$ | 788 | $L_{a75}$ | $L_{b165}$ |
| 789 | $L_{a76}$ | $L_{b165}$ | 790 | $L_{a77}$ | $L_{b165}$ |
| 791 | $L_{a78}$ | $L_{b165}$ | 792 | $L_{a79}$ | $L_{b165}$ |
| 793 | $L_{a80}$ | $L_{b165}$ | 794 | $L_{a81}$ | $L_{b165}$ |
| 795 | $L_{a82}$ | $L_{b165}$ | 796 | $L_{a83}$ | $L_{b165}$ |
| 797 | $L_{a92}$ | $L_{b165}$ | 798 | $L_{a93}$ | $L_{b165}$ |
| 799 | $L_{a94}$ | $L_{b165}$ | 800 | $L_{a95}$ | $L_{b165}$ |
| 801 | $L_{a96}$ | $L_{b165}$ | 802 | $L_{a97}$ | $L_{b165}$ |
| 803 | $L_{a98}$ | $L_{b165}$ | 804 | $L_{a99}$ | $L_{b165}$ |
| 805 | $L_{a100}$ | $L_{b165}$ | 806 | $L_{a101}$ | $L_{b165}$ |
| 807 | $L_{a102}$ | $L_{b165}$ | 808 | $L_{a103}$ | $L_{b165}$ |
| 809 | $L_{a104}$ | $L_{b165}$ | 810 | $L_{a105}$ | $L_{b165}$ |
| 811 | $L_{a106}$ | $L_{b165}$ | 812 | $L_{a109}$ | $L_{b165}$ |
| 813 | $L_{a110}$ | $L_{b165}$ | 814 | $L_{a111}$ | $L_{b165}$ |
| 815 | $L_{a112}$ | $L_{b165}$ | 816 | $L_{a113}$ | $L_{b165}$ |
| 817 | $L_{a114}$ | $L_{b165}$ | 818 | $L_{a115}$ | $L_{b165}$ |
| 819 | $L_{a116}$ | $L_{b165}$ | 820 | $L_{a125}$ | $L_{b165}$ |
| 821 | $L_{a126}$ | $L_{b165}$ | 822 | $L_{a127}$ | $L_{b165}$ |
| 823 | $L_{a128}$ | $L_{b165}$ | 824 | $L_{a129}$ | $L_{b165}$ |
| 825 | $L_{a130}$ | $L_{b165}$ | 826 | $L_{a131}$ | $L_{b165}$ |
| 827 | $L_{a132}$ | $L_{b165}$ | 828 | $L_{a155}$ | $L_{b165}$ |
| 829 | $L_{a156}$ | $L_{b165}$ | 830 | $L_{a157}$ | $L_{b165}$ |
| 831 | $L_{a158}$ | $L_{b165}$ | 832 | $L_{a159}$ | $L_{b165}$ |
| 833 | $L_{a160}$ | $L_{b165}$ | 834 | $L_{a161}$ | $L_{b165}$ |
| 835 | $L_{a162}$ | $L_{b165}$ | 836 | $L_{a163}$ | $L_{b165}$ |
| 837 | $L_{a164}$ | $L_{b165}$ | 838 | $L_{a165}$ | $L_{b165}$ |
| 839 | $L_{a166}$ | $L_{b165}$ | 840 | $L_{a167}$ | $L_{b165}$ |
| 841 | $L_{a168}$ | $L_{b165}$ | 842 | $L_{a169}$ | $L_{b165}$ |
| 843 | $L_{a170}$ | $L_{b165}$ | 844 | $L_{a171}$ | $L_{b165}$ |
| 845 | $L_{a172}$ | $L_{b165}$ | 846 | $L_{a173}$ | $L_{b165}$ |

-continued

| Metal Complex | $L_a$ | $L_b$ | Metal Complex | $L_a$ | $L_b$ |
|---|---|---|---|---|---|
| 847 | $L_{a174}$ | $L_{b165}$ | 848 | $L_{a175}$ | $L_{b165}$ |
| 849 | $L_{a176}$ | $L_{b165}$ | 850 | $L_{a177}$ | $L_{b165}$ |
| 851 | $L_{a178}$ | $L_{b165}$ | 852 | $L_{a179}$ | $L_{b165}$ |
| 853 | $L_{a180}$ | $L_{b165}$ | 854 | $L_{a181}$ | $L_{b165}$ |
| 855 | $L_{a182}$ | $L_{b165}$ | 856 | $L_{a183}$ | $L_{b165}$ |
| 857 | $L_{a184}$ | $L_{b165}$ | 858 | $L_{a185}$ | $L_{b165}$ |
| 859 | $L_{a186}$ | $L_{b165}$ | 860 | $L_{a187}$ | $L_{b165}$ |
| 861 | $L_{a188}$ | $L_{b165}$ | 862 | $L_{a189}$ | $L_{b165}$ |
| 863 | $L_{a190}$ | $L_{b165}$ | 864 | $L_{a199}$ | $L_{b165}$ |
| 865 | $L_{a200}$ | $L_{b165}$ | 866 | $L_{a201}$ | $L_{b165}$ |
| 867 | $L_{a202}$ | $L_{b165}$ | 868 | $L_{a203}$ | $L_{b165}$ |
| 869 | $L_{a204}$ | $L_{b165}$ | 870 | $L_{a205}$ | $L_{b165}$ |
| 871 | $L_{a206}$ | $L_{b165}$ | 872 | $L_{a207}$ | $L_{b165}$ |
| 873 | $L_{a208}$ | $L_{b165}$ | 874 | $L_{a209}$ | $L_{b165}$ |
| 875 | $L_{a210}$ | $L_{b165}$ | 876 | $L_{a211}$ | $L_{b165}$ |
| 877 | $L_{a212}$ | $L_{b165}$ | 878 | $L_{a213}$ | $L_{b165}$ |
| 879 | $L_{a214}$ | $L_{b165}$ | 880 | $L_{a215}$ | $L_{b165}$ |
| 881 | $L_{a216}$ | $L_{b165}$ | 882 | $L_{a217}$ | $L_{b165}$ |
| 883 | $L_{a218}$ | $L_{b165}$ | 884 | $L_{a219}$ | $L_{b165}$ |
| 885 | $L_{a220}$ | $L_{b165}$ | 886 | $L_{a221}$ | $L_{b165}$ |
| 887 | $L_{a230}$ | $L_{b165}$ | 888 | $L_{a231}$ | $L_{b165}$ |
| 889 | $L_{a232}$ | $L_{b165}$ | 890 | $L_{a233}$ | $L_{b165}$ |
| 891 | $L_{a234}$ | $L_{b165}$ | 892 | $L_{a235}$ | $L_{b165}$ |
| 893 | $L_{a236}$ | $L_{b165}$ | 894 | $L_{a252}$ | $L_{b165}$ |
| 895 | $L_{a253}$ | $L_{b165}$ | 896 | $L_{a254}$ | $L_{b165}$ |
| 897 | $L_{a255}$ | $L_{b165}$ | 898 | $L_{a256}$ | $L_{b165}$ |
| 899 | $L_{a257}$ | $L_{b165}$ | 900 | $L_{a258}$ | $L_{b165}$ |
| 901 | $L_{a259}$ | $L_{b165}$ | 902 | $L_{a260}$ | $L_{b165}$ |
| 903 | $L_{a261}$ | $L_{b165}$ | 904 | $L_{a262}$ | $L_{b165}$ |
| 905 | $L_{a263}$ | $L_{b165}$ | 906 | $L_{a264}$ | $L_{b165}$ |
| 907 | $L_{a265}$ | $L_{b165}$ | 908 | $L_{a266}$ | $L_{b165}$ |
| 909 | $L_{a267}$ | $L_{b165}$ | 910 | $L_{a268}$ | $L_{b165}$ |
| 911 | $L_{a269}$ | $L_{b165}$ | 912 | $L_{a270}$ | $L_{b165}$ |
| 913 | $L_{a271}$ | $L_{b165}$ | 914 | $L_{a272}$ | $L_{b165}$ |
| 915 | $L_{a273}$ | $L_{b165}$ | 916 | $L_{a274}$ | $L_{b165}$ |
| 917 | $L_{a275}$ | $L_{b165}$ | 918 | $L_{a276}$ | $L_{b165}$ |
| 919 | $L_{a277}$ | $L_{b165}$ | 920 | $L_{a278}$ | $L_{b165}$ |
| 921 | $L_{a279}$ | $L_{b165}$ | 922 | $L_{a280}$ | $L_{b165}$ |
| 923 | $L_{a281}$ | $L_{b165}$ | 924 | $L_{a282}$ | $L_{b165}$ |
| 925 | $L_{a283}$ | $L_{b165}$ | 926 | $L_{a284}$ | $L_{b165}$ |
| 927 | $L_{a285}$ | $L_{b165}$ | 928 | $L_{a286}$ | $L_{b165}$ |
| 929 | $L_{a287}$ | $L_{b165}$ | 930 | $L_{a288}$ | $L_{b165}$ |
| 931 | $L_{a1}$ | $L_{b165}$ | 932 | $L_{a2}$ | $L_{b165}$ |
| 933 | $L_{a3}$ | $L_{b165}$ | 934 | $L_{a4}$ | $L_{b165}$ |
| 935 | $L_{a5}$ | $L_{b165}$ | 936 | $L_{a6}$ | $L_{b165}$ |
| 937 | $L_{a7}$ | $L_{b165}$ | 938 | $L_{a8}$ | $L_{b165}$ |
| 939 | $L_{a17}$ | $L_{b165}$ | 940 | $L_{a18}$ | $L_{b165}$ |
| 941 | $L_{a19}$ | $L_{b165}$ | 942 | $L_{a20}$ | $L_{b165}$ |
| 943 | $L_{a21}$ | $L_{b165}$ | 944 | $L_{a22}$ | $L_{b165}$ |
| 945 | $L_{a23}$ | $L_{b165}$ | 946 | $L_{a24}$ | $L_{b165}$ |
| 947 | $L_{a48}$ | $L_{b165}$ | 948 | $L_{a49}$ | $L_{b165}$ |
| 949 | $L_{a50}$ | $L_{b165}$ | 950 | $L_{a51}$ | $L_{b165}$ |
| 951 | $L_{a52}$ | $L_{b165}$ | 952 | $L_{a53}$ | $L_{b165}$ |
| 953 | $L_{a54}$ | $L_{b165}$ | 954 | $L_{a55}$ | $L_{b165}$ |
| 955 | $L_{a56}$ | $L_{b165}$ | 956 | $L_{a57}$ | $L_{b165}$ |
| 957 | $L_{a58}$ | $L_{b165}$ | 958 | $L_{a59}$ | $L_{b165}$ |
| 959 | $L_{a60}$ | $L_{b165}$ | 960 | $L_{a61}$ | $L_{b165}$ |
| 961 | $L_{a62}$ | $L_{b165}$ | 962 | $L_{a63}$ | $L_{b165}$ |
| 963 | $L_{a64}$ | $L_{b165}$ | 964 | $L_{a65}$ | $L_{b165}$ |
| 965 | $L_{a66}$ | $L_{b165}$ | 966 | $L_{a67}$ | $L_{b165}$ |
| 967 | $L_{a68}$ | $L_{b165}$ | 968 | $L_{a69}$ | $L_{b165}$ |
| 969 | $L_{a70}$ | $L_{b165}$ | 970 | $L_{a71}$ | $L_{b165}$ |
| 971 | $L_{a72}$ | $L_{b165}$ | 972 | $L_{a73}$ | $L_{b165}$ |
| 973 | $L_{a74}$ | $L_{b165}$ | 974 | $L_{a75}$ | $L_{b165}$ |
| 975 | $L_{a76}$ | $L_{b165}$ | 976 | $L_{a77}$ | $L_{b165}$ |
| 977 | $L_{a78}$ | $L_{b165}$ | 978 | $L_{a79}$ | $L_{b165}$ |
| 979 | $L_{a80}$ | $L_{b165}$ | 980 | $L_{a81}$ | $L_{b165}$ |
| 981 | $L_{a82}$ | $L_{b165}$ | 982 | $L_{a83}$ | $L_{b165}$ |
| 983 | $L_{a92}$ | $L_{b165}$ | 984 | $L_{a93}$ | $L_{b165}$ |
| 985 | $L_{a94}$ | $L_{b165}$ | 986 | $L_{a95}$ | $L_{b165}$ |
| 987 | $L_{a96}$ | $L_{b165}$ | 988 | $L_{a97}$ | $L_{b165}$ |
| 989 | $L_{a98}$ | $L_{b165}$ | 990 | $L_{a99}$ | $L_{b165}$ |
| 991 | $L_{a100}$ | $L_{b165}$ | 992 | $L_{a101}$ | $L_{b165}$ |
| 993 | $L_{a102}$ | $L_{b165}$ | 994 | $L_{a103}$ | $L_{b165}$ |
| 995 | $L_{a104}$ | $L_{b165}$ | 996 | $L_{a105}$ | $L_{b165}$ |
| 997 | $L_{a106}$ | $L_{b165}$ | 998 | $L_{a109}$ | $L_{b165}$ |

-continued

| Metal Complex | $L_a$ | $L_b$ | Metal Complex | $L_a$ | $L_b$ |
|---|---|---|---|---|---|
| 999 | $L_{a110}$ | $L_{b165}$ | 1000 | $L_{a111}$ | $L_{b165}$ |
| 1001 | $L_{a112}$ | $L_{b165}$ | 1002 | $L_{a113}$ | $L_{b165}$ |
| 1003 | $L_{a114}$ | $L_{b165}$ | 1004 | $L_{a115}$ | $L_{b165}$ |
| 1005 | $L_{a116}$ | $L_{b165}$ | 1006 | $L_{a125}$ | $L_{b165}$ |
| 1007 | $L_{a126}$ | $L_{b165}$ | 1008 | $L_{a127}$ | $L_{b165}$ |
| 1009 | $L_{a128}$ | $L_{b165}$ | 1010 | $L_{a129}$ | $L_{b165}$ |
| 1011 | $L_{a130}$ | $L_{b165}$ | 1012 | $L_{a131}$ | $L_{b165}$ |
| 1013 | $L_{a132}$ | $L_{b165}$ | 1014 | $L_{a155}$ | $L_{b165}$ |
| 1015 | $L_{a156}$ | $L_{b165}$ | 1016 | $L_{a157}$ | $L_{b165}$ |
| 1017 | $L_{a158}$ | $L_{b165}$ | 1018 | $L_{a159}$ | $L_{b165}$ |
| 1019 | $L_{a160}$ | $L_{b165}$ | 1020 | $L_{a161}$ | $L_{b165}$ |
| 1021 | $L_{a162}$ | $L_{b165}$ | 1022 | $L_{a163}$ | $L_{b165}$ |
| 1023 | $L_{a164}$ | $L_{b165}$ | 1024 | $L_{a165}$ | $L_{b165}$ |
| 1025 | $L_{a166}$ | $L_{b165}$ | 1026 | $L_{a167}$ | $L_{b165}$ |
| 1027 | $L_{a168}$ | $L_{b165}$ | 1028 | $L_{a169}$ | $L_{b165}$ |
| 1029 | $L_{a170}$ | $L_{b165}$ | 1030 | $L_{a171}$ | $L_{b165}$ |
| 1031 | $L_{a172}$ | $L_{b165}$ | 1032 | $L_{a173}$ | $L_{b165}$ |
| 1033 | $L_{a174}$ | $L_{b165}$ | 1034 | $L_{a175}$ | $L_{b165}$ |
| 1035 | $L_{a176}$ | $L_{b165}$ | 1036 | $L_{a177}$ | $L_{b165}$ |
| 1037 | $L_{a178}$ | $L_{b165}$ | 1038 | $L_{a179}$ | $L_{b165}$ |
| 1039 | $L_{a180}$ | $L_{b165}$ | 1040 | $L_{a181}$ | $L_{b165}$ |
| 1041 | $L_{a182}$ | $L_{b165}$ | 1042 | $L_{a183}$ | $L_{b165}$ |
| 1043 | $L_{a184}$ | $L_{b165}$ | 1044 | $L_{a185}$ | $L_{b165}$ |
| 1045 | $L_{a186}$ | $L_{b165}$ | 1046 | $L_{a187}$ | $L_{b165}$ |
| 1047 | $L_{a188}$ | $L_{b165}$ | 1048 | $L_{a189}$ | $L_{b165}$ |
| 1049 | $L_{a190}$ | $L_{b165}$ | 1050 | $L_{a199}$ | $L_{b165}$ |
| 1051 | $L_{a200}$ | $L_{b165}$ | 1052 | $L_{a201}$ | $L_{b165}$ |
| 1053 | $L_{a202}$ | $L_{b165}$ | 1054 | $L_{a203}$ | $L_{b165}$ |
| 1055 | $L_{a204}$ | $L_{b165}$ | 1056 | $L_{a205}$ | $L_{b165}$ |
| 1057 | $L_{a206}$ | $L_{b165}$ | 1058 | $L_{a207}$ | $L_{b165}$ |
| 1059 | $L_{a208}$ | $L_{b165}$ | 1060 | $L_{a209}$ | $L_{b165}$ |
| 1061 | $L_{a210}$ | $L_{b165}$ | 1062 | $L_{a211}$ | $L_{b165}$ |
| 1063 | $L_{a212}$ | $L_{b165}$ | 1064 | $L_{a213}$ | $L_{b165}$ |
| 1065 | $L_{a214}$ | $L_{b165}$ | 1066 | $L_{a215}$ | $L_{b165}$ |
| 1067 | $L_{a216}$ | $L_{b165}$ | 1068 | $L_{a217}$ | $L_{b165}$ |
| 1069 | $L_{a218}$ | $L_{b165}$ | 1070 | $L_{a219}$ | $L_{b165}$ |
| 1071 | $L_{a220}$ | $L_{b165}$ | 1072 | $L_{a221}$ | $L_{b165}$ |
| 1073 | $L_{a230}$ | $L_{b165}$ | 1074 | $L_{a231}$ | $L_{b165}$ |
| 1075 | $L_{a232}$ | $L_{b165}$ | 1076 | $L_{a233}$ | $L_{b165}$ |
| 1077 | $L_{a234}$ | $L_{b165}$ | 1078 | $L_{a235}$ | $L_{b165}$ |
| 1079 | $L_{a236}$ | $L_{b165}$ | 1080 | $L_{a252}$ | $L_{b165}$ |
| 1081 | $L_{a253}$ | $L_{b165}$ | 1082 | $L_{a254}$ | $L_{b165}$ |
| 1083 | $L_{a255}$ | $L_{b165}$ | 1084 | $L_{a256}$ | $L_{b165}$ |
| 1085 | $L_{a257}$ | $L_{b165}$ | 1086 | $L_{a258}$ | $L_{b165}$ |
| 1087 | $L_{a259}$ | $L_{b165}$ | 1088 | $L_{a260}$ | $L_{b165}$ |
| 1089 | $L_{a261}$ | $L_{b165}$ | 1090 | $L_{a262}$ | $L_{b165}$ |
| 1091 | $L_{a263}$ | $L_{b165}$ | 1092 | $L_{a264}$ | $L_{b165}$ |
| 1093 | $L_{a265}$ | $L_{b165}$ | 1094 | $L_{a266}$ | $L_{b165}$ |
| 1095 | $L_{a267}$ | $L_{b165}$ | 1096 | $L_{a268}$ | $L_{b165}$ |
| 1097 | $L_{a269}$ | $L_{b165}$ | 1098 | $L_{a270}$ | $L_{b165}$ |
| 1099 | $L_{a271}$ | $L_{b165}$ | 1100 | $L_{a272}$ | $L_{b165}$ |
| 1101 | $L_{a273}$ | $L_{b165}$ | 1102 | $L_{a274}$ | $L_{b165}$ |
| 1103 | $L_{a275}$ | $L_{b165}$ | 1104 | $L_{a276}$ | $L_{b165}$ |
| 1105 | $L_{a277}$ | $L_{b165}$ | 1106 | $L_{a278}$ | $L_{b165}$ |
| 1107 | $L_{a279}$ | $L_{b165}$ | 1108 | $L_{a280}$ | $L_{b165}$ |
| 1109 | $L_{a281}$ | $L_{b165}$ | 1110 | $L_{a282}$ | $L_{b165}$ |
| 1111 | $L_{a283}$ | $L_{b165}$ | 1112 | $L_{a284}$ | $L_{b165}$ |
| 1113 | $L_{a285}$ | $L_{b165}$ | 1114 | $L_{a286}$ | $L_{b165}$ |
| 1115 | $L_{a287}$ | $L_{b165}$ | 1116 | $L_{a288}$ | $L_{b165}$ |
| 1117 | $L_{a1}$ | $L_{b173}$ | 1118 | $L_{a2}$ | $L_{b173}$ |
| 1119 | $L_{a3}$ | $L_{b173}$ | 1120 | $L_{a4}$ | $L_{b173}$ |
| 1121 | $L_{a5}$ | $L_{b173}$ | 1122 | $L_{a6}$ | $L_{b173}$ |
| 1123 | $L_{a7}$ | $L_{b173}$ | 1124 | $L_{a8}$ | $L_{b173}$ |
| 1125 | $L_{a17}$ | $L_{b173}$ | 1126 | $L_{a18}$ | $L_{b173}$ |
| 1127 | $L_{a19}$ | $L_{b173}$ | 1128 | $L_{a20}$ | $L_{b173}$ |
| 1129 | $L_{a21}$ | $L_{b173}$ | 1130 | $L_{a22}$ | $L_{b173}$ |
| 1131 | $L_{a23}$ | $L_{b173}$ | 1132 | $L_{a24}$ | $L_{b173}$ |
| 1133 | $L_{a48}$ | $L_{b173}$ | 1134 | $L_{a49}$ | $L_{b173}$ |
| 1135 | $L_{a50}$ | $L_{b173}$ | 1136 | $L_{a51}$ | $L_{b173}$ |
| 1137 | $L_{a52}$ | $L_{b173}$ | 1138 | $L_{a53}$ | $L_{b173}$ |
| 1139 | $L_{a54}$ | $L_{b173}$ | 1140 | $L_{a55}$ | $L_{b173}$ |
| 1141 | $L_{a56}$ | $L_{b173}$ | 1142 | $L_{a57}$ | $L_{b173}$ |
| 1143 | $L_{a58}$ | $L_{b173}$ | 1144 | $L_{a59}$ | $L_{b173}$ |
| 1145 | $L_{a60}$ | $L_{b173}$ | 1146 | $L_{a61}$ | $L_{b173}$ |
| 1147 | $L_{a62}$ | $L_{b173}$ | 1148 | $L_{a63}$ | $L_{b173}$ |
| 1149 | $L_{a64}$ | $L_{b173}$ | 1150 | $L_{a65}$ | $L_{b173}$ |

-continued

| Metal Complex | $L_a$ | $L_b$ | Metal Complex | $L_a$ | $L_b$ |
|---|---|---|---|---|---|
| 1151 | $L_{a66}$ | $L_{b173}$ | 1152 | $L_{a67}$ | $L_{b173}$ |
| 1153 | $L_{a68}$ | $L_{b173}$ | 1154 | $L_{a69}$ | $L_{b173}$ |
| 1155 | $L_{a70}$ | $L_{b173}$ | 1156 | $L_{a71}$ | $L_{b173}$ |
| 1157 | $L_{a72}$ | $L_{b173}$ | 1158 | $L_{a73}$ | $L_{b173}$ |
| 1159 | $L_{a74}$ | $L_{b173}$ | 1160 | $L_{a75}$ | $L_{b173}$ |
| 1161 | $L_{a76}$ | $L_{b173}$ | 1162 | $L_{a77}$ | $L_{b173}$ |
| 1163 | $L_{a78}$ | $L_{b173}$ | 1164 | $L_{a79}$ | $L_{b173}$ |
| 1165 | $L_{a80}$ | $L_{b173}$ | 1166 | $L_{a81}$ | $L_{b173}$ |
| 1167 | $L_{a82}$ | $L_{b173}$ | 1168 | $L_{a83}$ | $L_{b173}$ |
| 1169 | $L_{a92}$ | $L_{b173}$ | 1170 | $L_{a93}$ | $L_{b173}$ |
| 1171 | $L_{a94}$ | $L_{b173}$ | 1172 | $L_{a95}$ | $L_{b173}$ |
| 1173 | $L_{a96}$ | $L_{b173}$ | 1174 | $L_{a97}$ | $L_{b173}$ |
| 1175 | $L_{a98}$ | $L_{b173}$ | 1176 | $L_{a99}$ | $L_{b173}$ |
| 1177 | $L_{a100}$ | $L_{b173}$ | 1178 | $L_{a101}$ | $L_{b173}$ |
| 1179 | $L_{a102}$ | $L_{b173}$ | 1180 | $L_{a103}$ | $L_{b173}$ |
| 1181 | $L_{a104}$ | $L_{b173}$ | 1182 | $L_{a105}$ | $L_{b173}$ |
| 1183 | $L_{a106}$ | $L_{b173}$ | 1184 | $L_{a109}$ | $L_{b173}$ |
| 1185 | $L_{a110}$ | $L_{b173}$ | 1186 | $L_{a111}$ | $L_{b173}$ |
| 1187 | $L_{a112}$ | $L_{b173}$ | 1188 | $L_{a113}$ | $L_{b173}$ |
| 1189 | $L_{a114}$ | $L_{b173}$ | 1190 | $L_{a115}$ | $L_{b173}$ |
| 1191 | $L_{a116}$ | $L_{b173}$ | 1192 | $L_{a125}$ | $L_{b173}$ |
| 1193 | $L_{a126}$ | $L_{b173}$ | 1194 | $L_{a127}$ | $L_{b173}$ |
| 1195 | $L_{a128}$ | $L_{b173}$ | 1196 | $L_{a129}$ | $L_{b173}$ |
| 1197 | $L_{a130}$ | $L_{b173}$ | 1198 | $L_{a131}$ | $L_{b173}$ |
| 1199 | $L_{a132}$ | $L_{b173}$ | 1200 | $L_{a155}$ | $L_{b173}$ |
| 1201 | $L_{a156}$ | $L_{b173}$ | 1202 | $L_{a157}$ | $L_{b173}$ |
| 1203 | $L_{a158}$ | $L_{b173}$ | 1204 | $L_{a159}$ | $L_{b173}$ |
| 1205 | $L_{a160}$ | $L_{b173}$ | 1206 | $L_{a161}$ | $L_{b173}$ |
| 1207 | $L_{a162}$ | $L_{b173}$ | 1208 | $L_{a163}$ | $L_{b173}$ |
| 1209 | $L_{a164}$ | $L_{b173}$ | 1210 | $L_{a165}$ | $L_{b173}$ |
| 1211 | $L_{a166}$ | $L_{b173}$ | 1212 | $L_{a167}$ | $L_{b173}$ |
| 1213 | $L_{a168}$ | $L_{b173}$ | 1214 | $L_{a169}$ | $L_{b173}$ |
| 1215 | $L_{a170}$ | $L_{b173}$ | 1216 | $L_{a171}$ | $L_{b173}$ |
| 1217 | $L_{a172}$ | $L_{b173}$ | 1218 | $L_{a173}$ | $L_{b173}$ |
| 1219 | $L_{a174}$ | $L_{b173}$ | 1220 | $L_{a175}$ | $L_{b173}$ |
| 1221 | $L_{a176}$ | $L_{b173}$ | 1222 | $L_{a177}$ | $L_{b173}$ |
| 1223 | $L_{a178}$ | $L_{b173}$ | 1224 | $L_{a179}$ | $L_{b173}$ |
| 1225 | $L_{a180}$ | $L_{b173}$ | 1226 | $L_{a181}$ | $L_{b173}$ |
| 1227 | $L_{a182}$ | $L_{b173}$ | 1228 | $L_{a183}$ | $L_{b173}$ |
| 1229 | $L_{a184}$ | $L_{b173}$ | 1230 | $L_{a185}$ | $L_{b173}$ |
| 1231 | $L_{a186}$ | $L_{b173}$ | 1232 | $L_{a187}$ | $L_{b173}$ |
| 1233 | $L_{a188}$ | $L_{b173}$ | 1234 | $L_{a189}$ | $L_{b173}$ |
| 1235 | $L_{a190}$ | $L_{b173}$ | 1236 | $L_{a199}$ | $L_{b173}$ |
| 1237 | $L_{a200}$ | $L_{b173}$ | 1238 | $L_{a201}$ | $L_{b173}$ |
| 1239 | $L_{a202}$ | $L_{b173}$ | 1240 | $L_{a203}$ | $L_{b173}$ |
| 1241 | $L_{a204}$ | $L_{b173}$ | 1242 | $L_{a205}$ | $L_{b173}$ |
| 1243 | $L_{a206}$ | $L_{b173}$ | 1244 | $L_{a207}$ | $L_{b173}$ |
| 1245 | $L_{a208}$ | $L_{b173}$ | 1246 | $L_{a209}$ | $L_{b173}$ |
| 1247 | $L_{a210}$ | $L_{b173}$ | 1248 | $L_{a211}$ | $L_{b173}$ |
| 1249 | $L_{a212}$ | $L_{b173}$ | 1250 | $L_{a213}$ | $L_{b173}$ |
| 1251 | $L_{a214}$ | $L_{b173}$ | 1252 | $L_{a215}$ | $L_{b173}$ |
| 1253 | $L_{a216}$ | $L_{b173}$ | 1254 | $L_{a217}$ | $L_{b173}$ |
| 1255 | $L_{a218}$ | $L_{b173}$ | 1256 | $L_{a219}$ | $L_{b173}$ |
| 1257 | $L_{a220}$ | $L_{b173}$ | 1258 | $L_{a221}$ | $L_{b173}$ |
| 1259 | $L_{a230}$ | $L_{b173}$ | 1260 | $L_{a231}$ | $L_{b173}$ |
| 1261 | $L_{a232}$ | $L_{b173}$ | 1262 | $L_{a233}$ | $L_{b173}$ |
| 1263 | $L_{a234}$ | $L_{b173}$ | 1264 | $L_{a235}$ | $L_{b173}$ |
| 1265 | $L_{a236}$ | $L_{b173}$ | 1266 | $L_{a252}$ | $L_{b173}$ |
| 1267 | $L_{a253}$ | $L_{b173}$ | 1268 | $L_{a254}$ | $L_{b173}$ |
| 1269 | $L_{a255}$ | $L_{b173}$ | 1270 | $L_{a256}$ | $L_{b173}$ |
| 1271 | $L_{a257}$ | $L_{b173}$ | 1272 | $L_{a258}$ | $L_{b173}$ |
| 1273 | $L_{a259}$ | $L_{b173}$ | 1274 | $L_{a260}$ | $L_{b173}$ |
| 1275 | $L_{a261}$ | $L_{b173}$ | 1276 | $L_{a262}$ | $L_{b173}$ |
| 1277 | $L_{a263}$ | $L_{b173}$ | 1278 | $L_{a264}$ | $L_{b173}$ |
| 1279 | $L_{a265}$ | $L_{b173}$ | 1280 | $L_{a266}$ | $L_{b173}$ |
| 1281 | $L_{a267}$ | $L_{b173}$ | 1282 | $L_{a268}$ | $L_{b173}$ |
| 1283 | $L_{a269}$ | $L_{b173}$ | 1284 | $L_{a270}$ | $L_{b173}$ |
| 1285 | $L_{a271}$ | $L_{b173}$ | 1286 | $L_{a272}$ | $L_{b173}$ |
| 1287 | $L_{a273}$ | $L_{b173}$ | 1288 | $L_{a274}$ | $L_{b173}$ |
| 1289 | $L_{a275}$ | $L_{b173}$ | 1290 | $L_{a276}$ | $L_{b173}$ |
| 1291 | $L_{a277}$ | $L_{b173}$ | 1292 | $L_{a278}$ | $L_{b173}$ |
| 1293 | $L_{a279}$ | $L_{b173}$ | 1294 | $L_{a280}$ | $L_{b173}$ |
| 1295 | $L_{a281}$ | $L_{b173}$ | 1296 | $L_{a282}$ | $L_{b173}$ |
| 1297 | $L_{a283}$ | $L_{b173}$ | 1298 | $L_{a284}$ | $L_{b173}$ |
| 1299 | $L_{a285}$ | $L_{b173}$ | 1300 | $L_{a286}$ | $L_{b173}$ |
| 1301 | $L_{a287}$ | $L_{b173}$ | 1302 | $L_{a288}$ | $L_{b173}$ |

-continued

| Metal Complex | $L_a$ | $L_b$ | Metal Complex | $L_a$ | $L_b$ |
|---|---|---|---|---|---|
| 1303 | $L_{a1}$ | $L_{b177}$ | 1304 | $L_{a2}$ | $L_{b177}$ |
| 1305 | $L_{a3}$ | $L_{b177}$ | 1306 | $L_{a4}$ | $L_{b177}$ |
| 1307 | $L_{a5}$ | $L_{b177}$ | 1308 | $L_{a6}$ | $L_{b177}$ |
| 1309 | $L_{a7}$ | $L_{b177}$ | 1310 | $L_{a8}$ | $L_{b177}$ |
| 1311 | $L_{a17}$ | $L_{b177}$ | 1312 | $L_{a18}$ | $L_{b177}$ |
| 1313 | $L_{a19}$ | $L_{b177}$ | 1314 | $L_{a20}$ | $L_{b177}$ |
| 1315 | $L_{a21}$ | $L_{b177}$ | 1316 | $L_{a22}$ | $L_{b177}$ |
| 1317 | $L_{a23}$ | $L_{b177}$ | 1318 | $L_{a24}$ | $L_{b177}$ |
| 1319 | $L_{a48}$ | $L_{b177}$ | 1320 | $L_{a49}$ | $L_{b177}$ |
| 1321 | $L_{a50}$ | $L_{b177}$ | 1322 | $L_{a51}$ | $L_{b177}$ |
| 1323 | $L_{a52}$ | $L_{b177}$ | 1324 | $L_{a53}$ | $L_{b177}$ |
| 1325 | $L_{a54}$ | $L_{b177}$ | 1326 | $L_{a55}$ | $L_{b177}$ |
| 1327 | $L_{a56}$ | $L_{b177}$ | 1328 | $L_{a57}$ | $L_{b177}$ |
| 1329 | $L_{a58}$ | $L_{b177}$ | 1330 | $L_{a59}$ | $L_{b177}$ |
| 1331 | $L_{a60}$ | $L_{b177}$ | 1332 | $L_{a61}$ | $L_{b177}$ |
| 1333 | $L_{a62}$ | $L_{b177}$ | 1334 | $L_{a63}$ | $L_{b177}$ |
| 1335 | $L_{a64}$ | $L_{b177}$ | 1336 | $L_{a65}$ | $L_{b177}$ |
| 1337 | $L_{a66}$ | $L_{b177}$ | 1338 | $L_{a67}$ | $L_{b177}$ |
| 1339 | $L_{a68}$ | $L_{b177}$ | 1340 | $L_{a69}$ | $L_{b177}$ |
| 1341 | $L_{a70}$ | $L_{b177}$ | 1342 | $L_{a71}$ | $L_{b177}$ |
| 1343 | $L_{a72}$ | $L_{b177}$ | 1344 | $L_{a73}$ | $L_{b177}$ |
| 1345 | $L_{a74}$ | $L_{b177}$ | 1346 | $L_{a75}$ | $L_{b177}$ |
| 1347 | $L_{a76}$ | $L_{b177}$ | 1348 | $L_{a77}$ | $L_{b177}$ |
| 1349 | $L_{a78}$ | $L_{b177}$ | 1350 | $L_{a79}$ | $L_{b177}$ |
| 1351 | $L_{a80}$ | $L_{b177}$ | 1352 | $L_{a81}$ | $L_{b177}$ |
| 1353 | $L_{a82}$ | $L_{b177}$ | 1354 | $L_{a83}$ | $L_{b177}$ |
| 1355 | $L_{a92}$ | $L_{b177}$ | 1356 | $L_{a93}$ | $L_{b177}$ |
| 1357 | $L_{a94}$ | $L_{b177}$ | 1358 | $L_{a95}$ | $L_{b177}$ |
| 1359 | $L_{a96}$ | $L_{b177}$ | 1360 | $L_{a97}$ | $L_{b177}$ |
| 1361 | $L_{a98}$ | $L_{b177}$ | 1362 | $L_{a99}$ | $L_{b177}$ |
| 1363 | $L_{a100}$ | $L_{b177}$ | 1364 | $L_{a101}$ | $L_{b177}$ |
| 1365 | $L_{a102}$ | $L_{b177}$ | 1366 | $L_{a103}$ | $L_{b177}$ |
| 1367 | $L_{a104}$ | $L_{b177}$ | 1368 | $L_{a105}$ | $L_{b177}$ |
| 1369 | $L_{a106}$ | $L_{b177}$ | 1370 | $L_{a109}$ | $L_{b177}$ |
| 1371 | $L_{a110}$ | $L_{b177}$ | 1372 | $L_{a111}$ | $L_{b177}$ |
| 1373 | $L_{a112}$ | $L_{b177}$ | 1374 | $L_{a113}$ | $L_{b177}$ |
| 1375 | $L_{a114}$ | $L_{b177}$ | 1376 | $L_{a115}$ | $L_{b177}$ |
| 1377 | $L_{a116}$ | $L_{b177}$ | 1378 | $L_{a125}$ | $L_{b177}$ |
| 1379 | $L_{a126}$ | $L_{b177}$ | 1380 | $L_{a127}$ | $L_{b177}$ |
| 1381 | $L_{a128}$ | $L_{b177}$ | 1382 | $L_{a129}$ | $L_{b177}$ |
| 1383 | $L_{a130}$ | $L_{b177}$ | 1384 | $L_{a131}$ | $L_{b177}$ |
| 1385 | $L_{a132}$ | $L_{b177}$ | 1386 | $L_{a155}$ | $L_{b177}$ |
| 1387 | $L_{a156}$ | $L_{b177}$ | 1388 | $L_{a157}$ | $L_{b177}$ |
| 1389 | $L_{a158}$ | $L_{b177}$ | 1390 | $L_{a159}$ | $L_{b177}$ |
| 1391 | $L_{a160}$ | $L_{b177}$ | 1392 | $L_{a161}$ | $L_{b177}$ |
| 1393 | $L_{a162}$ | $L_{b177}$ | 1394 | $L_{a163}$ | $L_{b177}$ |
| 1395 | $L_{a164}$ | $L_{b177}$ | 1396 | $L_{a165}$ | $L_{b177}$ |
| 1397 | $L_{a166}$ | $L_{b177}$ | 1398 | $L_{a167}$ | $L_{b177}$ |
| 1399 | $L_{a168}$ | $L_{b177}$ | 1400 | $L_{a169}$ | $L_{b177}$ |
| 1401 | $L_{a170}$ | $L_{b177}$ | 1402 | $L_{a171}$ | $L_{b177}$ |
| 1403 | $L_{a172}$ | $L_{b177}$ | 1404 | $L_{a173}$ | $L_{b177}$ |
| 1405 | $L_{a174}$ | $L_{b177}$ | 1406 | $L_{a175}$ | $L_{b177}$ |
| 1407 | $L_{a176}$ | $L_{b177}$ | 1408 | $L_{a177}$ | $L_{b177}$ |
| 1409 | $L_{a178}$ | $L_{b177}$ | 1410 | $L_{a179}$ | $L_{b177}$ |
| 1411 | $L_{a180}$ | $L_{b177}$ | 1412 | $L_{a181}$ | $L_{b177}$ |
| 1413 | $L_{a182}$ | $L_{b177}$ | 1414 | $L_{a183}$ | $L_{b177}$ |
| 1415 | $L_{a184}$ | $L_{b177}$ | 1416 | $L_{a185}$ | $L_{b177}$ |
| 1417 | $L_{a186}$ | $L_{b177}$ | 1418 | $L_{a187}$ | $L_{b177}$ |
| 1419 | $L_{a188}$ | $L_{b177}$ | 1420 | $L_{a189}$ | $L_{b177}$ |
| 1421 | $L_{a190}$ | $L_{b177}$ | 1422 | $L_{a199}$ | $L_{b177}$ |
| 1423 | $L_{a200}$ | $L_{b177}$ | 1424 | $L_{a201}$ | $L_{b177}$ |
| 1425 | $L_{a202}$ | $L_{b177}$ | 1426 | $L_{a203}$ | $L_{b177}$ |
| 1427 | $L_{a204}$ | $L_{b177}$ | 1428 | $L_{a205}$ | $L_{b177}$ |
| 1429 | $L_{a206}$ | $L_{b177}$ | 1430 | $L_{a207}$ | $L_{b177}$ |
| 1431 | $L_{a208}$ | $L_{b177}$ | 1432 | $L_{a209}$ | $L_{b177}$ |
| 1433 | $L_{a210}$ | $L_{b177}$ | 1434 | $L_{a211}$ | $L_{b177}$ |
| 1435 | $L_{a212}$ | $L_{b177}$ | 1436 | $L_{a213}$ | $L_{b177}$ |
| 1437 | $L_{a214}$ | $L_{b177}$ | 1438 | $L_{a215}$ | $L_{b177}$ |
| 1439 | $L_{a216}$ | $L_{b177}$ | 1440 | $L_{a217}$ | $L_{b177}$ |
| 1441 | $L_{a218}$ | $L_{b177}$ | 1442 | $L_{a219}$ | $L_{b177}$ |
| 1443 | $L_{a220}$ | $L_{b177}$ | 1444 | $L_{a221}$ | $L_{b177}$ |
| 1445 | $L_{a230}$ | $L_{b177}$ | 1446 | $L_{a231}$ | $L_{b177}$ |
| 1447 | $L_{a232}$ | $L_{b177}$ | 1448 | $L_{a233}$ | $L_{b177}$ |
| 1449 | $L_{a234}$ | $L_{b177}$ | 1450 | $L_{a235}$ | $L_{b177}$ |
| 1451 | $L_{a236}$ | $L_{b177}$ | 1452 | $L_{a252}$ | $L_{b177}$ |
| 1453 | $L_{a253}$ | $L_{b177}$ | 1454 | $L_{a254}$ | $L_{b177}$ |

-continued

| Metal Complex | $L_a$ | $L_b$ | Metal Complex | $L_a$ | $L_b$ |
|---|---|---|---|---|---|
| 1455 | $L_{a255}$ | $L_{b177}$ | 1456 | $L_{a256}$ | $L_{b177}$ |
| 1457 | $L_{a257}$ | $L_{b177}$ | 1458 | $L_{a258}$ | $L_{b177}$ |
| 1459 | $L_{a259}$ | $L_{b177}$ | 1460 | $L_{a260}$ | $L_{b177}$ |
| 1461 | $L_{a261}$ | $L_{b177}$ | 1462 | $L_{a262}$ | $L_{b177}$ |
| 1463 | $L_{a263}$ | $L_{b177}$ | 1464 | $L_{a264}$ | $L_{b177}$ |
| 1465 | $L_{a265}$ | $L_{b177}$ | 1466 | $L_{a266}$ | $L_{b177}$ |
| 1467 | $L_{a267}$ | $L_{b177}$ | 1468 | $L_{a268}$ | $L_{b177}$ |
| 1469 | $L_{a269}$ | $L_{b177}$ | 1470 | $L_{a270}$ | $L_{b177}$ |
| 1471 | $L_{a271}$ | $L_{b177}$ | 1472 | $L_{a272}$ | $L_{b177}$ |
| 1473 | $L_{a273}$ | $L_{b177}$ | 1474 | $L_{a274}$ | $L_{b177}$ |
| 1475 | $L_{a275}$ | $L_{b177}$ | 1476 | $L_{a276}$ | $L_{b177}$ |
| 1477 | $L_{a277}$ | $L_{b177}$ | 1478 | $L_{a278}$ | $L_{b177}$ |
| 1479 | $L_{a279}$ | $L_{b177}$ | 1480 | $L_{a280}$ | $L_{b177}$ |
| 1481 | $L_{a281}$ | $L_{b177}$ | 1482 | $L_{a282}$ | $L_{b177}$ |
| 1483 | $L_{a283}$ | $L_{b177}$ | 1484 | $L_{a284}$ | $L_{b177}$ |
| 1485 | $L_{a285}$ | $L_{b177}$ | 1486 | $L_{a286}$ | $L_{b177}$ |
| 1487 | $L_{a287}$ | $L_{b177}$ | 1488 | $L_{a288}$ | $L_{b177}$ |
| 1489 | $L_{a1}$ | $L_{b181}$ | 1490 | $L_{a2}$ | $L_{b181}$ |
| 1491 | $L_{a3}$ | $L_{b181}$ | 1492 | $L_{a4}$ | $L_{b181}$ |
| 1493 | $L_{a5}$ | $L_{b181}$ | 1494 | $L_{a6}$ | $L_{b181}$ |
| 1495 | $L_{a7}$ | $L_{b181}$ | 1496 | $L_{a8}$ | $L_{b181}$ |
| 1497 | $L_{a17}$ | $L_{b181}$ | 1498 | $L_{a18}$ | $L_{b181}$ |
| 1499 | $L_{a19}$ | $L_{b181}$ | 1500 | $L_{a20}$ | $L_{b181}$ |
| 1501 | $L_{a21}$ | $L_{b181}$ | 1502 | $L_{a22}$ | $L_{b181}$ |
| 1503 | $L_{a23}$ | $L_{b181}$ | 1504 | $L_{a24}$ | $L_{b181}$ |
| 1505 | $L_{a48}$ | $L_{b181}$ | 1506 | $L_{a49}$ | $L_{b181}$ |
| 1507 | $L_{a50}$ | $L_{b181}$ | 1508 | $L_{a51}$ | $L_{b181}$ |
| 1509 | $L_{a52}$ | $L_{b181}$ | 1510 | $L_{a53}$ | $L_{b181}$ |
| 1511 | $L_{a54}$ | $L_{b181}$ | 1512 | $L_{a55}$ | $L_{b181}$ |
| 1513 | $L_{a56}$ | $L_{b181}$ | 1514 | $L_{a57}$ | $L_{b181}$ |
| 1515 | $L_{a58}$ | $L_{b181}$ | 1516 | $L_{a59}$ | $L_{b181}$ |
| 1517 | $L_{a60}$ | $L_{b181}$ | 1518 | $L_{a61}$ | $L_{b181}$ |
| 1519 | $L_{a62}$ | $L_{b181}$ | 1520 | $L_{a63}$ | $L_{b181}$ |
| 1521 | $L_{a64}$ | $L_{b181}$ | 1522 | $L_{a65}$ | $L_{b181}$ |
| 1523 | $L_{a66}$ | $L_{b181}$ | 1524 | $L_{a67}$ | $L_{b181}$ |
| 1525 | $L_{a68}$ | $L_{b181}$ | 1526 | $L_{a69}$ | $L_{b181}$ |
| 1527 | $L_{a70}$ | $L_{b181}$ | 1528 | $L_{a71}$ | $L_{b181}$ |
| 1529 | $L_{a72}$ | $L_{b181}$ | 1530 | $L_{a73}$ | $L_{b181}$ |
| 1531 | $L_{a74}$ | $L_{b181}$ | 1532 | $L_{a75}$ | $L_{b181}$ |
| 1533 | $L_{a76}$ | $L_{b181}$ | 1534 | $L_{a77}$ | $L_{b181}$ |
| 1535 | $L_{a78}$ | $L_{b181}$ | 1536 | $L_{a79}$ | $L_{b181}$ |
| 1537 | $L_{a80}$ | $L_{b181}$ | 1538 | $L_{a81}$ | $L_{b181}$ |
| 1539 | $L_{a82}$ | $L_{b181}$ | 1540 | $L_{a83}$ | $L_{b181}$ |
| 1541 | $L_{a92}$ | $L_{b181}$ | 1542 | $L_{a93}$ | $L_{b181}$ |
| 1543 | $L_{a94}$ | $L_{b181}$ | 1544 | $L_{a95}$ | $L_{b181}$ |
| 1545 | $L_{a96}$ | $L_{b181}$ | 1546 | $L_{a97}$ | $L_{b181}$ |
| 1547 | $L_{a98}$ | $L_{b181}$ | 1548 | $L_{a99}$ | $L_{b181}$ |
| 1549 | $L_{a100}$ | $L_{b181}$ | 1550 | $L_{a101}$ | $L_{b181}$ |
| 1551 | $L_{a102}$ | $L_{b181}$ | 1552 | $L_{a103}$ | $L_{b181}$ |
| 1553 | $L_{a104}$ | $L_{b181}$ | 1554 | $L_{a105}$ | $L_{b181}$ |
| 1555 | $L_{a106}$ | $L_{b181}$ | 1556 | $L_{a109}$ | $L_{b181}$ |
| 1557 | $L_{a110}$ | $L_{b181}$ | 1558 | $L_{a111}$ | $L_{b181}$ |
| 1559 | $L_{a112}$ | $L_{b181}$ | 1560 | $L_{a113}$ | $L_{b181}$ |
| 1561 | $L_{a114}$ | $L_{b181}$ | 1562 | $L_{a115}$ | $L_{b181}$ |
| 1563 | $L_{a116}$ | $L_{b181}$ | 1564 | $L_{a125}$ | $L_{b181}$ |
| 1565 | $L_{a126}$ | $L_{b181}$ | 1566 | $L_{a127}$ | $L_{b181}$ |
| 1567 | $L_{a128}$ | $L_{b181}$ | 1568 | $L_{a129}$ | $L_{b181}$ |
| 1569 | $L_{a130}$ | $L_{b181}$ | 1570 | $L_{a131}$ | $L_{b181}$ |
| 1571 | $L_{a132}$ | $L_{b181}$ | 1572 | $L_{a155}$ | $L_{b181}$ |
| 1573 | $L_{a156}$ | $L_{b181}$ | 1574 | $L_{a157}$ | $L_{b181}$ |
| 1575 | $L_{a158}$ | $L_{b181}$ | 1576 | $L_{a159}$ | $L_{b181}$ |
| 1577 | $L_{a160}$ | $L_{b181}$ | 1578 | $L_{a161}$ | $L_{b181}$ |
| 1579 | $L_{a162}$ | $L_{b181}$ | 1580 | $L_{a163}$ | $L_{b181}$ |
| 1581 | $L_{a164}$ | $L_{b181}$ | 1582 | $L_{a165}$ | $L_{b181}$ |
| 1583 | $L_{a166}$ | $L_{b181}$ | 1584 | $L_{a167}$ | $L_{b181}$ |
| 1585 | $L_{a168}$ | $L_{b181}$ | 1586 | $L_{a169}$ | $L_{b181}$ |
| 1587 | $L_{a170}$ | $L_{b181}$ | 1588 | $L_{a171}$ | $L_{b181}$ |
| 1589 | $L_{a172}$ | $L_{b181}$ | 1590 | $L_{a173}$ | $L_{b181}$ |
| 1591 | $L_{a174}$ | $L_{b181}$ | 1592 | $L_{a175}$ | $L_{b181}$ |
| 1593 | $L_{a176}$ | $L_{b181}$ | 1594 | $L_{a177}$ | $L_{b181}$ |
| 1595 | $L_{a178}$ | $L_{b181}$ | 1596 | $L_{a179}$ | $L_{b181}$ |
| 1597 | $L_{a180}$ | $L_{b181}$ | 1598 | $L_{a181}$ | $L_{b181}$ |
| 1599 | $L_{a182}$ | $L_{b181}$ | 1600 | $L_{a183}$ | $L_{b181}$ |
| 1601 | $L_{a184}$ | $L_{b181}$ | 1602 | $L_{a185}$ | $L_{b181}$ |
| 1603 | $L_{a186}$ | $L_{b181}$ | 1604 | $L_{a187}$ | $L_{b181}$ |
| 1605 | $L_{a188}$ | $L_{b181}$ | 1606 | $L_{a189}$ | $L_{b181}$ |

-continued

| Metal Complex | $L_a$ | $L_b$ | Metal Complex | $L_a$ | $L_b$ |
|---|---|---|---|---|---|
| 1607 | $L_{a190}$ | $L_{b181}$ | 1608 | $L_{a199}$ | $L_{b181}$ |
| 1609 | $L_{a200}$ | $L_{b181}$ | 1610 | $L_{a201}$ | $L_{b181}$ |
| 1611 | $L_{a202}$ | $L_{b181}$ | 1612 | $L_{a203}$ | $L_{b181}$ |
| 1613 | $L_{a204}$ | $L_{b181}$ | 1614 | $L_{a205}$ | $L_{b181}$ |
| 1615 | $L_{a206}$ | $L_{b181}$ | 1616 | $L_{a207}$ | $L_{b181}$ |
| 1617 | $L_{a208}$ | $L_{b181}$ | 1618 | $L_{a209}$ | $L_{b181}$ |
| 1619 | $L_{a210}$ | $L_{b181}$ | 1620 | $L_{a211}$ | $L_{b181}$ |
| 1621 | $L_{a212}$ | $L_{b181}$ | 1622 | $L_{a213}$ | $L_{b181}$ |
| 1623 | $L_{a214}$ | $L_{b181}$ | 1624 | $L_{a215}$ | $L_{b181}$ |
| 1625 | $L_{a216}$ | $L_{b181}$ | 1626 | $L_{a217}$ | $L_{b181}$ |
| 1627 | $L_{a218}$ | $L_{b181}$ | 1628 | $L_{a219}$ | $L_{b181}$ |
| 1629 | $L_{a220}$ | $L_{b181}$ | 1630 | $L_{a221}$ | $L_{b181}$ |
| 1631 | $L_{a230}$ | $L_{b181}$ | 1632 | $L_{a231}$ | $L_{b181}$ |
| 1633 | $L_{a232}$ | $L_{b181}$ | 1634 | $L_{a233}$ | $L_{b181}$ |
| 1635 | $L_{a234}$ | $L_{b181}$ | 1636 | $L_{a235}$ | $L_{b181}$ |
| 1637 | $L_{a236}$ | $L_{b181}$ | 1638 | $L_{a252}$ | $L_{b181}$ |
| 1639 | $L_{a253}$ | $L_{b181}$ | 1640 | $L_{a254}$ | $L_{b181}$ |
| 1641 | $L_{a255}$ | $L_{b181}$ | 1642 | $L_{a256}$ | $L_{b181}$ |
| 1643 | $L_{a257}$ | $L_{b181}$ | 1644 | $L_{a258}$ | $L_{b181}$ |
| 1645 | $L_{a259}$ | $L_{b181}$ | 1646 | $L_{a260}$ | $L_{b181}$ |
| 1647 | $L_{a261}$ | $L_{b181}$ | 1648 | $L_{a262}$ | $L_{b181}$ |
| 1649 | $L_{a263}$ | $L_{b181}$ | 1650 | $L_{a264}$ | $L_{b181}$ |
| 1651 | $L_{a265}$ | $L_{b181}$ | 1652 | $L_{a266}$ | $L_{b181}$ |
| 1653 | $L_{a267}$ | $L_{b181}$ | 1654 | $L_{a268}$ | $L_{b181}$ |
| 1655 | $L_{a269}$ | $L_{b181}$ | 1656 | $L_{a270}$ | $L_{b181}$ |
| 1657 | $L_{a271}$ | $L_{b181}$ | 1658 | $L_{a272}$ | $L_{b181}$ |
| 1659 | $L_{a273}$ | $L_{b181}$ | 1660 | $L_{a274}$ | $L_{b181}$ |
| 1661 | $L_{a275}$ | $L_{b181}$ | 1662 | $L_{a276}$ | $L_{b181}$ |
| 1663 | $L_{a277}$ | $L_{b181}$ | 1664 | $L_{a278}$ | $L_{b181}$ |
| 1665 | $L_{a279}$ | $L_{b181}$ | 1666 | $L_{a280}$ | $L_{b181}$ |
| 1667 | $L_{a281}$ | $L_{b181}$ | 1668 | $L_{a282}$ | $L_{b181}$ |
| 1669 | $L_{a283}$ | $L_{b181}$ | 1670 | $L_{a284}$ | $L_{b181}$ |
| 1671 | $L_{a285}$ | $L_{b181}$ | 1672 | $L_{a286}$ | $L_{b181}$ |
| 1673 | $L_{a287}$ | $L_{b181}$ | 1674 | $L_{a288}$ | $L_{b181}$ |
| 1675 | $L_{a1}$ | $L_{b185}$ | 1676 | $L_{a2}$ | $L_{b185}$ |
| 1677 | $L_{a3}$ | $L_{b185}$ | 1678 | $L_{a4}$ | $L_{b185}$ |
| 1679 | $L_{a5}$ | $L_{b185}$ | 1680 | $L_{a6}$ | $L_{b185}$ |
| 1681 | $L_{a7}$ | $L_{b185}$ | 1682 | $L_{a8}$ | $L_{b185}$ |
| 1683 | $L_{a17}$ | $L_{b185}$ | 1684 | $L_{a18}$ | $L_{b185}$ |
| 1685 | $L_{a19}$ | $L_{b185}$ | 1686 | $L_{a20}$ | $L_{b185}$ |
| 1687 | $L_{a21}$ | $L_{b185}$ | 1688 | $L_{a22}$ | $L_{b185}$ |
| 1689 | $L_{a23}$ | $L_{b185}$ | 1690 | $L_{a24}$ | $L_{b185}$ |
| 1691 | $L_{a48}$ | $L_{b185}$ | 1692 | $L_{a49}$ | $L_{b185}$ |
| 1693 | $L_{a50}$ | $L_{b185}$ | 1694 | $L_{a51}$ | $L_{b185}$ |
| 1695 | $L_{a52}$ | $L_{b185}$ | 1696 | $L_{a53}$ | $L_{b185}$ |
| 1697 | $L_{a54}$ | $L_{b185}$ | 1698 | $L_{a55}$ | $L_{b185}$ |
| 1699 | $L_{a56}$ | $L_{b185}$ | 1700 | $L_{a57}$ | $L_{b185}$ |
| 1701 | $L_{a58}$ | $L_{b185}$ | 1702 | $L_{a59}$ | $L_{b185}$ |
| 1703 | $L_{a60}$ | $L_{b185}$ | 1704 | $L_{a61}$ | $L_{b185}$ |
| 1705 | $L_{a62}$ | $L_{b185}$ | 1706 | $L_{a63}$ | $L_{b185}$ |
| 1707 | $L_{a64}$ | $L_{b185}$ | 1708 | $L_{a65}$ | $L_{b185}$ |
| 1709 | $L_{a66}$ | $L_{b185}$ | 1710 | $L_{a67}$ | $L_{b185}$ |
| 1711 | $L_{a68}$ | $L_{b185}$ | 1712 | $L_{a69}$ | $L_{b185}$ |
| 1713 | $L_{a70}$ | $L_{b185}$ | 1714 | $L_{a71}$ | $L_{b185}$ |
| 1715 | $L_{a72}$ | $L_{b185}$ | 1716 | $L_{a73}$ | $L_{b185}$ |
| 1717 | $L_{a74}$ | $L_{b185}$ | 1718 | $L_{a75}$ | $L_{b185}$ |
| 1719 | $L_{a76}$ | $L_{b185}$ | 1720 | $L_{a77}$ | $L_{b185}$ |
| 1721 | $L_{a78}$ | $L_{b185}$ | 1722 | $L_{a79}$ | $L_{b185}$ |
| 1723 | $L_{a80}$ | $L_{b185}$ | 1724 | $L_{a81}$ | $L_{b185}$ |
| 1725 | $L_{a82}$ | $L_{b185}$ | 1726 | $L_{a83}$ | $L_{b185}$ |
| 1727 | $L_{a92}$ | $L_{b185}$ | 1728 | $L_{a93}$ | $L_{b185}$ |
| 1729 | $L_{a94}$ | $L_{b185}$ | 1730 | $L_{a95}$ | $L_{b185}$ |
| 1731 | $L_{a96}$ | $L_{b185}$ | 1732 | $L_{a97}$ | $L_{b185}$ |
| 1733 | $L_{a98}$ | $L_{b185}$ | 1734 | $L_{a99}$ | $L_{b185}$ |
| 1735 | $L_{a100}$ | $L_{b185}$ | 1736 | $L_{a101}$ | $L_{b185}$ |
| 1737 | $L_{a102}$ | $L_{b185}$ | 1738 | $L_{a103}$ | $L_{b185}$ |
| 1739 | $L_{a104}$ | $L_{b185}$ | 1740 | $L_{a105}$ | $L_{b185}$ |
| 1741 | $L_{a106}$ | $L_{b185}$ | 1742 | $L_{a109}$ | $L_{b185}$ |
| 1743 | $L_{a110}$ | $L_{b185}$ | 1744 | $L_{a111}$ | $L_{b185}$ |
| 1745 | $L_{a112}$ | $L_{b185}$ | 1746 | $L_{a113}$ | $L_{b185}$ |
| 1747 | $L_{a114}$ | $L_{b185}$ | 1748 | $L_{a115}$ | $L_{b185}$ |
| 1749 | $L_{a116}$ | $L_{b185}$ | 1750 | $L_{a125}$ | $L_{b185}$ |
| 1751 | $L_{a126}$ | $L_{b185}$ | 1752 | $L_{a127}$ | $L_{b185}$ |
| 1753 | $L_{a128}$ | $L_{b185}$ | 1754 | $L_{a129}$ | $L_{b185}$ |
| 1755 | $L_{a130}$ | $L_{b185}$ | 1756 | $L_{a131}$ | $L_{b185}$ |
| 1757 | $L_{a132}$ | $L_{b185}$ | 1758 | $L_{a155}$ | $L_{b185}$ |

-continued

| Metal Complex | $L_a$ | $L_b$ | Metal Complex | $L_a$ | $L_b$ |
|---|---|---|---|---|---|
| 1759 | $L_{a156}$ | $L_{b185}$ | 1760 | $L_{a157}$ | $L_{b185}$ |
| 1761 | $L_{a158}$ | $L_{b185}$ | 1762 | $L_{a159}$ | $L_{b185}$ |
| 1763 | $L_{a160}$ | $L_{b185}$ | 1764 | $L_{a161}$ | $L_{b185}$ |
| 1765 | $L_{a162}$ | $L_{b185}$ | 1766 | $L_{a163}$ | $L_{b185}$ |
| 1767 | $L_{a164}$ | $L_{b185}$ | 1768 | $L_{a165}$ | $L_{b185}$ |
| 1769 | $L_{a166}$ | $L_{b185}$ | 1770 | $L_{a167}$ | $L_{b185}$ |
| 1771 | $L_{a168}$ | $L_{b185}$ | 1772 | $L_{a169}$ | $L_{b185}$ |
| 1773 | $L_{a170}$ | $L_{b185}$ | 1774 | $L_{a171}$ | $L_{b185}$ |
| 1775 | $L_{a172}$ | $L_{b185}$ | 1776 | $L_{a173}$ | $L_{b185}$ |
| 1777 | $L_{a174}$ | $L_{b185}$ | 1778 | $L_{a175}$ | $L_{b185}$ |
| 1779 | $L_{a176}$ | $L_{b185}$ | 1780 | $L_{a177}$ | $L_{b185}$ |
| 1781 | $L_{a178}$ | $L_{b185}$ | 1782 | $L_{a179}$ | $L_{b185}$ |
| 1783 | $L_{a180}$ | $L_{b185}$ | 1784 | $L_{a181}$ | $L_{b185}$ |
| 1785 | $L_{a182}$ | $L_{b185}$ | 1786 | $L_{a183}$ | $L_{b185}$ |
| 1787 | $L_{a184}$ | $L_{b185}$ | 1788 | $L_{a185}$ | $L_{b185}$ |
| 1789 | $L_{a186}$ | $L_{b185}$ | 1790 | $L_{a187}$ | $L_{b185}$ |
| 1791 | $L_{a188}$ | $L_{b185}$ | 1792 | $L_{a189}$ | $L_{b185}$ |
| 1793 | $L_{a190}$ | $L_{b185}$ | 1794 | $L_{a199}$ | $L_{b185}$ |
| 1795 | $L_{a200}$ | $L_{b185}$ | 1796 | $L_{a201}$ | $L_{b185}$ |
| 1797 | $L_{a202}$ | $L_{b185}$ | 1798 | $L_{a203}$ | $L_{b185}$ |
| 1799 | $L_{a204}$ | $L_{b185}$ | 1800 | $L_{a205}$ | $L_{b185}$ |
| 1801 | $L_{a206}$ | $L_{b185}$ | 1802 | $L_{a207}$ | $L_{b185}$ |
| 1803 | $L_{a208}$ | $L_{b185}$ | 1804 | $L_{a209}$ | $L_{b185}$ |
| 1805 | $L_{a210}$ | $L_{b185}$ | 1806 | $L_{a211}$ | $L_{b185}$ |
| 1807 | $L_{a212}$ | $L_{b185}$ | 1808 | $L_{a213}$ | $L_{b185}$ |
| 1809 | $L_{a214}$ | $L_{b185}$ | 1810 | $L_{a215}$ | $L_{b185}$ |
| 1811 | $L_{a216}$ | $L_{b185}$ | 1812 | $L_{a217}$ | $L_{b185}$ |
| 1813 | $L_{a218}$ | $L_{b185}$ | 1814 | $L_{a219}$ | $L_{b185}$ |
| 1815 | $L_{a220}$ | $L_{b185}$ | 1816 | $L_{a221}$ | $L_{b185}$ |
| 1817 | $L_{a230}$ | $L_{b185}$ | 1818 | $L_{a231}$ | $L_{b185}$ |
| 1819 | $L_{a232}$ | $L_{b185}$ | 1820 | $L_{a233}$ | $L_{b185}$ |
| 1821 | $L_{a234}$ | $L_{b185}$ | 1822 | $L_{a235}$ | $L_{b185}$ |
| 1823 | $L_{a236}$ | $L_{b185}$ | 1824 | $L_{a252}$ | $L_{b185}$ |
| 1825 | $L_{a253}$ | $L_{b185}$ | 1826 | $L_{a254}$ | $L_{b185}$ |
| 1827 | $L_{a255}$ | $L_{b185}$ | 1828 | $L_{a256}$ | $L_{b185}$ |
| 1829 | $L_{a257}$ | $L_{b185}$ | 1830 | $L_{a258}$ | $L_{b185}$ |
| 1831 | $L_{a259}$ | $L_{b185}$ | 1832 | $L_{a260}$ | $L_{b185}$ |
| 1833 | $L_{a261}$ | $L_{b185}$ | 1834 | $L_{a262}$ | $L_{b185}$ |
| 1835 | $L_{a263}$ | $L_{b185}$ | 1836 | $L_{a264}$ | $L_{b185}$ |
| 1837 | $L_{a265}$ | $L_{b185}$ | 1838 | $L_{a266}$ | $L_{b185}$ |
| 1839 | $L_{a267}$ | $L_{b185}$ | 1840 | $L_{a268}$ | $L_{b185}$ |
| 1841 | $L_{a269}$ | $L_{b185}$ | 1842 | $L_{a270}$ | $L_{b185}$ |
| 1843 | $L_{a271}$ | $L_{b185}$ | 1844 | $L_{a272}$ | $L_{b185}$ |
| 1845 | $L_{a273}$ | $L_{b185}$ | 1846 | $L_{a274}$ | $L_{b185}$ |
| 1847 | $L_{a275}$ | $L_{b185}$ | 1848 | $L_{a276}$ | $L_{b185}$ |
| 1849 | $L_{a277}$ | $L_{b185}$ | 1850 | $L_{a278}$ | $L_{b185}$ |
| 1851 | $L_{a279}$ | $L_{b185}$ | 1852 | $L_{a280}$ | $L_{b185}$ |
| 1853 | $L_{a281}$ | $L_{b185}$ | 1854 | $L_{a282}$ | $L_{b185}$ |
| 1855 | $L_{a283}$ | $L_{b185}$ | 1856 | $L_{a284}$ | $L_{b185}$ |
| 1857 | $L_{a285}$ | $L_{b185}$ | 1858 | $L_{a286}$ | $L_{b185}$ |
| 1859 | $L_{a287}$ | $L_{b185}$ | 1860 | $L_{a288}$ | $L_{b185}$ |
| 1861 | $L_{a1}$ | $L_{b188}$ | 1862 | $L_{a2}$ | $L_{b188}$ |
| 1863 | $L_{a3}$ | $L_{b188}$ | 1864 | $L_{a4}$ | $L_{b188}$ |
| 1865 | $L_{a5}$ | $L_{b188}$ | 1866 | $L_{a6}$ | $L_{b188}$ |
| 1867 | $L_{a7}$ | $L_{b188}$ | 1868 | $L_{a8}$ | $L_{b188}$ |
| 1869 | $L_{a17}$ | $L_{b188}$ | 1870 | $L_{a18}$ | $L_{b188}$ |
| 1871 | $L_{a19}$ | $L_{b188}$ | 1872 | $L_{a20}$ | $L_{b188}$ |
| 1873 | $L_{a21}$ | $L_{b188}$ | 1874 | $L_{a22}$ | $L_{b188}$ |
| 1875 | $L_{a23}$ | $L_{b188}$ | 1876 | $L_{a24}$ | $L_{b188}$ |
| 1877 | $L_{a48}$ | $L_{b188}$ | 1878 | $L_{a49}$ | $L_{b188}$ |
| 1879 | $L_{a50}$ | $L_{b188}$ | 1880 | $L_{a51}$ | $L_{b188}$ |
| 1881 | $L_{a52}$ | $L_{b188}$ | 1882 | $L_{a53}$ | $L_{b188}$ |
| 1883 | $L_{a54}$ | $L_{b188}$ | 1884 | $L_{a55}$ | $L_{b188}$ |
| 1885 | $L_{a56}$ | $L_{b188}$ | 1886 | $L_{a57}$ | $L_{b188}$ |
| 1887 | $L_{a58}$ | $L_{b188}$ | 1888 | $L_{a59}$ | $L_{b188}$ |
| 1889 | $L_{a60}$ | $L_{b188}$ | 1890 | $L_{a61}$ | $L_{b188}$ |
| 1891 | $L_{a62}$ | $L_{b188}$ | 1892 | $L_{a63}$ | $L_{b188}$ |
| 1893 | $L_{a64}$ | $L_{b188}$ | 1894 | $L_{a65}$ | $L_{b188}$ |
| 1895 | $L_{a66}$ | $L_{b188}$ | 1896 | $L_{a67}$ | $L_{b188}$ |
| 1897 | $L_{a68}$ | $L_{b188}$ | 1898 | $L_{a69}$ | $L_{b188}$ |
| 1899 | $L_{a70}$ | $L_{b188}$ | 1900 | $L_{a71}$ | $L_{b188}$ |
| 1901 | $L_{a72}$ | $L_{b188}$ | 1902 | $L_{a73}$ | $L_{b188}$ |
| 1903 | $L_{a74}$ | $L_{b188}$ | 1904 | $L_{a75}$ | $L_{b188}$ |
| 1905 | $L_{a76}$ | $L_{b188}$ | 1906 | $L_{a77}$ | $L_{b188}$ |
| 1907 | $L_{a78}$ | $L_{b188}$ | 1908 | $L_{a79}$ | $L_{b188}$ |
| 1909 | $L_{a80}$ | $L_{b188}$ | 1910 | $L_{a81}$ | $L_{b188}$ |

-continued

| Metal Complex | $L_a$ | $L_b$ | Metal Complex | $L_a$ | $L_b$ |
|---|---|---|---|---|---|
| 1911 | $L_{a82}$ | $L_{b188}$ | 1912 | $L_{a83}$ | $L_{b188}$ |
| 1913 | $L_{a92}$ | $L_{b188}$ | 1914 | $L_{a93}$ | $L_{b188}$ |
| 1915 | $L_{a94}$ | $L_{b188}$ | 1916 | $L_{a95}$ | $L_{b188}$ |
| 1917 | $L_{a96}$ | $L_{b188}$ | 1918 | $L_{a97}$ | $L_{b188}$ |
| 1919 | $L_{a98}$ | $L_{b188}$ | 1920 | $L_{a99}$ | $L_{b188}$ |
| 1921 | $L_{a100}$ | $L_{b188}$ | 1922 | $L_{a101}$ | $L_{b188}$ |
| 1923 | $L_{a102}$ | $L_{b188}$ | 1924 | $L_{a103}$ | $L_{b188}$ |
| 1925 | $L_{a104}$ | $L_{b188}$ | 1926 | $L_{a105}$ | $L_{b188}$ |
| 1927 | $L_{a106}$ | $L_{b188}$ | 1928 | $L_{a109}$ | $L_{b188}$ |
| 1929 | $L_{a110}$ | $L_{b188}$ | 1930 | $L_{a111}$ | $L_{b188}$ |
| 1931 | $L_{a112}$ | $L_{b188}$ | 1932 | $L_{a113}$ | $L_{b188}$ |
| 1933 | $L_{a114}$ | $L_{b188}$ | 1934 | $L_{a115}$ | $L_{b188}$ |
| 1935 | $L_{a116}$ | $L_{b188}$ | 1936 | $L_{a125}$ | $L_{b188}$ |
| 1937 | $L_{a126}$ | $L_{b188}$ | 1938 | $L_{a127}$ | $L_{b188}$ |
| 1939 | $L_{a128}$ | $L_{b188}$ | 1940 | $L_{a129}$ | $L_{b188}$ |
| 1941 | $L_{a130}$ | $L_{b188}$ | 1942 | $L_{a131}$ | $L_{b188}$ |
| 1943 | $L_{a132}$ | $L_{b188}$ | 1944 | $L_{a155}$ | $L_{b188}$ |
| 1945 | $L_{a156}$ | $L_{b188}$ | 1946 | $L_{a157}$ | $L_{b188}$ |
| 1947 | $L_{a158}$ | $L_{b188}$ | 1948 | $L_{a159}$ | $L_{b188}$ |
| 1949 | $L_{a160}$ | $L_{b188}$ | 1950 | $L_{a161}$ | $L_{b188}$ |
| 1951 | $L_{a162}$ | $L_{b188}$ | 1952 | $L_{a163}$ | $L_{b188}$ |
| 1953 | $L_{a164}$ | $L_{b188}$ | 1954 | $L_{a165}$ | $L_{b188}$ |
| 1955 | $L_{a166}$ | $L_{b188}$ | 1956 | $L_{a167}$ | $L_{b188}$ |
| 1957 | $L_{a168}$ | $L_{b188}$ | 1958 | $L_{a169}$ | $L_{b188}$ |
| 1959 | $L_{a170}$ | $L_{b188}$ | 1960 | $L_{a171}$ | $L_{b188}$ |
| 1961 | $L_{a172}$ | $L_{b188}$ | 1962 | $L_{a173}$ | $L_{b188}$ |
| 1963 | $L_{a174}$ | $L_{b188}$ | 1964 | $L_{a175}$ | $L_{b188}$ |
| 1965 | $L_{a176}$ | $L_{b188}$ | 1966 | $L_{a177}$ | $L_{b188}$ |
| 1967 | $L_{a178}$ | $L_{b188}$ | 1968 | $L_{a179}$ | $L_{b188}$ |
| 1969 | $L_{a180}$ | $L_{b188}$ | 1970 | $L_{a181}$ | $L_{b188}$ |
| 1971 | $L_{a182}$ | $L_{b188}$ | 1972 | $L_{a183}$ | $L_{b188}$ |
| 1973 | $L_{a184}$ | $L_{b188}$ | 1974 | $L_{a185}$ | $L_{b188}$ |
| 1975 | $L_{a186}$ | $L_{b188}$ | 1976 | $L_{a187}$ | $L_{b188}$ |
| 1977 | $L_{a188}$ | $L_{b188}$ | 1978 | $L_{a189}$ | $L_{b188}$ |
| 1979 | $L_{a190}$ | $L_{b188}$ | 1980 | $L_{a199}$ | $L_{b188}$ |
| 1981 | $L_{a200}$ | $L_{b188}$ | 1982 | $L_{a201}$ | $L_{b188}$ |
| 1983 | $L_{a202}$ | $L_{b188}$ | 1984 | $L_{a203}$ | $L_{b188}$ |
| 1985 | $L_{a204}$ | $L_{b188}$ | 1986 | $L_{a205}$ | $L_{b188}$ |
| 1987 | $L_{a206}$ | $L_{b188}$ | 1988 | $L_{a207}$ | $L_{b188}$ |
| 1989 | $L_{a208}$ | $L_{b188}$ | 1990 | $L_{a209}$ | $L_{b188}$ |
| 1991 | $L_{a210}$ | $L_{b188}$ | 1992 | $L_{a211}$ | $L_{b188}$ |
| 1993 | $L_{a212}$ | $L_{b188}$ | 1994 | $L_{a213}$ | $L_{b188}$ |
| 1995 | $L_{a214}$ | $L_{b188}$ | 1996 | $L_{a215}$ | $L_{b188}$ |
| 1997 | $L_{a216}$ | $L_{b188}$ | 1998 | $L_{a217}$ | $L_{b188}$ |
| 1999 | $L_{a218}$ | $L_{b188}$ | 2000 | $L_{a219}$ | $L_{b188}$ |
| 2001 | $L_{a220}$ | $L_{b188}$ | 2002 | $L_{a221}$ | $L_{b188}$ |
| 2003 | $L_{a230}$ | $L_{b188}$ | 2004 | $L_{a231}$ | $L_{b188}$ |
| 2005 | $L_{a232}$ | $L_{b188}$ | 2006 | $L_{a233}$ | $L_{b188}$ |
| 2007 | $L_{a234}$ | $L_{b188}$ | 2008 | $L_{a235}$ | $L_{b188}$ |
| 2009 | $L_{a236}$ | $L_{b188}$ | 2010 | $L_{a252}$ | $L_{b188}$ |
| 2011 | $L_{a253}$ | $L_{b188}$ | 2012 | $L_{a254}$ | $L_{b188}$ |
| 2013 | $L_{a255}$ | $L_{b188}$ | 2014 | $L_{a256}$ | $L_{b188}$ |
| 2015 | $L_{a257}$ | $L_{b188}$ | 2016 | $L_{a258}$ | $L_{b188}$ |
| 2017 | $L_{a259}$ | $L_{b188}$ | 2018 | $L_{a260}$ | $L_{b188}$ |
| 2019 | $L_{a261}$ | $L_{b188}$ | 2020 | $L_{a262}$ | $L_{b188}$ |
| 2021 | $L_{a263}$ | $L_{b188}$ | 2022 | $L_{a264}$ | $L_{b188}$ |
| 2023 | $L_{a265}$ | $L_{b188}$ | 2024 | $L_{a266}$ | $L_{b188}$ |
| 2025 | $L_{a267}$ | $L_{b188}$ | 2026 | $L_{a268}$ | $L_{b188}$ |
| 2027 | $L_{a269}$ | $L_{b188}$ | 2028 | $L_{a270}$ | $L_{b188}$ |
| 2029 | $L_{a271}$ | $L_{b188}$ | 2030 | $L_{a272}$ | $L_{b188}$ |
| 2031 | $L_{a273}$ | $L_{b188}$ | 2032 | $L_{a274}$ | $L_{b188}$ |
| 2033 | $L_{a275}$ | $L_{b188}$ | 2034 | $L_{a276}$ | $L_{b188}$ |
| 2035 | $L_{a277}$ | $L_{b188}$ | 2036 | $L_{a278}$ | $L_{b188}$ |
| 2037 | $L_{a279}$ | $L_{b188}$ | 2038 | $L_{a280}$ | $L_{b188}$ |
| 2039 | $L_{a281}$ | $L_{b188}$ | 2040 | $L_{a282}$ | $L_{b188}$ |
| 2041 | $L_{a283}$ | $L_{b188}$ | 2042 | $L_{a284}$ | $L_{b188}$ |
| 2043 | $L_{a285}$ | $L_{b188}$ | 2044 | $L_{a286}$ | $L_{b188}$ |
| 2045 | $L_{a287}$ | $L_{b188}$ | 2046 | $L_{a288}$ | $L_{b188}$ |
| 2047 | $L_{a1}$ | $L_{b190}$ | 2048 | $L_{a2}$ | $L_{b190}$ |
| 2049 | $L_{a3}$ | $L_{b190}$ | 2050 | $L_{a4}$ | $L_{b190}$ |
| 2051 | $L_{a5}$ | $L_{b190}$ | 2052 | $L_{a6}$ | $L_{b190}$ |
| 2053 | $L_{a7}$ | $L_{b190}$ | 2054 | $L_{a8}$ | $L_{b190}$ |
| 2055 | $L_{a17}$ | $L_{b190}$ | 2056 | $L_{a18}$ | $L_{b190}$ |
| 2057 | $L_{a19}$ | $L_{b190}$ | 2058 | $L_{a20}$ | $L_{b190}$ |
| 2059 | $L_{a21}$ | $L_{b190}$ | 2060 | $L_{a22}$ | $L_{b190}$ |
| 2061 | $L_{a23}$ | $L_{b190}$ | 2062 | $L_{a24}$ | $L_{b190}$ |

-continued

| Metal Complex | $L_a$ | $L_b$ | Metal Complex | $L_a$ | $L_b$ |
|---|---|---|---|---|---|
| 2063 | $L_{a48}$ | $L_{b190}$ | 2064 | $L_{a49}$ | $L_{b190}$ |
| 2065 | $L_{a50}$ | $L_{b190}$ | 2066 | $L_{a51}$ | $L_{b190}$ |
| 2067 | $L_{a52}$ | $L_{b190}$ | 2068 | $L_{a53}$ | $L_{b190}$ |
| 2069 | $L_{a54}$ | $L_{b190}$ | 2070 | $L_{a55}$ | $L_{b190}$ |
| 2071 | $L_{a56}$ | $L_{b190}$ | 2072 | $L_{a57}$ | $L_{b190}$ |
| 2073 | $L_{a58}$ | $L_{b190}$ | 2074 | $L_{a59}$ | $L_{b190}$ |
| 2075 | $L_{a60}$ | $L_{b190}$ | 2076 | $L_{a61}$ | $L_{b190}$ |
| 2077 | $L_{a62}$ | $L_{b190}$ | 2078 | $L_{a63}$ | $L_{b190}$ |
| 2079 | $L_{a64}$ | $L_{b190}$ | 2080 | $L_{a65}$ | $L_{b190}$ |
| 2081 | $L_{a66}$ | $L_{b190}$ | 2082 | $L_{a67}$ | $L_{b190}$ |
| 2083 | $L_{a68}$ | $L_{b190}$ | 2084 | $L_{a69}$ | $L_{b190}$ |
| 2085 | $L_{a70}$ | $L_{b190}$ | 2086 | $L_{a71}$ | $L_{b190}$ |
| 2087 | $L_{a72}$ | $L_{b190}$ | 2088 | $L_{a73}$ | $L_{b190}$ |
| 2089 | $L_{a74}$ | $L_{b190}$ | 2090 | $L_{a75}$ | $L_{b190}$ |
| 2091 | $L_{a76}$ | $L_{b190}$ | 2092 | $L_{a77}$ | $L_{b190}$ |
| 2093 | $L_{a78}$ | $L_{b190}$ | 2094 | $L_{a79}$ | $L_{b190}$ |
| 2095 | $L_{a80}$ | $L_{b190}$ | 2096 | $L_{a81}$ | $L_{b190}$ |
| 2097 | $L_{a82}$ | $L_{b190}$ | 2098 | $L_{a83}$ | $L_{b190}$ |
| 2099 | $L_{a92}$ | $L_{b190}$ | 2100 | $L_{a93}$ | $L_{b190}$ |
| 2101 | $L_{a94}$ | $L_{b190}$ | 2102 | $L_{a95}$ | $L_{b190}$ |
| 2103 | $L_{a96}$ | $L_{b190}$ | 2104 | $L_{a97}$ | $L_{b190}$ |
| 2105 | $L_{a98}$ | $L_{b190}$ | 2106 | $L_{a99}$ | $L_{b190}$ |
| 2107 | $L_{a100}$ | $L_{b190}$ | 2108 | $L_{a101}$ | $L_{b190}$ |
| 2109 | $L_{a102}$ | $L_{b190}$ | 2110 | $L_{a103}$ | $L_{b190}$ |
| 2111 | $L_{a104}$ | $L_{b190}$ | 2112 | $L_{a105}$ | $L_{b190}$ |
| 2113 | $L_{a106}$ | $L_{b190}$ | 2114 | $L_{a109}$ | $L_{b190}$ |
| 2115 | $L_{a110}$ | $L_{b190}$ | 2116 | $L_{a111}$ | $L_{b190}$ |
| 2117 | $L_{a112}$ | $L_{b190}$ | 2118 | $L_{a113}$ | $L_{b190}$ |
| 2119 | $L_{a114}$ | $L_{b190}$ | 2120 | $L_{a115}$ | $L_{b190}$ |
| 2121 | $L_{a116}$ | $L_{b190}$ | 2122 | $L_{a125}$ | $L_{b190}$ |
| 2123 | $L_{a126}$ | $L_{b190}$ | 2124 | $L_{a127}$ | $L_{b190}$ |
| 2125 | $L_{a128}$ | $L_{b190}$ | 2126 | $L_{a129}$ | $L_{b190}$ |
| 2127 | $L_{a130}$ | $L_{b190}$ | 2128 | $L_{a131}$ | $L_{b190}$ |
| 2129 | $L_{a132}$ | $L_{b190}$ | 2130 | $L_{a155}$ | $L_{b190}$ |
| 2131 | $L_{a156}$ | $L_{b190}$ | 2132 | $L_{a157}$ | $L_{b190}$ |
| 2133 | $L_{a158}$ | $L_{b190}$ | 2134 | $L_{a159}$ | $L_{b190}$ |
| 2135 | $L_{a160}$ | $L_{b190}$ | 2136 | $L_{a161}$ | $L_{b190}$ |
| 2137 | $L_{a162}$ | $L_{b190}$ | 2138 | $L_{a163}$ | $L_{b190}$ |
| 2139 | $L_{a164}$ | $L_{b190}$ | 2140 | $L_{a165}$ | $L_{b190}$ |
| 2141 | $L_{a166}$ | $L_{b190}$ | 2142 | $L_{a167}$ | $L_{b190}$ |
| 2143 | $L_{a168}$ | $L_{b190}$ | 2144 | $L_{a169}$ | $L_{b190}$ |
| 2145 | $L_{a170}$ | $L_{b190}$ | 2146 | $L_{a171}$ | $L_{b190}$ |
| 2147 | $L_{a172}$ | $L_{b190}$ | 2148 | $L_{a173}$ | $L_{b190}$ |
| 2149 | $L_{a174}$ | $L_{b190}$ | 2150 | $L_{a175}$ | $L_{b190}$ |
| 2151 | $L_{a176}$ | $L_{b190}$ | 2152 | $L_{a177}$ | $L_{b190}$ |
| 2153 | $L_{a178}$ | $L_{b190}$ | 2154 | $L_{a179}$ | $L_{b190}$ |
| 2155 | $L_{a180}$ | $L_{b190}$ | 2156 | $L_{a181}$ | $L_{b190}$ |
| 2157 | $L_{a182}$ | $L_{b190}$ | 2158 | $L_{a183}$ | $L_{b190}$ |
| 2159 | $L_{a184}$ | $L_{b190}$ | 2160 | $L_{a185}$ | $L_{b190}$ |
| 2161 | $L_{a186}$ | $L_{b190}$ | 2162 | $L_{a187}$ | $L_{b190}$ |
| 2163 | $L_{a188}$ | $L_{b190}$ | 2164 | $L_{a189}$ | $L_{b190}$ |
| 2165 | $L_{a190}$ | $L_{b190}$ | 2166 | $L_{a199}$ | $L_{b190}$ |
| 2167 | $L_{a200}$ | $L_{b190}$ | 2168 | $L_{a201}$ | $L_{b190}$ |
| 2169 | $L_{a202}$ | $L_{b190}$ | 2170 | $L_{a203}$ | $L_{b190}$ |
| 2171 | $L_{a204}$ | $L_{b190}$ | 2172 | $L_{a205}$ | $L_{b190}$ |
| 2173 | $L_{a206}$ | $L_{b190}$ | 2174 | $L_{a207}$ | $L_{b190}$ |
| 2175 | $L_{a208}$ | $L_{b190}$ | 2176 | $L_{a209}$ | $L_{b190}$ |
| 2177 | $L_{a210}$ | $L_{b190}$ | 2178 | $L_{a211}$ | $L_{b190}$ |
| 2179 | $L_{a212}$ | $L_{b190}$ | 2180 | $L_{a213}$ | $L_{b190}$ |
| 2181 | $L_{a214}$ | $L_{b190}$ | 2182 | $L_{a215}$ | $L_{b190}$ |
| 2183 | $L_{a216}$ | $L_{b190}$ | 2184 | $L_{a217}$ | $L_{b190}$ |
| 2185 | $L_{a218}$ | $L_{b190}$ | 2186 | $L_{a219}$ | $L_{b190}$ |
| 2187 | $L_{a220}$ | $L_{b190}$ | 2188 | $L_{a221}$ | $L_{b190}$ |
| 2189 | $L_{a230}$ | $L_{b190}$ | 2190 | $L_{a231}$ | $L_{b190}$ |
| 2191 | $L_{a232}$ | $L_{b190}$ | 2192 | $L_{a233}$ | $L_{b190}$ |
| 2193 | $L_{a234}$ | $L_{b190}$ | 2194 | $L_{a235}$ | $L_{b190}$ |
| 2195 | $L_{a236}$ | $L_{b190}$ | 2196 | $L_{a252}$ | $L_{b190}$ |
| 2197 | $L_{a253}$ | $L_{b190}$ | 2198 | $L_{a254}$ | $L_{b190}$ |
| 2199 | $L_{a255}$ | $L_{b190}$ | 2200 | $L_{a256}$ | $L_{b190}$ |
| 2201 | $L_{a257}$ | $L_{b190}$ | 2202 | $L_{a258}$ | $L_{b190}$ |
| 2203 | $L_{a259}$ | $L_{b190}$ | 2204 | $L_{a260}$ | $L_{b190}$ |
| 2205 | $L_{a261}$ | $L_{b190}$ | 2206 | $L_{a262}$ | $L_{b190}$ |
| 2207 | $L_{a263}$ | $L_{b190}$ | 2208 | $L_{a264}$ | $L_{b190}$ |
| 2209 | $L_{a265}$ | $L_{b190}$ | 2210 | $L_{a266}$ | $L_{b190}$ |
| 2211 | $L_{a267}$ | $L_{b190}$ | 2212 | $L_{a268}$ | $L_{b190}$ |
| 2213 | $L_{a269}$ | $L_{b190}$ | 2214 | $L_{a270}$ | $L_{b190}$ |

-continued

| Metal Complex | $L_a$ | $L_b$ | Metal Complex | $L_a$ | $L_b$ |
|---|---|---|---|---|---|
| 2215 | $L_{a271}$ | $L_{b190}$ | 2216 | $L_{a272}$ | $L_{b190}$ |
| 2217 | $L_{a273}$ | $L_{b190}$ | 2218 | $L_{a274}$ | $L_{b190}$ |
| 2219 | $L_{a275}$ | $L_{b190}$ | 2220 | $L_{a276}$ | $L_{b190}$ |
| 2221 | $L_{a277}$ | $L_{b190}$ | 2222 | $L_{a278}$ | $L_{b190}$ |
| 2223 | $L_{a279}$ | $L_{b190}$ | 2224 | $L_{a280}$ | $L_{b190}$ |
| 2225 | $L_{a281}$ | $L_{b190}$ | 2226 | $L_{a282}$ | $L_{b190}$ |
| 2227 | $L_{a283}$ | $L_{b190}$ | 2228 | $L_{a284}$ | $L_{b190}$ |
| 2229 | $L_{a285}$ | $L_{b190}$ | 2230 | $L_{a286}$ | $L_{b190}$ |
| 2231 | $L_{a287}$ | $L_{b190}$ | 2232 | $L_{a288}$ | $L_{b190}$ |
| 2233 | $L_{a1}$ | $L_{b195}$ | 2234 | $L_{a2}$ | $L_{b195}$ |
| 2235 | $L_{a3}$ | $L_{b195}$ | 2236 | $L_{a4}$ | $L_{b195}$ |
| 2237 | $L_{a5}$ | $L_{b195}$ | 2238 | $L_{a6}$ | $L_{b195}$ |
| 2239 | $L_{a7}$ | $L_{b195}$ | 2240 | $L_{a8}$ | $L_{b195}$ |
| 2241 | $L_{a17}$ | $L_{b195}$ | 2242 | $L_{a18}$ | $L_{b195}$ |
| 2243 | $L_{a19}$ | $L_{b195}$ | 2244 | $L_{a20}$ | $L_{b195}$ |
| 2245 | $L_{a21}$ | $L_{b195}$ | 2246 | $L_{a22}$ | $L_{b195}$ |
| 2247 | $L_{a23}$ | $L_{b195}$ | 2248 | $L_{a24}$ | $L_{b195}$ |
| 2249 | $L_{a48}$ | $L_{b195}$ | 2250 | $L_{a49}$ | $L_{b195}$ |
| 2251 | $L_{a50}$ | $L_{b195}$ | 2252 | $L_{a51}$ | $L_{b195}$ |
| 2253 | $L_{a52}$ | $L_{b195}$ | 2254 | $L_{a53}$ | $L_{b195}$ |
| 2255 | $L_{a54}$ | $L_{b195}$ | 2256 | $L_{a55}$ | $L_{b195}$ |
| 2257 | $L_{a56}$ | $L_{b195}$ | 2258 | $L_{a57}$ | $L_{b195}$ |
| 2259 | $L_{a58}$ | $L_{b195}$ | 2260 | $L_{a59}$ | $L_{b195}$ |
| 2261 | $L_{a60}$ | $L_{b195}$ | 2262 | $L_{a61}$ | $L_{b195}$ |
| 2263 | $L_{a62}$ | $L_{b195}$ | 2264 | $L_{a63}$ | $L_{b195}$ |
| 2265 | $L_{a64}$ | $L_{b195}$ | 2266 | $L_{a65}$ | $L_{b195}$ |
| 2267 | $L_{a66}$ | $L_{b195}$ | 2268 | $L_{a67}$ | $L_{b195}$ |
| 2269 | $L_{a68}$ | $L_{b195}$ | 2270 | $L_{a69}$ | $L_{b195}$ |
| 2271 | $L_{a70}$ | $L_{b195}$ | 2272 | $L_{a71}$ | $L_{b195}$ |
| 2273 | $L_{a72}$ | $L_{b195}$ | 2274 | $L_{a73}$ | $L_{b195}$ |
| 2275 | $L_{a74}$ | $L_{b195}$ | 2276 | $L_{a75}$ | $L_{b195}$ |
| 2277 | $L_{a76}$ | $L_{b195}$ | 2278 | $L_{a77}$ | $L_{b195}$ |
| 2279 | $L_{a78}$ | $L_{b195}$ | 2280 | $L_{a79}$ | $L_{b195}$ |
| 2281 | $L_{a80}$ | $L_{b195}$ | 2282 | $L_{a81}$ | $L_{b195}$ |
| 2283 | $L_{a82}$ | $L_{b195}$ | 2284 | $L_{a83}$ | $L_{b195}$ |
| 2285 | $L_{a92}$ | $L_{b195}$ | 2286 | $L_{a93}$ | $L_{b195}$ |
| 2287 | $L_{a94}$ | $L_{b195}$ | 2288 | $L_{a95}$ | $L_{b195}$ |
| 2289 | $L_{a96}$ | $L_{b195}$ | 2290 | $L_{a97}$ | $L_{b195}$ |
| 2291 | $L_{a98}$ | $L_{b195}$ | 2292 | $L_{a99}$ | $L_{b195}$ |
| 2293 | $L_{a100}$ | $L_{b195}$ | 2294 | $L_{a101}$ | $L_{b195}$ |
| 2295 | $L_{a102}$ | $L_{b195}$ | 2296 | $L_{a103}$ | $L_{b195}$ |
| 2297 | $L_{a104}$ | $L_{b195}$ | 2298 | $L_{a105}$ | $L_{b195}$ |
| 2299 | $L_{a106}$ | $L_{b195}$ | 2300 | $L_{a109}$ | $L_{b195}$ |
| 2301 | $L_{a110}$ | $L_{b195}$ | 2302 | $L_{a111}$ | $L_{b195}$ |
| 2303 | $L_{a112}$ | $L_{b195}$ | 2304 | $L_{a113}$ | $L_{b195}$ |
| 2305 | $L_{a114}$ | $L_{b195}$ | 2306 | $L_{a115}$ | $L_{b195}$ |
| 2307 | $L_{a116}$ | $L_{b195}$ | 2308 | $L_{a125}$ | $L_{b195}$ |
| 2309 | $L_{a126}$ | $L_{b195}$ | 2310 | $L_{a127}$ | $L_{b195}$ |
| 2311 | $L_{a128}$ | $L_{b195}$ | 2312 | $L_{a129}$ | $L_{b195}$ |
| 2313 | $L_{a130}$ | $L_{b195}$ | 2314 | $L_{a131}$ | $L_{b195}$ |
| 2315 | $L_{a132}$ | $L_{b195}$ | 2316 | $L_{a155}$ | $L_{b195}$ |
| 2317 | $L_{a156}$ | $L_{b195}$ | 2318 | $L_{a157}$ | $L_{b195}$ |
| 2319 | $L_{a158}$ | $L_{b195}$ | 2320 | $L_{a159}$ | $L_{b195}$ |
| 2321 | $L_{a160}$ | $L_{b195}$ | 2322 | $L_{a161}$ | $L_{b195}$ |
| 2323 | $L_{a162}$ | $L_{b195}$ | 2324 | $L_{a163}$ | $L_{b195}$ |
| 2325 | $L_{a164}$ | $L_{b195}$ | 2326 | $L_{a165}$ | $L_{b195}$ |
| 2327 | $L_{a166}$ | $L_{b195}$ | 2328 | $L_{a167}$ | $L_{b195}$ |
| 2329 | $L_{a168}$ | $L_{b195}$ | 2330 | $L_{a169}$ | $L_{b195}$ |
| 2331 | $L_{a170}$ | $L_{b195}$ | 2332 | $L_{a171}$ | $L_{b195}$ |
| 2333 | $L_{a172}$ | $L_{b195}$ | 2334 | $L_{a173}$ | $L_{b195}$ |
| 2335 | $L_{a174}$ | $L_{b195}$ | 2336 | $L_{a175}$ | $L_{b195}$ |
| 2337 | $L_{a176}$ | $L_{b195}$ | 2338 | $L_{a177}$ | $L_{b195}$ |
| 2339 | $L_{a178}$ | $L_{b195}$ | 2340 | $L_{a179}$ | $L_{b195}$ |
| 2341 | $L_{a180}$ | $L_{b195}$ | 2342 | $L_{a181}$ | $L_{b195}$ |
| 2343 | $L_{a182}$ | $L_{b195}$ | 2344 | $L_{a183}$ | $L_{b195}$ |
| 2345 | $L_{a184}$ | $L_{b195}$ | 2346 | $L_{a185}$ | $L_{b195}$ |
| 2347 | $L_{a186}$ | $L_{b195}$ | 2348 | $L_{a187}$ | $L_{b195}$ |
| 2349 | $L_{a188}$ | $L_{b195}$ | 2350 | $L_{a189}$ | $L_{b195}$ |
| 2351 | $L_{a190}$ | $L_{b195}$ | 2352 | $L_{a199}$ | $L_{b195}$ |
| 2353 | $L_{a200}$ | $L_{b195}$ | 2354 | $L_{a201}$ | $L_{b195}$ |
| 2355 | $L_{a202}$ | $L_{b195}$ | 2356 | $L_{a203}$ | $L_{b195}$ |
| 2357 | $L_{a204}$ | $L_{b195}$ | 2358 | $L_{a205}$ | $L_{b195}$ |
| 2359 | $L_{a206}$ | $L_{b195}$ | 2360 | $L_{a207}$ | $L_{b195}$ |
| 2361 | $L_{a208}$ | $L_{b195}$ | 2362 | $L_{a209}$ | $L_{b195}$ |
| 2363 | $L_{a210}$ | $L_{b195}$ | 2364 | $L_{a211}$ | $L_{b195}$ |
| 2365 | $L_{a212}$ | $L_{b195}$ | 2366 | $L_{a213}$ | $L_{b195}$ |

| Metal Complex | $L_a$ | $L_b$ | Metal Complex | $L_a$ | $L_b$ |
|---|---|---|---|---|---|
| 2367 | $L_{a214}$ | $L_{b195}$ | 2368 | $L_{a215}$ | $L_{b195}$ |
| 2369 | $L_{a216}$ | $L_{b195}$ | 2370 | $L_{a217}$ | $L_{b195}$ |
| 2371 | $L_{a218}$ | $L_{b195}$ | 2372 | $L_{a219}$ | $L_{b195}$ |
| 2373 | $L_{a220}$ | $L_{b195}$ | 2374 | $L_{a221}$ | $L_{b195}$ |
| 2375 | $L_{a230}$ | $L_{b195}$ | 2376 | $L_{a231}$ | $L_{b195}$ |
| 2377 | $L_{a232}$ | $L_{b195}$ | 2378 | $L_{a233}$ | $L_{b195}$ |
| 2379 | $L_{a234}$ | $L_{b195}$ | 2380 | $L_{a235}$ | $L_{b195}$ |
| 2381 | $L_{a236}$ | $L_{b195}$ | 2382 | $L_{a252}$ | $L_{b195}$ |
| 2383 | $L_{a253}$ | $L_{b195}$ | 2384 | $L_{a254}$ | $L_{b195}$ |
| 2385 | $L_{a255}$ | $L_{b195}$ | 2386 | $L_{a256}$ | $L_{b195}$ |
| 2387 | $L_{a257}$ | $L_{b195}$ | 2388 | $L_{a258}$ | $L_{b195}$ |
| 2389 | $L_{a259}$ | $L_{b195}$ | 2390 | $L_{a260}$ | $L_{b195}$ |
| 2391 | $L_{a261}$ | $L_{b195}$ | 2392 | $L_{a262}$ | $L_{b195}$ |
| 2393 | $L_{a263}$ | $L_{b195}$ | 2394 | $L_{a264}$ | $L_{b195}$ |
| 2395 | $L_{a265}$ | $L_{b195}$ | 2396 | $L_{a266}$ | $L_{b195}$ |
| 2397 | $L_{a267}$ | $L_{b195}$ | 2398 | $L_{a268}$ | $L_{b195}$ |
| 2399 | $L_{a269}$ | $L_{b195}$ | 2400 | $L_{a270}$ | $L_{b195}$ |
| 2401 | $L_{a271}$ | $L_{b195}$ | 2402 | $L_{a272}$ | $L_{b195}$ |
| 2403 | $L_{a273}$ | $L_{b195}$ | 2404 | $L_{a274}$ | $L_{b195}$ |
| 2405 | $L_{a275}$ | $L_{b195}$ | 2406 | $L_{a276}$ | $L_{b195}$ |
| 2407 | $L_{a277}$ | $L_{b195}$ | 2408 | $L_{a278}$ | $L_{b195}$ |
| 2409 | $L_{a279}$ | $L_{b195}$ | 2410 | $L_{a280}$ | $L_{b195}$ |
| 2411 | $L_{a281}$ | $L_{b195}$ | 2412 | $L_{a282}$ | $L_{b195}$ |
| 2413 | $L_{a283}$ | $L_{b195}$ | 2414 | $L_{a284}$ | $L_{b195}$ |
| 2415 | $L_{a285}$ | $L_{b195}$ | 2416 | $L_{a286}$ | $L_{b195}$ |
| 2417 | $L_{a287}$ | $L_{b195}$ | 2418 | $L_{a288}$ | $L_{b195}$ |
| 2419 | $L_{a1}$ | $L_{b201}$ | 2420 | $L_{a2}$ | $L_{b201}$ |
| 2421 | $L_{a3}$ | $L_{b201}$ | 2422 | $L_{a4}$ | $L_{b201}$ |
| 2423 | $L_{a5}$ | $L_{b201}$ | 2424 | $L_{a6}$ | $L_{b201}$ |
| 2425 | $L_{a7}$ | $L_{b201}$ | 2426 | $L_{a8}$ | $L_{b201}$ |
| 2427 | $L_{a17}$ | $L_{b201}$ | 2428 | $L_{a18}$ | $L_{b201}$ |
| 2429 | $L_{a19}$ | $L_{b201}$ | 2430 | $L_{a20}$ | $L_{b201}$ |
| 2431 | $L_{a21}$ | $L_{b201}$ | 2432 | $L_{a22}$ | $L_{b201}$ |
| 2433 | $L_{a23}$ | $L_{b201}$ | 2434 | $L_{a24}$ | $L_{b201}$ |
| 2435 | $L_{a48}$ | $L_{b201}$ | 2436 | $L_{a49}$ | $L_{b201}$ |
| 2437 | $L_{a50}$ | $L_{b201}$ | 2438 | $L_{a51}$ | $L_{b201}$ |
| 2439 | $L_{a52}$ | $L_{b201}$ | 2440 | $L_{a53}$ | $L_{b201}$ |
| 2441 | $L_{a54}$ | $L_{b201}$ | 2442 | $L_{a55}$ | $L_{b201}$ |
| 2443 | $L_{a56}$ | $L_{b201}$ | 2444 | $L_{a57}$ | $L_{b201}$ |
| 2445 | $L_{a58}$ | $L_{b201}$ | 2446 | $L_{a59}$ | $L_{b201}$ |
| 2447 | $L_{a60}$ | $L_{b201}$ | 2448 | $L_{a61}$ | $L_{b201}$ |
| 2449 | $L_{a62}$ | $L_{b201}$ | 2450 | $L_{a63}$ | $L_{b201}$ |
| 2451 | $L_{a64}$ | $L_{b201}$ | 2452 | $L_{a65}$ | $L_{b201}$ |
| 2453 | $L_{a66}$ | $L_{b201}$ | 2454 | $L_{a67}$ | $L_{b201}$ |
| 2455 | $L_{a68}$ | $L_{b201}$ | 2456 | $L_{a69}$ | $L_{b201}$ |
| 2457 | $L_{a70}$ | $L_{b201}$ | 2458 | $L_{a71}$ | $L_{b201}$ |
| 2459 | $L_{a72}$ | $L_{b201}$ | 2460 | $L_{a73}$ | $L_{b201}$ |
| 2461 | $L_{a74}$ | $L_{b201}$ | 2462 | $L_{a75}$ | $L_{b201}$ |
| 2463 | $L_{a76}$ | $L_{b201}$ | 2464 | $L_{a77}$ | $L_{b201}$ |
| 2465 | $L_{a78}$ | $L_{b201}$ | 2466 | $L_{a79}$ | $L_{b201}$ |
| 2467 | $L_{a80}$ | $L_{b201}$ | 2468 | $L_{a81}$ | $L_{b201}$ |
| 2469 | $L_{a82}$ | $L_{b201}$ | 2470 | $L_{a83}$ | $L_{b201}$ |
| 2471 | $L_{a92}$ | $L_{b201}$ | 2472 | $L_{a93}$ | $L_{b201}$ |
| 2473 | $L_{a94}$ | $L_{b201}$ | 2474 | $L_{a95}$ | $L_{b201}$ |
| 2475 | $L_{a96}$ | $L_{b201}$ | 2476 | $L_{a97}$ | $L_{b201}$ |
| 2477 | $L_{a98}$ | $L_{b201}$ | 2478 | $L_{a99}$ | $L_{b201}$ |
| 2479 | $L_{a100}$ | $L_{b201}$ | 2480 | $L_{a101}$ | $L_{b201}$ |
| 2481 | $L_{a102}$ | $L_{b201}$ | 2482 | $L_{a103}$ | $L_{b201}$ |
| 2483 | $L_{a104}$ | $L_{b201}$ | 2484 | $L_{a105}$ | $L_{b201}$ |
| 2485 | $L_{a106}$ | $L_{b201}$ | 2486 | $L_{a109}$ | $L_{b201}$ |
| 2487 | $L_{a110}$ | $L_{b201}$ | 2488 | $L_{a111}$ | $L_{b201}$ |
| 2489 | $L_{a112}$ | $L_{b201}$ | 2490 | $L_{a113}$ | $L_{b201}$ |
| 2491 | $L_{a114}$ | $L_{b201}$ | 2492 | $L_{a115}$ | $L_{b201}$ |
| 2493 | $L_{a116}$ | $L_{b201}$ | 2494 | $L_{a125}$ | $L_{b201}$ |
| 2495 | $L_{a126}$ | $L_{b201}$ | 2496 | $L_{a127}$ | $L_{b201}$ |
| 2497 | $L_{a128}$ | $L_{b201}$ | 2498 | $L_{a129}$ | $L_{b201}$ |
| 2499 | $L_{a130}$ | $L_{b201}$ | 2500 | $L_{a131}$ | $L_{b201}$ |
| 2501 | $L_{a132}$ | $L_{b201}$ | 2502 | $L_{a155}$ | $L_{b201}$ |
| 2503 | $L_{a156}$ | $L_{b201}$ | 2504 | $L_{a157}$ | $L_{b201}$ |
| 2505 | $L_{a158}$ | $L_{b201}$ | 2506 | $L_{a159}$ | $L_{b201}$ |
| 2507 | $L_{a160}$ | $L_{b201}$ | 2508 | $L_{a161}$ | $L_{b201}$ |
| 2509 | $L_{a162}$ | $L_{b201}$ | 2510 | $L_{a163}$ | $L_{b201}$ |
| 2511 | $L_{a164}$ | $L_{b201}$ | 2512 | $L_{a165}$ | $L_{b201}$ |
| 2513 | $L_{a166}$ | $L_{b201}$ | 2514 | $L_{a167}$ | $L_{b201}$ |
| 2515 | $L_{a168}$ | $L_{b201}$ | 2516 | $L_{a169}$ | $L_{b201}$ |
| 2517 | $L_{a170}$ | $L_{b201}$ | 2518 | $L_{a171}$ | $L_{b201}$ |

| Metal Complex | $L_a$ | $L_b$ | Metal Complex | $L_a$ | $L_b$ |
|---|---|---|---|---|---|
| 2519 | $L_{a172}$ | $L_{b201}$ | 2520 | $L_{a173}$ | $L_{b201}$ |
| 2521 | $L_{a174}$ | $L_{b201}$ | 2522 | $L_{a175}$ | $L_{b201}$ |
| 2523 | $L_{a176}$ | $L_{b201}$ | 2524 | $L_{a177}$ | $L_{b201}$ |
| 2525 | $L_{a178}$ | $L_{b201}$ | 2526 | $L_{a179}$ | $L_{b201}$ |
| 2527 | $L_{a180}$ | $L_{b201}$ | 2528 | $L_{a181}$ | $L_{b201}$ |
| 2529 | $L_{a182}$ | $L_{b201}$ | 2530 | $L_{a183}$ | $L_{b201}$ |
| 2531 | $L_{a184}$ | $L_{b201}$ | 2532 | $L_{a185}$ | $L_{b201}$ |
| 2533 | $L_{a186}$ | $L_{b201}$ | 2534 | $L_{a187}$ | $L_{b201}$ |
| 2535 | $L_{a188}$ | $L_{b201}$ | 2536 | $L_{a189}$ | $L_{b201}$ |
| 2537 | $L_{a190}$ | $L_{b201}$ | 2538 | $L_{a199}$ | $L_{b201}$ |
| 2539 | $L_{a200}$ | $L_{b201}$ | 2540 | $L_{a201}$ | $L_{b201}$ |
| 2541 | $L_{a202}$ | $L_{b201}$ | 2542 | $L_{a203}$ | $L_{b201}$ |
| 2543 | $L_{a204}$ | $L_{b201}$ | 2544 | $L_{a205}$ | $L_{b201}$ |
| 2545 | $L_{a206}$ | $L_{b201}$ | 2546 | $L_{a207}$ | $L_{b201}$ |
| 2547 | $L_{a208}$ | $L_{b201}$ | 2548 | $L_{a209}$ | $L_{b201}$ |
| 2549 | $L_{a210}$ | $L_{b201}$ | 2550 | $L_{a211}$ | $L_{b201}$ |
| 2551 | $L_{a212}$ | $L_{b201}$ | 2552 | $L_{a213}$ | $L_{b201}$ |
| 2553 | $L_{a214}$ | $L_{b201}$ | 2554 | $L_{a215}$ | $L_{b201}$ |
| 2555 | $L_{a216}$ | $L_{b201}$ | 2556 | $L_{a217}$ | $L_{b201}$ |
| 2557 | $L_{a218}$ | $L_{b201}$ | 2558 | $L_{a219}$ | $L_{b201}$ |
| 2559 | $L_{a220}$ | $L_{b201}$ | 2560 | $L_{a221}$ | $L_{b201}$ |
| 2561 | $L_{a230}$ | $L_{b201}$ | 2562 | $L_{a231}$ | $L_{b201}$ |
| 2563 | $L_{a232}$ | $L_{b201}$ | 2564 | $L_{a233}$ | $L_{b201}$ |
| 2565 | $L_{a234}$ | $L_{b201}$ | 2566 | $L_{a235}$ | $L_{b201}$ |
| 2567 | $L_{a236}$ | $L_{b201}$ | 2568 | $L_{a252}$ | $L_{b201}$ |
| 2569 | $L_{a253}$ | $L_{b201}$ | 2570 | $L_{a254}$ | $L_{b201}$ |
| 2571 | $L_{a255}$ | $L_{b201}$ | 2572 | $L_{a256}$ | $L_{b201}$ |
| 2573 | $L_{a257}$ | $L_{b201}$ | 2574 | $L_{a258}$ | $L_{b201}$ |
| 2575 | $L_{a259}$ | $L_{b201}$ | 2576 | $L_{a260}$ | $L_{b201}$ |
| 2577 | $L_{a261}$ | $L_{b201}$ | 2578 | $L_{a262}$ | $L_{b201}$ |
| 2579 | $L_{a263}$ | $L_{b201}$ | 2580 | $L_{a264}$ | $L_{b201}$ |
| 2581 | $L_{a265}$ | $L_{b201}$ | 2582 | $L_{a266}$ | $L_{b201}$ |
| 2583 | $L_{a267}$ | $L_{b201}$ | 2584 | $L_{a268}$ | $L_{b201}$ |
| 2585 | $L_{a269}$ | $L_{b201}$ | 2586 | $L_{a270}$ | $L_{b201}$ |
| 2587 | $L_{a271}$ | $L_{b201}$ | 2588 | $L_{a272}$ | $L_{b201}$ |
| 2589 | $L_{a273}$ | $L_{b201}$ | 2590 | $L_{a274}$ | $L_{b201}$ |
| 2591 | $L_{a275}$ | $L_{b201}$ | 2592 | $L_{a276}$ | $L_{b201}$ |
| 2593 | $L_{a277}$ | $L_{b201}$ | 2594 | $L_{a278}$ | $L_{b201}$ |
| 2595 | $L_{a279}$ | $L_{b201}$ | 2596 | $L_{a280}$ | $L_{b201}$ |
| 2597 | $L_{a281}$ | $L_{b201}$ | 2598 | $L_{a282}$ | $L_{b201}$ |
| 2599 | $L_{a283}$ | $L_{b201}$ | 2600 | $L_{a284}$ | $L_{b201}$ |
| 2601 | $L_{a285}$ | $L_{b201}$ | 2602 | $L_{a286}$ | $L_{b201}$ |
| 2603 | $L_{a287}$ | $L_{b201}$ | 2604 | $L_{a288}$ | $L_{b201}$ |
| 2605 | $L_{a1}$ | $L_{b266}$ | 2606 | $L_{a2}$ | $L_{b266}$ |
| 2607 | $L_{a3}$ | $L_{b266}$ | 2608 | $L_{a4}$ | $L_{b266}$ |
| 2609 | $L_{a5}$ | $L_{b266}$ | 2610 | $L_{a6}$ | $L_{b266}$ |
| 2611 | $L_{a7}$ | $L_{b266}$ | 2612 | $L_{a8}$ | $L_{b266}$ |
| 2613 | $L_{a17}$ | $L_{b266}$ | 2614 | $L_{a18}$ | $L_{b266}$ |
| 2615 | $L_{a19}$ | $L_{b266}$ | 2616 | $L_{a20}$ | $L_{b266}$ |
| 2617 | $L_{a21}$ | $L_{b266}$ | 2618 | $L_{a22}$ | $L_{b266}$ |
| 2619 | $L_{a23}$ | $L_{b266}$ | 2620 | $L_{a24}$ | $L_{b266}$ |
| 2621 | $L_{a48}$ | $L_{b266}$ | 2622 | $L_{a49}$ | $L_{b266}$ |
| 2623 | $L_{a50}$ | $L_{b266}$ | 2624 | $L_{a51}$ | $L_{b266}$ |
| 2625 | $L_{a52}$ | $L_{b266}$ | 2626 | $L_{a53}$ | $L_{b266}$ |
| 2627 | $L_{a54}$ | $L_{b266}$ | 2628 | $L_{a55}$ | $L_{b266}$ |
| 2629 | $L_{a56}$ | $L_{b266}$ | 2630 | $L_{a57}$ | $L_{b266}$ |
| 2631 | $L_{a58}$ | $L_{b266}$ | 2632 | $L_{a59}$ | $L_{b266}$ |
| 2633 | $L_{a60}$ | $L_{b266}$ | 2634 | $L_{a61}$ | $L_{b266}$ |
| 2635 | $L_{a62}$ | $L_{b266}$ | 2636 | $L_{a63}$ | $L_{b266}$ |
| 2637 | $L_{a64}$ | $L_{b266}$ | 2638 | $L_{a65}$ | $L_{b266}$ |
| 2639 | $L_{a66}$ | $L_{b266}$ | 2640 | $L_{a67}$ | $L_{b266}$ |
| 2641 | $L_{a68}$ | $L_{b266}$ | 2642 | $L_{a69}$ | $L_{b266}$ |
| 2643 | $L_{a70}$ | $L_{b266}$ | 2644 | $L_{a71}$ | $L_{b266}$ |
| 2645 | $L_{a72}$ | $L_{b266}$ | 2646 | $L_{a73}$ | $L_{b266}$ |
| 2647 | $L_{a74}$ | $L_{b266}$ | 2648 | $L_{a75}$ | $L_{b266}$ |
| 2649 | $L_{a76}$ | $L_{b266}$ | 2650 | $L_{a77}$ | $L_{b266}$ |
| 2651 | $L_{a78}$ | $L_{b266}$ | 2652 | $L_{a79}$ | $L_{b266}$ |
| 2653 | $L_{a80}$ | $L_{b266}$ | 2654 | $L_{a81}$ | $L_{b266}$ |
| 2655 | $L_{a82}$ | $L_{b266}$ | 2656 | $L_{a83}$ | $L_{b266}$ |
| 2657 | $L_{a92}$ | $L_{b266}$ | 2658 | $L_{a93}$ | $L_{b266}$ |
| 2659 | $L_{a94}$ | $L_{b266}$ | 2660 | $L_{a95}$ | $L_{b266}$ |
| 2661 | $L_{a96}$ | $L_{b266}$ | 2662 | $L_{a97}$ | $L_{b266}$ |
| 2663 | $L_{a98}$ | $L_{b266}$ | 2664 | $L_{a99}$ | $L_{b266}$ |
| 2665 | $L_{a100}$ | $L_{b266}$ | 2666 | $L_{a101}$ | $L_{b266}$ |
| 2667 | $L_{a102}$ | $L_{b266}$ | 2668 | $L_{a103}$ | $L_{b266}$ |
| 2669 | $L_{a104}$ | $L_{b266}$ | 2670 | $L_{a105}$ | $L_{b266}$ |

-continued

| Metal Complex | $L_a$ | $L_b$ | Metal Complex | $L_a$ | $L_b$ |
|---|---|---|---|---|---|
| 2671 | $L_{a106}$ | $L_{b266}$ | 2672 | $L_{a109}$ | $L_{b266}$ |
| 2673 | $L_{a110}$ | $L_{b266}$ | 2674 | $L_{a111}$ | $L_{b266}$ |
| 2675 | $L_{a112}$ | $L_{b266}$ | 2676 | $L_{a113}$ | $L_{b266}$ |
| 2677 | $L_{a114}$ | $L_{b266}$ | 2678 | $L_{a115}$ | $L_{b266}$ |
| 2679 | $L_{a116}$ | $L_{b266}$ | 2680 | $L_{a125}$ | $L_{b266}$ |
| 2681 | $L_{a126}$ | $L_{b266}$ | 2682 | $L_{a127}$ | $L_{b266}$ |
| 2683 | $L_{a128}$ | $L_{b266}$ | 2684 | $L_{a129}$ | $L_{b266}$ |
| 2685 | $L_{a130}$ | $L_{b266}$ | 2686 | $L_{a131}$ | $L_{b266}$ |
| 2687 | $L_{a132}$ | $L_{b266}$ | 2688 | $L_{a155}$ | $L_{b266}$ |
| 2689 | $L_{a156}$ | $L_{b266}$ | 2690 | $L_{a157}$ | $L_{b266}$ |
| 2691 | $L_{a158}$ | $L_{b266}$ | 2692 | $L_{a159}$ | $L_{b266}$ |
| 2693 | $L_{a160}$ | $L_{b266}$ | 2694 | $L_{a161}$ | $L_{b266}$ |
| 2695 | $L_{a162}$ | $L_{b266}$ | 2696 | $L_{a163}$ | $L_{b266}$ |
| 2697 | $L_{a164}$ | $L_{b266}$ | 2698 | $L_{a165}$ | $L_{b266}$ |
| 2699 | $L_{a166}$ | $L_{b266}$ | 2700 | $L_{a167}$ | $L_{b266}$ |
| 2701 | $L_{a168}$ | $L_{b266}$ | 2702 | $L_{a169}$ | $L_{b266}$ |
| 2703 | $L_{a170}$ | $L_{b266}$ | 2704 | $L_{a171}$ | $L_{b266}$ |
| 2705 | $L_{a172}$ | $L_{b266}$ | 2706 | $L_{a173}$ | $L_{b266}$ |
| 2707 | $L_{a174}$ | $L_{b266}$ | 2708 | $L_{a175}$ | $L_{b266}$ |
| 2709 | $L_{a176}$ | $L_{b266}$ | 2710 | $L_{a177}$ | $L_{b266}$ |
| 2711 | $L_{a178}$ | $L_{b266}$ | 2712 | $L_{a179}$ | $L_{b266}$ |
| 2713 | $L_{a180}$ | $L_{b266}$ | 2714 | $L_{a181}$ | $L_{b266}$ |
| 2715 | $L_{a182}$ | $L_{b266}$ | 2716 | $L_{a183}$ | $L_{b266}$ |
| 2717 | $L_{a184}$ | $L_{b266}$ | 2718 | $L_{a185}$ | $L_{b266}$ |
| 2719 | $L_{a186}$ | $L_{b266}$ | 2720 | $L_{a187}$ | $L_{b266}$ |
| 2721 | $L_{a188}$ | $L_{b266}$ | 2722 | $L_{a189}$ | $L_{b266}$ |
| 2723 | $L_{a190}$ | $L_{b266}$ | 2724 | $L_{a199}$ | $L_{b266}$ |
| 2725 | $L_{a200}$ | $L_{b266}$ | 2726 | $L_{a201}$ | $L_{b266}$ |
| 2727 | $L_{a202}$ | $L_{b266}$ | 2728 | $L_{a203}$ | $L_{b266}$ |
| 2729 | $L_{a204}$ | $L_{b266}$ | 2730 | $L_{a205}$ | $L_{b266}$ |
| 2731 | $L_{a206}$ | $L_{b266}$ | 2732 | $L_{a207}$ | $L_{b266}$ |
| 2733 | $L_{a208}$ | $L_{b266}$ | 2734 | $L_{a209}$ | $L_{b266}$ |
| 2735 | $L_{a210}$ | $L_{b266}$ | 2736 | $L_{a211}$ | $L_{b266}$ |
| 2737 | $L_{a212}$ | $L_{b266}$ | 2738 | $L_{a213}$ | $L_{b266}$ |
| 2739 | $L_{a214}$ | $L_{b266}$ | 2740 | $L_{a215}$ | $L_{b266}$ |
| 2741 | $L_{a216}$ | $L_{b266}$ | 2742 | $L_{a217}$ | $L_{b266}$ |
| 2743 | $L_{a218}$ | $L_{b266}$ | 2744 | $L_{a219}$ | $L_{b266}$ |
| 2745 | $L_{a220}$ | $L_{b266}$ | 2746 | $L_{a221}$ | $L_{b266}$ |
| 2747 | $L_{a230}$ | $L_{b266}$ | 2748 | $L_{a231}$ | $L_{b266}$ |
| 2749 | $L_{a232}$ | $L_{b266}$ | 2750 | $L_{a233}$ | $L_{b266}$ |
| 2751 | $L_{a234}$ | $L_{b266}$ | 2752 | $L_{a235}$ | $L_{b266}$ |
| 2753 | $L_{a236}$ | $L_{b266}$ | 2754 | $L_{a252}$ | $L_{b266}$ |
| 2755 | $L_{a253}$ | $L_{b266}$ | 2756 | $L_{a254}$ | $L_{b266}$ |
| 2757 | $L_{a255}$ | $L_{b266}$ | 2758 | $L_{a256}$ | $L_{b266}$ |
| 2759 | $L_{a257}$ | $L_{b266}$ | 2760 | $L_{a258}$ | $L_{b266}$ |
| 2761 | $L_{a259}$ | $L_{b266}$ | 2762 | $L_{a260}$ | $L_{b266}$ |
| 2763 | $L_{a261}$ | $L_{b266}$ | 2764 | $L_{a262}$ | $L_{b266}$ |
| 2765 | $L_{a263}$ | $L_{b266}$ | 2766 | $L_{a264}$ | $L_{b266}$ |
| 2767 | $L_{a265}$ | $L_{b266}$ | 2768 | $L_{a266}$ | $L_{b266}$ |
| 2769 | $L_{a267}$ | $L_{b266}$ | 2770 | $L_{a268}$ | $L_{b266}$ |
| 2771 | $L_{a269}$ | $L_{b266}$ | 2772 | $L_{a270}$ | $L_{b266}$ |
| 2773 | $L_{a271}$ | $L_{b266}$ | 2774 | $L_{a272}$ | $L_{b266}$ |
| 2775 | $L_{a273}$ | $L_{b266}$ | 2776 | $L_{a274}$ | $L_{b266}$ |
| 2777 | $L_{a275}$ | $L_{b266}$ | 2778 | $L_{a276}$ | $L_{b266}$ |
| 2779 | $L_{a277}$ | $L_{b266}$ | 2780 | $L_{a278}$ | $L_{b266}$ |
| 2781 | $L_{a279}$ | $L_{b266}$ | 2782 | $L_{a280}$ | $L_{b266}$ |
| 2783 | $L_{a281}$ | $L_{b266}$ | 2784 | $L_{a282}$ | $L_{b266}$ |
| 2785 | $L_{a283}$ | $L_{b266}$ | 2786 | $L_{a284}$ | $L_{b266}$ |
| 2787 | $L_{a285}$ | $L_{b266}$ | 2788 | $L_{a286}$ | $L_{b266}$ |
| 2789 | $L_{a287}$ | $L_{b266}$ | 2790 | $L_{a288}$ | $L_{b266}$ |
| 2791 | $L_{a1}$ | $L_{b482}$ | 2792 | $L_{a2}$ | $L_{b482}$ |
| 2793 | $L_{a3}$ | $L_{b482}$ | 2794 | $L_{a4}$ | $L_{b482}$ |
| 2795 | $L_{a5}$ | $L_{b482}$ | 2796 | $L_{a6}$ | $L_{b482}$ |
| 2797 | $L_{a7}$ | $L_{b482}$ | 2798 | $L_{a8}$ | $L_{b482}$ |
| 2799 | $L_{a17}$ | $L_{b482}$ | 2800 | $L_{a18}$ | $L_{b482}$ |
| 2801 | $L_{a19}$ | $L_{b482}$ | 2802 | $L_{a20}$ | $L_{b482}$ |
| 2803 | $L_{a21}$ | $L_{b482}$ | 2804 | $L_{a22}$ | $L_{b482}$ |
| 2805 | $L_{a23}$ | $L_{b482}$ | 2806 | $L_{a24}$ | $L_{b482}$ |
| 2807 | $L_{a48}$ | $L_{b482}$ | 2808 | $L_{a49}$ | $L_{b482}$ |
| 2809 | $L_{a50}$ | $L_{b482}$ | 2810 | $L_{a51}$ | $L_{b482}$ |
| 2811 | $L_{a52}$ | $L_{b482}$ | 2812 | $L_{a53}$ | $L_{b482}$ |
| 2813 | $L_{a54}$ | $L_{b482}$ | 2814 | $L_{a55}$ | $L_{b482}$ |
| 2815 | $L_{a56}$ | $L_{b482}$ | 2816 | $L_{a57}$ | $L_{b482}$ |
| 2817 | $L_{a58}$ | $L_{b482}$ | 2818 | $L_{a59}$ | $L_{b482}$ |
| 2819 | $L_{a60}$ | $L_{b482}$ | 2820 | $L_{a61}$ | $L_{b482}$ |
| 2821 | $L_{a62}$ | $L_{b482}$ | 2822 | $L_{a63}$ | $L_{b482}$ |

-continued

| Metal Complex | $L_a$ | $L_b$ | Metal Complex | $L_a$ | $L_b$ |
|---|---|---|---|---|---|
| 2823 | $L_{a64}$ | $L_{b482}$ | 2824 | $L_{a65}$ | $L_{b482}$ |
| 2825 | $L_{a66}$ | $L_{b482}$ | 2826 | $L_{a67}$ | $L_{b482}$ |
| 2827 | $L_{a68}$ | $L_{b482}$ | 2828 | $L_{a69}$ | $L_{b482}$ |
| 2829 | $L_{a70}$ | $L_{b482}$ | 2830 | $L_{a71}$ | $L_{b482}$ |
| 2831 | $L_{a72}$ | $L_{b482}$ | 2832 | $L_{a73}$ | $L_{b482}$ |
| 2833 | $L_{a74}$ | $L_{b482}$ | 2834 | $L_{a75}$ | $L_{b482}$ |
| 2835 | $L_{a76}$ | $L_{b482}$ | 2836 | $L_{a77}$ | $L_{b482}$ |
| 2837 | $L_{a78}$ | $L_{b482}$ | 2838 | $L_{a79}$ | $L_{b482}$ |
| 2839 | $L_{a80}$ | $L_{b482}$ | 2840 | $L_{a81}$ | $L_{b482}$ |
| 2841 | $L_{a82}$ | $L_{b482}$ | 2842 | $L_{a83}$ | $L_{b482}$ |
| 2843 | $L_{a92}$ | $L_{b482}$ | 2844 | $L_{a93}$ | $L_{b482}$ |
| 2845 | $L_{a94}$ | $L_{b482}$ | 2846 | $L_{a95}$ | $L_{b482}$ |
| 2847 | $L_{a96}$ | $L_{b482}$ | 2848 | $L_{a97}$ | $L_{b482}$ |
| 2849 | $L_{a98}$ | $L_{b482}$ | 2850 | $L_{a99}$ | $L_{b482}$ |
| 2851 | $L_{a100}$ | $L_{b482}$ | 2852 | $L_{a101}$ | $L_{b482}$ |
| 2853 | $L_{a102}$ | $L_{b482}$ | 2854 | $L_{a103}$ | $L_{b482}$ |
| 2855 | $L_{a104}$ | $L_{b482}$ | 2856 | $L_{a105}$ | $L_{b482}$ |
| 2857 | $L_{a106}$ | $L_{b482}$ | 2858 | $L_{a109}$ | $L_{b482}$ |
| 2859 | $L_{a110}$ | $L_{b482}$ | 2860 | $L_{a111}$ | $L_{b482}$ |
| 2861 | $L_{a112}$ | $L_{b482}$ | 2862 | $L_{a113}$ | $L_{b482}$ |
| 2863 | $L_{a114}$ | $L_{b482}$ | 2864 | $L_{a115}$ | $L_{b482}$ |
| 2865 | $L_{a116}$ | $L_{b482}$ | 2866 | $L_{a125}$ | $L_{b482}$ |
| 2867 | $L_{a126}$ | $L_{b482}$ | 2868 | $L_{a127}$ | $L_{b482}$ |
| 2869 | $L_{a128}$ | $L_{b482}$ | 2870 | $L_{a129}$ | $L_{b482}$ |
| 2871 | $L_{a130}$ | $L_{b482}$ | 2872 | $L_{a131}$ | $L_{b482}$ |
| 2873 | $L_{a132}$ | $L_{b482}$ | 2874 | $L_{a155}$ | $L_{b482}$ |
| 2875 | $L_{a156}$ | $L_{b482}$ | 2876 | $L_{a157}$ | $L_{b482}$ |
| 2877 | $L_{a158}$ | $L_{b482}$ | 2878 | $L_{a159}$ | $L_{b482}$ |
| 2879 | $L_{a160}$ | $L_{b482}$ | 2880 | $L_{a161}$ | $L_{b482}$ |
| 2881 | $L_{a162}$ | $L_{b482}$ | 2882 | $L_{a163}$ | $L_{b482}$ |
| 2883 | $L_{a164}$ | $L_{b482}$ | 2884 | $L_{a165}$ | $L_{b482}$ |
| 2885 | $L_{a166}$ | $L_{b482}$ | 2886 | $L_{a167}$ | $L_{b482}$ |
| 2887 | $L_{a168}$ | $L_{b482}$ | 2888 | $L_{a169}$ | $L_{b482}$ |
| 2889 | $L_{a170}$ | $L_{b482}$ | 2890 | $L_{a171}$ | $L_{b482}$ |
| 2891 | $L_{a172}$ | $L_{b482}$ | 2892 | $L_{a173}$ | $L_{b482}$ |
| 2893 | $L_{a174}$ | $L_{b482}$ | 2894 | $L_{a175}$ | $L_{b482}$ |
| 2895 | $L_{a176}$ | $L_{b482}$ | 2896 | $L_{a177}$ | $L_{b482}$ |
| 2897 | $L_{a178}$ | $L_{b482}$ | 2898 | $L_{a179}$ | $L_{b482}$ |
| 2899 | $L_{a180}$ | $L_{b482}$ | 2900 | $L_{a181}$ | $L_{b482}$ |
| 2901 | $L_{a182}$ | $L_{b482}$ | 2902 | $L_{a183}$ | $L_{b482}$ |
| 2903 | $L_{a184}$ | $L_{b482}$ | 2904 | $L_{a185}$ | $L_{b482}$ |
| 2905 | $L_{a186}$ | $L_{b482}$ | 2906 | $L_{a187}$ | $L_{b482}$ |
| 2907 | $L_{a188}$ | $L_{b482}$ | 2908 | $L_{a189}$ | $L_{b482}$ |
| 2909 | $L_{a190}$ | $L_{b482}$ | 2910 | $L_{a199}$ | $L_{b482}$ |
| 2911 | $L_{a200}$ | $L_{b482}$ | 2912 | $L_{a201}$ | $L_{b482}$ |
| 2913 | $L_{a202}$ | $L_{b482}$ | 2914 | $L_{a203}$ | $L_{b482}$ |
| 2915 | $L_{a204}$ | $L_{b482}$ | 2916 | $L_{a205}$ | $L_{b482}$ |
| 2917 | $L_{a206}$ | $L_{b482}$ | 2918 | $L_{a207}$ | $L_{b482}$ |
| 2919 | $L_{a208}$ | $L_{b482}$ | 2920 | $L_{a209}$ | $L_{b482}$ |
| 2921 | $L_{a210}$ | $L_{b482}$ | 2922 | $L_{a211}$ | $L_{b482}$ |
| 2923 | $L_{a212}$ | $L_{b482}$ | 2924 | $L_{a213}$ | $L_{b482}$ |
| 2925 | $L_{a214}$ | $L_{b482}$ | 2926 | $L_{a215}$ | $L_{b482}$ |
| 2927 | $L_{a216}$ | $L_{b482}$ | 2928 | $L_{a217}$ | $L_{b482}$ |
| 2929 | $L_{a218}$ | $L_{b482}$ | 2930 | $L_{a219}$ | $L_{b482}$ |
| 2931 | $L_{a220}$ | $L_{b482}$ | 2932 | $L_{a221}$ | $L_{b482}$ |
| 2933 | $L_{a230}$ | $L_{b482}$ | 2934 | $L_{a231}$ | $L_{b482}$ |
| 2935 | $L_{a232}$ | $L_{b482}$ | 2936 | $L_{a233}$ | $L_{b482}$ |
| 2937 | $L_{a234}$ | $L_{b482}$ | 2938 | $L_{a235}$ | $L_{b482}$ |
| 2939 | $L_{a236}$ | $L_{b482}$ | 2940 | $L_{a252}$ | $L_{b482}$ |
| 2941 | $L_{a253}$ | $L_{b482}$ | 2942 | $L_{a254}$ | $L_{b482}$ |
| 2943 | $L_{a255}$ | $L_{b482}$ | 2944 | $L_{a256}$ | $L_{b482}$ |
| 2945 | $L_{a257}$ | $L_{b482}$ | 2946 | $L_{a258}$ | $L_{b482}$ |
| 2947 | $L_{a259}$ | $L_{b482}$ | 2948 | $L_{a260}$ | $L_{b482}$ |
| 2949 | $L_{a261}$ | $L_{b482}$ | 2950 | $L_{a262}$ | $L_{b482}$ |
| 2951 | $L_{a263}$ | $L_{b482}$ | 2952 | $L_{a264}$ | $L_{b482}$ |
| 2953 | $L_{a265}$ | $L_{b482}$ | 2954 | $L_{a266}$ | $L_{b482}$ |
| 2955 | $L_{a267}$ | $L_{b482}$ | 2956 | $L_{a268}$ | $L_{b482}$ |
| 2957 | $L_{a269}$ | $L_{b482}$ | 2958 | $L_{a270}$ | $L_{b482}$ |
| 2959 | $L_{a271}$ | $L_{b482}$ | 2960 | $L_{a272}$ | $L_{b482}$ |
| 2961 | $L_{a273}$ | $L_{b482}$ | 2962 | $L_{a274}$ | $L_{b482}$ |
| 2963 | $L_{a275}$ | $L_{b482}$ | 2964 | $L_{a276}$ | $L_{b482}$ |
| 2965 | $L_{a277}$ | $L_{b482}$ | 2966 | $L_{a278}$ | $L_{b482}$ |
| 2967 | $L_{a279}$ | $L_{b482}$ | 2968 | $L_{a280}$ | $L_{b482}$ |
| 2969 | $L_{a281}$ | $L_{b482}$ | 2970 | $L_{a282}$ | $L_{b482}$ |
| 2971 | $L_{a283}$ | $L_{b482}$ | 2972 | $L_{a284}$ | $L_{b482}$ |
| 2973 | $L_{a285}$ | $L_{b482}$ | 2974 | $L_{a286}$ | $L_{b482}$ |

-continued

| Metal Complex | $L_a$ | $L_b$ | Metal Complex | $L_a$ | $L_b$ |
|---|---|---|---|---|---|
| 2975 | $L_{a287}$ | $L_{b482}$ | 2976 | $L_{a288}$ | $L_{b482}$ |
| 2977 | $L_{a1}$ | $L_{b483}$ | 2978 | $L_{a2}$ | $L_{b483}$ |
| 2979 | $L_{a3}$ | $L_{b483}$ | 2980 | $L_{a4}$ | $L_{b483}$ |
| 2981 | $L_{a5}$ | $L_{b483}$ | 2982 | $L_{a6}$ | $L_{b483}$ |
| 2983 | $L_{a7}$ | $L_{b483}$ | 2984 | $L_{a8}$ | $L_{b483}$ |
| 2985 | $L_{a17}$ | $L_{b483}$ | 2986 | $L_{a18}$ | $L_{b483}$ |
| 2987 | $L_{a19}$ | $L_{b483}$ | 2988 | $L_{a20}$ | $L_{b483}$ |
| 2989 | $L_{a21}$ | $L_{b483}$ | 2990 | $L_{a22}$ | $L_{b483}$ |
| 2991 | $L_{a23}$ | $L_{b483}$ | 2992 | $L_{a24}$ | $L_{b483}$ |
| 2993 | $L_{a48}$ | $L_{b483}$ | 2994 | $L_{a49}$ | $L_{b483}$ |
| 2995 | $L_{a50}$ | $L_{b483}$ | 2996 | $L_{a51}$ | $L_{b483}$ |
| 2997 | $L_{a52}$ | $L_{b483}$ | 2998 | $L_{a53}$ | $L_{b483}$ |
| 2999 | $L_{a54}$ | $L_{b483}$ | 3000 | $L_{a55}$ | $L_{b483}$ |
| 3001 | $L_{a56}$ | $L_{b483}$ | 3002 | $L_{a57}$ | $L_{b483}$ |
| 3003 | $L_{a58}$ | $L_{b483}$ | 3004 | $L_{a59}$ | $L_{b483}$ |
| 3005 | $L_{a60}$ | $L_{b483}$ | 3006 | $L_{a61}$ | $L_{b483}$ |
| 3007 | $L_{a62}$ | $L_{b483}$ | 3008 | $L_{a63}$ | $L_{b483}$ |
| 3009 | $L_{a64}$ | $L_{b483}$ | 3010 | $L_{a65}$ | $L_{b483}$ |
| 3011 | $L_{a66}$ | $L_{b483}$ | 3012 | $L_{a67}$ | $L_{b483}$ |
| 3013 | $L_{a68}$ | $L_{b483}$ | 3014 | $L_{a69}$ | $L_{b483}$ |
| 3015 | $L_{a70}$ | $L_{b483}$ | 3016 | $L_{a71}$ | $L_{b483}$ |
| 3017 | $L_{a72}$ | $L_{b483}$ | 3018 | $L_{a73}$ | $L_{b483}$ |
| 3019 | $L_{a74}$ | $L_{b483}$ | 3020 | $L_{a75}$ | $L_{b483}$ |
| 3021 | $L_{a76}$ | $L_{b483}$ | 3022 | $L_{a77}$ | $L_{b483}$ |
| 3023 | $L_{a78}$ | $L_{b483}$ | 3024 | $L_{a79}$ | $L_{b483}$ |
| 3025 | $L_{a80}$ | $L_{b483}$ | 3026 | $L_{a81}$ | $L_{b483}$ |
| 3027 | $L_{a82}$ | $L_{b483}$ | 3028 | $L_{a83}$ | $L_{b483}$ |
| 3029 | $L_{a92}$ | $L_{b483}$ | 3030 | $L_{a93}$ | $L_{b483}$ |
| 3031 | $L_{a94}$ | $L_{b483}$ | 3032 | $L_{a95}$ | $L_{b483}$ |
| 3033 | $L_{a96}$ | $L_{b483}$ | 3034 | $L_{a97}$ | $L_{b483}$ |
| 3035 | $L_{a98}$ | $L_{b483}$ | 3036 | $L_{a99}$ | $L_{b483}$ |
| 3037 | $L_{a100}$ | $L_{b483}$ | 3038 | $L_{a101}$ | $L_{b483}$ |
| 3039 | $L_{a102}$ | $L_{b483}$ | 3040 | $L_{a103}$ | $L_{b483}$ |
| 3041 | $L_{a104}$ | $L_{b483}$ | 3042 | $L_{a105}$ | $L_{b483}$ |
| 3043 | $L_{a106}$ | $L_{b483}$ | 3044 | $L_{a109}$ | $L_{b483}$ |
| 3045 | $L_{a110}$ | $L_{b483}$ | 3046 | $L_{a111}$ | $L_{b483}$ |
| 3047 | $L_{a112}$ | $L_{b483}$ | 3048 | $L_{a113}$ | $L_{b483}$ |
| 3049 | $L_{a114}$ | $L_{b483}$ | 3050 | $L_{a115}$ | $L_{b483}$ |
| 3051 | $L_{a116}$ | $L_{b483}$ | 3052 | $L_{a125}$ | $L_{b483}$ |
| 3053 | $L_{a126}$ | $L_{b483}$ | 3054 | $L_{a127}$ | $L_{b483}$ |
| 3055 | $L_{a128}$ | $L_{b483}$ | 3056 | $L_{a129}$ | $L_{b483}$ |
| 3057 | $L_{a130}$ | $L_{b483}$ | 3058 | $L_{a131}$ | $L_{b483}$ |
| 3059 | $L_{a132}$ | $L_{b483}$ | 3060 | $L_{a155}$ | $L_{b483}$ |
| 3061 | $L_{a156}$ | $L_{b483}$ | 3062 | $L_{a157}$ | $L_{b483}$ |
| 3063 | $L_{a158}$ | $L_{b483}$ | 3064 | $L_{a159}$ | $L_{b483}$ |
| 3065 | $L_{a160}$ | $L_{b483}$ | 3066 | $L_{a161}$ | $L_{b483}$ |
| 3067 | $L_{a162}$ | $L_{b483}$ | 3068 | $L_{a163}$ | $L_{b483}$ |
| 3069 | $L_{a164}$ | $L_{b483}$ | 3070 | $L_{a165}$ | $L_{b483}$ |
| 3071 | $L_{a166}$ | $L_{b483}$ | 3072 | $L_{a167}$ | $L_{b483}$ |
| 3073 | $L_{a168}$ | $L_{b483}$ | 3074 | $L_{a169}$ | $L_{b483}$ |
| 3075 | $L_{a170}$ | $L_{b483}$ | 3076 | $L_{a171}$ | $L_{b483}$ |
| 3077 | $L_{a172}$ | $L_{b483}$ | 3078 | $L_{a173}$ | $L_{b483}$ |
| 3079 | $L_{a174}$ | $L_{b483}$ | 3080 | $L_{a175}$ | $L_{b483}$ |
| 3081 | $L_{a176}$ | $L_{b483}$ | 3082 | $L_{a177}$ | $L_{b483}$ |
| 3083 | $L_{a178}$ | $L_{b483}$ | 3084 | $L_{a179}$ | $L_{b483}$ |
| 3085 | $L_{a180}$ | $L_{b483}$ | 3086 | $L_{a181}$ | $L_{b483}$ |
| 3087 | $L_{a182}$ | $L_{b483}$ | 3088 | $L_{a183}$ | $L_{b483}$ |
| 3089 | $L_{a184}$ | $L_{b483}$ | 3090 | $L_{a185}$ | $L_{b483}$ |
| 3091 | $L_{a186}$ | $L_{b483}$ | 3092 | $L_{a187}$ | $L_{b483}$ |
| 3093 | $L_{a188}$ | $L_{b483}$ | 3094 | $L_{a189}$ | $L_{b483}$ |
| 3095 | $L_{a190}$ | $L_{b483}$ | 3096 | $L_{a199}$ | $L_{b483}$ |
| 3097 | $L_{a200}$ | $L_{b483}$ | 3098 | $L_{a201}$ | $L_{b483}$ |
| 3099 | $L_{a202}$ | $L_{b483}$ | 3100 | $L_{a203}$ | $L_{b483}$ |
| 3101 | $L_{a204}$ | $L_{b483}$ | 3102 | $L_{a205}$ | $L_{b483}$ |
| 3103 | $L_{a206}$ | $L_{b483}$ | 3104 | $L_{a207}$ | $L_{b483}$ |
| 3105 | $L_{a208}$ | $L_{b483}$ | 3106 | $L_{a209}$ | $L_{b483}$ |
| 3107 | $L_{a210}$ | $L_{b483}$ | 3108 | $L_{a211}$ | $L_{b483}$ |
| 3109 | $L_{a212}$ | $L_{b483}$ | 3110 | $L_{a213}$ | $L_{b483}$ |
| 3111 | $L_{a214}$ | $L_{b483}$ | 3112 | $L_{a215}$ | $L_{b483}$ |
| 3113 | $L_{a216}$ | $L_{b483}$ | 3114 | $L_{a217}$ | $L_{b483}$ |
| 3115 | $L_{a218}$ | $L_{b483}$ | 3116 | $L_{a219}$ | $L_{b483}$ |
| 3117 | $L_{a220}$ | $L_{b483}$ | 3118 | $L_{a221}$ | $L_{b483}$ |
| 3119 | $L_{a230}$ | $L_{b483}$ | 3120 | $L_{a231}$ | $L_{b483}$ |
| 3121 | $L_{a232}$ | $L_{b483}$ | 3122 | $L_{a233}$ | $L_{b483}$ |
| 3123 | $L_{a234}$ | $L_{b483}$ | 3124 | $L_{a235}$ | $L_{b483}$ |
| 3125 | $L_{a236}$ | $L_{b483}$ | 3126 | $L_{a252}$ | $L_{b483}$ |

-continued

| Metal Complex | $L_a$ | $L_b$ | Metal Complex | $L_a$ | $L_b$ |
|---|---|---|---|---|---|
| 3127 | $L_{a253}$ | $L_{b483}$ | 3128 | $L_{a254}$ | $L_{b483}$ |
| 3129 | $L_{a255}$ | $L_{b483}$ | 3130 | $L_{a256}$ | $L_{b483}$ |
| 3131 | $L_{a257}$ | $L_{b483}$ | 3132 | $L_{a258}$ | $L_{b483}$ |
| 3133 | $L_{a259}$ | $L_{b483}$ | 3134 | $L_{a260}$ | $L_{b483}$ |
| 3135 | $L_{a261}$ | $L_{b483}$ | 3136 | $L_{a262}$ | $L_{b483}$ |
| 3137 | $L_{a263}$ | $L_{b483}$ | 3138 | $L_{a264}$ | $L_{b483}$ |
| 3139 | $L_{a265}$ | $L_{b483}$ | 3140 | $L_{a266}$ | $L_{b483}$ |
| 3141 | $L_{a267}$ | $L_{b483}$ | 3142 | $L_{a268}$ | $L_{b483}$ |
| 3143 | $L_{a269}$ | $L_{b483}$ | 3144 | $L_{a270}$ | $L_{b483}$ |
| 3145 | $L_{a271}$ | $L_{b483}$ | 3146 | $L_{a272}$ | $L_{b483}$ |
| 3147 | $L_{a273}$ | $L_{b483}$ | 3148 | $L_{a274}$ | $L_{b483}$ |
| 3149 | $L_{a275}$ | $L_{b483}$ | 3150 | $L_{a276}$ | $L_{b483}$ |
| 3151 | $L_{a277}$ | $L_{b483}$ | 3152 | $L_{a278}$ | $L_{b483}$ |
| 3153 | $L_{a279}$ | $L_{b483}$ | 3154 | $L_{a280}$ | $L_{b483}$ |
| 3155 | $L_{a281}$ | $L_{b483}$ | 3156 | $L_{a282}$ | $L_{b483}$ |
| 3157 | $L_{a283}$ | $L_{b483}$ | 3158 | $L_{a284}$ | $L_{b483}$ |
| 3159 | $L_{a285}$ | $L_{b483}$ | 3160 | $L_{a286}$ | $L_{b483}$ |
| 3161 | $L_{a287}$ | $L_{b483}$ | 3162 | $L_{a288}$ | $L_{b483}$ |
| 3163 | $L_{a1}$ | $L_{b484}$ | 3164 | $L_{a2}$ | $L_{b484}$ |
| 3165 | $L_{a3}$ | $L_{b484}$ | 3166 | $L_{a4}$ | $L_{b484}$ |
| 3167 | $L_{a5}$ | $L_{b484}$ | 3168 | $L_{a6}$ | $L_{b484}$ |
| 3169 | $L_{a7}$ | $L_{b484}$ | 3170 | $L_{a8}$ | $L_{b484}$ |
| 3171 | $L_{a17}$ | $L_{b484}$ | 3172 | $L_{a18}$ | $L_{b484}$ |
| 3173 | $L_{a19}$ | $L_{b484}$ | 3174 | $L_{a20}$ | $L_{b484}$ |
| 3175 | $L_{a21}$ | $L_{b484}$ | 3176 | $L_{a22}$ | $L_{b484}$ |
| 3177 | $L_{a23}$ | $L_{b484}$ | 3178 | $L_{a24}$ | $L_{b484}$ |
| 3179 | $L_{a48}$ | $L_{b484}$ | 3180 | $L_{a49}$ | $L_{b484}$ |
| 3181 | $L_{a50}$ | $L_{b484}$ | 3182 | $L_{a51}$ | $L_{b484}$ |
| 3183 | $L_{a52}$ | $L_{b484}$ | 3184 | $L_{a53}$ | $L_{b484}$ |
| 3185 | $L_{a54}$ | $L_{b484}$ | 3186 | $L_{a55}$ | $L_{b484}$ |
| 3187 | $L_{a56}$ | $L_{b484}$ | 3188 | $L_{a57}$ | $L_{b484}$ |
| 3189 | $L_{a58}$ | $L_{b484}$ | 3190 | $L_{a59}$ | $L_{b484}$ |
| 3191 | $L_{a60}$ | $L_{b484}$ | 3192 | $L_{a61}$ | $L_{b484}$ |
| 3193 | $L_{a62}$ | $L_{b484}$ | 3194 | $L_{a63}$ | $L_{b484}$ |
| 3195 | $L_{a64}$ | $L_{b484}$ | 3196 | $L_{a65}$ | $L_{b484}$ |
| 3197 | $L_{a66}$ | $L_{b484}$ | 3198 | $L_{a67}$ | $L_{b484}$ |
| 3199 | $L_{a68}$ | $L_{b484}$ | 3200 | $L_{a69}$ | $L_{b484}$ |
| 3201 | $L_{a70}$ | $L_{b484}$ | 3202 | $L_{a71}$ | $L_{b484}$ |
| 3203 | $L_{a72}$ | $L_{b484}$ | 3204 | $L_{a73}$ | $L_{b484}$ |
| 3205 | $L_{a74}$ | $L_{b484}$ | 3206 | $L_{a75}$ | $L_{b484}$ |
| 3207 | $L_{a76}$ | $L_{b484}$ | 3208 | $L_{a77}$ | $L_{b484}$ |
| 3209 | $L_{a78}$ | $L_{b484}$ | 3210 | $L_{a79}$ | $L_{b484}$ |
| 3211 | $L_{a80}$ | $L_{b484}$ | 3212 | $L_{a81}$ | $L_{b484}$ |
| 3213 | $L_{a82}$ | $L_{b484}$ | 3214 | $L_{a83}$ | $L_{b484}$ |
| 3215 | $L_{a92}$ | $L_{b484}$ | 3216 | $L_{a93}$ | $L_{b484}$ |
| 3217 | $L_{a94}$ | $L_{b484}$ | 3218 | $L_{a95}$ | $L_{b484}$ |
| 3219 | $L_{a96}$ | $L_{b484}$ | 3220 | $L_{a97}$ | $L_{b484}$ |
| 3221 | $L_{a98}$ | $L_{b484}$ | 3222 | $L_{a99}$ | $L_{b484}$ |
| 3223 | $L_{a100}$ | $L_{b484}$ | 3224 | $L_{a101}$ | $L_{b484}$ |
| 3225 | $L_{a102}$ | $L_{b484}$ | 3226 | $L_{a103}$ | $L_{b484}$ |
| 3227 | $L_{a104}$ | $L_{b484}$ | 3228 | $L_{a105}$ | $L_{b484}$ |
| 3229 | $L_{a106}$ | $L_{b484}$ | 3230 | $L_{a109}$ | $L_{b484}$ |
| 3231 | $L_{a110}$ | $L_{b484}$ | 3232 | $L_{a111}$ | $L_{b484}$ |
| 3233 | $L_{a112}$ | $L_{b484}$ | 3234 | $L_{a113}$ | $L_{b484}$ |
| 3235 | $L_{a114}$ | $L_{b484}$ | 3236 | $L_{a115}$ | $L_{b484}$ |
| 3237 | $L_{a116}$ | $L_{b484}$ | 3238 | $L_{a125}$ | $L_{b484}$ |
| 3239 | $L_{a126}$ | $L_{b484}$ | 3240 | $L_{a127}$ | $L_{b484}$ |
| 3241 | $L_{a128}$ | $L_{b484}$ | 3242 | $L_{a129}$ | $L_{b484}$ |
| 3243 | $L_{a130}$ | $L_{b484}$ | 3244 | $L_{a131}$ | $L_{b484}$ |
| 3245 | $L_{a132}$ | $L_{b484}$ | 3246 | $L_{a155}$ | $L_{b484}$ |
| 3247 | $L_{a156}$ | $L_{b484}$ | 3248 | $L_{a157}$ | $L_{b484}$ |
| 3249 | $L_{a158}$ | $L_{b484}$ | 3250 | $L_{a159}$ | $L_{b484}$ |
| 3251 | $L_{a160}$ | $L_{b484}$ | 3252 | $L_{a161}$ | $L_{b484}$ |
| 3253 | $L_{a162}$ | $L_{b484}$ | 3254 | $L_{a163}$ | $L_{b484}$ |
| 3255 | $L_{a164}$ | $L_{b484}$ | 3256 | $L_{a165}$ | $L_{b484}$ |
| 3257 | $L_{a166}$ | $L_{b484}$ | 3258 | $L_{a167}$ | $L_{b484}$ |
| 3259 | $L_{a168}$ | $L_{b484}$ | 3260 | $L_{a169}$ | $L_{b484}$ |
| 3261 | $L_{a170}$ | $L_{b484}$ | 3262 | $L_{a171}$ | $L_{b484}$ |
| 3263 | $L_{a172}$ | $L_{b484}$ | 3264 | $L_{a173}$ | $L_{b484}$ |
| 3265 | $L_{a174}$ | $L_{b484}$ | 3266 | $L_{a175}$ | $L_{b484}$ |
| 3267 | $L_{a176}$ | $L_{b484}$ | 3268 | $L_{a177}$ | $L_{b484}$ |
| 3269 | $L_{a178}$ | $L_{b484}$ | 3270 | $L_{a179}$ | $L_{b484}$ |
| 3271 | $L_{a180}$ | $L_{b484}$ | 3272 | $L_{a181}$ | $L_{b484}$ |
| 3273 | $L_{a182}$ | $L_{b484}$ | 3274 | $L_{a183}$ | $L_{b484}$ |
| 3275 | $L_{a184}$ | $L_{b484}$ | 3276 | $L_{a185}$ | $L_{b484}$ |
| 3277 | $L_{a186}$ | $L_{b484}$ | 3278 | $L_{a187}$ | $L_{b484}$ |

-continued

| Metal Complex | $L_a$ | $L_b$ | Metal Complex | $L_a$ | $L_b$ |
|---|---|---|---|---|---|
| 3279 | $L_{a188}$ | $L_{b484}$ | 3280 | $L_{a189}$ | $L_{b484}$ |
| 3281 | $L_{a190}$ | $L_{b484}$ | 3282 | $L_{a199}$ | $L_{b484}$ |
| 3283 | $L_{a200}$ | $L_{b484}$ | 3284 | $L_{a201}$ | $L_{b484}$ |
| 3285 | $L_{a202}$ | $L_{b484}$ | 3286 | $L_{a203}$ | $L_{b484}$ |
| 3287 | $L_{a204}$ | $L_{b484}$ | 3288 | $L_{a205}$ | $L_{b484}$ |
| 3289 | $L_{a206}$ | $L_{b484}$ | 3290 | $L_{a207}$ | $L_{b484}$ |
| 3291 | $L_{a208}$ | $L_{b484}$ | 3292 | $L_{a209}$ | $L_{b484}$ |
| 3293 | $L_{a210}$ | $L_{b484}$ | 3294 | $L_{a211}$ | $L_{b484}$ |
| 3295 | $L_{a212}$ | $L_{b484}$ | 3296 | $L_{a213}$ | $L_{b484}$ |
| 3297 | $L_{a214}$ | $L_{b484}$ | 3298 | $L_{a215}$ | $L_{b484}$ |
| 3299 | $L_{a216}$ | $L_{b484}$ | 3300 | $L_{a217}$ | $L_{b484}$ |
| 3301 | $L_{a218}$ | $L_{b484}$ | 3302 | $L_{a219}$ | $L_{b484}$ |
| 3303 | $L_{a220}$ | $L_{b484}$ | 3304 | $L_{a221}$ | $L_{b484}$ |
| 3305 | $L_{a230}$ | $L_{b484}$ | 3306 | $L_{a231}$ | $L_{b484}$ |
| 3307 | $L_{a232}$ | $L_{b484}$ | 3308 | $L_{a233}$ | $L_{b484}$ |
| 3309 | $L_{a234}$ | $L_{b484}$ | 3310 | $L_{a235}$ | $L_{b484}$ |
| 3311 | $L_{a236}$ | $L_{b484}$ | 3312 | $L_{a252}$ | $L_{b484}$ |
| 3313 | $L_{a253}$ | $L_{b484}$ | 3314 | $L_{a254}$ | $L_{b484}$ |
| 3315 | $L_{a255}$ | $L_{b484}$ | 3316 | $L_{a256}$ | $L_{b484}$ |
| 3317 | $L_{a257}$ | $L_{b484}$ | 3318 | $L_{a258}$ | $L_{b484}$ |
| 3319 | $L_{a259}$ | $L_{b484}$ | 3320 | $L_{a260}$ | $L_{b484}$ |
| 3321 | $L_{a261}$ | $L_{b484}$ | 3322 | $L_{a262}$ | $L_{b484}$ |
| 3323 | $L_{a263}$ | $L_{b484}$ | 3324 | $L_{a264}$ | $L_{b484}$ |
| 3325 | $L_{a265}$ | $L_{b484}$ | 3326 | $L_{a266}$ | $L_{b484}$ |
| 3327 | $L_{a267}$ | $L_{b484}$ | 3328 | $L_{a268}$ | $L_{b484}$ |
| 3329 | $L_{a269}$ | $L_{b484}$ | 3330 | $L_{a270}$ | $L_{b484}$ |
| 3331 | $L_{a271}$ | $L_{b484}$ | 3332 | $L_{a272}$ | $L_{b484}$ |
| 3333 | $L_{a273}$ | $L_{b484}$ | 3334 | $L_{a274}$ | $L_{b484}$ |
| 3335 | $L_{a275}$ | $L_{b484}$ | 3336 | $L_{a276}$ | $L_{b484}$ |
| 3337 | $L_{a277}$ | $L_{b484}$ | 3338 | $L_{a278}$ | $L_{b484}$ |
| 3339 | $L_{a279}$ | $L_{b484}$ | 3340 | $L_{a280}$ | $L_{b484}$ |
| 3341 | $L_{a281}$ | $L_{b484}$ | 3342 | $L_{a282}$ | $L_{b484}$ |
| 3343 | $L_{a283}$ | $L_{b484}$ | 3344 | $L_{a284}$ | $L_{b484}$ |
| 3345 | $L_{a285}$ | $L_{b484}$ | 3346 | $L_{a286}$ | $L_{b484}$ |
| 3347 | $L_{a287}$ | $L_{b484}$ | 3348 | $L_{a288}$ | $L_{b484}$. |

21. An organic electroluminescent device, comprising:

an anode, a cathode, and an organic layer disposed between the anode and the cathode, wherein at least one layer of the organic layer contains the metal complex of claim 1.

22. The organic electroluminescent device of claim 21, wherein the organic layer is a light-emitting layer and the metal complex is a light-emitting material.

23. The organic electroluminescent device of claim 22, wherein the light-emitting layer emits yellow or green light.

24. The organic electroluminescent device of claim 22, wherein the light-emitting layer further contains at least one first host compound;

preferably, the light-emitting layer further contains a second host compound;

more preferably, at least one of the host compounds comprises at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

25. The organic electroluminescent device of claim 24, wherein the first host compound has a structure represented by Formula 3:

Formula 3

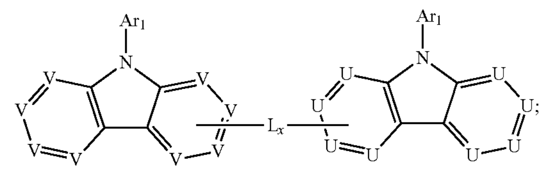

wherein $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof, V is, at each occurrence identically or differently, selected from C, $CR_v$ or N, and at least one V is C and joined to $L_x$;

U is, at each occurrence identically or differently, selected from C, $CR_u$ or N, and at least one U is C and joined to $L_x$;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, $Ar_1$ is, at each occurrence identically or differently, selected from substituted or unsubstituted aryl having 6 to 30 carbon atoms, substituted or unsubstituted heteroaryl having 3 to 30 carbon atoms or a combination thereof, and adjacent substituents $R_v$ and $R_u$ can be optionally joined to form a ring;

preferably, the first host compound has a structure represented by one of Formulas 3-a to 3-j:
3-a
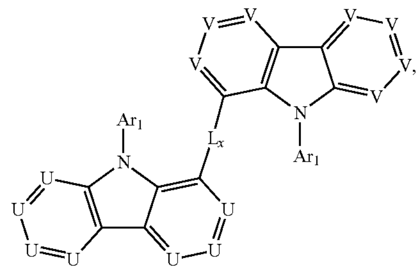
3-b
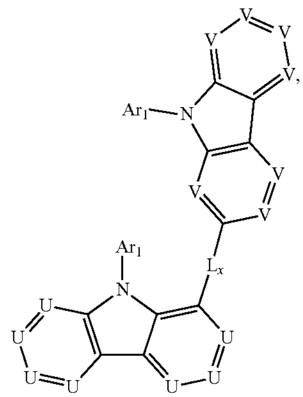
3-c
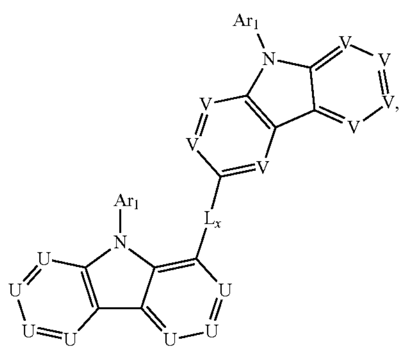
3-d
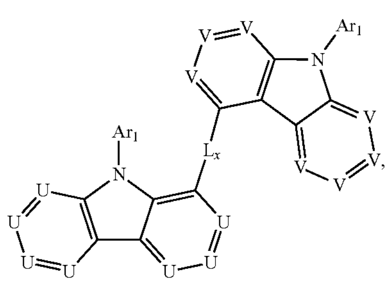
3-e
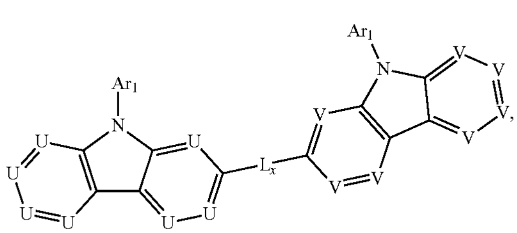
-continued
3-f
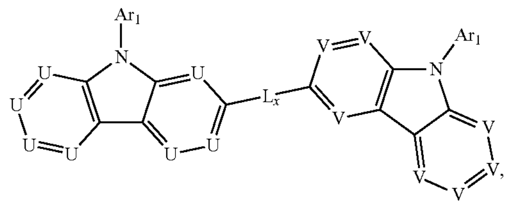
3-g
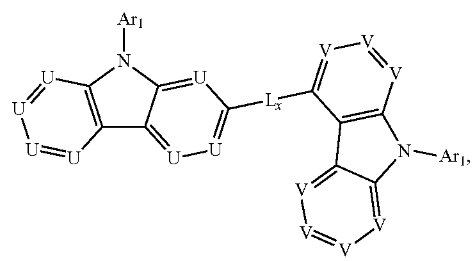
3-h
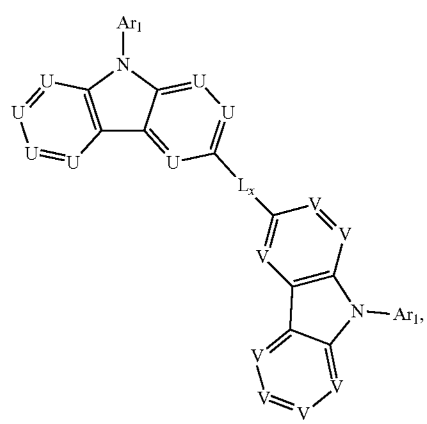
3-i
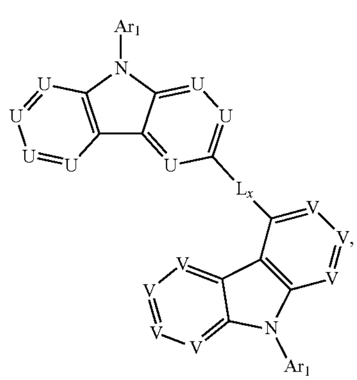

-continued 3-j

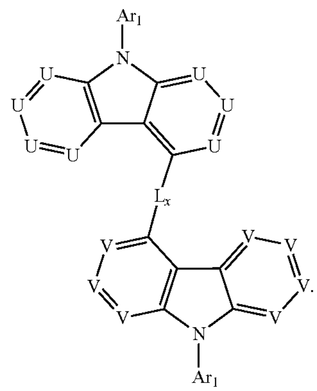

26. The organic electroluminescent device of claim 24, wherein the metal complex is doped in the first host compound and the second host compound, and the weight of the metal complex accounts for 1% to 30% of the total weight of the light-emitting layer;

preferably, the weight of the metal complex accounts for 3% to 13% of the total weight of the light-emitting layer.

27. A compound composition containing the metal complex of claim 1.

* * * * *